(12) United States Patent  
Kawai et al.

(10) Patent No.: US 9,249,257 B2  
(45) Date of Patent: Feb. 2, 2016

(54) COPOLYMER, ORGANIC SEMICONDUCTOR MATERIAL, ORGANIC ELECTRICAL DEVICE, PHOTOVOLTAIC MODULE

(71) Applicant: MITSUBISHI CHEMICAL CORPORATION, Chiyoda-ku (JP)

(72) Inventors: Junya Kawai, Yokohama (JP); Rieko Fujita, Yokohama (JP); Wataru Sato, Yokohama (JP); Mitsunori Furuya, Yokohama (JP); Kenichi Satake, Yokohama (JP); Maki Oba, Yokohama (JP)

(73) Assignee: MITSUBISHI CHEMICAL CORPORATION, Chiyoda-ku (JP)

( * ) Notice: Subject to any disclaimer, the term of this patent is extended or adjusted under 35 U.S.C. 154(b) by 0 days.

(21) Appl. No.: 14/556,767

(22) Filed: Dec. 1, 2014

(65) Prior Publication Data

US 2015/0094436 A1    Apr. 2, 2015

Related U.S. Application Data

(63) Continuation of application No. PCT/JP2013/065103, filed on May 30, 2013.

(30) Foreign Application Priority Data

May 31, 2012   (JP) .................................. 2012-125073  
May 31, 2012   (JP) .................................. 2012-125074

(51) Int. Cl.  
*C08G 73/06*   (2006.01)  
*C08G 61/12*   (2006.01)  
(Continued)

(52) U.S. Cl.  
CPC ............ *C08G 61/126* (2013.01); *C08G 61/124* (2013.01); *H01L 51/0036* (2013.01); *H01L 51/0043* (2013.01); *H01L 51/0094* (2013.01); *C08G 61/123* (2013.01); *C08G 2261/12* (2013.01); *C08G 2261/124* (2013.01); *C08G 2261/3223* (2013.01); *C08G 2261/3246* (2013.01); *C08G 2261/344* (2013.01); *C08G 2261/414* (2013.01); *C08G 2261/91* (2013.01);  
(Continued)

(58) Field of Classification Search  
USPC ............................ 526/256; 136/263; 528/423  
See application file for complete search history.

(56) References Cited

U.S. PATENT DOCUMENTS

2010/0032018 A1*   2/2010   Zhu et al. ...................... 136/261  
2011/0028644 A1    2/2011   Brown et al.  
(Continued)

FOREIGN PATENT DOCUMENTS

CN    102344548 A    2/2012  
CN    102362314 A    2/2012  
(Continued)

OTHER PUBLICATIONS

International Search Report issued in PCT/JP2013/065103, dated Sep. 3, 2013.  
(Continued)

*Primary Examiner* — Shane Fang  
(74) *Attorney, Agent, or Firm* — Oblon, McClelland, Maier & Neustadt, L.L.P.

(57) ABSTRACT

A copolymer containing a repeating unit having a dioxopyrrole condensed ring skeleton and a repeating unit having a dithieno condensed ring skeleton and also having a specific substituent is provided.

20 Claims, 3 Drawing Sheets

(51) Int. Cl.
*H01L 51/00* (2006.01)
*H01L 51/42* (2006.01)

(52) U.S. Cl.
CPC .............. *H01L 51/42* (2013.01); *H01L 51/4253* (2013.01); *Y02E 10/549* (2013.01)

(56) References Cited

U.S. PATENT DOCUMENTS

| | | | |
|---|---|---|---|
| 2011/0114184 | A1 | 5/2011 | Brown et al. |
| 2012/0283377 | A1 | 11/2012 | Grenier |
| 2014/0243488 | A1 | 8/2014 | Sato et al. |
| 2014/0243492 | A1 | 8/2014 | Fujita et al. |

FOREIGN PATENT DOCUMENTS

| | | |
|---|---|---|
| EP | 2 774 931 A1 | 9/2014 |
| EP | 2 774 940 A1 | 9/2014 |
| JP | 2011-168747 | 9/2011 |
| WO | WO 2011/028827 A2 | 3/2011 |
| WO | WO 2013/065836 A1 | 5/2013 |
| WO | WO 2013/065855 A1 | 5/2013 |

OTHER PUBLICATIONS

Yong Zhang et al.; "Conjugated polymers based on C, Si and N-bridged dithiophene and thienopyrroledione units: synthesis, field-effect transistors and bulk heterojunction polymer solar cells"; J. Mater. Chem., 2011, 21, 3895-3902.

Chad M. Amb et al.; "Dithienogermole as a Fused Electron Donor in Bulk Heterojunction Solar Cells"; J. Am. Chem. Soc. 2011, 133, 10062-10065.

Young-Rae Hong et al.; "Polymer solar cells based on copolymers of dithieno[3,2-b:20,30-d]silole and thienopyrroledione"; *Chem. Commun.*, 2011, 47, 4920-4922.

International Preliminary Report on Patentability and Written Opinion issued on Dec. 11, 2014 in PCT/JP2013/065103.

Extended European Search Report issued Mar. 25, 2015 in Patent Application No. 13796867.3.

Ta-Ya Chu, et al., "Effects of the Molecular Weight and the Side-Chain Length on the Photovoltaic Performance of Dithienosilole/Thienopyrrolodione Copolymers" Advanced Functional Materials, vol. 22, No. 11, XP001576528, Mar. 6, 2012, pp. 2345-2351.

Chinese Office Action dated Nov. 13, 2015, in Chinese Patent Application No. 201380028470.2 (with English Translation), 15 pages.

* cited by examiner

COPOLYMER, ORGANIC SEMICONDUCTOR MATERIAL, ORGANIC ELECTRICAL DEVICE, PHOTOVOLTAIC MODULE

CROSS-REFERENCE TO RELATED APPLICATION

This is a continuation of International Application PCT/JP2013/065103, filed on May 30, 2013, and designated the U.S., and claims priority from Japanese Patent Application 2012-125073 which was filed on May 31, 2012 and Japanese Patent Application 2012-125074 which was filed on May 31, 2012, the entire contents of which are incorporated herein by reference.

TECHNICAL FIELD

The present invention relates to a copolymer, and to an organic semiconductor material, organic electronic device and photovoltaic module containing the copolymer.

BACKGROUND ART

Pi-conjugated polymers have been used as semiconductor materials for an organic electronic device such as organic solar cells, organic EL elements, organic thin-film transistors, and organic luminescence sensors. Improvements in the absorption efficiency of solar light are desirable in organic solar cells in particular, and development of polymers capable of absorbing light at long wavelengths (600 nm or more) is important. Examples have been reported in which a copolymer of a donor monomer and an acceptor monomer (hereunder also called a copolymer) is used in a photoelectric conversion element with the aim of increasing the absorption wavelength.

Specifically, Non-Patent Document 1 describes a photoelectric conversion element using a copolymer having an imidothiophene structure and a dithienocyclopentadiene structure. Further, Non-Patent Documents 1, 2 and 3 and Patent Document 1 describe a photoelectric conversion element using a copolymer having an imidothiophene structure and a dithienosilole structure. Moreover, Non-Patent Document 2 describes a photoelectric conversion element using a copolymer having an imidothiophene structure and a dithienogermole structure.

CITATION LIST

Patent Document

Patent Document 1: WO 2011/028827

Non-Patent Document

Non-Patent Document 1: J. Mater. Chem., 2011, 21, 3895-3902
Non-Patent Document 2: J. Am. Chem. Soc., 2011, 133, 10062-10065
Non-Patent Document 3: Chem. Commun., 2011, 47, 4920-4922

SUMMARY OF INVENTION

Technical Problem

To prepare an organic electronic device more easily, it is desirable to prepare a solution (hereinafter sometimes called an ink) of a dissolved organic semiconductor material, and coat or otherwise apply this ink to form a film of the organic semiconductor material. However, the investigations of the inventors of this application have revealed that an ink containing such a copolymer and an organic solvent gels when left standing for only a few minutes at room temperature.

It is an object of the present invention to provide a copolymer that can be used as a semiconductor material and is highly stable in solution.

Solution to Problem

The inventors of the present application discovered as a result of exhaustive research aimed at solving this problem that a copolymer containing a repeating unit having a dioxopyrrole condensed ring skeleton and a repeating unit having a dithieno condensed ring skeleton and also having a specific substituent is highly stable in solution, and perfected the present invention based on this finding. That is, the substance of the first embodiment of the present invention is as follows.

One embodiment of the present invention is a copolymer containing a repeating unit represented by Formula (1A), a repeating unit represented by Formula (1B), and a repeating unit represented by Formula (1C) below.

[Chemical Formula 1]

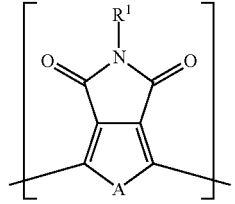

(1A)

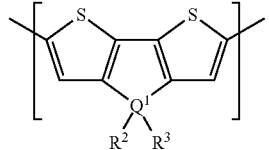

(1B)

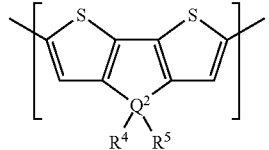

(1C)

(In Formula (1A), Formula (1B), and Formula (1C), A represents an atom selected from elements of Group 16 of the periodic table, each of $Q^1$ and $Q^2$ independently represents an atom selected from elements of Group 14 of the periodic table, $R^1$ represents a hydrocarbon group optionally having a heteroatom, $R^2$ represents an optionally substituted branched alkyl group, $R^4$ represents an optionally substituted linear alkyl group, optionally substituted aromatic hydrocarbon group, or optionally substituted aromatic heterocyclic group, each of $R^3$ and $R^5$ independently represents an optionally substituted branched alkyl group, optionally substituted linear alkyl group, optionally substituted cycloalkyl group, optionally substituted aromatic hydrocarbon group, optionally substituted aliphatic heterocyclic group, or optionally substituted aromatic heterocyclic group, and at least one of a combination of $R^2$ and $R^5$ and a combination of $R^3$ and $R^4$ is a combination of groups that are different from each other.)

The copolymer preferably contains a repeating unit represented by Formula (2A) and a repeating unit represented by Formula (2B) below.

[Chemical Formula 2]

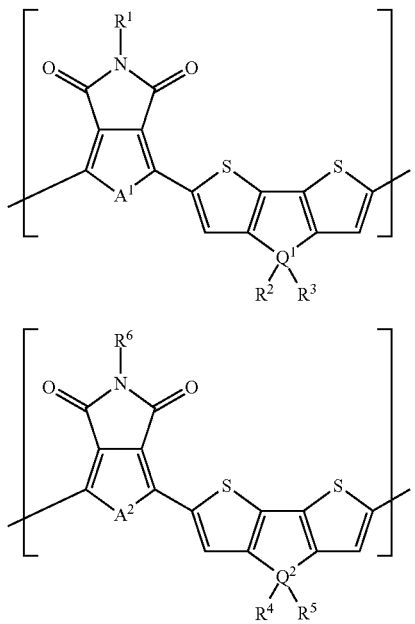

(2A)

(2B)

(In Formula (2A) and Formula (2B), each of $A^1$ and $A^2$ independently represents an atom selected from elements of group 16 of the periodic table, each of $Q^1$ and $Q^2$ independently represents an atom selected from elements of Group 14 of the periodic table, each of $R^1$ and $R^6$ independently represents a hydrocarbon group optionally having a heteroatom, $R^2$ represents an optionally substituted branched alkyl group, $R^4$ represents an optionally substituted linear alkyl group, optionally substituted aromatic hydrocarbon group, or optionally substituted aromatic heterocyclic group, each of $R^3$ and $R^5$ independently represents an optionally substituted branched alkyl group, optionally substituted linear alkyl group, optionally substituted cycloalkyl group, optionally substituted aromatic hydrocarbon group, optionally substituted aliphatic heterocyclic group or optionally substituted aromatic heterocyclic group, and at least one of a combination of $R^2$ and $R^5$ and a combination of $R^3$ and $R^4$ is a combination of groups that are different from each other.)

The present invention also provides an organic semiconductor material containing the copolymer. The present invention also provides an organic electronic device containing the organic semiconductor material.

The organic device is preferably a photoelectric conversion element. The organic device is also preferably a solar cell.

The present invention also provides a solar cell module provided with the organic electronic device.

The present invention also provides the following second embodiment.

[1] A copolymer containing at least the repeating units represented by Formula (1A) and Formula (1B), or a copolymer containing the repeating units represented by Formula (1A), Formula (1B) and Formula (1C).

[Chemical Formula 3]

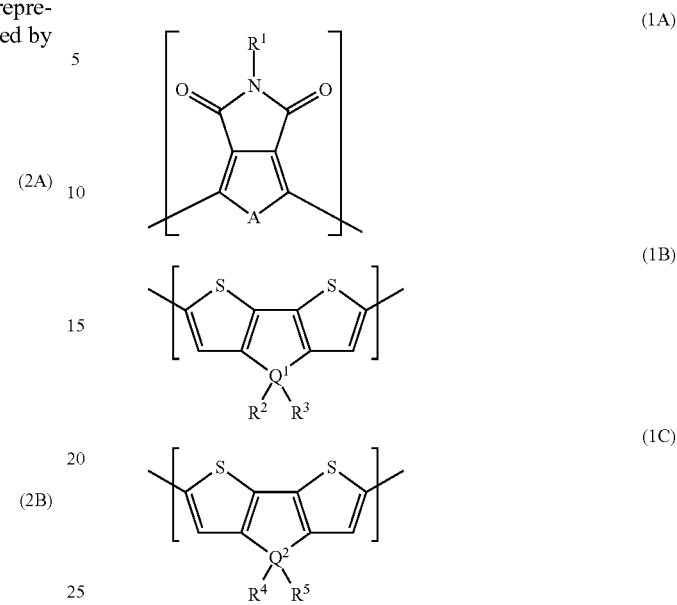

(1A)

(1B)

(1C)

(In Formula (1A), Formula (1B) and Formula (1C), A represents an atom selected from the elements of Group 16 of the periodic table, each of $Q^1$ and $Q^2$ independently represents an atom selected from the elements of Group 14 of the periodic table, $R^1$ represents a hydrocarbon group optionally having a heteroatom, each of $R^2$, $R^3$, $R^4$, and $R^5$ is independently an optionally substituted group selected from the linear aliphatic hydrocarbon groups, branched aliphatic hydrocarbon groups, alicyclic hydrocarbon groups, aromatic hydrocarbon groups and heterocyclic groups, and in the case of a copolymer containing the repeating units represented by Formulae (1A) and (1B), $R^2$ and $R^3$ are different from each other, while in the case of a copolymer containing the repeating units represented by Formulae (1A), (1B), and (1C), at least one of $R^2$, $R^3$, $R^4$ and $R^5$ is different from another group.)

[2] The copolymer according to [1], which is a copolymer containing the repeating units represented by Formula (1A) and Formula (1B), wherein $R^2$ is an optionally substituted branched aliphatic hydrocarbon group, and $R^3$ is an optionally substituted group selected from the linear aliphatic hydrocarbon groups, alicyclic hydrocarbon groups, aromatic hydrocarbon groups and heterocyclic groups.

[3] The copolymer according to [2], which is a copolymer containing the repeating units represented by Formula (1A) and Formula (1B), wherein $R^3$ is an optionally substituted linear aliphatic hydrocarbon group.

[4] The copolymer according to [3], which is a copolymer containing the repeating units represented by Formula (1A) and Formula (1B), wherein $R^2$ is an optionally substituted branched alkyl group, and $R^3$ is an optionally substituted linear alkyl group.

[5] A copolymer according to any of [1] to [4], which is a copolymer containing the repeating units represented by Formula (1A) and Formula (1B), wherein the numbers of carbon atoms in $R^2$ and $R^3$ are independently 6 or more and 10 or less.

[6] The copolymer according to [1], which is a copolymer containing the repeating units represented by Formula (1A), Formula (1B) and Formula (1C), wherein $R^2$ is an optionally substituted branched aliphatic hydrocarbon group, $R^4$ is an optionally substituted group selected from the linear aliphatic hydrocarbon groups, alicyclic hydrocarbon groups, aromatic hydrocarbon groups, and heterocyclic groups, and each of $R^3$ and $R^5$ is independently a linear aliphatic hydrocarbon group, branched aliphatic hydrocarbon group, alicyclic hydrocarbon group, aromatic hydrocarbon group or heterocyclic group, and is optionally substituted.

[7] The copolymer according to [6], which is a copolymer containing the repeating units represented by Formula (1A), Formula (1B), and Formula (1C), wherein $R^4$ is an optionally substituted linear aliphatic hydrocarbon group.

[8] The copolymer according to [1], which is a copolymer containing the repeating units represented by Formula (1A), Formula (1B), and Formula (1C), wherein each of $R^3$ and $R^5$ is independently an optionally substituted group selected from the linear aliphatic hydrocarbon groups and branched aliphatic hydrocarbon groups.

[9] The copolymer according to [8], which is a copolymer containing the repeating units represented by Formula (1A), Formula (1B), and Formula (1C), wherein $R^2$ is an optionally substituted branched alkyl group, $R^4$ is an optionally substituted linear alkyl group, and each of $R^3$ and $R^5$ is independently an optionally substituted group independently selected from the linear alkyl groups and branched alkyl groups.

[10] A copolymer according to any of [6] to [9], which is a copolymer containing the repeating units represented by Formula (1A), the Formula (1B), and Formula (1C), wherein the numbers of carbon atoms in $R^2$, $R^3$, $R^4$, and $R^5$ are each independently 6 or more and 10 or less.

[11] A photoelectric conversion element having the copolymer according to any of [1] to [10].

[12] A photovoltaics having the photoelectric conversion element according to [11].

The present invention also provides the following third embodiment.

[1] A copolymer containing a repeating unit represented by Formula (1A) below and a repeating unit represented by Formula (1B) below.

[Chemical Formula 4]

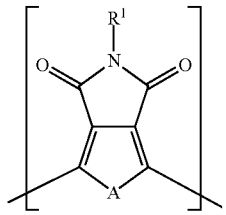

(1A)

(In Formula (1A), A represents an atom selected from the elements of Group 16 of the periodic table, and $R^1$ represents a hydrocarbon group optionally having a heteroatom.)

[Chemical Formula 5]

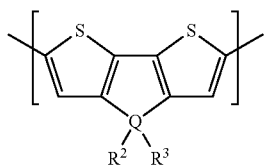

(1B)

(In Formula (1B), Q represents an atom selected from the elements of Group 14 of the periodic table, $R^2$ represents an optionally substituted branched alkyl group, and $R^3$ represents an optionally substituted linear alkyl group, optionally substituted cycloalkyl group, optionally substituted aromatic hydrocarbon group, optionally substituted aliphatic heterocyclic group, or optionally substituted aromatic heterocyclic group.)

[2] The copolymer according to [1], containing a repeating unit represented by Formula (2A) below.

[Chemical Formula 6]

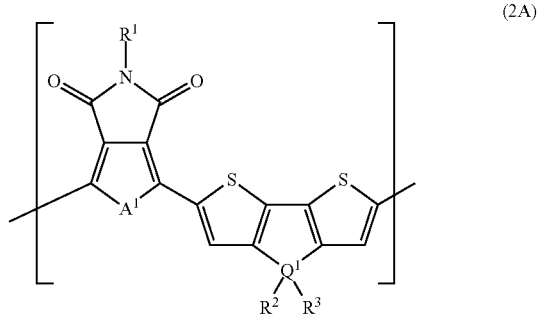

(2A)

(In Formula (2A), $A^1$ represents an atom selected from the elements of group 16 of the periodic table, $Q^1$ represents an atom selected from the elements of Group 14 of the periodic table, $R^1$ represents a hydrocarbon group optionally having a heteroatom, $R^2$ represents an optionally substituted branched alkyl group, and $R^3$ represents an optionally substituted linear alkyl group, optionally substituted cycloalkyl group, optionally substituted aromatic hydrocarbon group, optionally substituted aliphatic heterocyclic group, or optionally substituted aromatic heterocyclic group.)

[3] An organic semiconductor material containing a copolymer according to [1] or [2].

[4] An organic electronic device containing the organic semiconductor material according to [3].

[5] The organic electronic device according to [4], which is a photoelectric conversion element.

[6] The organic electronic device according to [4], which is a photovoltaics.

[7] A photovoltaic module provided with an organic electronic device according to [6].

Advantageous Effects of Invention

A copolymer can be provided that has high stability in solution and can be used as a semiconductor material.

DESCRIPTION OF EMBODIMENTS

Figure 1:
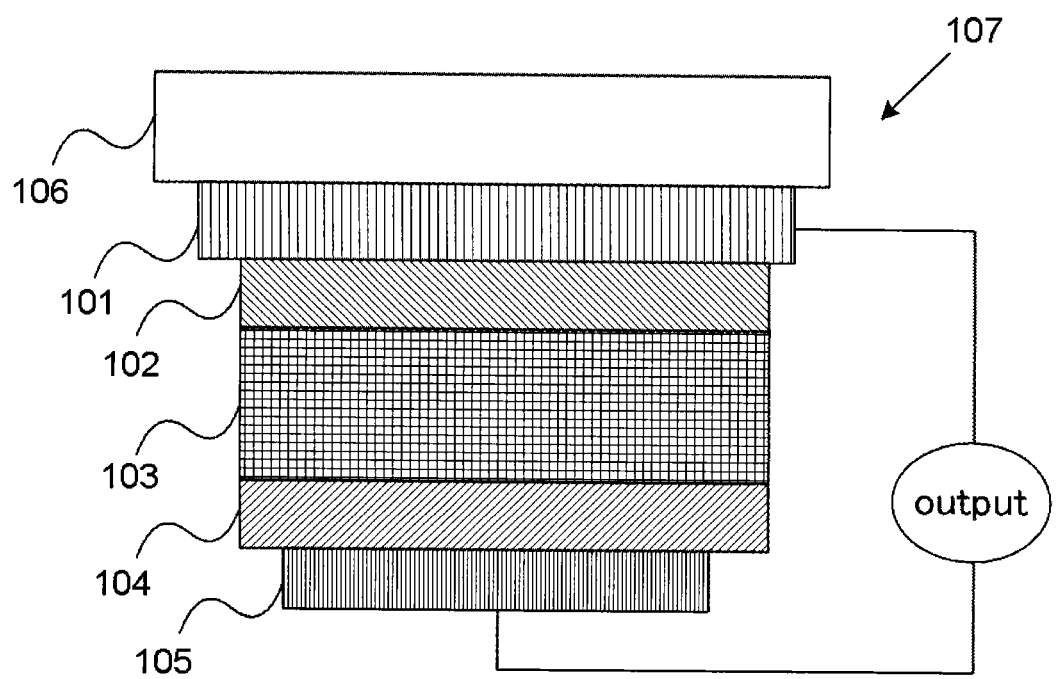
FIG. 1 is a cross-section schematically illustrating the configuration of a photoelectric conversion element as one embodiment of the present invention.

Embodiments of the present invention are explained in detail below. The following explanations of constituent elements pertain only to examples (typical examples) of embodiments of the present invention, and the present invention is not limited thereby as long as its intent is not exceeded.

1. Copolymer of Invention

The copolymer of the present invention contains either a repeating unit represented by Formula (1A) below and a repeating unit represented by Formula (1B) below (hereunder sometimes called the repeating units represented by Formula (1A) and Formula (1B)), or else a repeating unit represented by Formula (1A) below, a repeating unit represented by Formula (1B) below, and a repeating unit represented by Formula (1C) below (hereunder sometimes called the repeating units represented by Formula (1A), Formula (1B), and Formula (1C)). Because the copolymer of the present invention resists gelling in a dissolved state, it is suited to coating film formation. Moreover, the copolymer of the present invention is also desirable because it has a light absorption wavelength range at longer wavelengths, strong light-absorbing properties, and high mobility. The copolymer of the present invention is also desirable because it can be easily obtained with a high molecular weight.

[Chemical Formula 7]

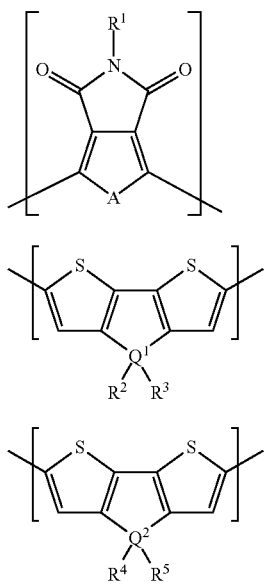

In the Formula (1A), Formula (1B), and Formula (1C), A represents an atom selected from the elements of Group 16 of the periodic table. Specific examples of A include oxygen, sulfur, selenium, and tellurium atoms. Of these, an oxygen atom, sulfur atom or selenium atom is preferred for ease of synthesis, a sulfur atom or oxygen atom is more preferred, and a sulfur atom is especially preferred.

In the Formula (1B) and Formula (1C), each of $Q^1$ and $Q^2$ independently represents an atom selected from the elements of Group 14 of the periodic table. Specific examples of atoms selected from the elements of Group 14 of the periodic table include carbon, silicon, germanium, tin and lead atoms. $Q^1$ and $Q^2$ may be the same or different.

Carbon, silicon, germanium and tin atoms are preferred as $Q^1$ and $Q^2$, and carbon, silicon and germanium atoms are more preferred. Silicon and germanium atoms are still more preferred. Because the silicon and germanium atoms have larger atomic radii than the carbon atom, this can reduce any steric hindrance from the substituents $R^2$ to $R^5$ that interferes with pi-pi stacking. This is desirable because it helps to maintain a suitable degree of molecular interaction between copolymer units.

In the Formula (1A), $R^1$ represents a hydrocarbon group optionally having a heteroatom. A hydrocarbon group optionally having a heteroatom means a hydrocarbon group in which at least some of the carbon atoms and hydrogen atoms making up the hydrocarbon group may have been replaced with heteroatoms or atom groups having heteroatoms.

Examples of a hydrocarbon group optionally having a heteroatom include an optionally substituted alkyl group, an optionally substituted alkenyl group, an optionally substituted alkynyl group, an optionally substituted aromatic hydrocarbon group, or an optionally substituted heterocyclic group.

An alkyl group may be a linear alkyl group, branched alkyl group or cycloalkyl group. Of these, a linear alkyl group or branched alkyl group is preferred for improving the solubility of the copolymer of the present invention. A branched alkyl group may be a branched primary alkyl group, branched secondary alkyl group or branched tertiary alkyl group. A branched primary alkyl group is a branched alkyl group in which two hydrogen atoms bind to carbon atoms having free valence. A branched secondary alkyl group is a branched alkyl group in which one hydrogen atom binds to a carbon atom having free valence. A branched tertiary alkyl group is a branched alkyl group in which no hydrogen atom binds to a carbon atom having free valence. Free valence here means the ability to form a bond with another free valence as described in Nomenclature for Organic Chemistry and Biochemistry (I) (Revised Second Edition, Nankodo, 1992).

A linear alkyl group or branched primary alkyl group is more preferable from the standpoint of improving mobility by reinforcing intermolecular interactions to a suitable degree, while a branched secondary alkyl group is more preferable for improving solubility. A linear alkyl group or branched primary alkyl group is still more preferable, and a linear alkyl group is especially preferable.

The number of carbon atoms in the alkyl group is normally at least 1, or preferably at least 3, or more preferably at least 4, and is normally 30 or less, or preferably 20 or less, or more preferably 16 or less, or still more preferably 12 or less.

Examples of linear alkyl groups include methyl, ethyl, n-propyl, n-butyl, n-pentyl, n-hexyl, n-heptyl, n-octyl, n-nonyl, n-decyl, n-undecyl, n-dodecyl, n-tridecyl, n-tetradecyl, n-pentadecyl, n-hexadecyl, n-heptadecyl, n-octadecyl, n-nonadecyl, n-icosyl, n-henicosyl, n-docosyl, n-tricosyl, n-tetracosyl, n-pentacosyl, n-hexacosyl, n-heptacosyl, n-octacosyl, n-nonacosyl and n-triacontyl groups and the like.

Of these, an n-propyl, n-butyl, n-pentyl, n-hexyl, n-heptyl, n-octyl, n-nonyl, n-decyl, n-undecyl, n-dodecyl, n-tridecyl, n-tetradecyl, n-pentadecyl, n-hexadecyl, n-heptadecyl, n-octadecyl, n-nonadecyl, n-icosyl, n-henicosyl, n-docosyl, n-tricosyl, n-tetracosyl, n-pentacosyl, n-hexacosyl, n-heptacosyl, n-octacosyl, n-nonacosyl or n-triacontyl group is preferred, and a n-butyl, n-pentyl, n-hexyl, n-heptyl, n-octyl, n-nonyl, n-decyl, n-undecyl or n-dodecyl group is more preferred for maintaining a high solubility of the copolymer while promoting charge transfer by not allowing too much distance between molecules of the copolymer.

Examples of branched primary alkyl groups include 2-ethylhexyl, 2-methylpropyl, 2-ethylhexyl, 2,2-dimethylpropyl, 2-methylbutyl, 2-ethylbutyl, 2,4-dimethylhexyl, 2-methylpentyl, 2,4,4-trimethylpentyl, 2,3-dimethylbutyl, 2,6-dimethylheptyl, 3,7-dimethyloctyl, 2-hexyldecyl, 2,2-dimethylbutyl, 2-methylheptyl, 2-methylhexadecyl, 2-butyloctyl, 2-methylnonyl, 2-propylpentyl, 2-methylundecyl, 2-hexyloctyl, 2-methyloctyl, 2-methyldecyl, 2-methyldodecyl and 2,5-dimethylhexyl groups and the like. Of these, a 2-ethylhexyl, 2,4-dimethylhexyl, 2,4,4-trimethylpentyl, 2,6-dimethylheptyl, 3,7-dimethyloctyl, 2-hexyldecyl, 2-methylheptyl, 2-butyloctyl, 2-methylnonyl, 2-propylpentyl, 2-methylundecyl, 2-hexyloctyl, 2-methyloctyl, 2-methyldecyl, 2-methyldodecyl or 2,5-dimethylhexyl group is preferred, and a 2-ethylhexyl, 3,7-dimethyloctyl, 2-hexyldecyl, 2-butyloctyl or 2-hexyloctyl group is more preferred.

Examples of branched secondary alkyl groups include isopropyl, 1-methylpropyl, 1-methylbutyl, 1-methylheptyl, 1-propylpentyl, 1-ethylhexyl, 1-ethylpropyl, 1-methylpentyl, 1-ethylpentyl, 1-butylpentyl, 1-methyloctyl, 1-ethylbutyl, 1-ethyl-2-methylpropyl, 1,5-dimethylhexyl, 1-butylheptyl, 1-methylundecyl, 1,2-dimethylpropyl, 1,3-dimethylbutyl, 1-ethyloctyl, 1-propylhexyl, 1,2-dimethylpentyl, 4-ethyl-1-methyloctyl, 1-ethylundecyl, 4-methyl-1-propylhexyl, 1-hexylheptyl, 1,3-dimethylpentyl, 1-ethyl-2-methylpentyl, 1,2-dimethylpentyl, 1-butylhexyl, 1-methyltridecyl, 1-methylpentadecyl, 1,3-dimethyldecyl, 1,3,5-trimethylhexyl, 3-ethyl-1,5-dimethylnonyl and 1-propylheptyl groups and the like. Of these, a 1-methylpropyl, 1-methylbutyl, 1-methylheptyl, 1-propylpentyl, 1-ethylhexyl, 1-methylpentyl, 1-ethylpentyl, 1-methyloctyl, 1-ethylbutyl, 1-ethyl-2-methylpropyl, 1,5-dimethylhexyl, 1-butylheptyl, 1,2-dimethylpropyl, 1,3-dimethylbutyl, 1-ethyloctyl, 1-propylhexyl, 1,2-dimethylpentyl, 4-ethyl-1-methyloctyl, 4-methyl-1-propylhexyl, 1,3-dimethylpentyl, 1-ethyl-2-methylpentyl, 1,2-dimethylpentyl, 1-butylhexyl, 1,3,5-trimethylhexyl, 3-ethyl-1,5-dimethylnonyl or 1-propylheptyl group is preferred, and a 1-propylpentyl, 1-ethylhexyl, 1-ethylpentyl, 1-ethylbutyl, 1-ethyl-2-methylpropyl, 1-butylheptyl, 1-ethyloctyl, 1-propylhexyl, 4-ethyl-1-methyloctyl, 4-methyl-1-propylhexyl, 1-ethyl-2-methylpentyl, 1-butylhexyl, 3-ethyl-1,5-dimethylnonyl or 1-propylheptyl group is especially preferred.

Examples of branched tertiary alkyl groups include t-butyl, 1-(1-methylethyl)-1-methylpentyl, 1-ethyl-1,3,3-trimethylbutyl, 1-ethyl-1,3-dimethylpentyl, 3-ethyl-1,1-dimethylpentyl, 2-ethyl-1,1-dimethylpentyl, 1,1,3,4-tetramethylpentyl, 1,1,3,3-tetramethylpentyl, 1,1,4-trimethylhexyl, 1,1,3-trimethylhexyl, 1,1,2-trimethylhexyl, 1,1-diethyl-2-methylpropyl, 1-ethyl-1,2-dimethylpropyl, 1,1-dipropylpentyl, 1,1-dimethyldodecyl, 1,1,5-trimethylhexyl, 1,1-dibutyldodecyl, 1-butyl-1-ethylhexyl, 1,1,4-trimethylpentyl, 1-(2-methylpropyl)-1-methylpentyl, 1,3-dimethyl-1-(2-methylpropyl)butyl, 3-methyl-1-(2-methylpropyl)butyl, 2,2-dimethyltetracosyl, 1-ethyl-1-propylpentyl, 1,3,3,5,5-pentamethylhexyl, 1-ethyl-1,2,2-trimethylpropyl, 1,1,2,3,3-pentamethylhexyl, 1,1-dimethylnonyl, 1-ethyl-1,4-dimethylpentyl, 1,1,2-trimethylpropyl, 1,1-dimethylheptyl, 1-ethyl-1-methylpentyl, 1,1-dimethyldecyl, 1,1-dimethyloctyl, 1,1-bis(1-methylethyl)-2-methylpropyl, 1-(1-methylethyl)-1,2-dimethylbutyl, 1,1-dimethyloctadecyl, 1-(2-methylpropyl)-1,3,3-trimethylbutyl, 1-ethyl-1,3-dimethylbutyl, 1,1-dimethylundecyl, 1,1-diethylpropyl, 1,1-dimethylpentyl, 1-propyl-1,2-dimethylbutyl, 2-methyl-1-(1-methylethyl)propyl, 1,1-dibutylpentyl, 1-butyl-1-propylpentyl, 1,1-dipropylbutyl, 1,1,3,3-tetramethylbutyl, 1,1-dimethylhexadecyl, 1,1-dibutyl-4-methylpentyl, 1,4-dimethyl-1-(2-methylpropyl)pentyl, 1-butyl-1,4-dimethylpentyl, 1-butyl-1-ethylpentyl, 1-butyl-1-methylpentyl, 1-ethyl-1-methylhexyl, 1-methyl-1-propylpentyl, 1-hexyl-1-methylnonyl, 1-ethyl-1-methylpropyl, 1-(2-ethylhexyl)-1-methyldodecyl, 1,1-bis(2-ethylhexyl)-3-ethylheptyl, 1,1-dioctylnonyl and 1,1,2,2-tetramethyl-propyl groups and the like. Of these, a t-butyl or 1,1-dimethylpropyl group is preferred, and a t-butyl group is more preferred.

Examples of cycloalkyl groups include cyclopropyl, cyclobutyl, cyclopentyl, cyclohexyl, cycloheptyl, cyclooctyl, cyclononyl, cyclodecyl and cyclolauryl groups and the like. Of these, cyclopentyl, cyclohexyl, cycloheptyl or cyclooctyl group is preferred.

The number of carbon atoms in the alkenyl group is normally at least 2, or preferably at least 3, or more preferably at least 4, and is normally 20 or less, or preferably 16 or less, or more preferably 12 or less, or still more preferably 10 or less. Examples of such alkenyl groups include ethenyl, propenyl, butenyl, pentenyl, hexenyl, heptenyl, octenyl, nonenyl, decenyl, undecenyl, dodecenyl, tridecenyl, tetradecenyl, pentadecenyl, hexadecenyl, heptadecenyl, octadecenyl, nonadecenyl and icosenyl groups and the like. A propenyl, butenyl, pentenyl, hexenyl, heptenyl, octenyl, nonenyl, decenyl, undecenyl or dodecenyl group is preferred, and a butenyl, pentenyl, hexenyl, heptenyl, octenyl, nonenyl or decenyl group is more preferred.

More specifically, the aforementioned alkenyl group may be a linear alkenyl group, branched alkenyl group or cycloalkenyl group.

Examples of linear alkenyl groups include ethenyl, 1-propenyl, 2-propenyl, 2-butenyl, 3-butenyl, 4-pentenyl, 5-hexenyl, 6-heptenyl, 7-octenyl, 8-nonenyl, 9-decenyl, 10-undecenyl, 11-dodecenyl, 12-tridecenyl, 13-tetradecenyl, 14-pentadecenyl, 15-hexadecenyl, 16-heptadecenyl, 17-octadecenyl, 18-nonadecenyl and 19-icosenyl groups and the like. A 2-propenyl, 3-butenyl, 4-pentenyl, 5-hexenyl, 6-heptenyl, 7-octenyl, 8-nonenyl, 9-decenyl, 10-undecenyl or 11-dodecenyl group is preferred, and a 3-butenyl, 4-pentenyl, 5-hexenyl, 6-heptenyl, 7-octenyl, 8-nonenyl or 9-decenyl group is more preferred.

Examples of branched alkenyl groups include 2-methyl-2-propenyl, 3-methyl-3-butenyl and 4-methyl-2-hexenyl groups.

Examples of cycloalkenyl groups include 2-cyclopropenyl, 2-cyclobutenyl, 2-cyclopentenyl, 3-cyclopentenyl, 2-cyclohexenyl, 2-cycloheptenyl and 2-cyclooctenyl groups.

The number of carbon atoms in the alkynyl group is normally at least 2, or preferably at least 3, or more preferably at least 4, and is normally 20 or less, or preferably 16 or less, or more preferably 12 or less, or still more preferably 10 or less. Examples of such alkynyl groups include ethynyl, propynyl, butynyl, pentynyl, hexynyl, heptynyl, octynyl, nonynyl, decynyl, undecynyl, dodecynyl, tridecynyl, tetradecynyl, pentadecynyl, hexadecynyl, heptadecynyl, octadecynyl, nonadecynyl and icosynyl groups and the like.

More specifically, the aforementioned alkynyl group may be a linear alkynyl group, branched alkynyl group or cycloalkynyl group.

Examples of linear alkynyl groups include ethynyl, 2-propynyl, 2-butynyl, 3-butynyl, 4-pentynyl, 5-hexynyl, 6-heptynyl, 7-octynyl, 8-nonynyl, 9-decynyl, 10-undecynyl, 11-dodecynyl, 12-tridecynyl, 13-tetradecynyl, 14-pentadecynyl, 15-hexadecynyl, 16-heptadecynyl, 17-octadecynyl, 18-nonadecynyl and 19-icosynyl groups.

Examples of branched alkynyl groups include 1-methyl-2-propenyl, 2-methyl-3-butenyl and 4-methyl-2-hexenyl groups and the like.

Examples of cycloalkynyl groups include 2-cyclooctynyl and 3-cyclooctynyl groups and the like.

The number of carbon atoms in the above-mentioned aromatic hydrocarbon group is normally at least 6, and normally 30 or less, or preferably 20 or less, or more preferably 14 or less. Examples of such aromatic hydrocarbon groups include phenyl, naphthyl, indanyl, indenyl, fluorenyl, anthracenyl and azulenyl groups and the like. Of these, a phenyl group or naphthyl group is preferred.

The above-mentioned heterocyclic group may be an aliphatic heterocyclic group or aromatic heterocyclic group. The number of carbon atoms in the aliphatic heterocyclic group is normally at least 2 and normally 20 or less, or preferably 14 or less, or more preferably 12 or less, or still more preferably 10 or less, or most preferably 6 or less. Examples of such aliphatic heterocyclic groups include oxetanyl, pyrrolidinyl, tetrahydrofuryl, tetrahydrothienyl, piperidinyl, tetrahydropyranyl and tetrahydrothiopyranyl groups and the like.

The number of carbon atoms in the above-mentioned aromatic heterocyclic group is normally at least 2 and normally 30 or less, or preferably 20 or less, or more preferably no 14 or less. Examples of such aromatic heterocyclic group include thienyl, furanyl, pyridyl, pyrimidyl, thiazolyl, oxazolyl, triazolyl, benzothiophenyl, benzofuranyl, benzothiazolyl, benzoxazolyl and benzotriazolyl groups and the like. Of these, a thienyl, pyridyl, pyrimidyl, thiazolyl or oxazolyl group is preferred.

The "optional" substituent of each group in the present Specification is not particularly limited unless the effects of the present invention are impaired, but preferred examples include halogen atoms and hydroxyl, carboxyl, carbamoyl, acyl, alkoxycarbonyl, aryloxycarbonyl, alkylsulfonyl arylsulfonyl, boryl, alkyl, alkenyl, alkynyl, alkoxy, aryloxy, alkylthio, arylthio, amino, substituted amino, amide, silyl, substituted silyl, aliphatic heterocyclic, aromatic hydrocarbon and aromatic heterocyclic groups and the like. When a substituent is present, it is preferably a halogen atom, hydroxyl group, acyl group, alkoxy group, alkoxycarbonyl group, amino group, amido group or alkylthio group from the standpoint of controlling the intramolecular polarity of the copolymer of the present invention.

$R^1$ is preferably an optionally substituted alkyl group, optionally substituted alkenyl group, optionally substituted aromatic hydrocarbon group or optionally substituted aromatic heterocyclic group, and an optionally substituted alkyl group is more preferred because it is more likely to provide good solubility of the copolymer in organic solvents, which is advantageous from the standpoint of the coated film-forming process.

When $R^1$ is an optionally substituted alkyl group, it preferably has at least 3 or more preferably at least 6 or still more preferably at least 8 carbon atoms from the standpoint of solubility. To optimize intermolecular interactions in the copolymer of the present invention, on the other hand, the number of carbon atoms is preferably 20 or less, or more preferably 16 or less, or still more preferably 10 or less. The alkyl group may be an alkyl group having a branched chain, but a linear alkyl group is preferred from the standpoint of the semiconductor properties. For purposes of controlling the intramolecular polarity of the copolymer of the present invention, preferred examples of the optional substituent of the alkyl group include halogen atoms and hydroxyl, acyl, alkoxy, alkoxycarbonyl, amino, amido and alkylthio groups.

In the present invention, each of $R^2$, $R^3$, $R^4$ and $R^5$ in the Formula (1B) and Formula (1C) is independently an optionally substituted group selected from the linear aliphatic hydrocarbon groups, branched aliphatic hydrocarbon groups, alicyclic hydrocarbon groups, aromatic hydrocarbon groups and heterocyclic groups.

In the case of a copolymer containing at least repeating units represented by the Formula (1A) and Formula (1B), $R^2$ and $R^3$ are different from each other. In the case of a copolymer containing the repeating units represented by the Formula (1A), Formula (1B), and Formula (1C), at least one of $R^2$, $R^3$, $R^4$, and $R^5$ is different from another group.

In the present invention, for $R^2$ and $R^3$ to be different from each other means that $R^2$ and $R^3$ are not identical in structure. For example, even if $R^2$ and $R^3$ are both linear aliphatic hydrocarbon groups, the aliphatic hydrocarbon groups are not considered identical in structure if the numbers of carbon atoms are different. In the case of branched aliphatic hydrocarbon groups, they are not considered identical in structure if the branching positions are different, even if the numbers of carbon atoms are the same. For at least one of $R^2$, $R^3$, $R^4$, and $R^5$ to be different from another group means that at least one group out of $R^2$, $R^3$, $R^4$ and $R^5$ is not identical in structure to one other group, but may be either identical or not identical in structure to the other groups apart from that one other group. "Not identical in structure" is defined as in the case of $R^2$ and $R^3$. Thus, in the present invention the storage stability of the ink can be improved because the sequences can be disordered among the copolymer units by using a copolymer having dithieno condensed rings with different substituents or two or more kinds of dithieno condensed rings.

Examples of linear aliphatic hydrocarbon groups include linear alkyl, linear alkenyl and linear alkynyl groups. Examples of these groups include the linear alkyl groups, linear alkenyl groups and linear alkynyl groups given as examples of $R^1$.

Examples of branched aliphatic hydrocarbon groups include branched alkyl, branched alkenyl and branched alkynyl groups. Examples of these groups include the branched alkyl groups, branched alkenyl groups and branched alkynyl groups given as examples of $R^1$.

Examples of alicyclic hydrocarbon groups include cycloalkyl, cycloalkenyl and cycloalkynyl groups. Examples of these groups include the cycloalkyl groups, cycloalkenyl groups and cycloalkynyl groups given as examples of $R^1$.

Examples of aromatic hydrocarbon groups include aromatic hydrocarbon groups given as examples of $R^1$.

Examples of heterocyclic groups include the heterocyclic groups given as examples of $R^1$.

The linear aliphatic hydrocarbon groups, branched aliphatic hydrocarbon groups, alicyclic hydrocarbon groups, aromatic hydrocarbon groups, and heterocyclic groups above may either have substituents or have no substituents. When a substituent is present, examples of desirable substituents include halogen atoms and hydroxyl, carboxyl, carbamoyl, acyl, alkoxycarbonyl, aryloxycarbonyl, alkylsulfonyl, arylsulfonyl, boryl, alkyl, alkenyl, alkynyl, alkoxy, aryloxy, alkylthio, arylthio, amino, substituted amino, amido, silyl and substituted silyl groups, and aliphatic heterocyclic groups, aromatic hydrocarbon groups, aromatic heterocyclic groups and the like. Halogen atoms and hydroxyl, acyl, alkoxy, alkoxycarbonyl, amino, amido and alkylthio groups are especially preferred for controlling the intramolecular polarity of the copolymer of the present invention. In the present invention, a linear aliphatic hydrocarbon group is considered a branched aliphatic hydrocarbon group if a substituent other than a halogen atom is introduced at a position other than a terminus of the aliphatic hydrocarbon group.

Preferred combinations of $R^2$ and $R^3$ in a copolymer containing the repeating units represented by the Formula (1A) and Formula (1B) are explained next.

As discussed above, in the case of a copolymer containing the repeating units represented by the Formula (1A) and Formula (1B), each of $R^2$ and $R^3$ in the Formula (1B) is independently an optionally substituted group selected from the linear aliphatic hydrocarbon groups, branched aliphatic hydrocarbon groups, alicyclic hydrocarbon groups, aromatic hydrocarbon groups and heterocyclic groups. Also, $R^2$ and $R^3$ are different from each other.

The numbers of carbon atoms in $R^2$ and $R^3$ are each independently normally at least 3, or preferably at least 6, or more preferably at least 8, and are normally 20 or less, or preferably 16 or less, or more preferably 12 or less, or especially 10 or less.

When $R^2$ and $R^3$ are both optionally substituted groups selected from the linear aliphatic hydrocarbon groups, branched aliphatic hydrocarbon groups, alicyclic hydrocarbon groups, aromatic hydrocarbon groups and heterocyclic groups, the difference between the number of carbon atoms in $R^2$ and $R^3$ is preferably 2 or more, or more preferably 3 or more, or especially 4 or more for purposes of increasing the sequence disorder among copolymer units. Also, the difference is preferably 20 or less, or more preferably 18 or less, or especially 16 or less because the semiconductor properties are reduced if the difference in the number of carbon atoms is too great.

However, $R^2$ and $R^3$ are preferably optionally substituted groups of different kinds selected from the aforementioned linear aliphatic hydrocarbon groups, branched aliphatic hydrocarbon groups, alicyclic hydrocarbon groups, aromatic hydrocarbon groups and heterocyclic groups. That is, if $R^2$ is an optionally substituted linear aliphatic hydrocarbon group, $R^3$ is preferably an optionally substituted group selected from the branched aliphatic hydrocarbon groups, alicyclic hydrocarbon groups, aromatic hydrocarbon groups and heterocyclic groups. The same applies to other combinations.

Of these, preferably $R^2$ is an optionally substituted branched aliphatic hydrocarbon group, while $R^3$ is an optionally substituted group selected from the linear aliphatic hydrocarbon groups, alicyclic hydrocarbon groups, aromatic hydrocarbon groups and heterocyclic groups. With such a combination of $R^2$ and $R^3$, the solubility conferred by the branched aliphatic hydrocarbon group ($R^2$) can be improved, intermolecular interactions can be improved because steric hindrance is controlled by the linear aliphatic hydrocarbon group, alicyclic hydrocarbon group, aromatic hydrocarbon group or heterocyclic group ($R^3$), and light at longer wavelengths can be absorbed in the copolymer of the present invention. High solution stability can also be obtained due to the sequence disorder among copolymer units.

When $R^2$ is an optionally substituted branched aliphatic hydrocarbon group in the Formula (1B), the number of carbon atoms in $R^2$ is preferably 3 or more, or more preferably 6 or more, or still more preferably 8 or more, and the number of carbon atoms in $R^2$ is preferably 20 or less, or more preferably 16 or less, or still more preferably 12 or less, or especially 10 or less. Moreover, when $R^2$ is a branched aliphatic hydrocarbon group in the Formula (1B), $R^2$ is preferably an optionally substituted branched alkyl group. Examples of branched alkyl groups include the branched alkyl groups given as examples of $R^1$, and a branched primary alkyl group is especially preferred. A branched alkyl group is preferred for $R^2$ from the standpoint of further improving the solubility of the copolymer of the present invention in organic solvents. From this standpoint, the number of carbon atoms in $R^2$ is preferably 3 or more, or more preferably 8 or more, and the number of carbon atoms in $R^2$ is preferably 20 or less, or more preferably 16 or less. Desirable examples of the optional substituent of $R^2$ include substituents containing atoms such as halogen atoms selected from the group that includes hydrogen atoms and heteroatoms. An unsubstituted branched alkyl group is also desirable as $R^2$. A 2-ethylhexyl, 3,7-dimethylhexyl, 2-ethylheptyl, 2-ethyloctyl, 2-ethylnonyl or 2-ethyldecanyl group or the like is more preferred for $R^2$, and a 2-ethylhexyl or 3,7-dimethylhexyl group is especially preferred.

When $R^3$ in Formula (1B) is an optionally substituted group selected from the linear aliphatic hydrocarbon groups, alicyclic hydrocarbon groups, aromatic hydrocarbon groups and heterocyclic groups, $R^3$ is preferably an optionally substituted linear alkyl group, optionally substituted cycloalkyl group, optionally substituted aromatic hydrocarbon group, optionally substituted aliphatic heterocyclic group or optionally substituted aromatic heterocyclic group. The group represented by $R^3$ has preferably at least 3 or more preferably at least 6 carbon atoms. Also, the number of carbon atoms in $R^3$ is preferably 20 or less, or more preferably 16 or less, or especially 10 or less. Examples of linear alkyl groups, cycloalkyl groups, aromatic hydrocarbon groups, aliphatic heterocyclic groups and aromatic heterocyclic groups include the linear alkyl groups, cycloalkyl groups, aromatic hydrocarbon groups, aliphatic heterocyclic groups and aromatic heterocyclic groups given as examples of $R^1$.

Preferably $R^2$ is a branched aliphatic hydrocarbon group and $R^3$ is a group selected from the linear aliphatic hydrocarbon groups, aromatic hydrocarbon groups and heterocyclic groups, and is optionally substituted. Of these, $R^3$ is preferably an optionally substituted group selected from the linear alkyl groups, aromatic hydrocarbon groups and aromatic heterocyclic groups. A fluorine atom or other halogen atom is particularly desirable as the optional substituent.

Of those described above, it is especially desirable that $R^2$ be an optionally substituted branched aliphatic hydrocarbon group, while $R^3$ is an optionally substituted linear aliphatic hydrocarbon group. Specifically, it is especially desirable that $R^2$ be an optionally substituted branched alkyl group, while $R^3$ is an optionally substituted linear alkyl group. Light absorption at longer wavelengths can be achieved by having $R^3$ be an optionally substituted linear aliphatic hydrocarbon group.

Preferred linear alkyl groups include n-hexyl, n-heptyl, n-octyl, n-nonyl, n-decyl, n-undecyl and n-dodecyl groups and the like, and n-octyl, n-nonyl and n-decyl groups are especially desirable. The most preferable cycloalkyl group may be a cyclohexyl group or the like. The most preferable aromatic hydrocarbon group may be a phenyl or naphthyl group or the like. The most preferable aliphatic heterocyclic groups include tetrahydrothienyl groups and the like. The most preferable aromatic heterocyclic groups include thienyl groups and the like. A 2-ethylhexyl group or other branched alkyl group or an n-octyl group or other linear alkyl group is preferred as the optional substituent of a cycloalkyl group, aromatic hydrocarbon group, aliphatic heterocyclic group or aromatic heterocyclic group.

Preferred combinations of $R^2$, $R^3$, $R^4$ and $R^5$ in a copolymer containing the repeating units represented by the Formula (1A), Formula (1B) and Formula (1C) are explained next.

As described above, each of $R^2$, $R^3$, $R^4$ and $R^5$ in the Formula (1B) and Formula (1C) is independently selected from the linear aliphatic hydrocarbon groups, branched aliphatic hydrocarbon groups, alicyclic hydrocarbon groups, aromatic hydrocarbon groups and heterocyclic groups, and is optionally substituted. At least one group out of $R^2$, $R^3$, $R^4$ and $R^5$ is different from another group. Specifically, $R^2$ and $R^4$ are different from each other for example.

Examples of linear aliphatic hydrocarbon groups include linear alkyl, linear alkenyl and linear alkynyl groups. Examples of these groups include the linear alkyl groups, linear alkenyl groups and linear alkynyl groups given as examples of $R^1$. Examples of branched aliphatic hydrocarbon groups include branched alkyl, branched alkenyl and branched alkynyl groups. Examples of these groups include the branched alkyl groups, branched alkenyl groups and branched alkynyl groups given as examples of $R^1$. Examples of alicyclic hydrocarbon groups include cycloalkyl, cycloalkenyl and cycloalkynyl groups. Examples of these groups include the cycloalkyl groups, cycloalkenyl groups and cycloalkynyl groups given as examples of $R^1$. Examples of aromatic hydrocarbon groups include the aromatic hydrocarbon groups exemplified with respect to $R^1$. The heterocyclic group may be aliphatic heterocyclic groups or aromatic heterocyclic groups. Examples of these groups include the aliphatic heterocyclic groups or aromatic heterocyclic groups exemplified with respect to $R^1$.

When $R^2$, $R^3$, $R^4$ and $R^5$ are all optionally substituted groups selected from the linear aliphatic hydrocarbon groups, branched aliphatic hydrocarbon groups, alicyclic hydrocarbon groups, aromatic hydrocarbon groups and heterocyclic groups (for example, when $R^2$, $R^3$, $R^4$ and $R^5$ are all linear aliphatic hydrocarbon groups, or when $R^2$, $R^3$, $R^4$ and $R^5$ are all branched aliphatic hydrocarbon groups), the difference in the numbers of carbon atoms between at least one group and one other group out of $R^2$, $R^3$, $R^4$ and $R^5$ is preferably at least 2, or more preferably at least 3, or especially at least 4 so as to increase the sequence disorder among copolymer units. The difference is also preferably 20 or less, or more preferably 18 or less, or especially 16 or less because the semiconductor properties are reduced if the difference in numbers of carbon atoms is too great.

However, preferably at least one group out of $R^2$, $R^3$, $R^4$ and $R^5$ is an optionally substituted group selected from the aforementioned linear aliphatic hydrocarbon groups, branched aliphatic hydrocarbon groups, alicyclic hydrocarbon groups, aromatic hydrocarbon groups and heterocyclic groups, while another group is a group of a different kind. That is, when at least one group is an optionally substituted linear aliphatic hydrocarbon group, preferably at least one of the other groups is an optionally substituted group selected from the branched aliphatic hydrocarbon groups, alicyclic hydrocarbon groups, aromatic hydrocarbon groups and heterocyclic groups. The same applies to other combinations.

Of these, preferably $R^2$ is an optionally substituted branched aliphatic hydrocarbon group, while $R^4$ is an optionally substituted group selected from the linear aliphatic hydrocarbon groups, alicyclic hydrocarbon groups, aromatic hydrocarbon groups and heterocyclic groups.

With such a combination of $R^2$ and $R^4$, the solubility conferred by the branched aliphatic hydrocarbon group ($R^2$) can be improved, intermolecular interactions can be improved because steric hindrance is controlled by the linear aliphatic hydrocarbon group, alicyclic hydrocarbon group, aromatic hydrocarbon group or heterocyclic group ($R^4$), charge transport efficiency is improved, and light at longer wavelengths can be absorbed in the copolymer of the present invention. High solution stability can also be obtained due to the sequence disorder among copolymer units.

When $R^2$ is an optionally substituted branched aliphatic hydrocarbon group, $R^2$ is preferably an optionally substituted branched alkyl group. Examples of branched alkyl groups include the branched alkyl groups given as examples of $R^1$, and a branched primary alkyl group is especially preferable. An optionally substituted branched aliphatic hydrocarbon group such as optionally substituted branched alkyl group is preferred for $R^2$ from the standpoint of further improving the solubility of the copolymer of the present invention in organic solvents. From this standpoint, the number of carbon atoms in $R^2$ is preferably 3 or more, or more preferably 6 or more, or especially 8 or more, and the number of carbon atoms in $R^2$ is preferably 20 or less, or more preferably 16 or less, or still more preferably 12 or less, or especially 10 or less. The most preferable optional substituent may be halogen atoms such as a fluorine atom.

A 2-ethylhexyl, 3,7-dimethyloctyl, 2-hexyldecyl, 2-butyloctyl or 2-hexyloctyl group or the like is preferred for $R^2$, and a 2-ethylhexyl group or 3,7-dimethyloctyl group is especially preferred.

When $R^4$ is an optionally substituted group selected from the linear aliphatic hydrocarbon groups, aromatic hydrocarbon groups, alicyclic hydrocarbon groups and heterocyclic groups, $R^4$ is preferably an optionally substituted linear alkyl group, optionally substituted cycloalkyl group, optionally substituted aromatic hydrocarbon group or optionally substituted aromatic heterocyclic group, and is more preferably an optionally substituted linear alkyl group, optionally substituted aromatic hydrocarbon group or optionally substituted aromatic heterocyclic group.

Examples of linear alkyl groups, cycloalkyl groups, aromatic hydrocarbon groups and aromatic heterocyclic groups include the linear alkyl groups, cycloalkyl groups, aromatic hydrocarbon groups and aromatic heterocyclic groups given as examples of $R^1$. Steric hindrance around the repeating unit represented by Formula (1C) can be controlled and intermolecular interactions can be improved to a suitable degree by having $R^4$ be a linear alkyl group, aromatic hydrocarbon group or aromatic heterocyclic group. This is desirable from the standpoint of increasing the light absorption wavelengths of the copolymer of the present invention, and for improving the semiconductor properties of the copolymer of the present invention. From this perspective, the number of carbon atoms in $R^4$ is preferably at least 3, or more preferably at least 6, or especially at least 8. From the standpoint of further reducing steric hindrance, $R^4$ is more preferably an optionally substituted linear aliphatic hydrocarbon group, or still more preferably an optionally substituted linear alkyl group. The number of carbon atoms in $R^4$ is preferably 20 or less, or more preferably 16 or less, or still more preferably 12 or less, or especially 10 or less. The most preferable optional substituent may be halogen atoms such as a fluorine atom.

The most preferable examples of $R^4$ include n-hexyl, n-heptyl, n-octyl, n-nonyl, n-decyl, n-undecyl and n-dodecyl groups and the like, and n-octyl, n-nonyl and n-decyl groups are especially preferable.

Each of $R^3$ and $R^5$ is independently an optionally substituted group selected from the branched aliphatic hydrocarbon groups, linear aliphatic hydrocarbon groups, alicyclic hydrocarbon groups, aromatic hydrocarbon groups and heterocyclic groups. Of these, optionally substituted branched alkyl groups, optionally substituted linear alkyl groups, optionally substituted cycloalkyl groups, optionally substituted aromatic hydrocarbon groups, optionally substituted aliphatic heterocyclic groups or optionally substituted aromatic heterocyclic groups are preferred. Examples of branched alkyl groups, linear alkyl groups, cycloalkyl groups, aromatic hydrocarbon groups, aliphatic heterocyclic groups and aromatic heterocyclic groups include the branched alkyl groups, linear alkyl groups, cycloalkyl groups, aromatic hydrocarbon groups, aliphatic heterocyclic groups and aromatic heterocyclic groups given as examples of $R^1$. Examples of preferable optional substituents include halogen atoms such as a fluorine atom.

The numbers of carbon atoms in $R^3$ and $R^5$ are independently normally at least 3, or preferably at least 6, or more preferably at least 8, and are normally 20 or less, or preferably 16 or less, or more preferably 12 or less, or especially 10 or less.

Optionally substituted groups selected from the branched aliphatic hydrocarbon groups, linear aliphatic hydrocarbon groups, aromatic hydrocarbon groups and aromatic heterocyclic groups are more preferred for $R^3$ and $R^5$. $R^3$ and $R^5$ are more preferably selected from an optionally substituted branched alkyl group, an optionally substituted linear alkyl group, an optionally substituted aromatic hydrocarbon group, and an optionally substituted aromatic heterocyclic group. The most preferable examples of branched alkyl groups include 2-ethylhexyl, 2-butyloctyl and 2-hexyloctyl groups and the like. The most preferable examples of linear alkyl groups include n-octyl, n-nonyl, n-decyl, n-undecyl and n-dodecyl groups and the like. The most preferable examples of aromatic hydrocarbon and aromatic heterocyclic groups include phenyl, thienyl and naphthyl groups and the like. Aromatic hydrocarbon groups and aromatic heterocyclic groups preferably have optionally substituted branched alkyl groups such as 2-ethylhexyl groups or optionally substituted linear alkyl groups such as n-octyl groups as additional substituents.

More preferable combinations of $R^3$ and $R^5$ are explained here. When $R^3$ is an optionally substituted branched aliphatic hydrocarbon group, $R^5$ is preferably an optionally substituted group selected from the branched aliphatic hydrocarbon groups, linear aliphatic hydrocarbon groups, alicyclic hydrocarbon groups and heterocyclic groups. In particular, when $R^3$ is an optionally substituted branched alkyl group, $R^5$ is preferably a branched alkyl group, linear alkyl group, aromatic hydrocarbon group or aromatic heterocyclic group in order to suitably increase the degree of intermolecular interaction. These groups may also have halogen or other substituents. $R^5$ is further preferably an optionally substituted linear aliphatic hydrocarbon group, optionally substituted aromatic hydrocarbon group or optionally substituted heterocyclic group, and, for example, a linear alkyl, aromatic hydrocarbon or aromatic heterocyclic group is preferable. Of these, an optionally substituted linear aliphatic hydrocarbon group, or more specifically, a linear alkyl group is especially preferable.

When $R^3$ is an optionally substituted linear aliphatic hydrocarbon group, $R^5$ is preferably an optionally substituted group selected from the branched aliphatic hydrocarbon groups, alicyclic hydrocarbon groups and heterocyclic groups. More specifically, when $R^3$ is a linear alkyl group, $R^5$ is preferably a branched alkyl group, cycloalkyl group, aliphatic heterocyclic group or aromatic heterocyclic group from the standpoint of improving the solubility of the copolymer of the present invention and further controlling gelling. These groups may also have halogen or other substituents. For purposes of suitably increasing the intermolecular interactions of the copolymer of the present invention, a branched alkyl group is more preferred, and a branched primary alkyl group is especially preferred.

When $R^3$ is an optionally substituted alicyclic hydrocarbon group, $R^5$ is preferably an optionally substituted linear aliphatic hydrocarbon group. More specifically, when $R^3$ is a cycloalkyl group, $R^5$ is preferably a linear alkyl group in order to increase intermolecular interactions to a suitable degree. These groups may also have halogen or other substituents.

When $R^3$ is an optionally substituted aromatic hydrocarbon group, $R^5$ is preferably an optionally substituted group selected from the branched aliphatic hydrocarbon groups, linear aliphatic hydrocarbon groups, aromatic hydrocarbon groups and heterocyclic groups. More specifically, when $R^3$ is an aromatic hydrocarbon group, $R^5$ is preferably a branched alkyl group, linear alkyl group, aromatic hydrocarbon group or aromatic heterocyclic group is preferred from the standpoint of suitably increasing the intermolecular interactions of the copolymer of the present invention. These groups may also have halogen or other substituents.

When $R^3$ is an optionally substituted aliphatic heterocyclic group, $R^5$ is preferably an optionally substituted linear aliphatic hydrocarbon group. Specifically, a linear alkyl group is preferred from the standpoint of suitably increasing the intermolecular interactions of the copolymer of the present invention. This alkyl group may also have a halogen or other substituent.

When $R^3$ is an optionally substituted aromatic heterocyclic group, $R^5$ is preferably an optionally substituted group selected from the branched aliphatic hydrocarbon groups, linear aliphatic hydrocarbon groups, aromatic hydrocarbon groups and heterocyclic groups. More specifically, a branched alkyl group, linear alkyl group, aromatic hydrocarbon group or aromatic heterocyclic group is preferred from the standpoint of suitably increasing the intermolecular interactions of the copolymer of the present invention. These groups may also have halogens or other substituents.

Of those mentioned above, $R^3$ and $R^5$ are preferably optionally substituted groups selected from the branched aliphatic hydrocarbon groups and linear aliphatic hydrocarbon groups, respectively. Specifically, they are preferably optionally substituted groups selected from the branched alkyl groups and the linear alkyl groups.

Of the aforementioned combinations of $R^2$, $R^3$, $R^4$, and $R^5$, the most preferably are those in which $R^2$ is an optionally substituted branched aliphatic hydrocarbon group, $R^4$ is an optionally substituted linear aliphatic hydrocarbon group, and $R^3$ and $R^5$ are optionally substituted groups selected from the linear aliphatic hydrocarbon groups and branched aliphatic hydrocarbon groups.

At least one of the combination of $R^2$ and $R^5$ and the combination of $R^3$ and $R^4$ is preferably a combination of groups that are different from each other. When $R^2$ and $R^5$ represent groups that are different from each other, since $R^2$ and $R^4$ are different groups as discussed above, $R^2$ is different from both $R^4$ and $R^5$. That is, the combination of the two groups represented by $R^2$ and $R^3$ is different from the combination of the two groups represented by $R^4$ and $R^5$. When $R^3$ and $R^4$ represent groups that are different from each other, on the other hand, since $R^2$ and $R^4$ are different groups as discussed above, $R^4$ is different from both $R^2$ and $R^3$. That is, the combination of the two groups represented by $R^2$ and $R^3$ is different from the combination of the two groups represented by $R^4$ and $R^5$. Thus, the combination of the two groups represented by $R^2$ and $R^3$ is different from the combination of the two groups represented by $R^4$ and $R^5$ in Formulae (1B) and (1C).

As mentioned above, at least one of the combination of $R^2$ and $R^5$ and the combination of $R^3$ and $R^4$ is preferably a combination of groups that are different from each other. If the repeating unit represented by the Formula (1B) and the repeating unit represented by the Formula (1C) have substituents that are different from each other, this creates sequence disorder in the copolymer of the present invention, making it possible to further control loss of solubility due to pi-pi stacking and other intermolecular interactions. It is also possible to control precipitation during the polymerization reaction and obtain a high-molecular-weight polymer. Moreover, because sequence disorder is greater in the copolymer, it is possible to control gelling of a solution of the copolymer of the present invention. Furthermore, sequence disorder of the copolymer lowers the crystallinity of the copolymer of the present invention to a suitable degree, and may have the effect of flattening a thin film containing the copolymer of the present invention or reducing defects in the film. Such a film containing the copolymer is suited to use as a component of an organic electronic device. When the copolymer of the present invention is used in a photovoltaics, moreover, heat resistance and light resistance are increased, resulting in a long-life photovoltaics element.

The copolymer of the present invention containing the repeating units represented by the Formula (1A) and Formula (1B) may also contain two or more kinds each of one or more of the repeating unit represented by the Formula (1A) and the repeating unit represented by the Formula (1B).

The copolymer of the present invention containing the repeating units represented by the Formula (1A) and Formula (1B) may also contain a repeating unit other than the repeating units represented by Formulae (1A) and (1B) as long as this does not detract from the effects of the present invention. The total of the repeating units represented by the Formula (1A) and the repeating units represented by the Formula (1B) as a percentage of the repeating units making up the copolymer of the present invention is not particularly limited, but is normally at least 2 mol %, or preferably at least 10 mol %, or more preferably at least 25 mol %, or still more preferably at least 50 mol %, or yet more preferably at least 70 mol %, or most preferably at least 90 mol %. It is especially desirable that the copolymer of the present invention either contain the repeating unit represented by Formula (1A) and the repeating unit represented by Formula (1B) and be formed solely of these repeating units, or contain these repeating units and contain polymer chains formed solely of these repeating units.

The ratio of the repeating units represented by the Formula (1A) as a percentage of the repeating units making up a copolymer containing the repeating units represented by the Formula (1A) and Formula (1B) in the present invention is not particularly limited, but is normally at least 1 mol %, or preferably at least 2 mol %, or more preferably at least 10 mol %, or still more preferably at least 30 mol %. Also, it is normally 99 mol % or less, or preferably 90 mol % or less, or more preferably 70 mol % or less.

The ratio of the repeating units represented by the Formula (1B) as a percentage of the repeating units making up a copolymer containing the repeating units represented by the Formula (1A) and Formula (1B) in the present invention is not particularly limited, but is normally at least 1 mol %, or preferably at least 10 mol %, or more preferably at least 30 mol %. Also, it is normally 99 mol % or less, or preferably 90 mol % or less, or more preferably 70 mol % or less.

The ratio (1B/1A) of the number of the repeating units represented by the Formula (1B) to the number of the repeating units represented by the Formula (1A) in the copolymer of the present invention containing the repeating units represented by the Formula (1A) and Formula (1B) is not particularly limited, but is normally at least 0.01, or preferably at least 0.1, or more preferably at least 0.5. Also, it is normally 100 or less, or preferably 10 or less, or more preferably 2 or less.

The sequence arrangement of the repeating units represented by the Formula (1A) and Formula (1B) in the copolymer of the present invention containing the repeating units represented by the Formula (1A) and Formula (1B) may be either alternating, block or random. That is, the copolymer of the present invention containing the repeating units represented by the Formula (1A) and Formula (1B) may be an alternating copolymer, a block copolymer or a random copolymer. It may also be a copolymer having a structure intermediate between these structures, such as a random copolymer with block properties. Dendrimers and copolymers having branches off the main strand and three or more termini are also included.

In particular, the copolymer of the present invention containing the repeating units represented by the Formula (1A) and Formula (1B) preferably has a repeating unit represented by a Formula (2A) below. A copolymer having a repeating unit represented by the Formula (2A) below is desirable for maintaining charge separation more easily.

[Chemical Formula 8]

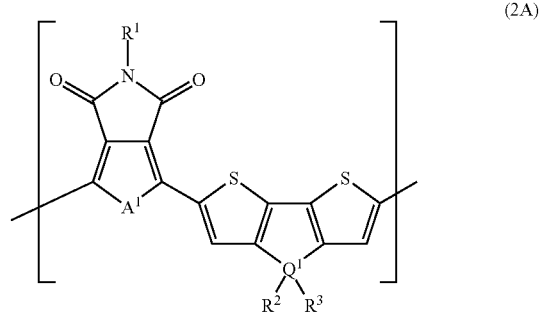

(2A)

In formula (2A), $A^1$ represents an atom selected from group 16 elements of the periodic table. $A^1$ is similar to A in Formula (1A). $Q^1$ represents an atom selected from group 14 elements of the periodic table. $Q^1$ is similar to $Q^1$ in Formula (1B). $R^1$ to $R^3$ are similar to $R^1$ to $R^3$ in Formulae (1A) and (1B).

The copolymer of the present invention containing the repeating units represented by the Formula (1A) and Formula (1B) may also contain two or more kinds of the repeating unit represented by the Formula (2A). Moreover, the copolymer of the present invention containing the repeating units represented by the Formula (1A) and Formula (1B) may also contain a repeating unit other than the repeating unit represented by the Formula (2A) as long as this does not detract from the effects of the present invention. The ratio of the repeating units represented by the Formula (2A) as a percentage of the repeating units making up the copolymer of the present invention containing the repeating units represented by the Formula (1A) and Formula (1B) is not particularly limited, but is normally at least 2 mol %, or preferably at least 10 mol %, or more preferably at least 25 mol %, or still more preferably at least 50 mol %, or yet more preferably at least 70 mol %, or most preferably at least 90 mol %. It is especially desirable that the copolymer of the present invention containing the repeating units represented by the Formula (1A) and Formula (1B) be formed solely of repeating units represented by the Formula (2A), or contain polymer chains formed solely of these repeating units.

Preferred specific examples of the repeating units represented by the Formula (1A) and Formula (1B) in the copolymer of the present invention containing the repeating units represented by the Formula (1A) and Formula (1B) are given below. However, the repeating units represented by the Formula (1A) and Formula (1B) in the copolymer of the present invention containing the repeating units represented by the Formula (1A) and Formula (1B) are not limited to the following examples.

[Chemical Formula 9]
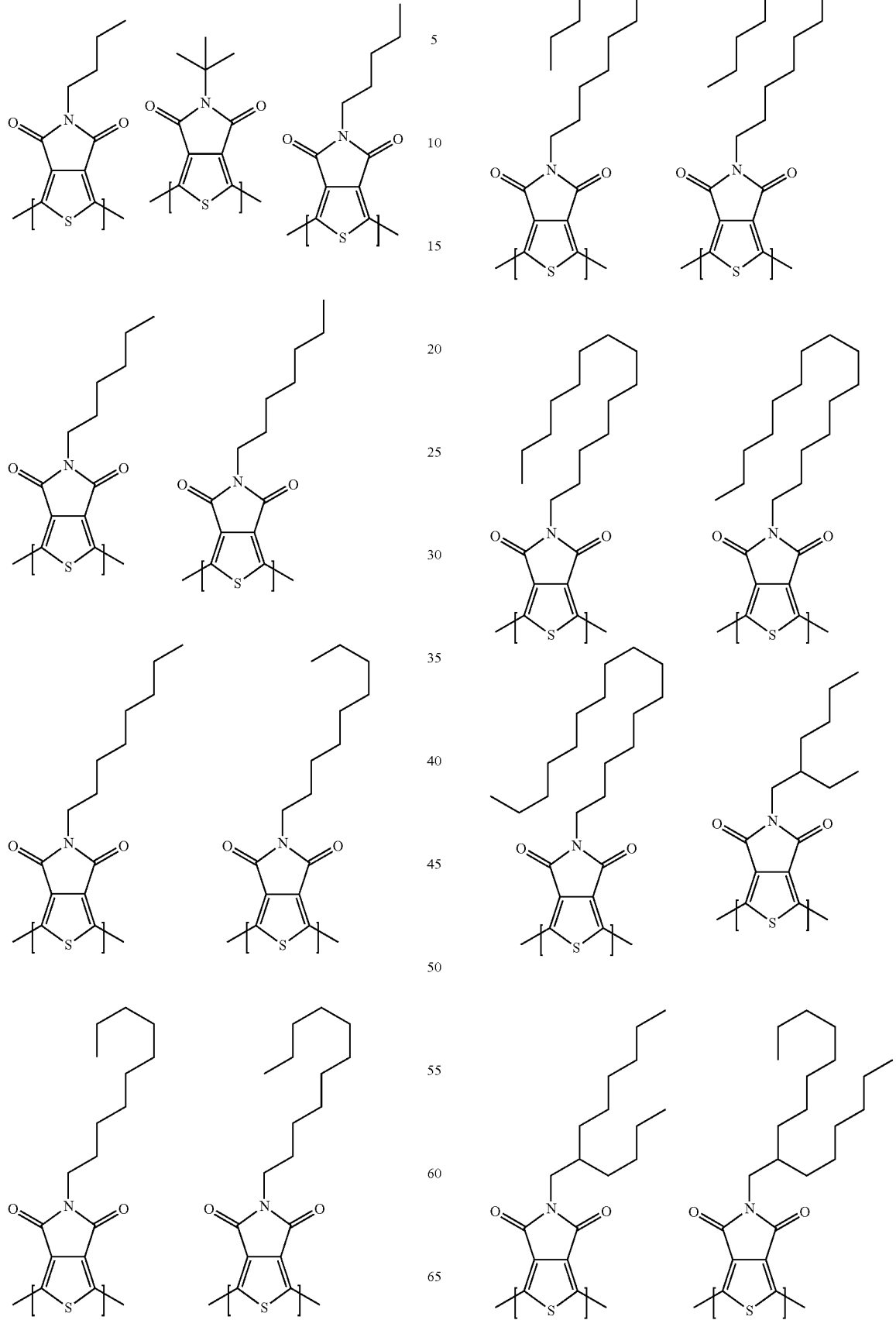

-continued
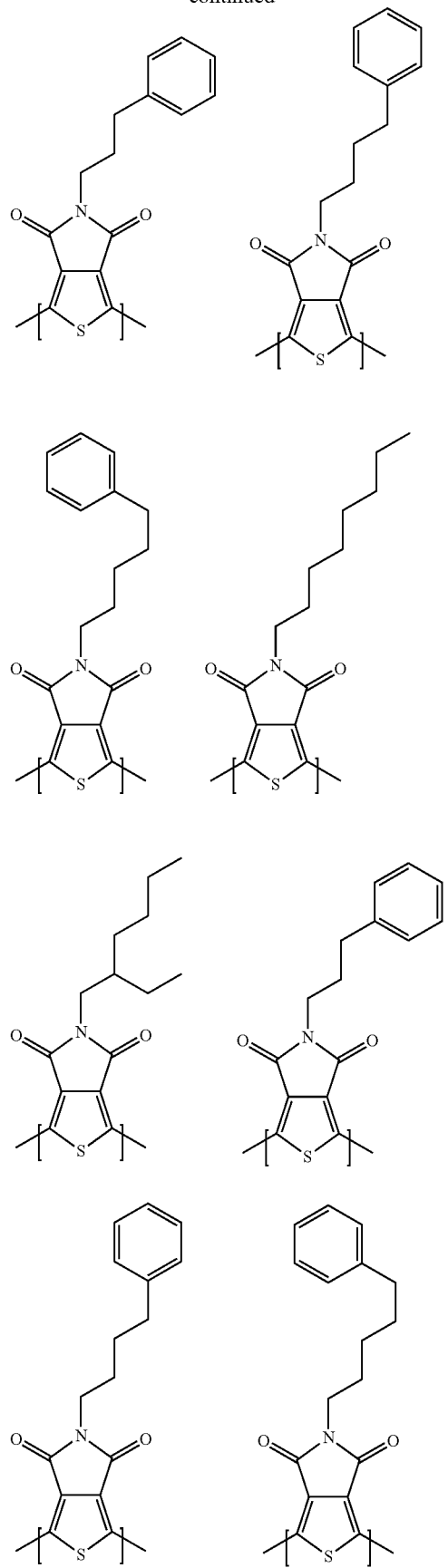
-continued
[Chemical Formula 10]
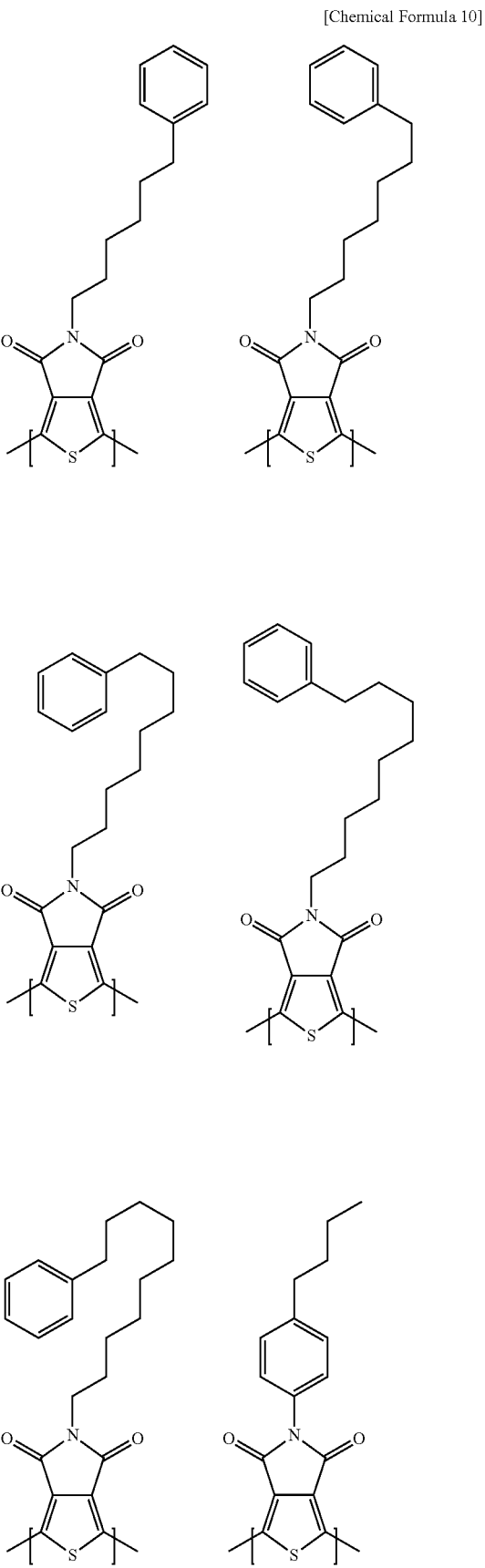

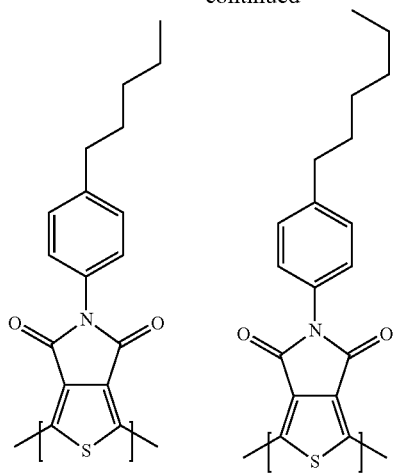
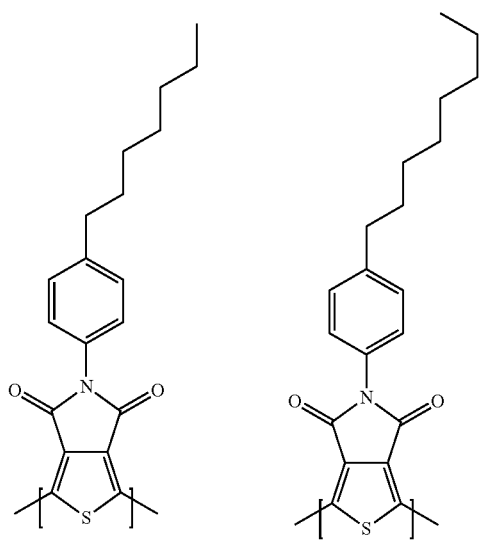
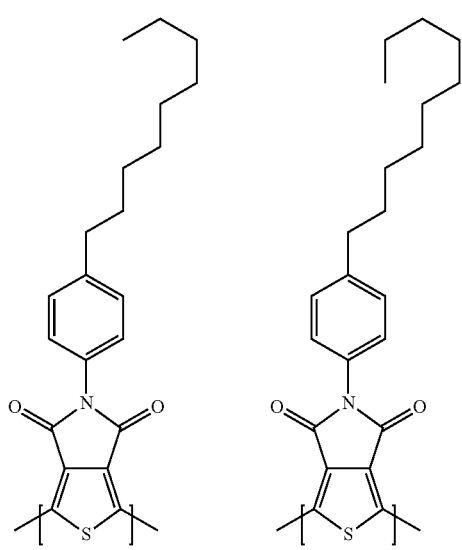
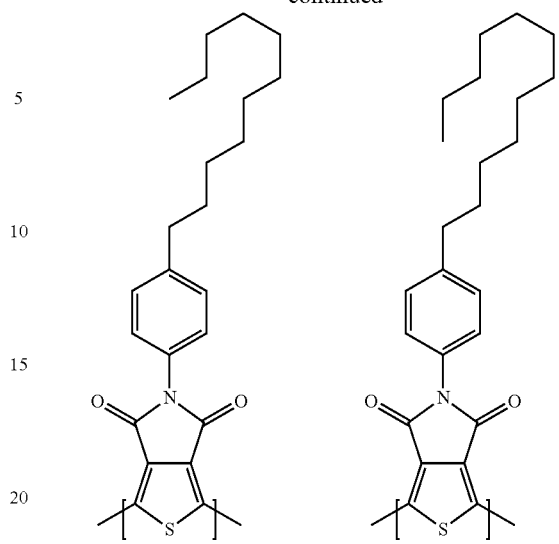
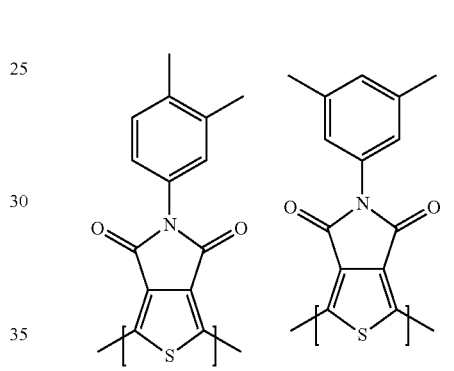
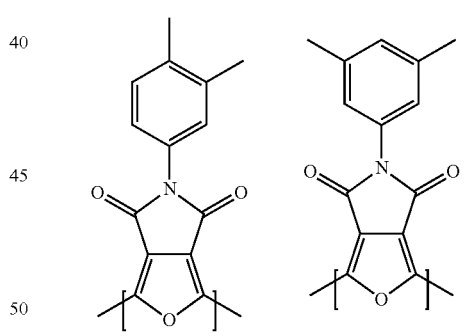
[Chemical Formula 11]

-continued
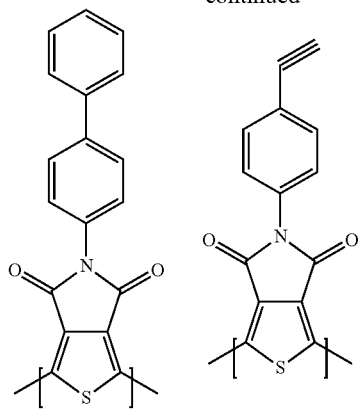
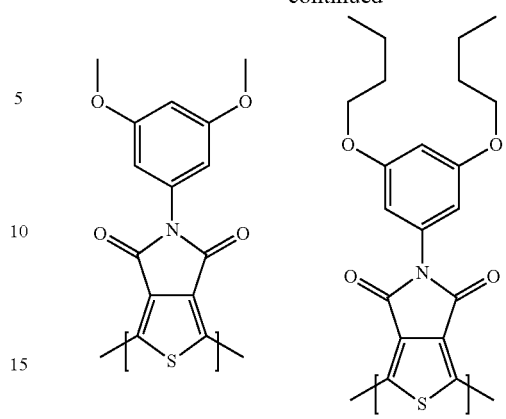
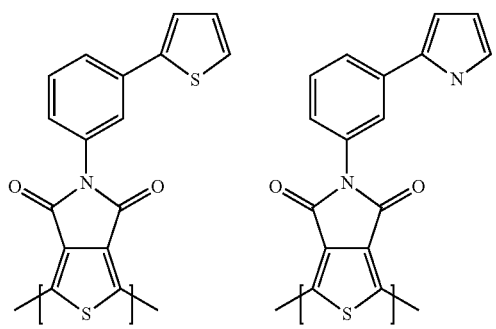
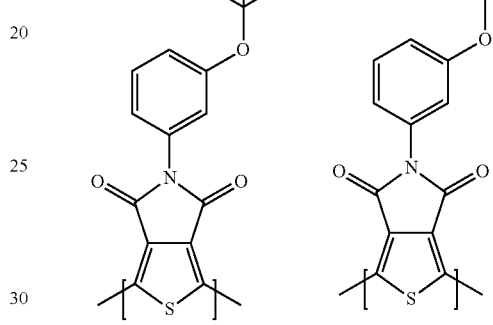
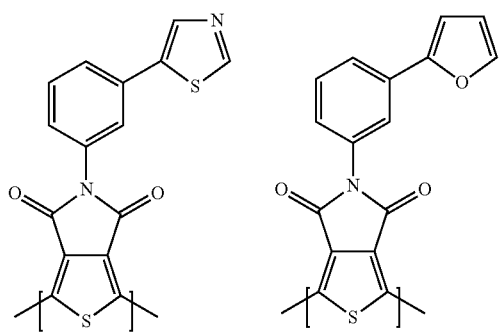
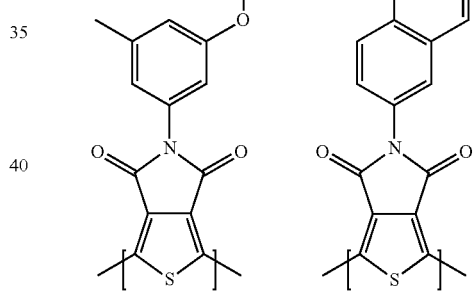
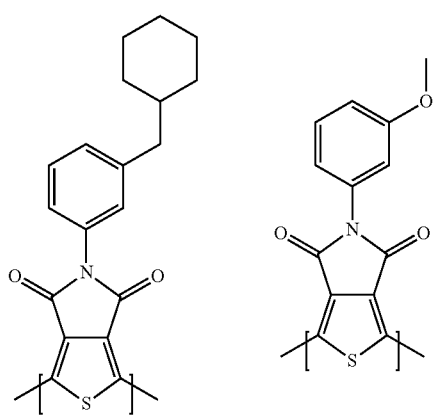
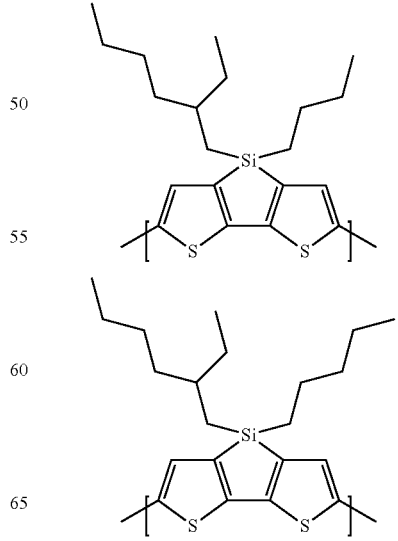
[Chemical Formula 12]

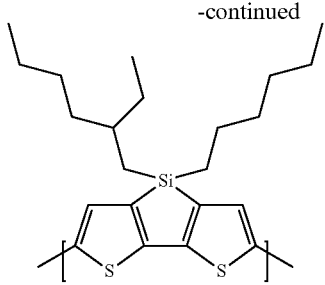
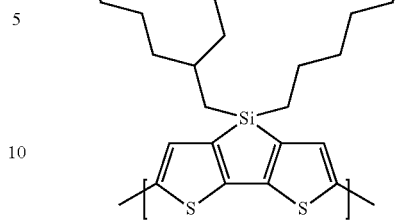
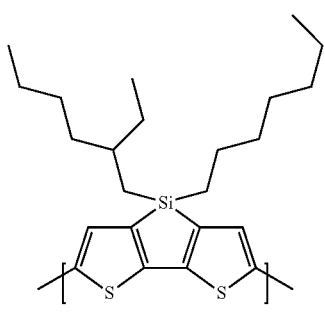
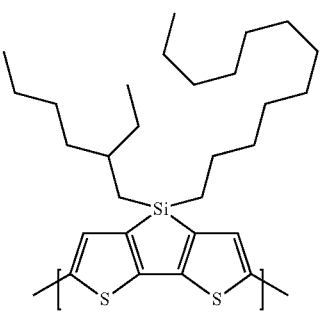
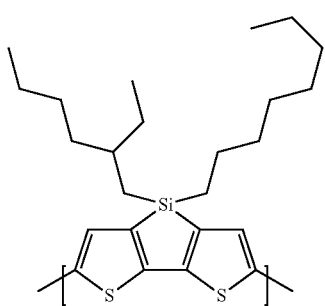
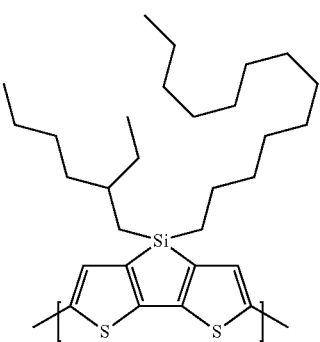
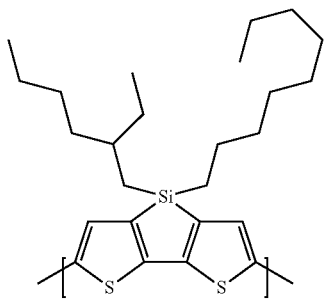
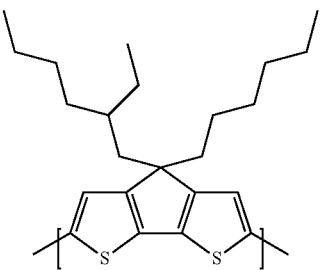
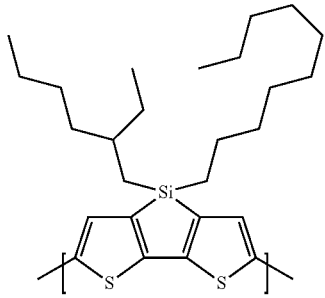
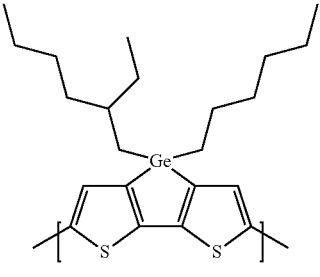

31
-continued
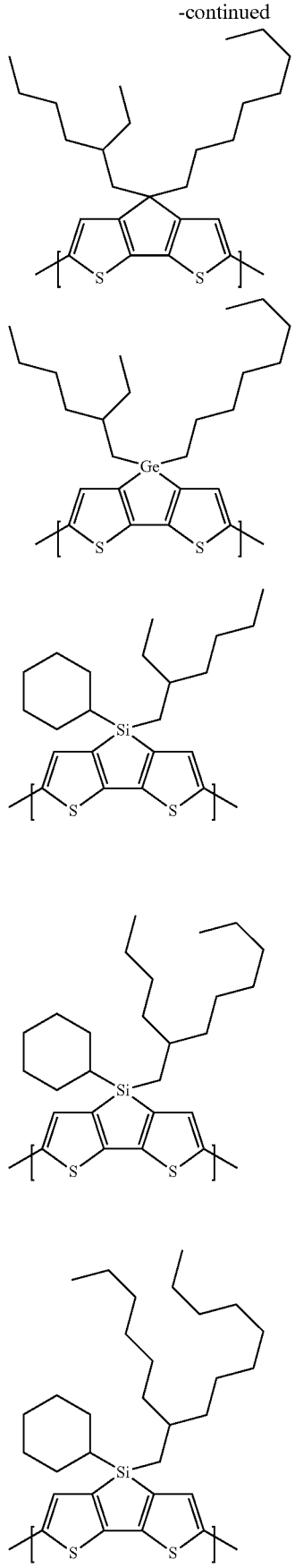
[Chemical Formula 13]
32
-continued
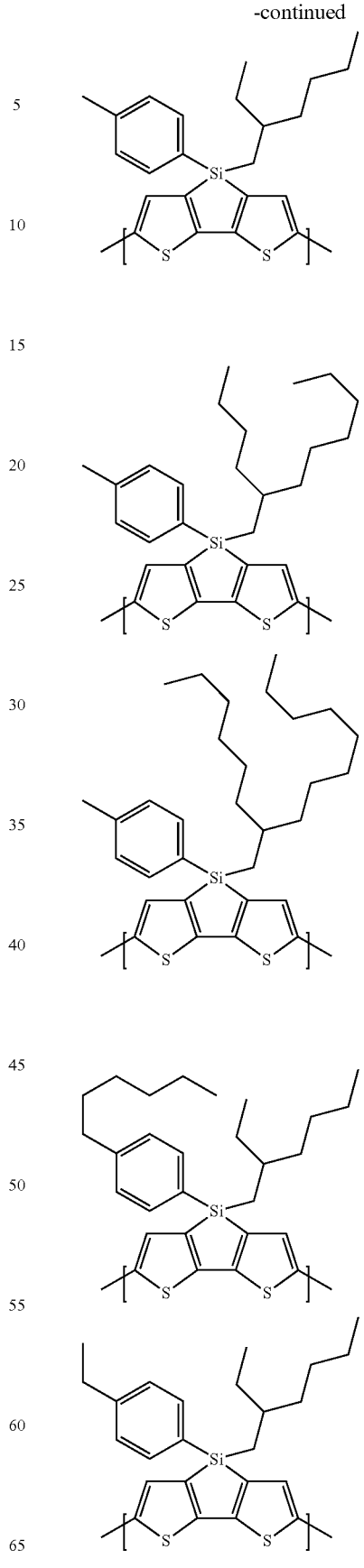

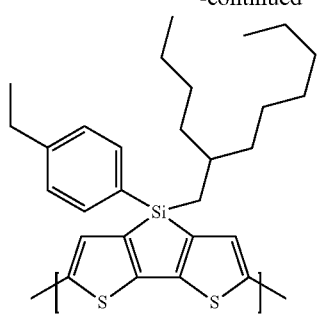
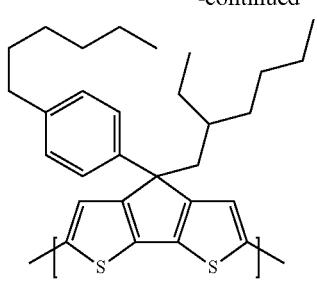
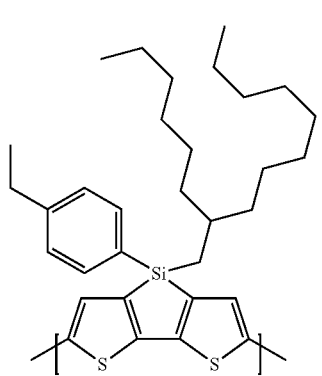
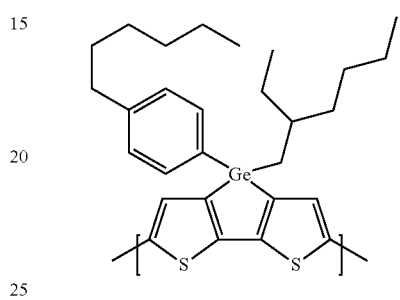
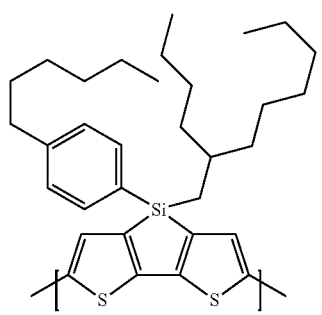
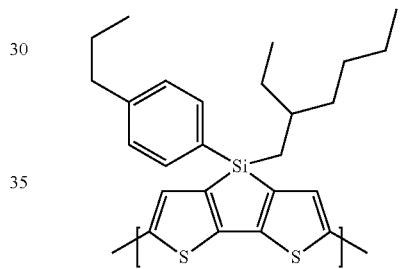
[Chemical Formula 14]
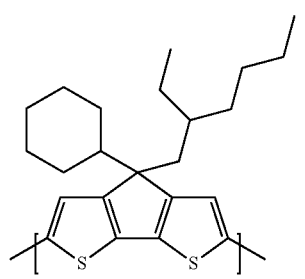
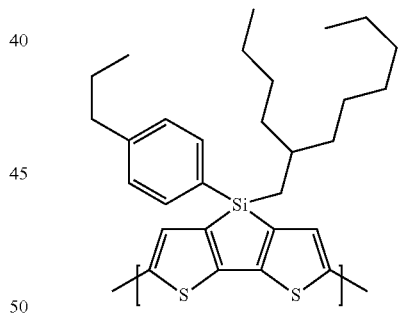
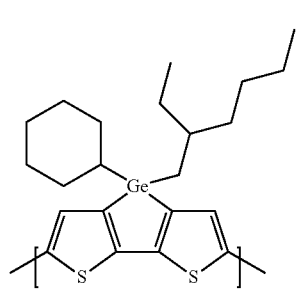
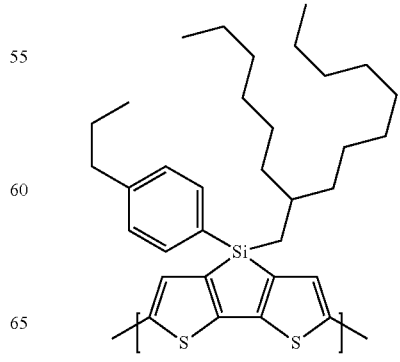

-continued
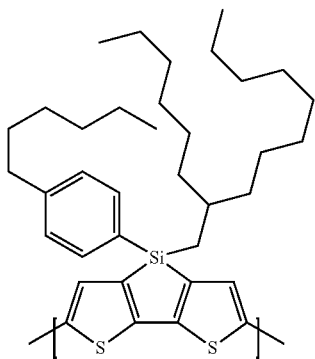
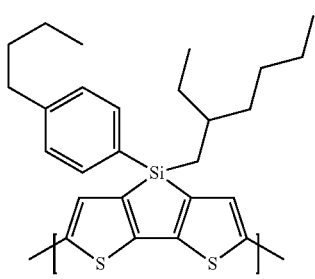
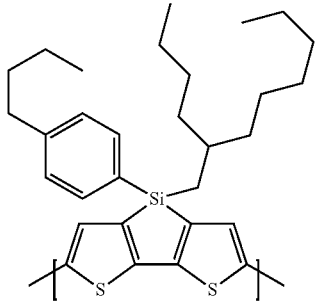
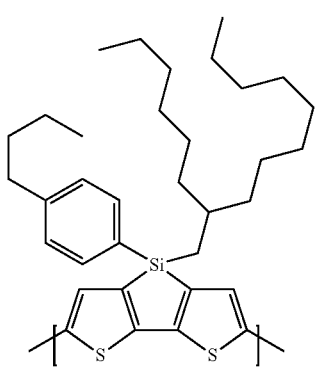
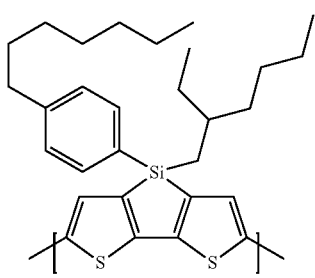
-continued
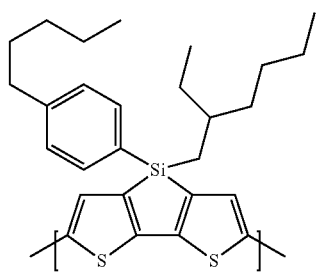
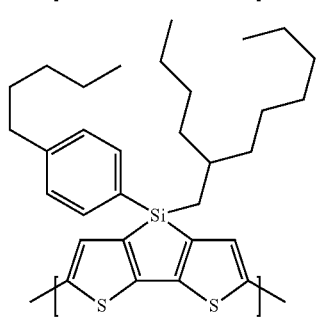
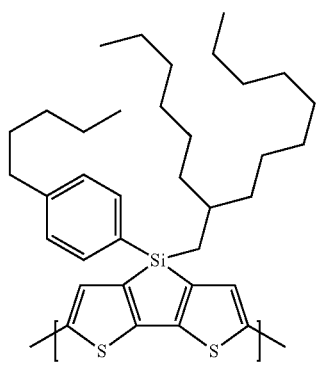
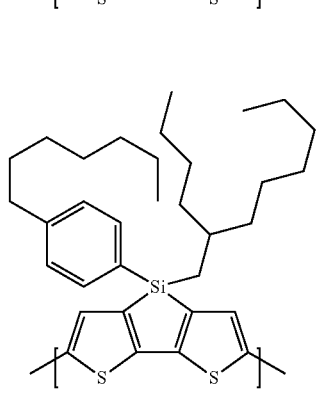
[Chemical Formula 15]
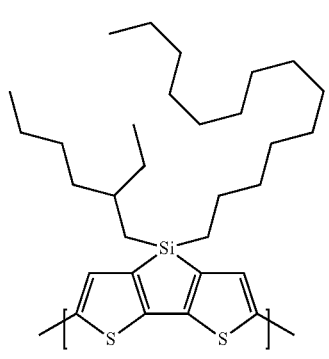

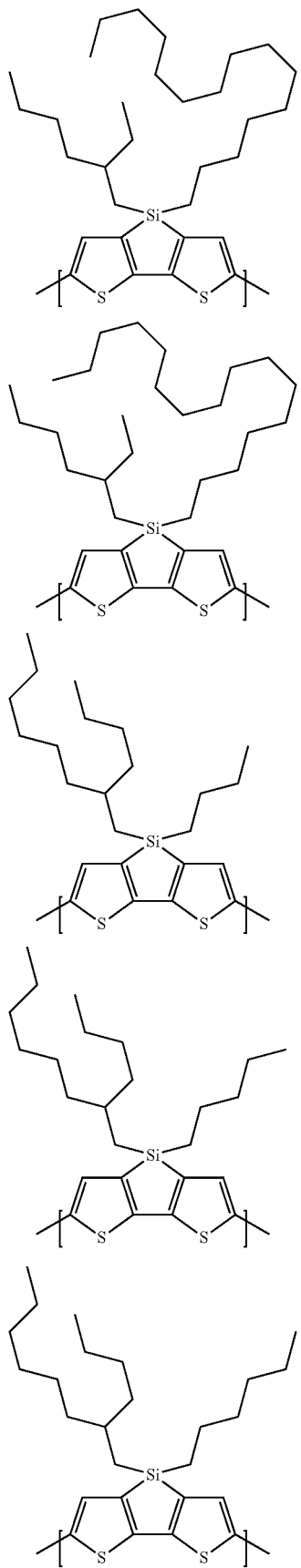
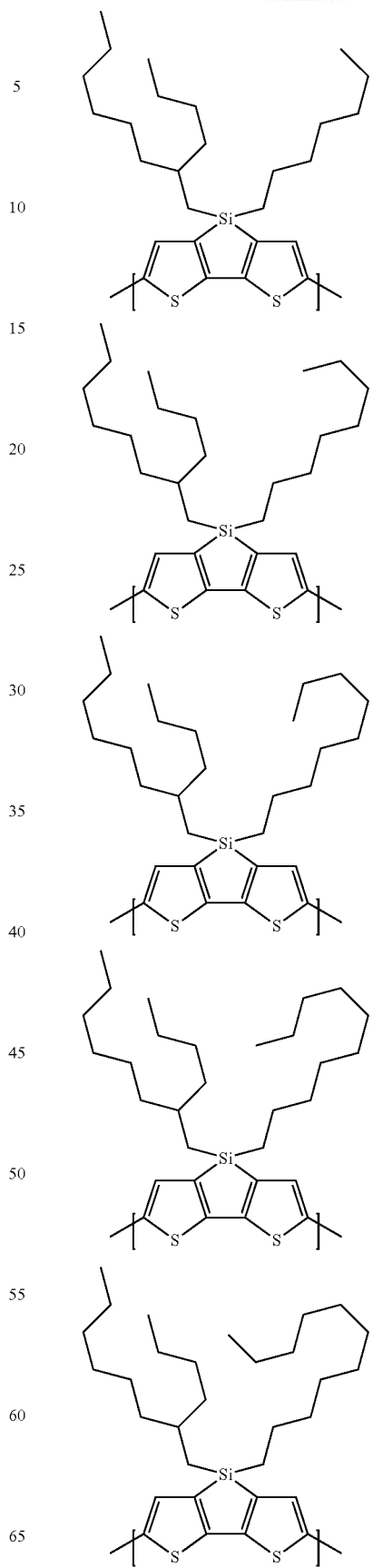

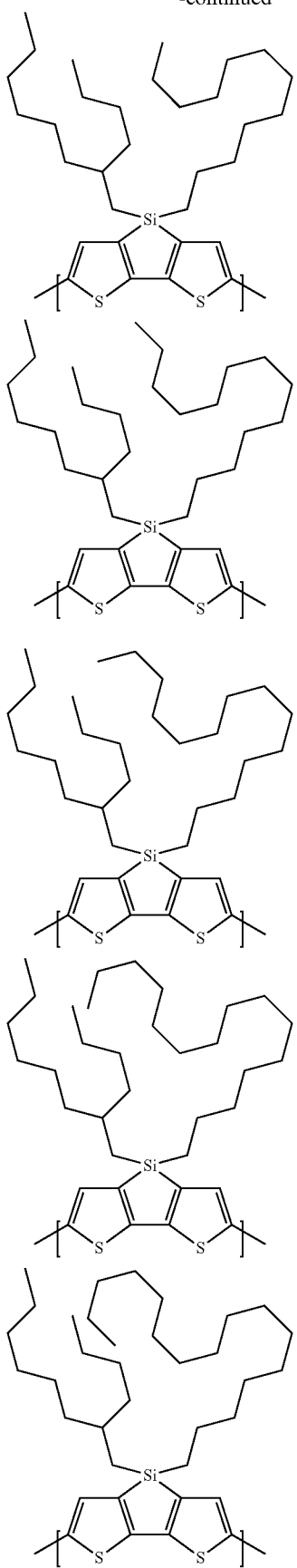
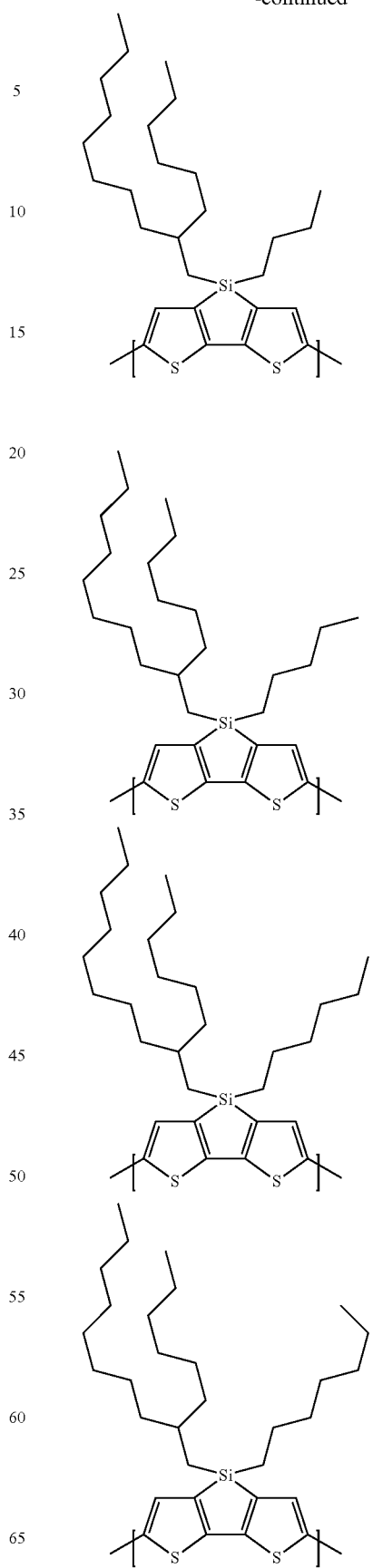
[Chemical Formula 16]

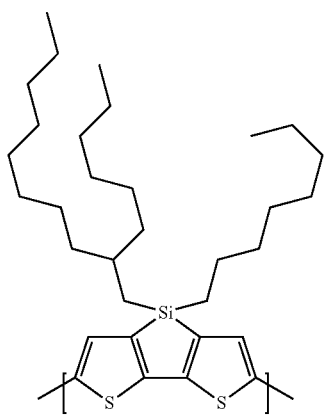
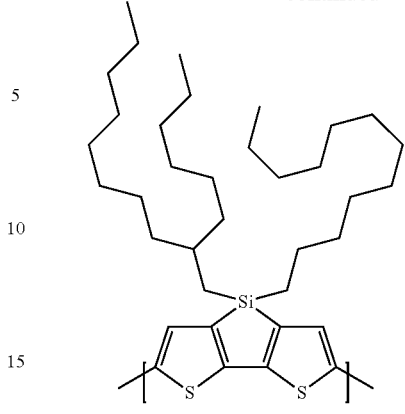
[Chemical Formula 17]
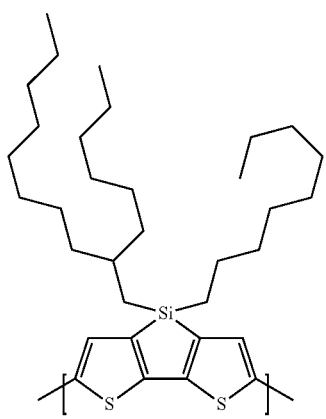
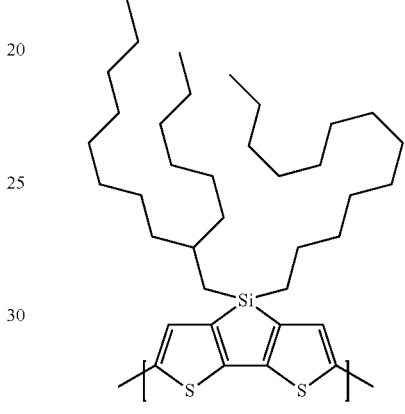
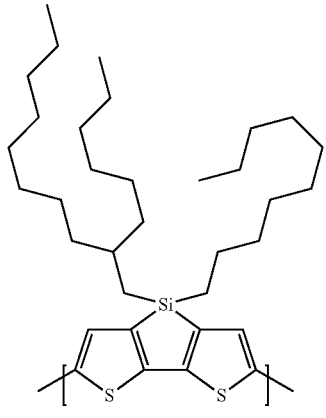
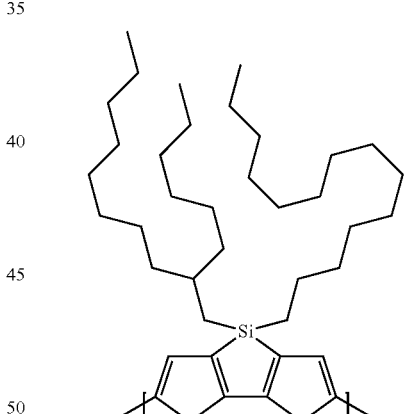
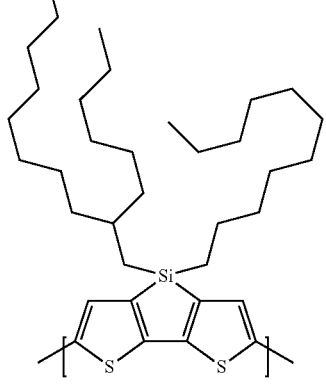
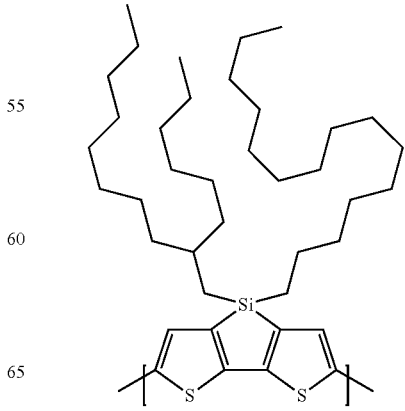

-continued
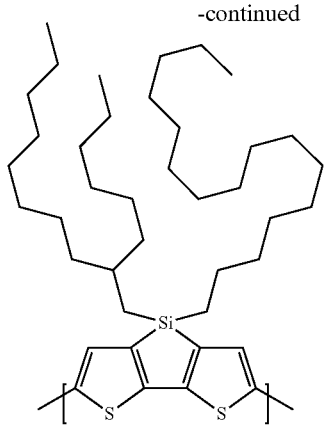
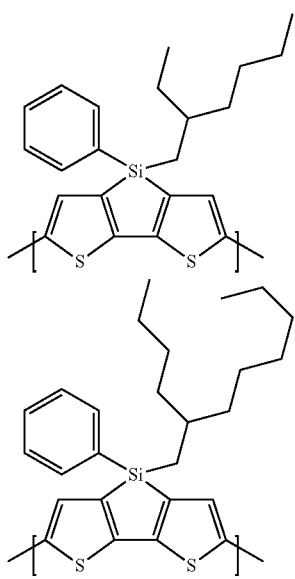
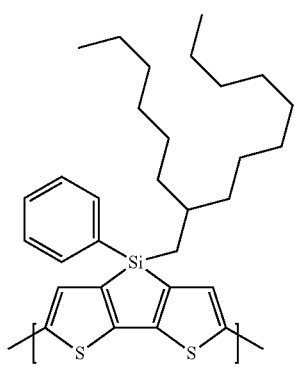
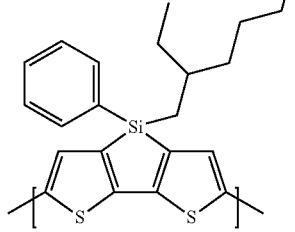
-continued
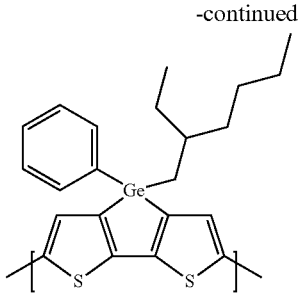
[Chemical Formula 18]
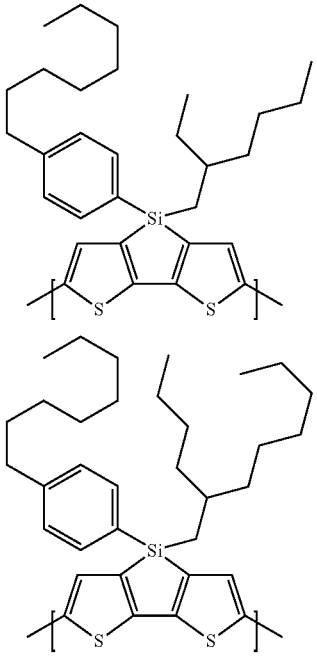

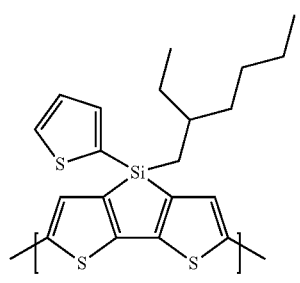
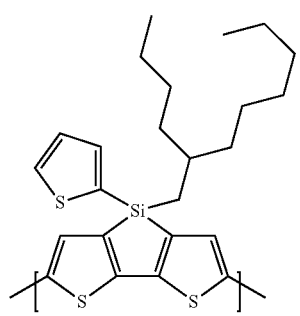
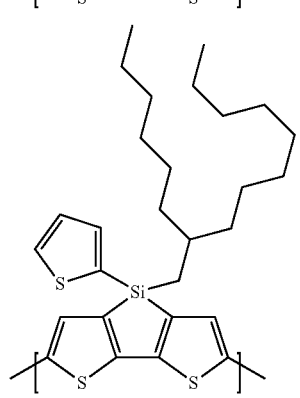
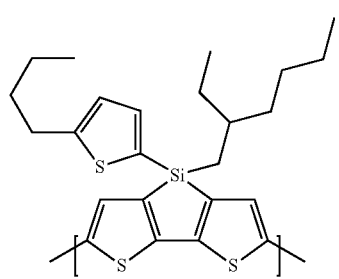
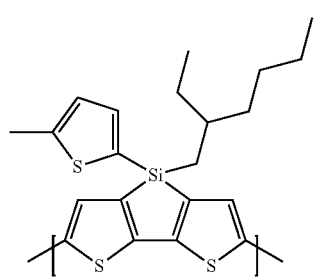
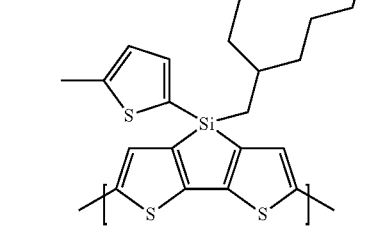
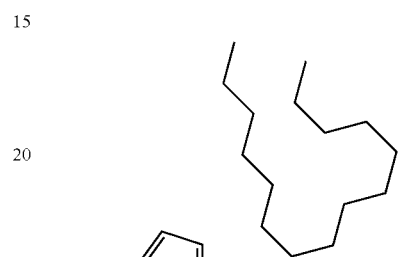
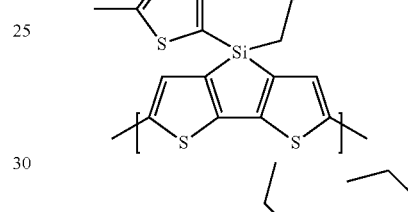
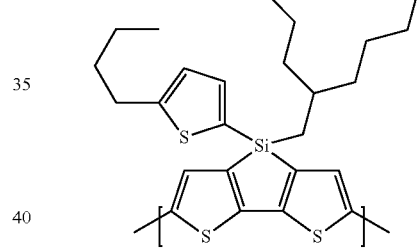
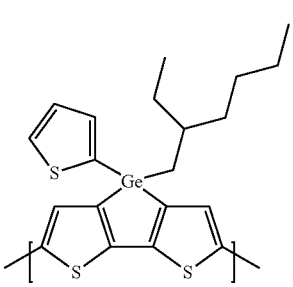

47
-continued
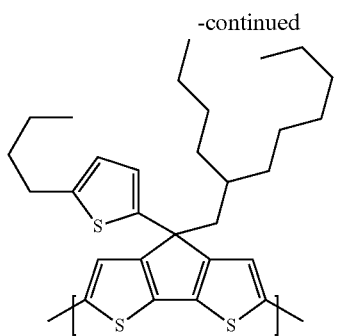
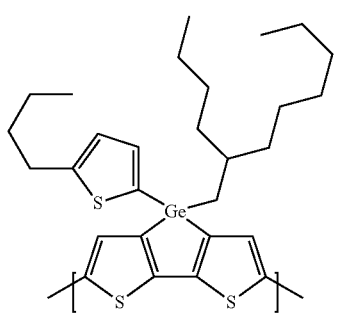
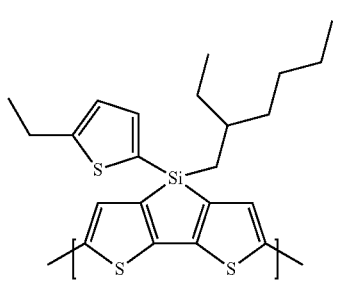
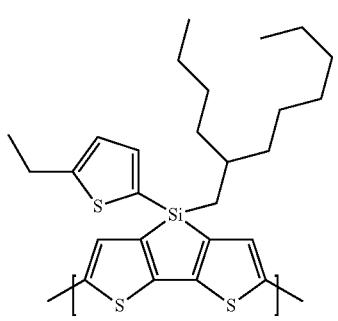
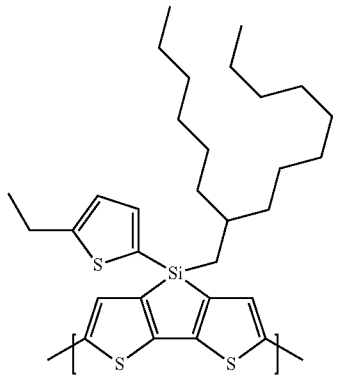
48
-continued
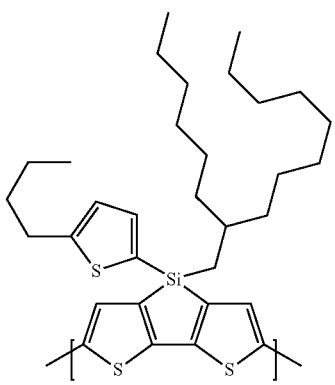
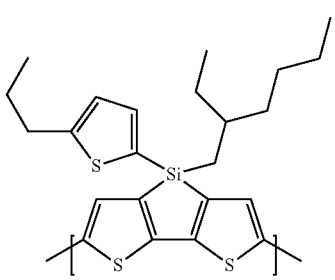
[Chemical Formula 19]
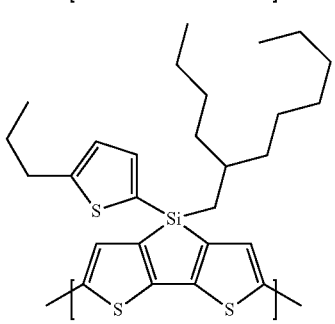
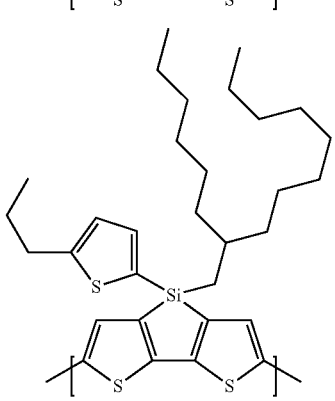
[Chemical Formula 20]
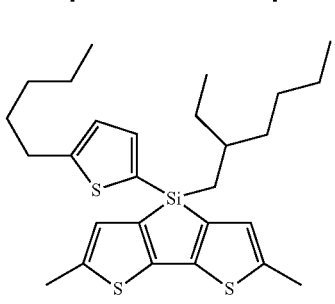

49
-continued
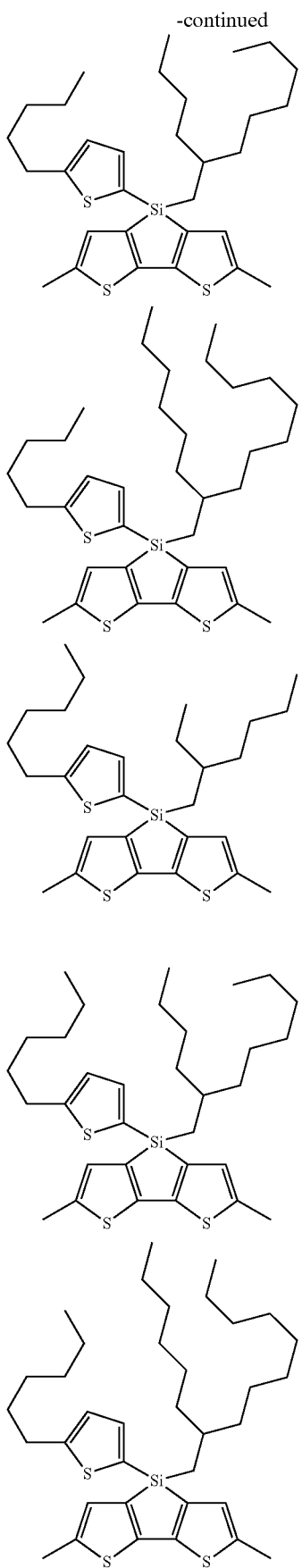
50
-continued
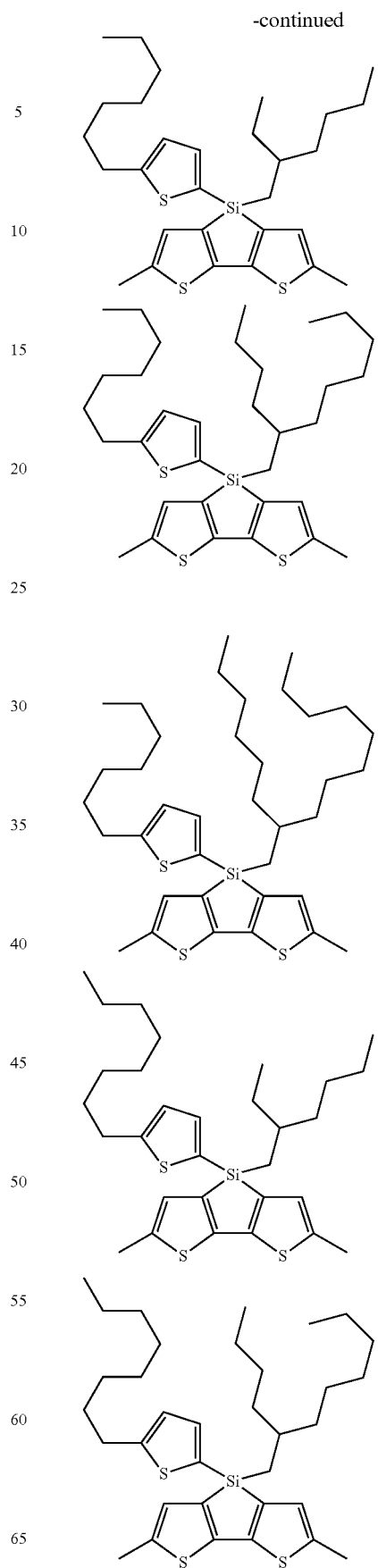

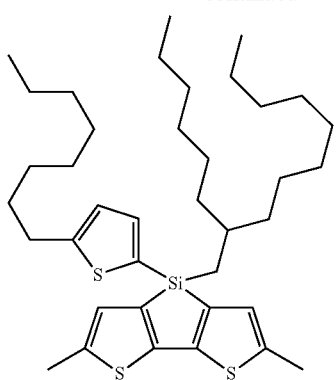
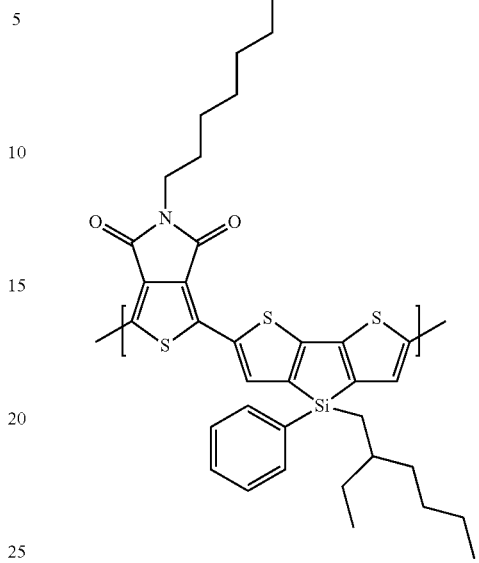
Preferred specific examples of the copolymer of the present invention containing the repeating units represented by the Formula (1A) and Formula (1B) are given below. However, the copolymer of the present invention containing the repeating units represented by the Formula (1A) and Formula (1B) is not limited to the following examples.
[Chemical Formula 21]
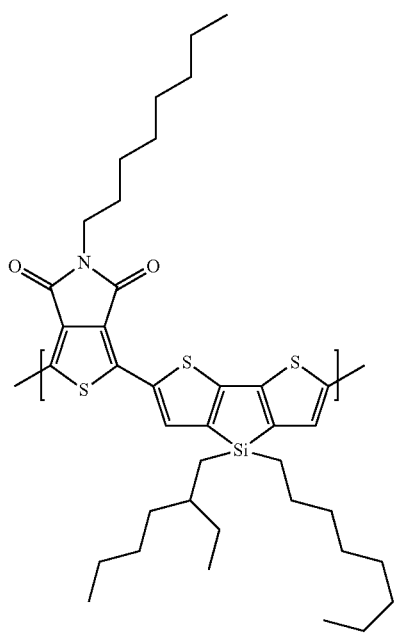
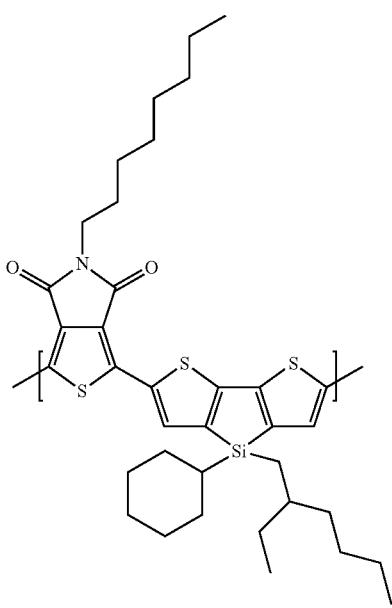

53
-continued
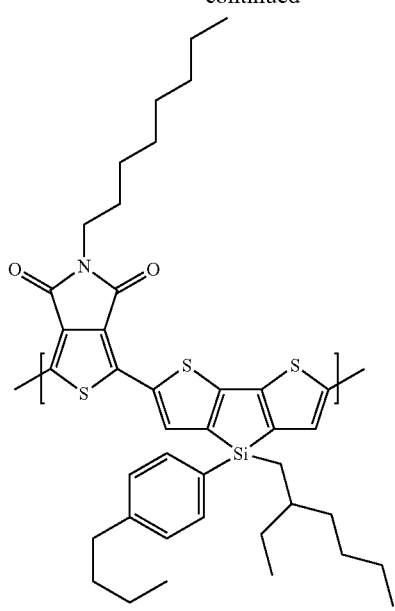
54
-continued
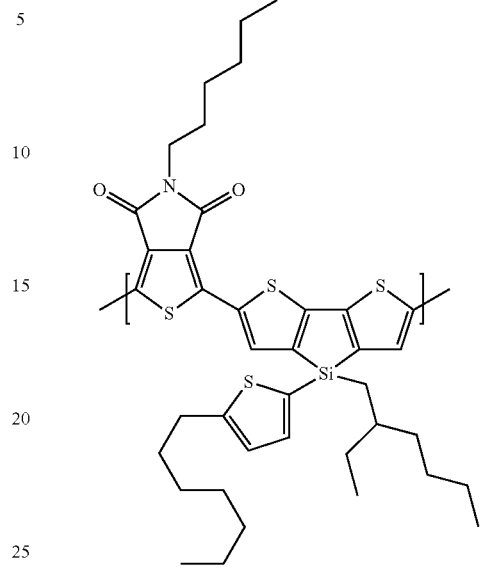
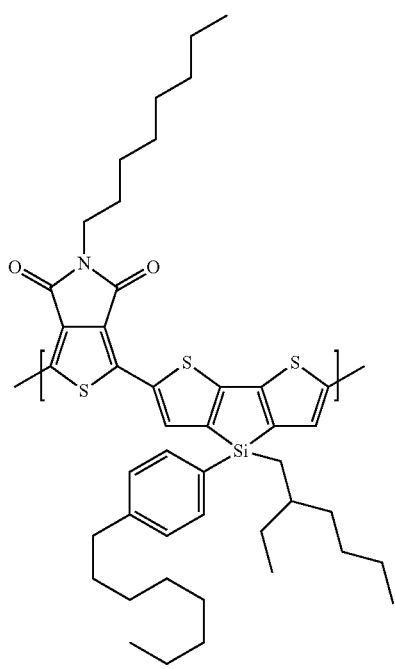
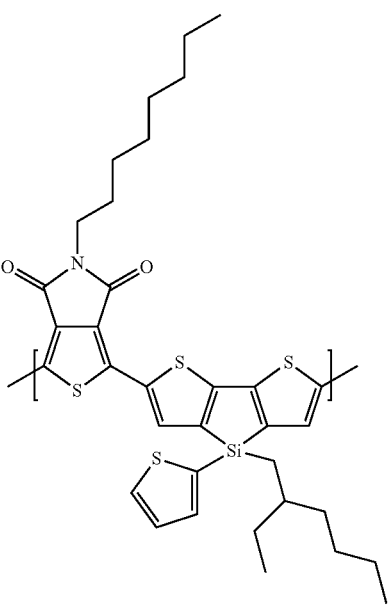

55
-continued
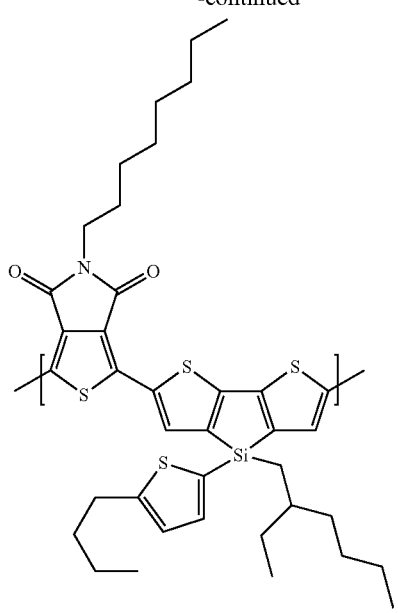
56
-continued
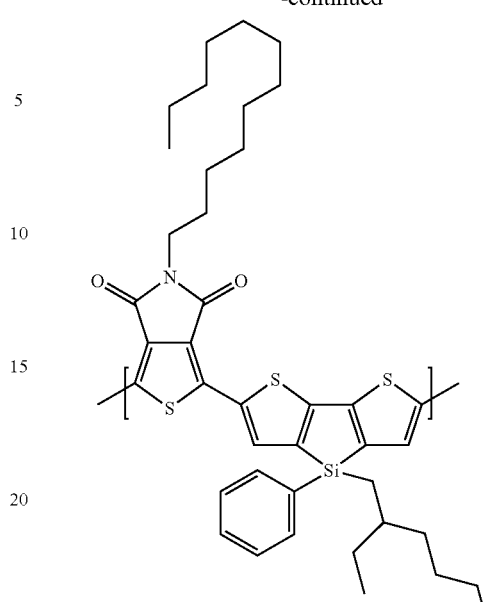
[Chemical Formula 22]
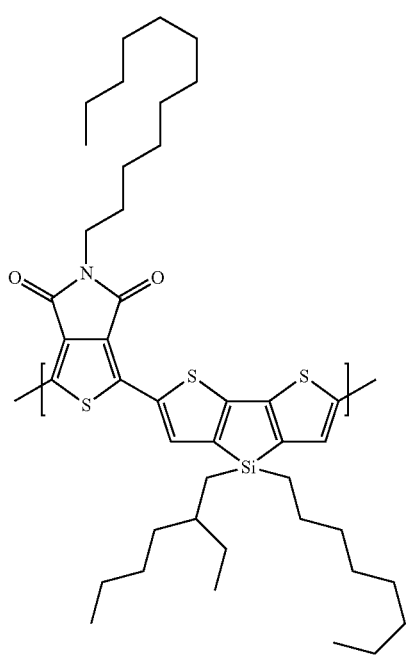
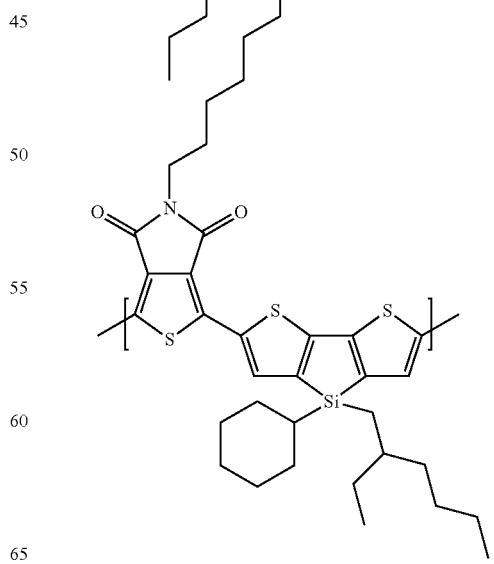

57
-continued
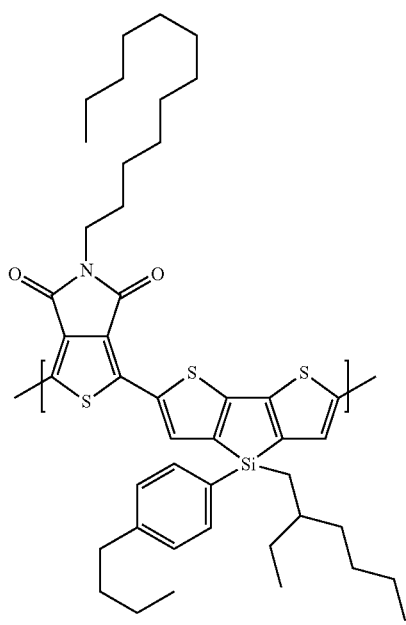
58
-continued
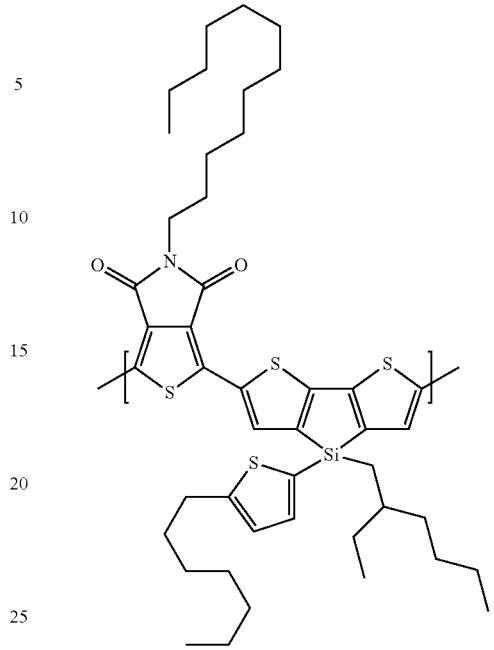
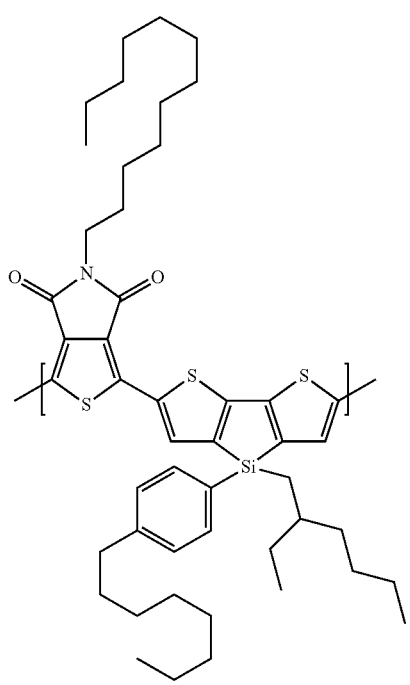
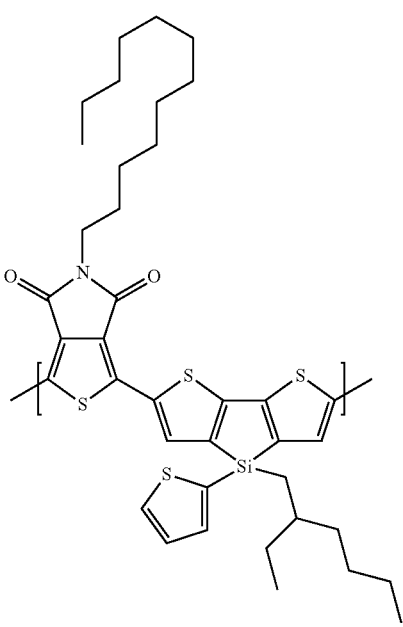

59
-continued
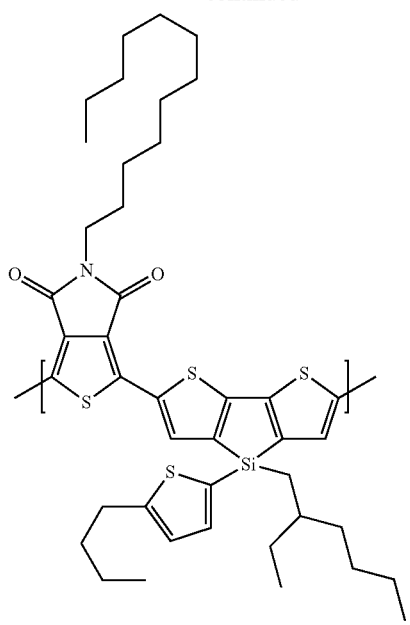
[Chemical Formula 23]
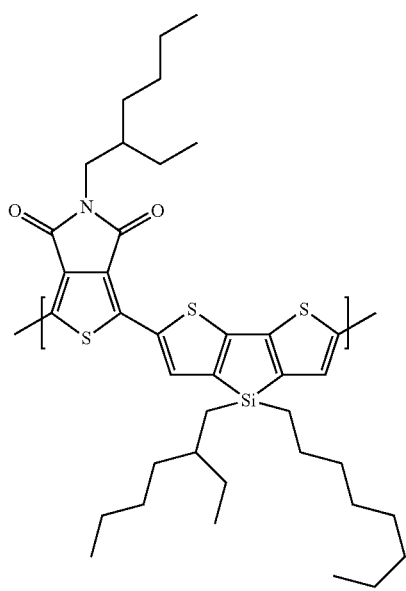
60
-continued
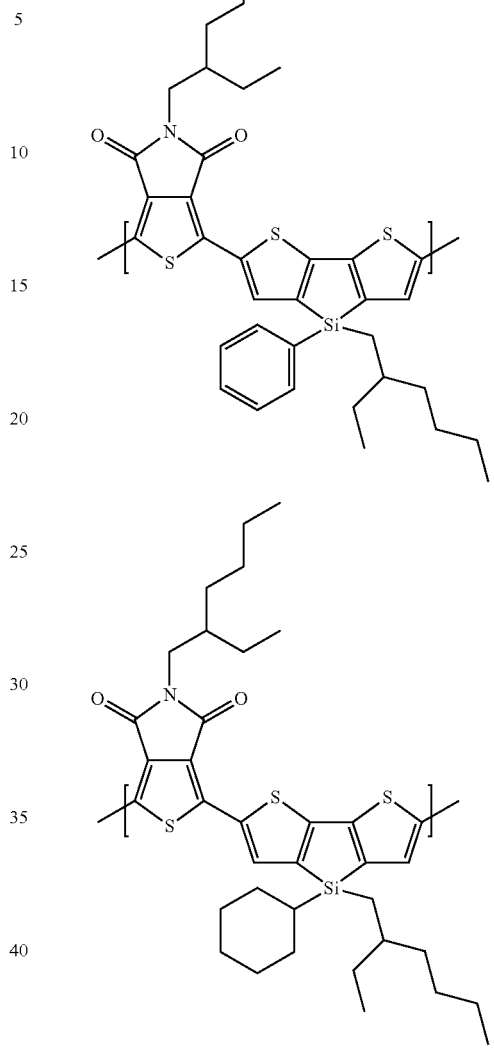

61
-continued
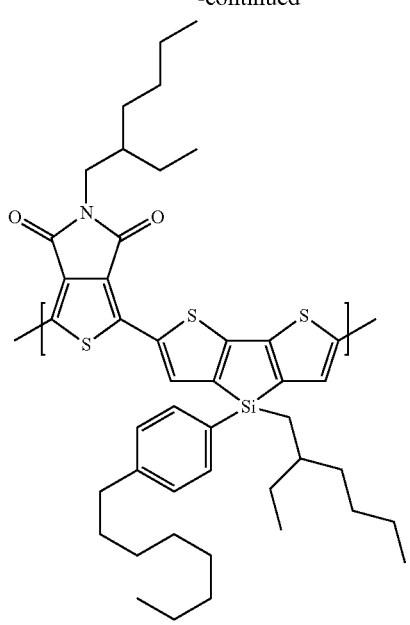
62
-continued
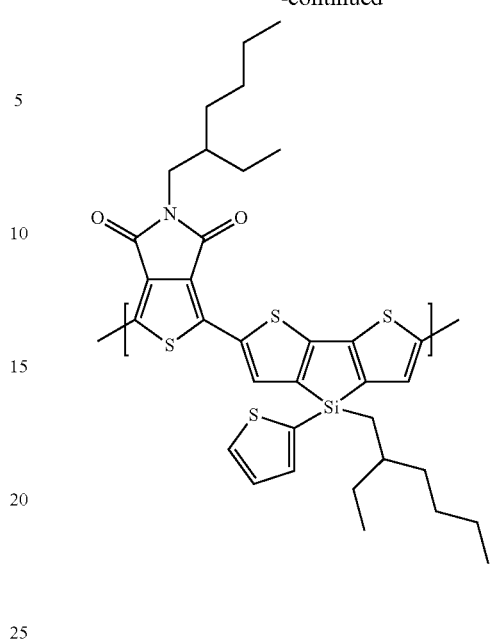
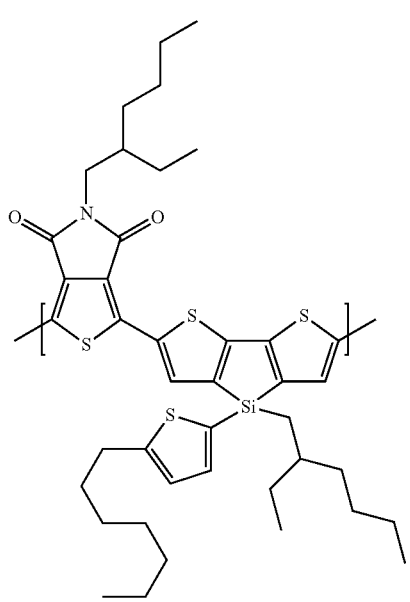
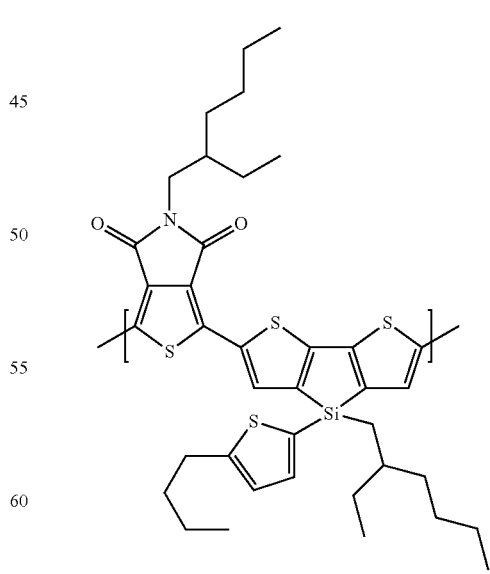

[Chemical Formula 24]
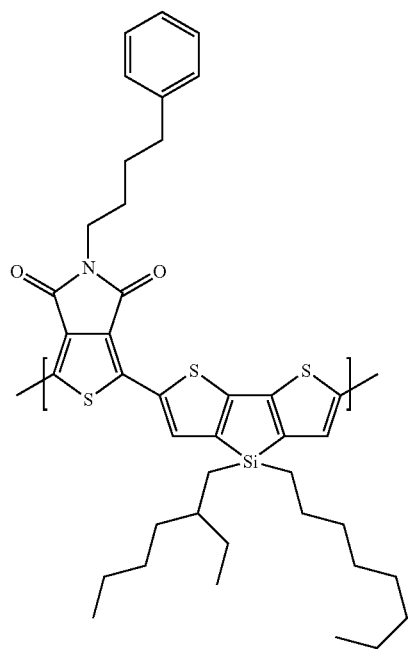
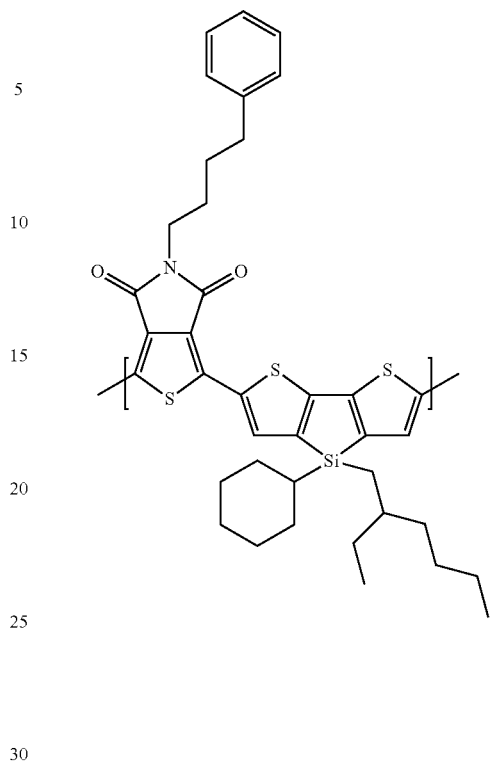
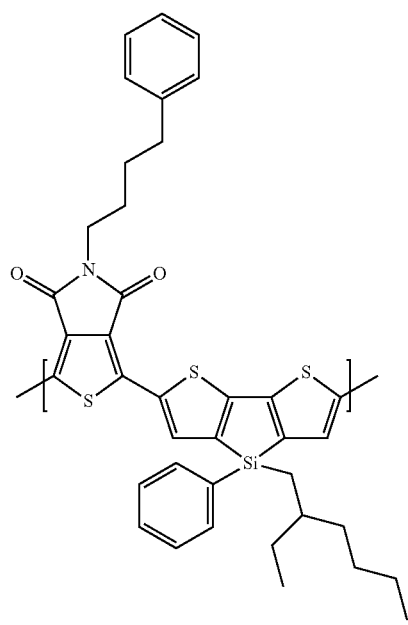
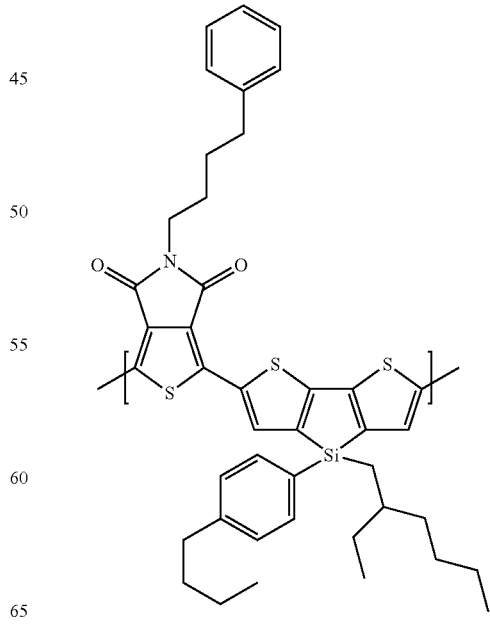

65
-continued
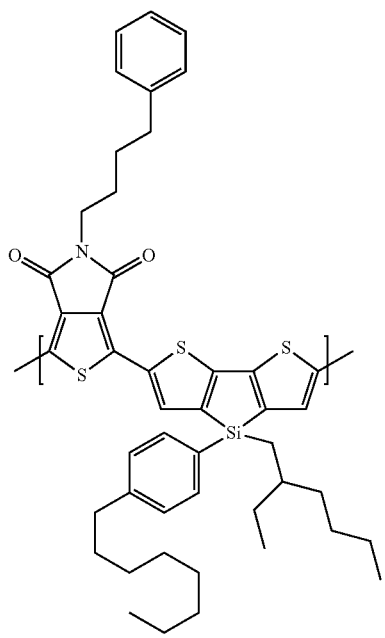
66
-continued
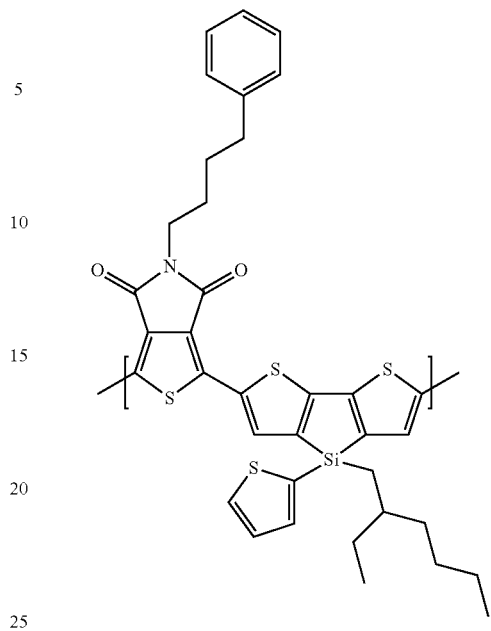
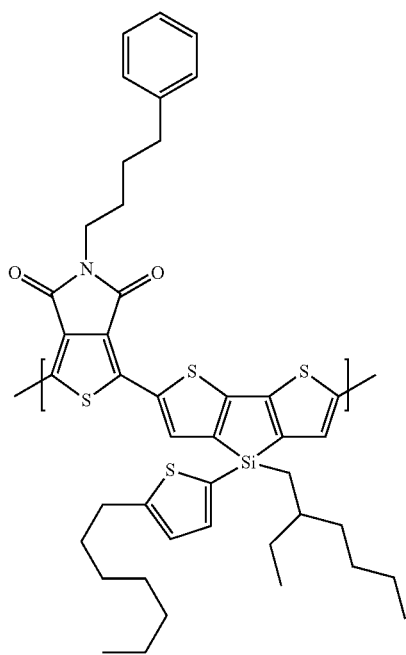
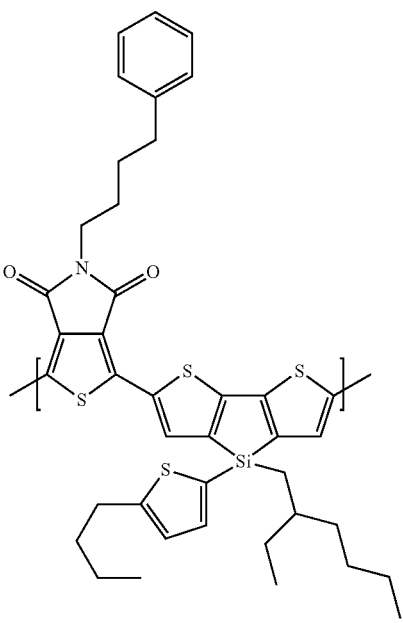

[Chemical Formula 25]
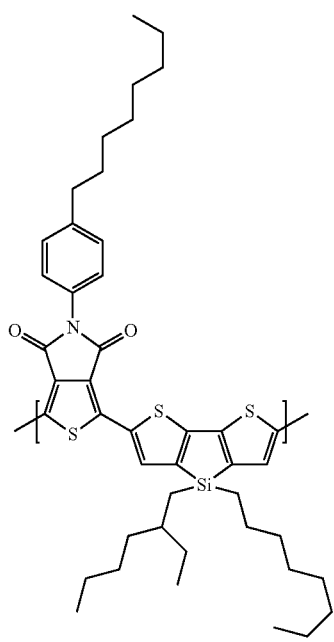
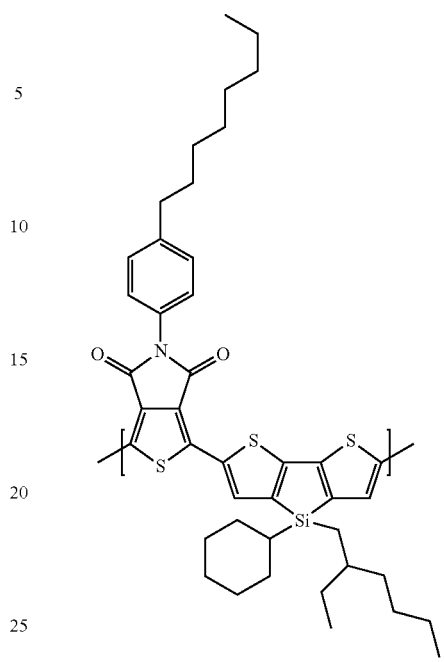
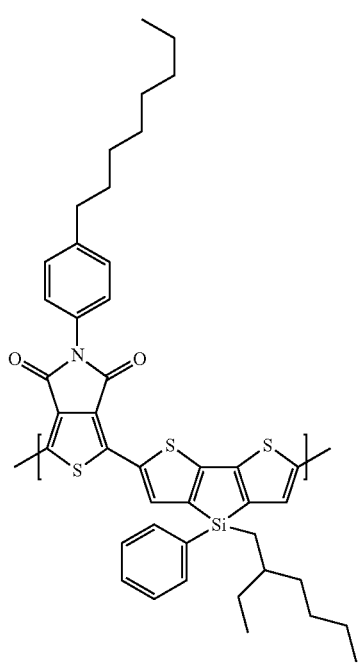
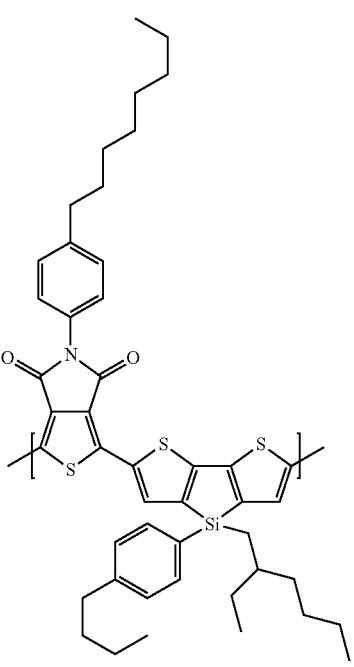

69
-continued
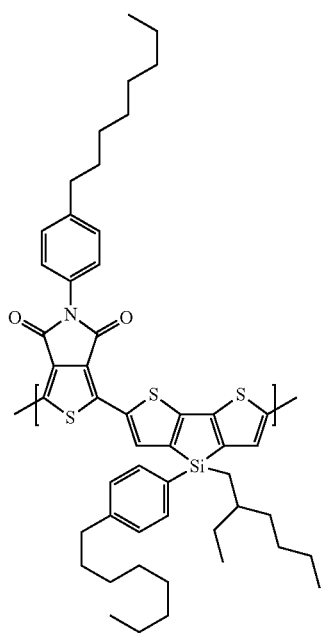
70
-continued
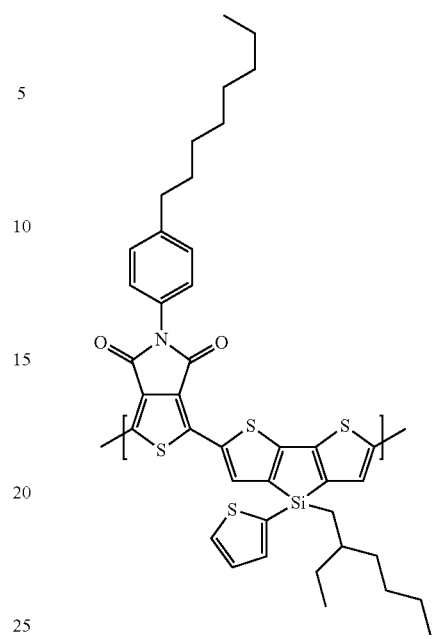
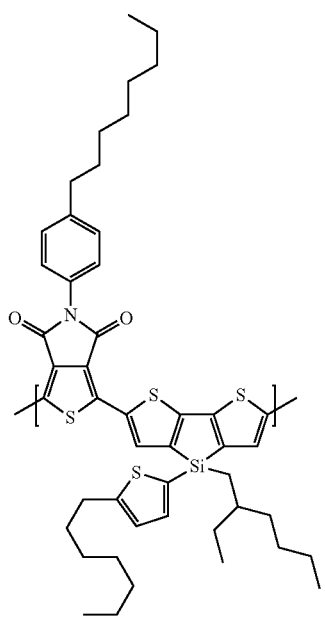
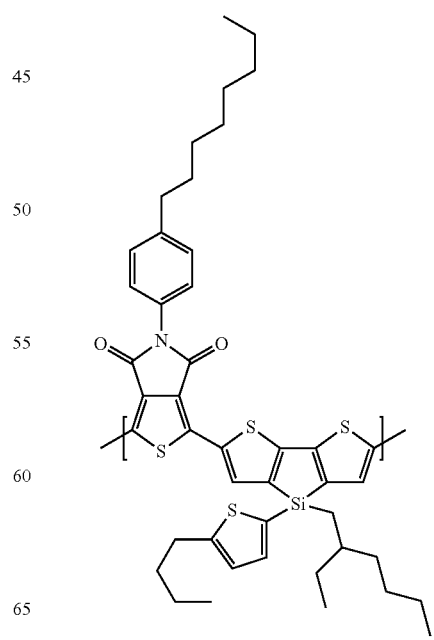

71
-continued
[Chemical Formula 26]
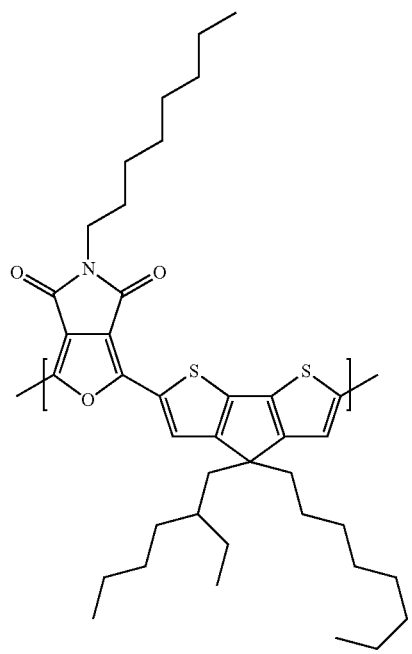
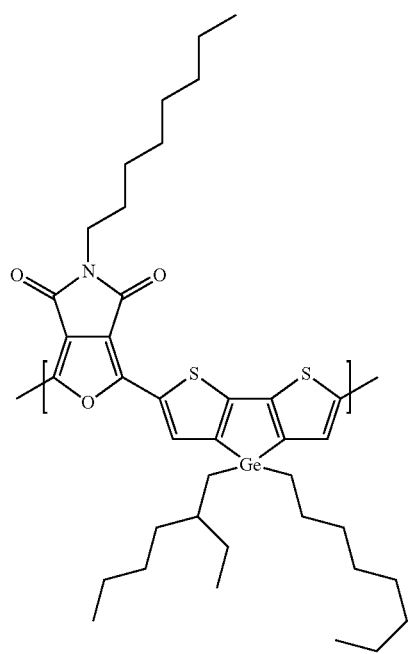
72
-continued
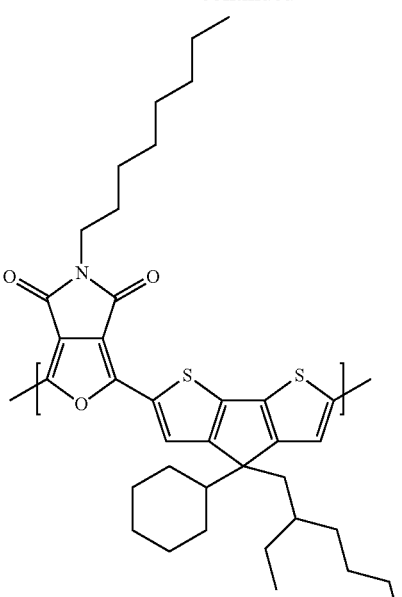

73
-continued
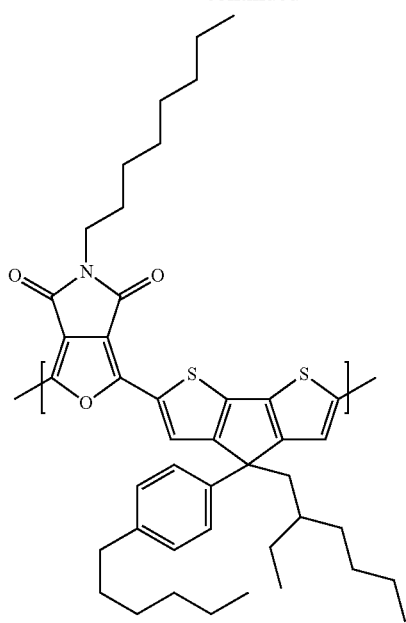
74
-continued
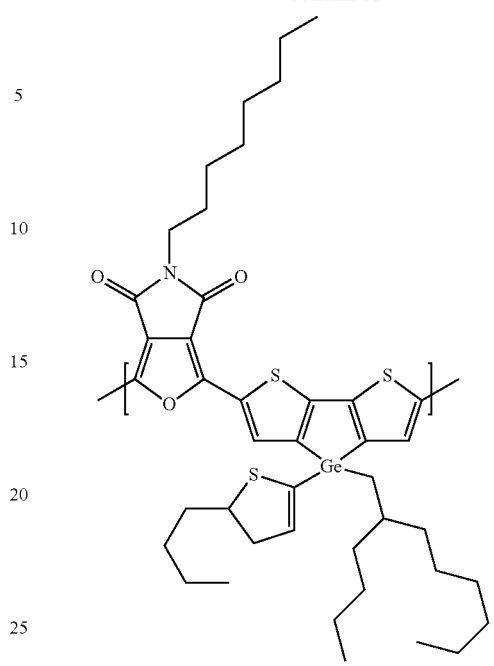
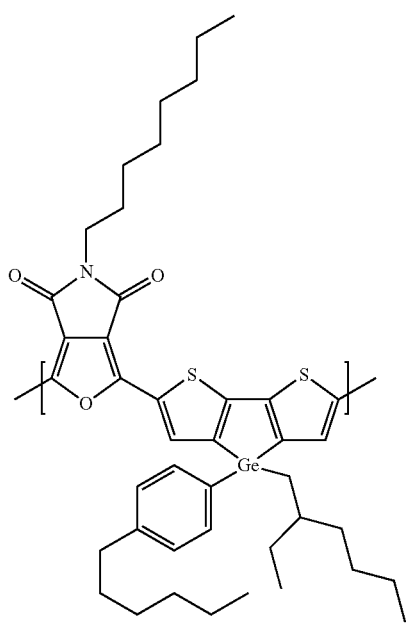
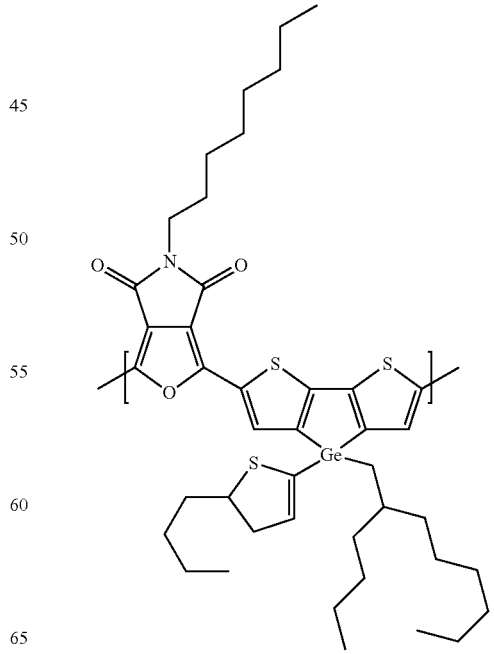

75
-continued
[Chemical Formula 27]
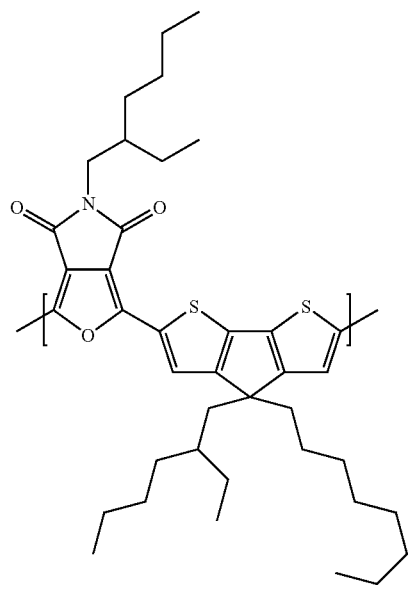
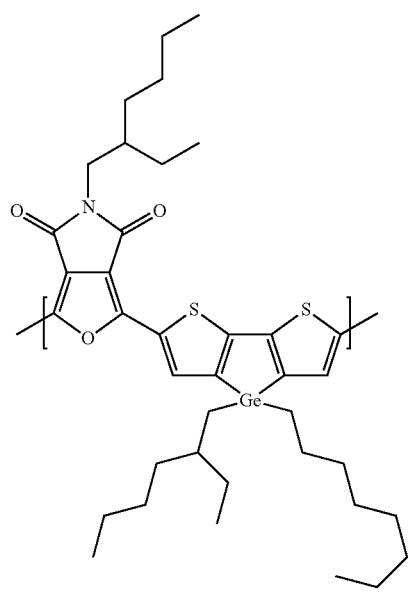
76
-continued
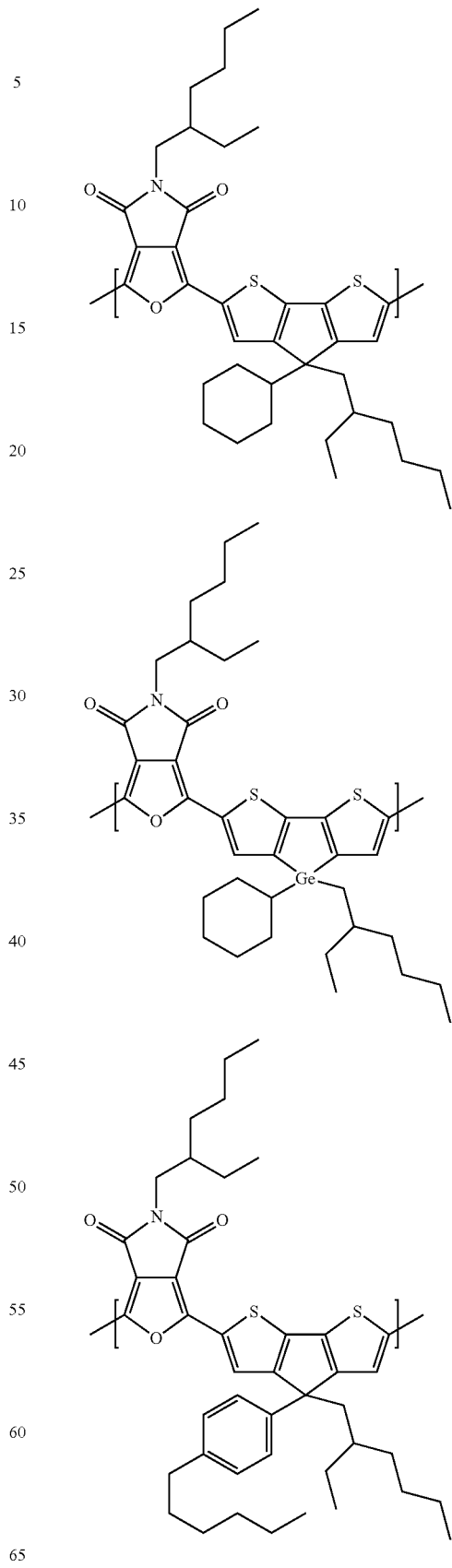

77
-continued
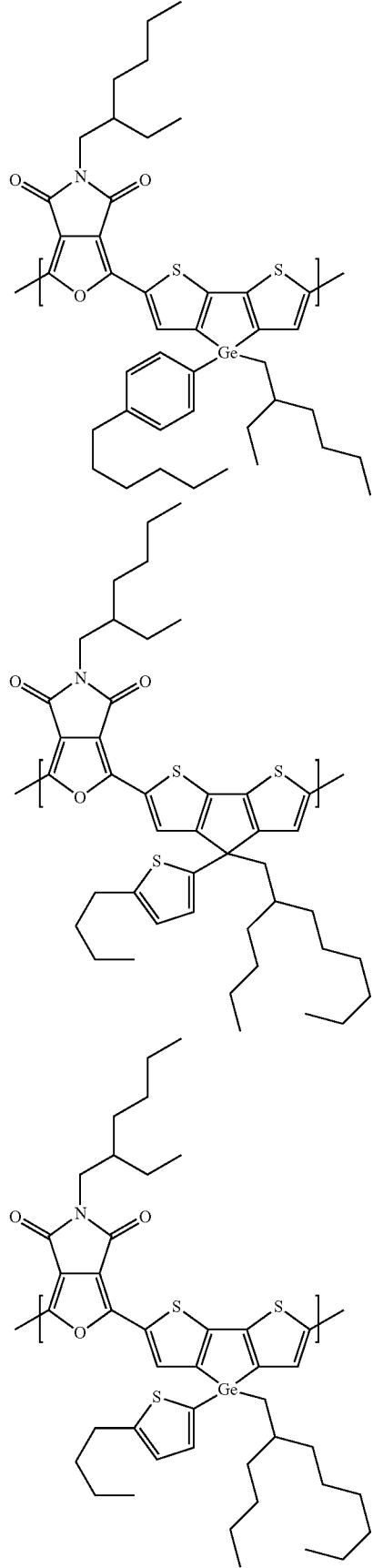
78
-continued
[Chemical Formula 28]
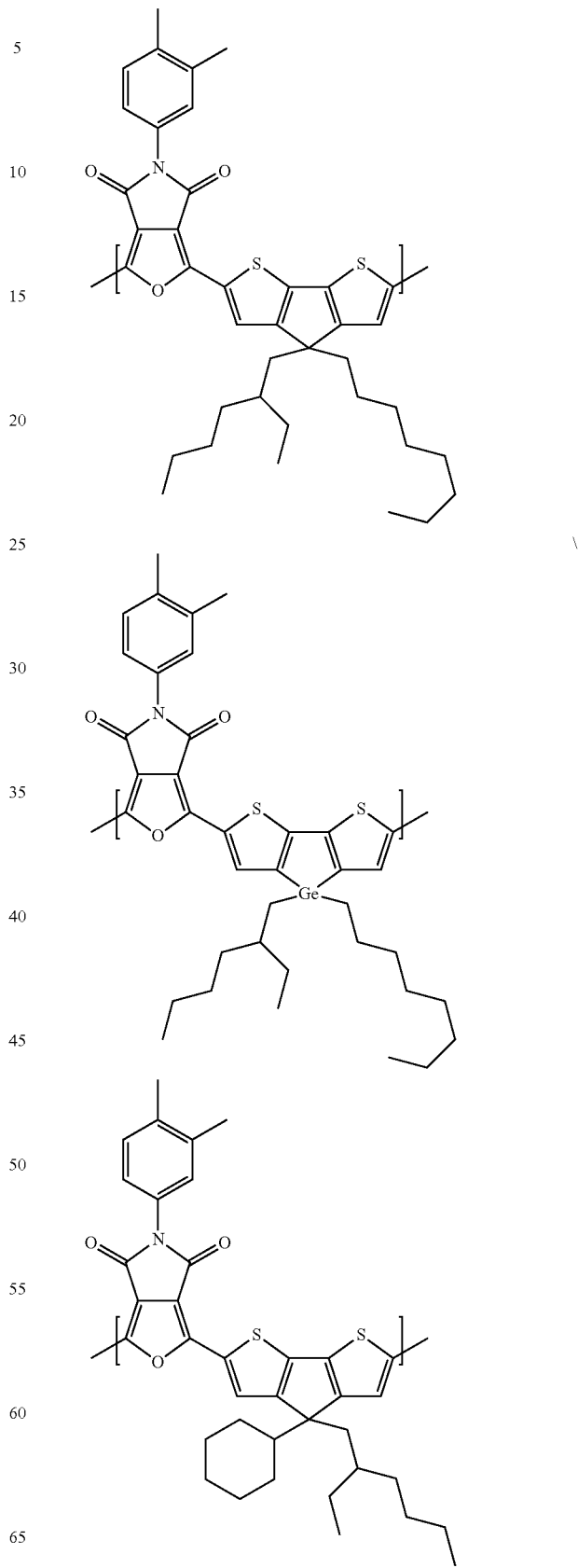

-continued

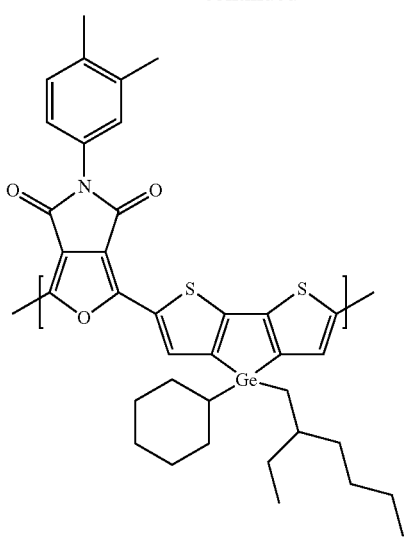

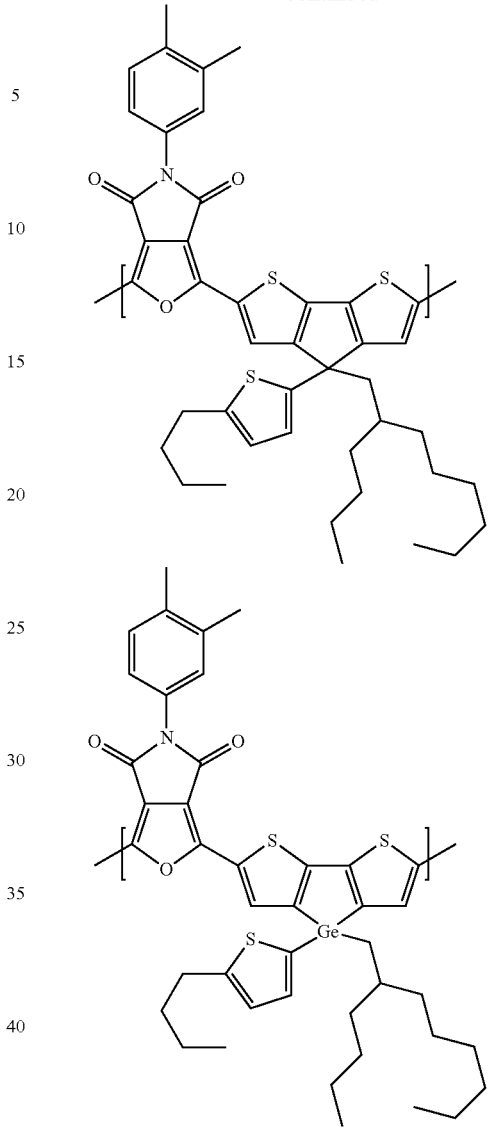

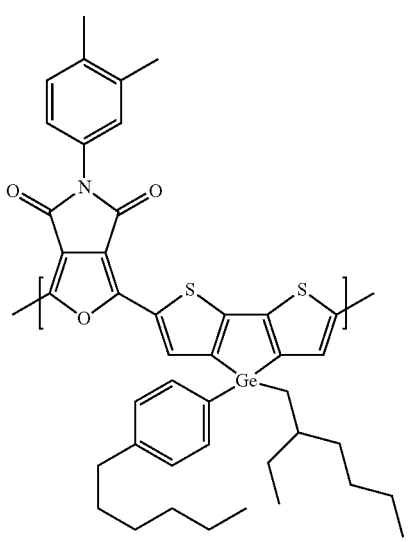

The copolymer of the present invention containing the repeating units represented by the Formula (1A), Formula (1B) and Formula (1C) may also contain two or more kinds each of one or more of the repeating unit represented by the Formula (1A), the repeating unit represented by the Formula (1B) and the repeating unit represented by the Formula (1C).

The copolymer of the present invention containing the repeating units represented by the Formula (1A), Formula (1B) and Formula (1C) may also contain a repeating unit other than the repeating units represented by Formulae (1A), (1B) and (1C) as long as this does not detract from the effects of the present invention. The total of the repeating units represented by Formula (1A), the repeating units represented by the Formula (1B) and the repeating units represented by the Formula (1C) as a percentage of the repeating units making up the copolymer containing the repeating units represented by the Formula (1A), Formula (1B) and Formula (1C) of the present invention is not particularly limited, but is normally at least 3 mol %, or preferably at least 10 mol %, or more preferably at least 25 mol %, or still more preferably at least 50 mol %, or yet more preferably at least 70 mol %, or most preferably at least 90 mol %. More preferably, the copolymer of the present invention containing the repeating units represented by the Formula (1A), Formula (1B) and Formula (1C) either contains the repeating unit represented by Formula (1A), the repeating unit represented by the Formula (1B) and the repeating unit represented by the Formula (1C) and is formed solely of these repeating units, or contains these repeating units and contains polymer chains formed solely of these repeating units.

The ratio of the repeating units represented by the Formula (1A) as a percentage of the repeating units constituting the copolymer of the present invention containing the repeating units represented by the Formula (1A), Formula (1B) and Formula (1C) is not particularly limited, but is normally at least 1 mol %, or preferably at least 2 mol %, or more preferably at least 10 mol %, or still more preferably at least 30 mol %. Also, it is normally 98 mol % or less, or preferably 90 mol % or less, or more preferably 70 mol % or less.

The ratio of the repeating units represented by the Formula (1B) as a percentage of the repeating units constituting the copolymer of the present invention containing the repeating units represented by the Formula (1A), Formula (1B) and Formula (1C) is not particularly limited, but is normally at least 1 mol %, or preferably at least 10 mol %, or more preferably at least 30 mol %. Also, it is normally 98 mol % or less, or preferably 90 mol % or less, or more preferably 70 mol % or less.

The ratio of the repeating units represented by the Formula (1C) as a percentage of the repeating units constituting the copolymer of the present invention containing the repeating units represented by the Formula (1A), Formula (1B) and Formula (1C) is not particularly limited, but is normally at least 1 mol %, or preferably at least 10 mol %, or more preferably at least 30 mol %. Also, it is normally 98 mol % or less, or preferably 90 mol % or less, or more preferably 70 mol % or less.

The ratio (1C/1B) of the number of the repeating units represented by the Formula (1C) to the number of the repeating units represented by the Formula (1B) in the copolymer of the present invention containing the repeating units represented by the Formula (1A), Formula (1B) and Formula (1C) is not particularly limited, but is normally at least 0.01, or preferably at least 0.1, or more preferably at least 0.2. Also, the ratio is normally 100 or less, or preferably 10 or less, or more preferably 5 or less.

The ratio ((1B+1C)/1A) of the number of the repeating units represented by the Formula (1B) and the number of the repeating units represented by the Formula (1C) to the number of the repeating units represented by the Formula (1A) in the copolymer of the present invention containing the repeating units represented by the Formula (1A), Formula (1B) and Formula (1C) is not particularly limited, but is normally at least 0.01, or preferably at least 0.1, or more preferably at least 0.5. Also, the ratio is normally 100 or less, or preferably 10 or less, or more preferably 2 or less.

The sequence arrangement of the repeating units represented by the Formula (1A), Formula (1B) and Formula (1C) in the copolymer of the present invention containing the repeating units represented by the Formula (1A), Formula (1B) and Formula (1C) may be either alternating, block or random. That is, the copolymer of the present invention may be an alternating copolymer, a block copolymer or a random copolymer. It may also be a copolymer having a structure intermediate between these structures, such as a random copolymer with block properties. Dendrimers and copolymers having branches off the main strand and three or more termini are also included. Of these, a block copolymer or random copolymer is preferred for ease of synthesis and to further reduce regularity, while a random copolymer is more preferred from the standpoint of improving the solubility of the copolymer and improving the storage stability of an ink made by dissolving the copolymer.

In particular, the copolymer of the present invention containing the repeating units represented by the Formula (1A), Formula (1B) and Formula (1C) preferably has repeating units represented by the Formula (2A) and Formula (2B) below. A copolymer having the repeating units represented by the Formula (2A) and Formula (2B) below is preferred for maintaining charge separation more easily.

[Chemical Formula 29]

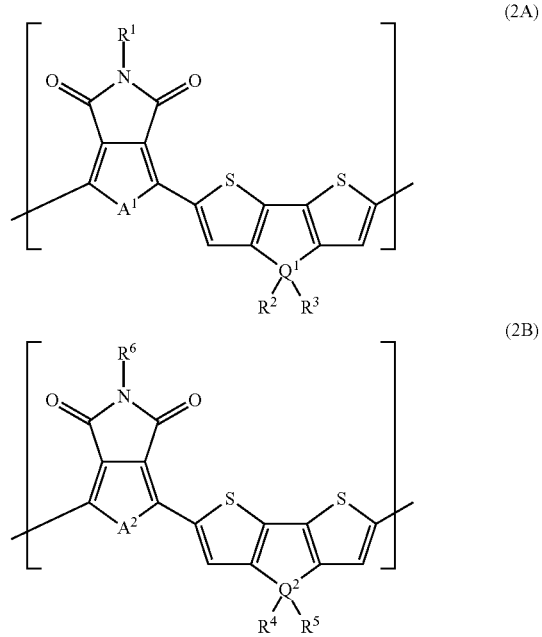

In the Formula (2A) and Formula (2B), each of $A^1$ and $A^2$ independently represents an atom selected from the elements of Group 16 of the periodic table. $A^1$ and $A^2$ are similar to the A in the Formula (1A). $A^1$ and $A^2$ may be the same or different, but are preferably the same in order to inhibit localization of pi-conjugation in the copolymer. $A^1$ and $A^2$ are preferably oxygen atoms, sulfur atoms or selenium atoms, with sulfur atoms or selenium atoms being preferred for improving mobility, and sulfur atoms being especially preferred.

In the Formula (2A) and Formula (2B), each of $Q^1$ and $Q^2$ independently represents an atom selected from the elements of Group 14 of the periodic table. $Q^1$ and $Q^2$ are similar to the $Q^1$ and $Q^2$ in the Formula (1B) and Formula (1C).

Each of $R^1$ and $R^6$ independently represents a hydrocarbon group optionally having a heteroatom. Specifically, $R^1$ is similar to the $R^1$ in the Formula (1A). $R^2$ to $R^5$ are similar to the $R^2$ to $R^5$ in the Formula (1B) and Formula (1C). $R^6$ is similar to the $R^1$ in the Formula (1A).

The copolymer of the present invention containing the repeating units represented by the Formula (1A), Formula (1B) and Formula (1C) may also contain two or more kinds each of one or more of the repeating unit represented by Formula (2A) and the repeating unit represented by the Formula (2B).

The copolymer of the present invention containing the repeating units represented by the Formula (1A), Formula (1B) and Formula (1C) may also contain another repeating unit other than the repeating units represented by Formulae (2A) and (2B) as long as this does not detract from the effects of the present invention. The total of the repeating unit represented by Formula (2A) and the repeating unit represented by Formula (2B) as a percentage of the repeating units making up a copolymer containing the repeating units represented by Formula (1A), Formula (1B) and Formula (1C) is not particularly limited, but is normally at least 2 mol %, or preferably at least 10 mol %, or more preferably at least 25 mol %, or still more preferably at least 50 mol %, or yet more preferably at least 70 mol %, or most preferably at least 90 mol %. It is especially desirable that the copolymer of the present invention containing the repeating units represented by the Formula (1A), Formula (1B) and Formula (1C) either contain the repeating unit represented by the Formula (2A) and the repeating unit represented by the Formula (2B) and be composed solely of these repeating units, or contain these repeating units and contains polymer chains formed solely of these repeating units.

The ratio of the repeating units represented by the Formula (2A) as a percentage of the repeating units making up the copolymer of the present invention containing the repeating units represented by the Formula (1A), Formula (1B) and Formula (1C) is not particularly limited, but is normally at least 1 mol %, or preferably at least 10 mol %, or more preferably at least 20 mol %. Also, it is normally 99 mol % or less, or preferably 90 mol % or less, or more preferably 70 mol % or less.

The ratio of the repeating units represented by the Formula (2B) as a percentage of the repeating units making up the copolymer of the present invention containing the repeating units represented by the Formula (1A), Formula (1B) and Formula (1C) is not particularly limited, but is normally at least 1 mol %, or preferably at least 10 mol %, or more preferably at least 20 mol %. Also, it is normally 99 mol % or less, or preferably 90 mol % or less, or more preferably 70 mol % or less.

The ratio (2A/2B) of the number of repeating units represented by the Formula (2A) to the number of repeating units represented by the Formula (2B) in the copolymer of the present invention containing the repeating units represented by the Formula (1A), Formula (1B) and Formula (1C) is not particularly limited, but is normally at least 0.01, or preferably at least 0.1, or more preferably at least 0.2. Also, it is normally 100 or less, or preferably 10 or less, or more preferably 5 or less.

The sequence arrangement of the repeating units represented by the Formula (2A) and Formula (2B) in the copolymer of the present invention containing the repeating units represented by the Formula (1A), Formula (1B) and Formula (1C) may be either alternating, block or random. That is, the copolymer of the present invention may be an alternating copolymer, a block copolymer or a random copolymer. It may also be a copolymer having a structure intermediate between these structures, such as a random copolymer with block properties. Dendrimers and copolymers having branches off the main strand and three or more termini are also included. Of these, a block copolymer or random copolymer is preferred for ease of synthesis and to further reduce regularity, while a random copolymer is more preferred from the standpoint of improving the solubility of the copolymer and improving the storage stability of an ink made by dissolving the copolymer.

Preferred specific examples of the copolymer of the present invention containing the repeating units represented by the Formula (1A), Formula (1B) and Formula (1C) are shown below. However, the copolymer of the present invention is not limited to these examples.

[Chemical Formula 30]

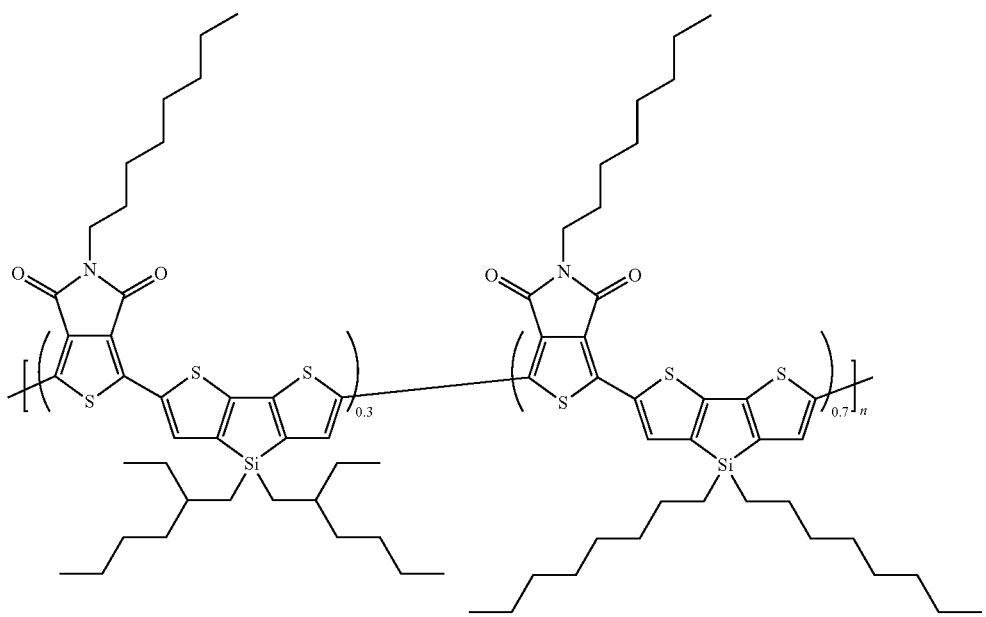

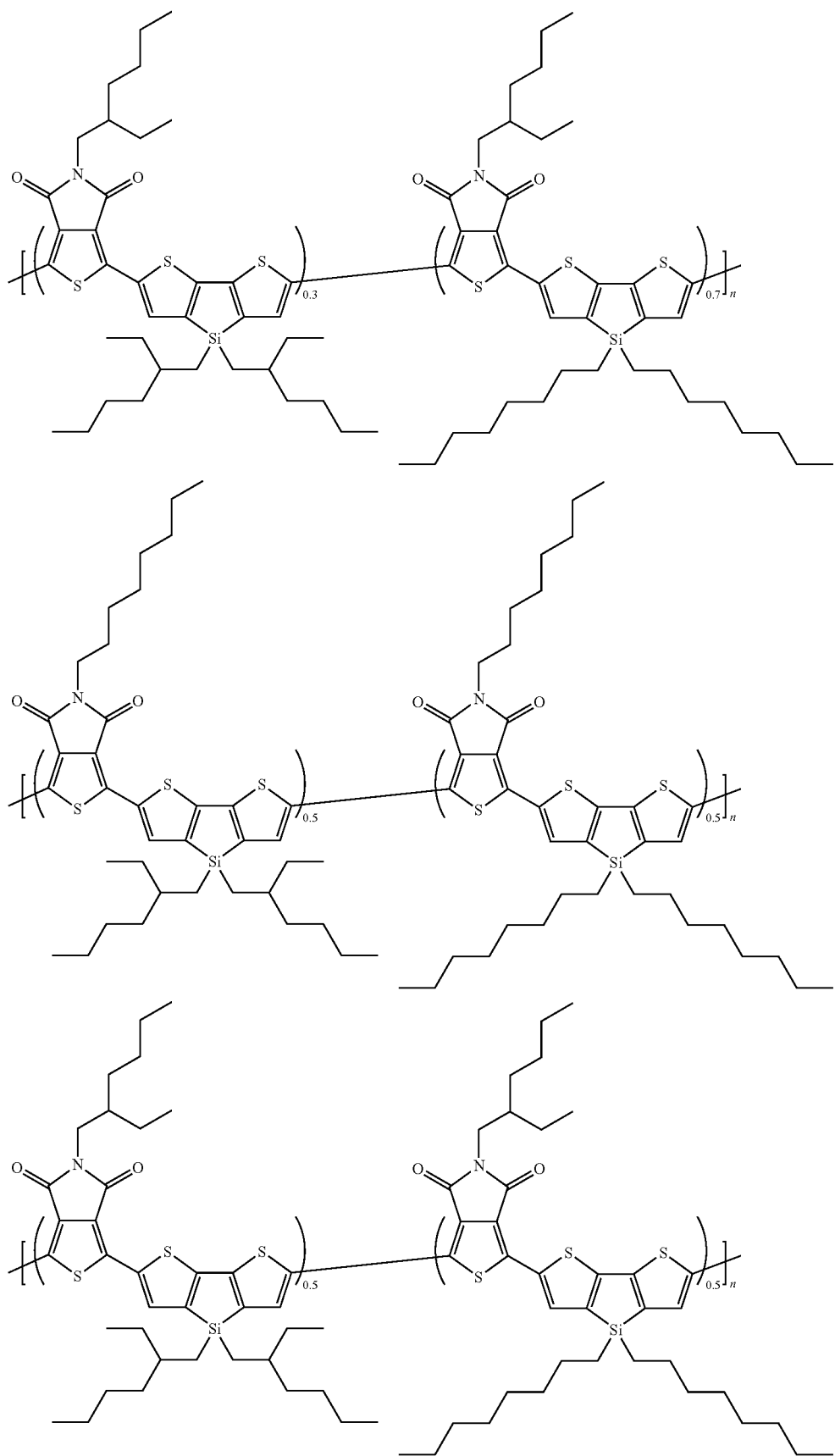

-continued
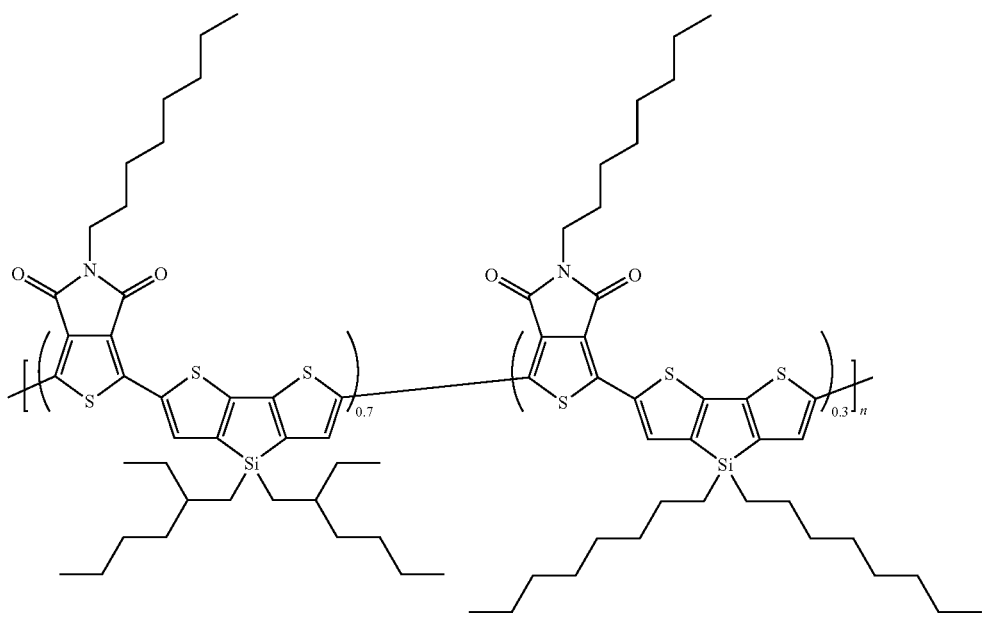
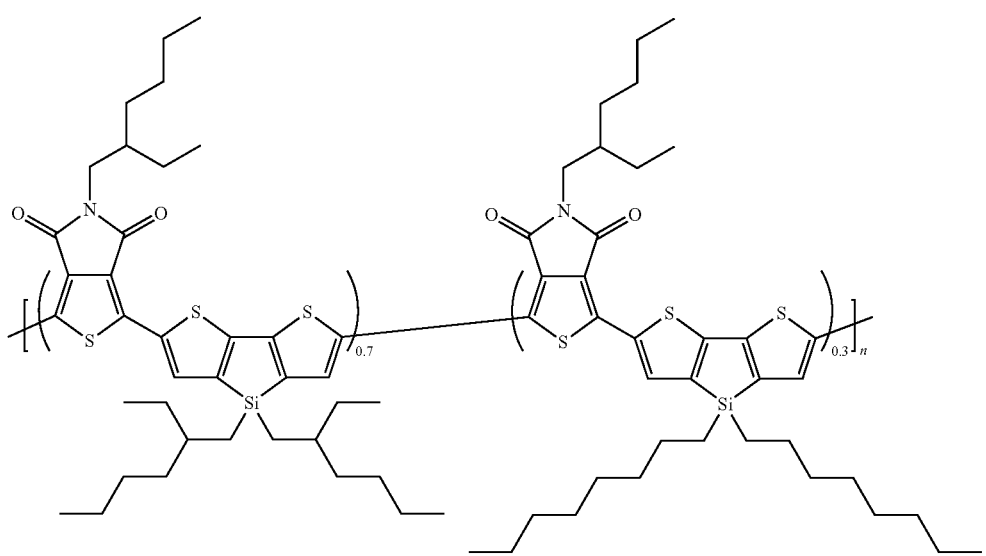

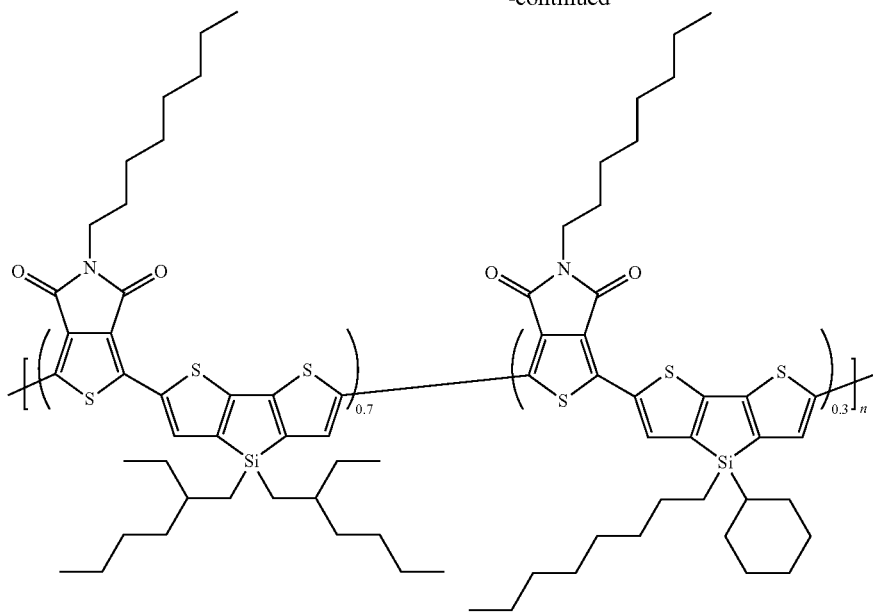
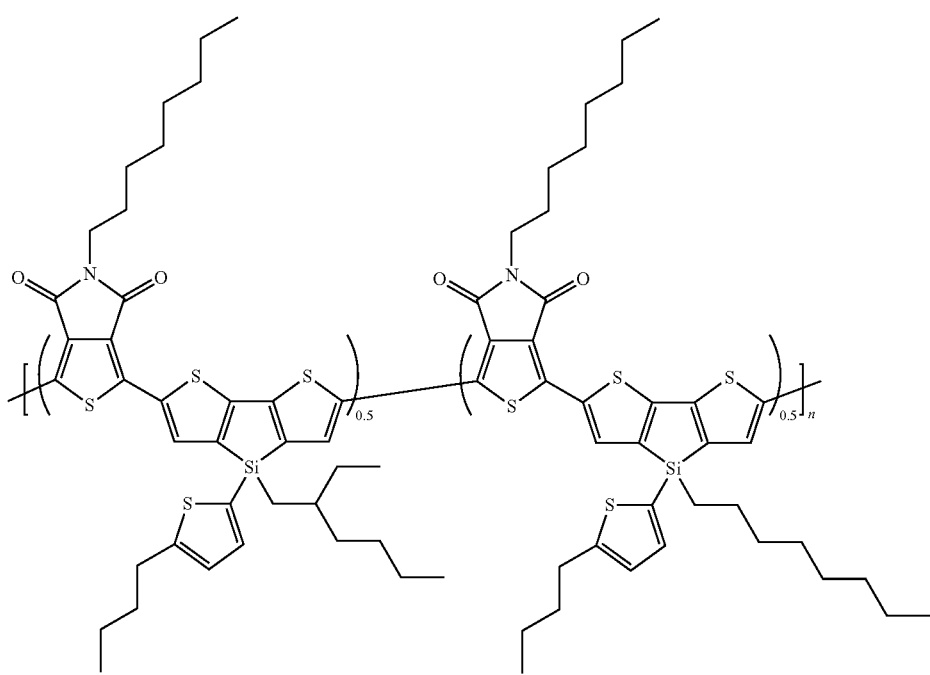

[Chemical Formula 31]
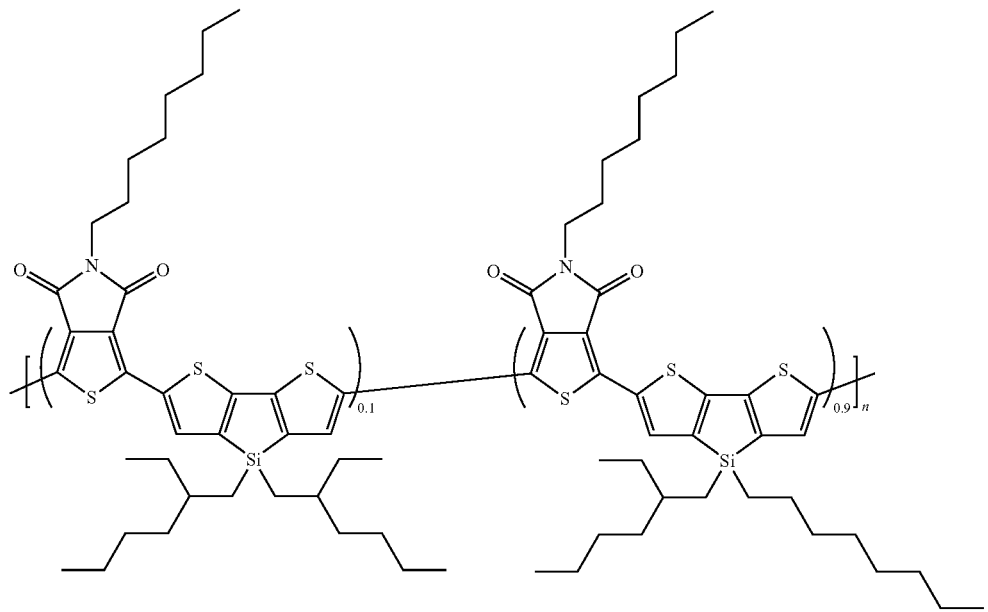
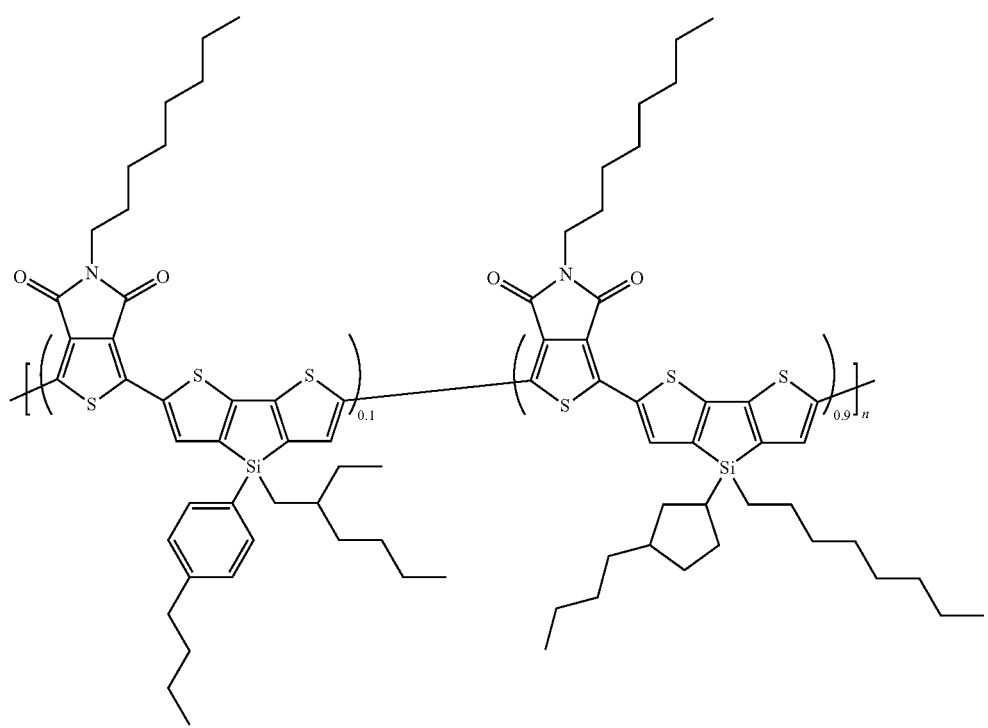

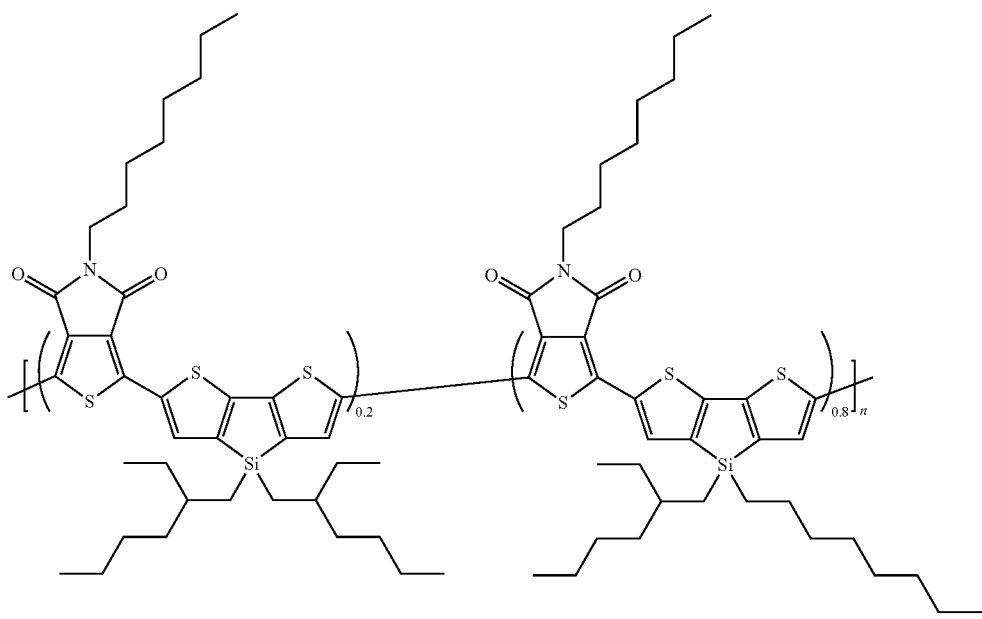
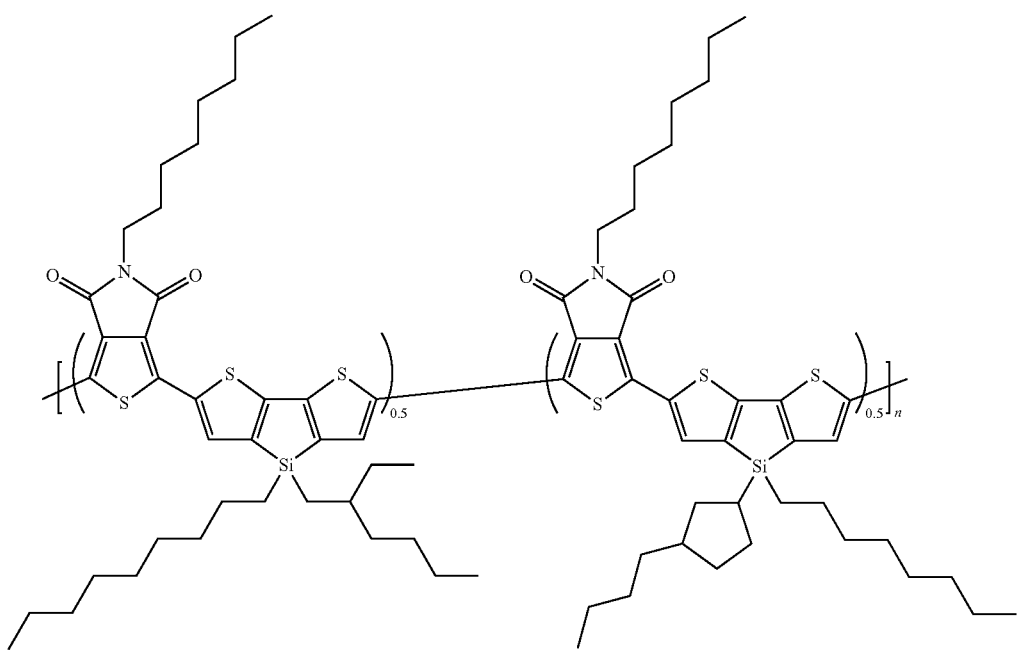

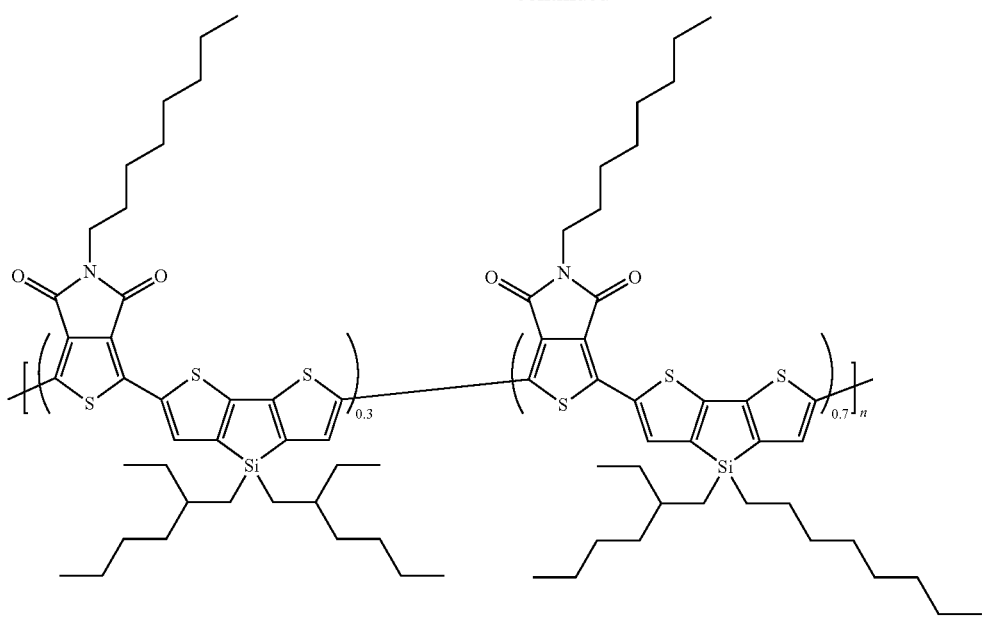
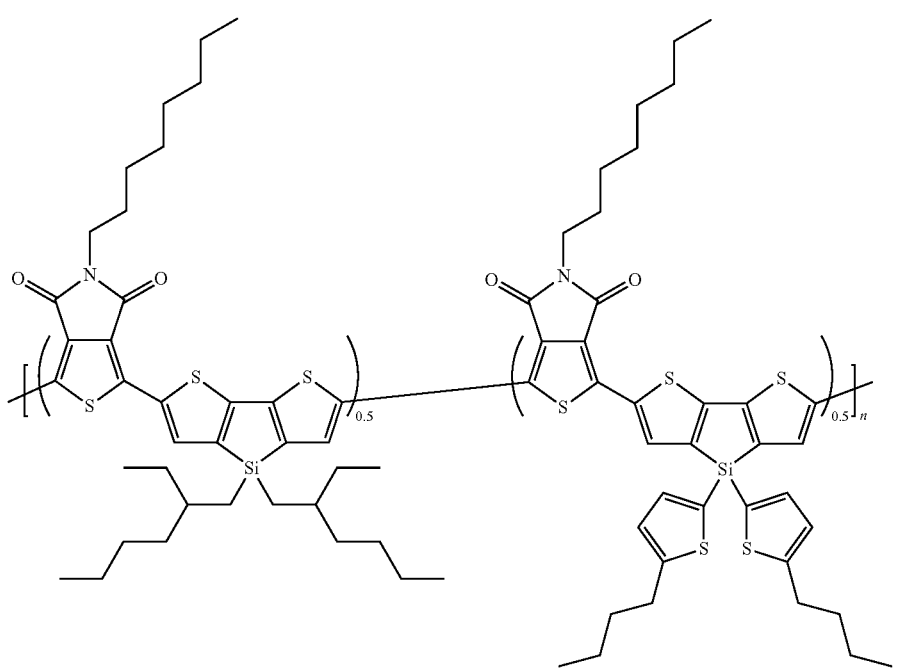

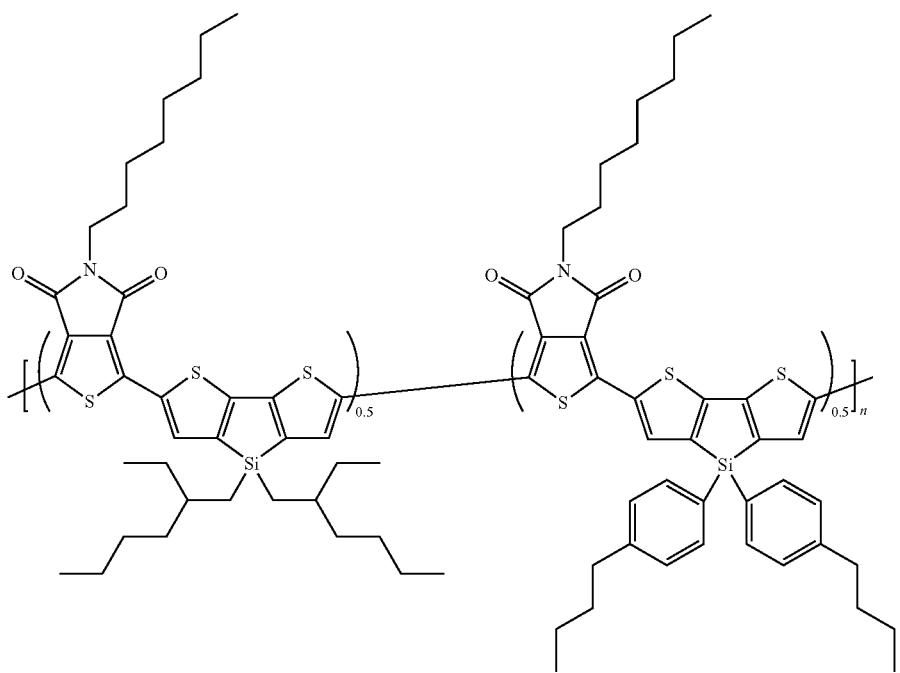
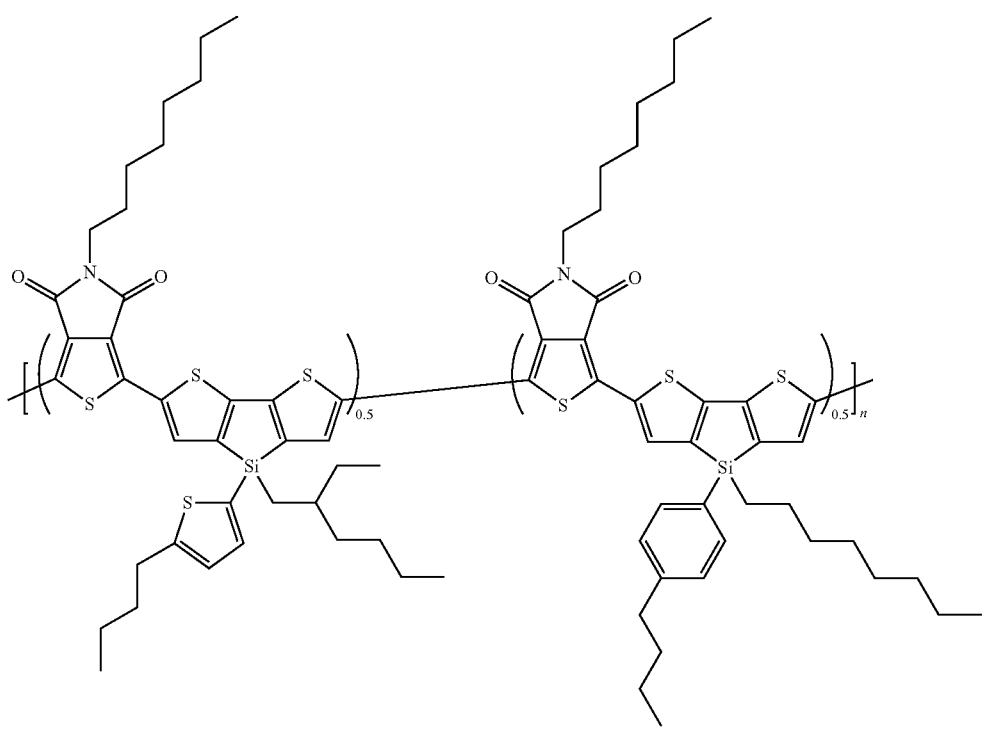

[Chemical Formula 32]
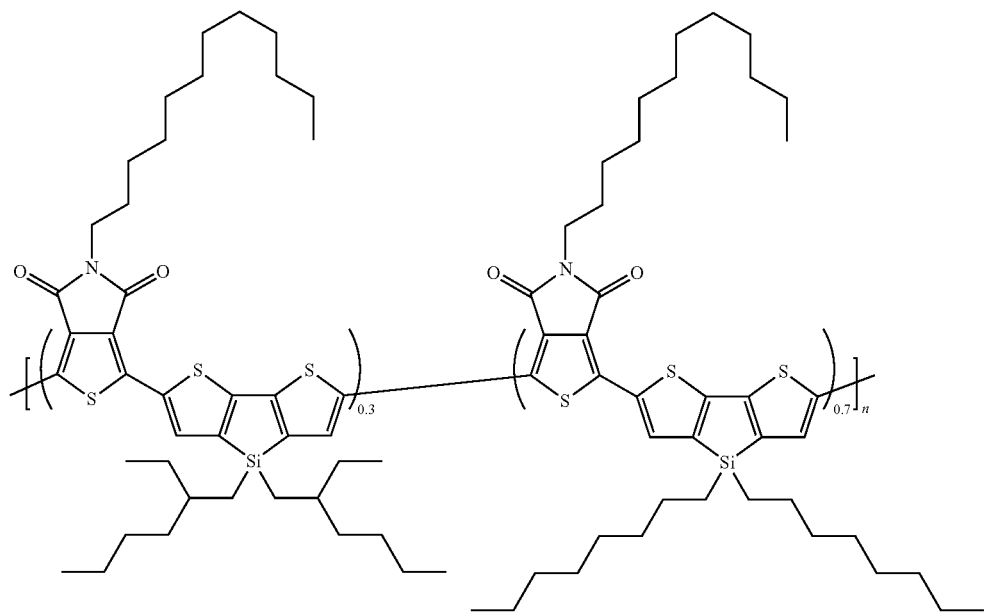
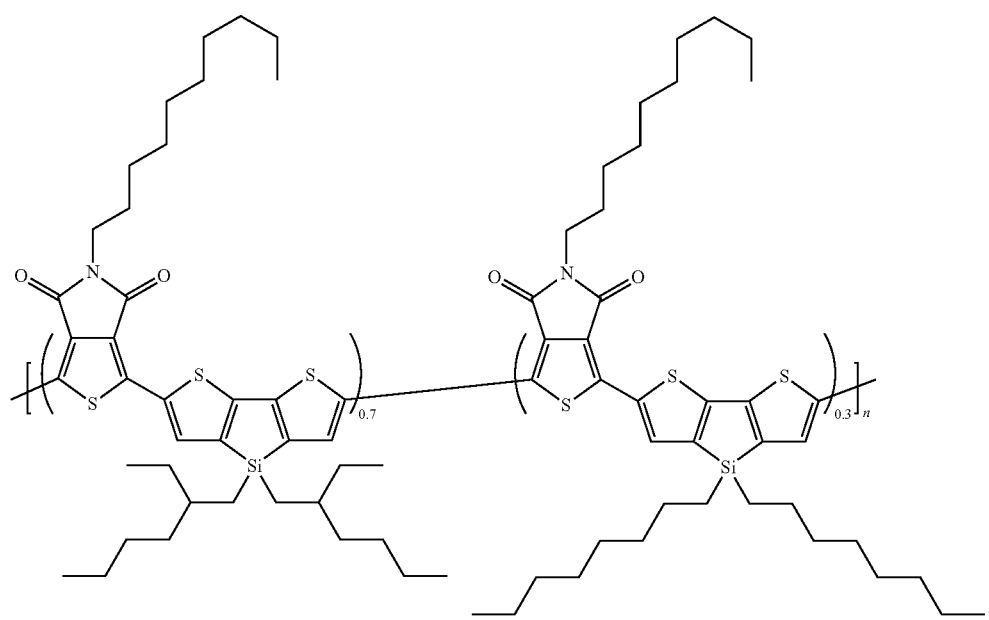

101
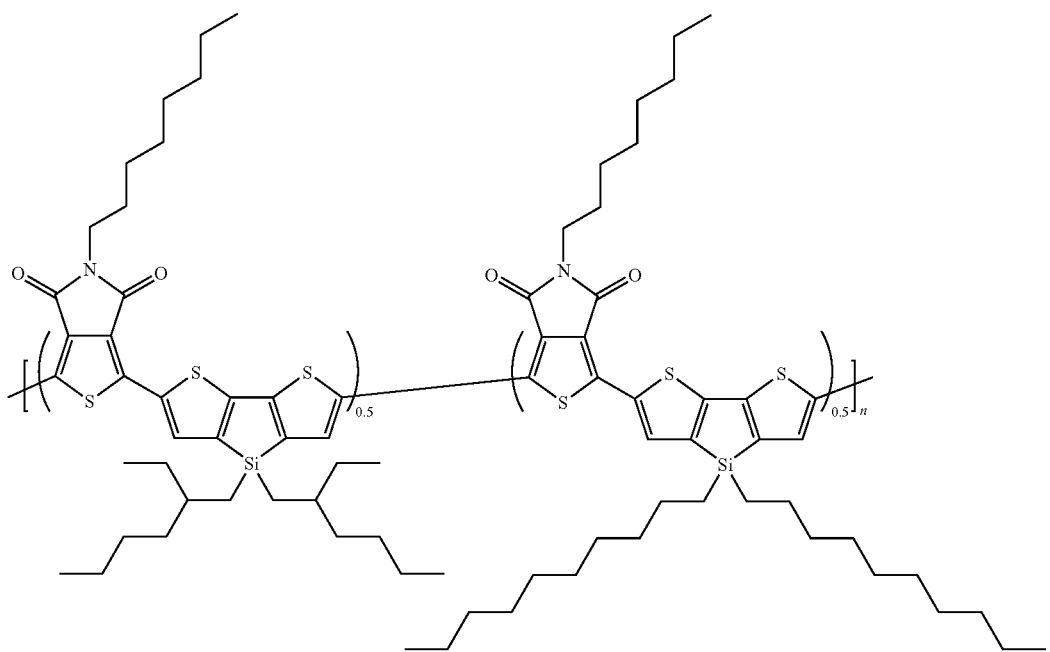
102
-continued
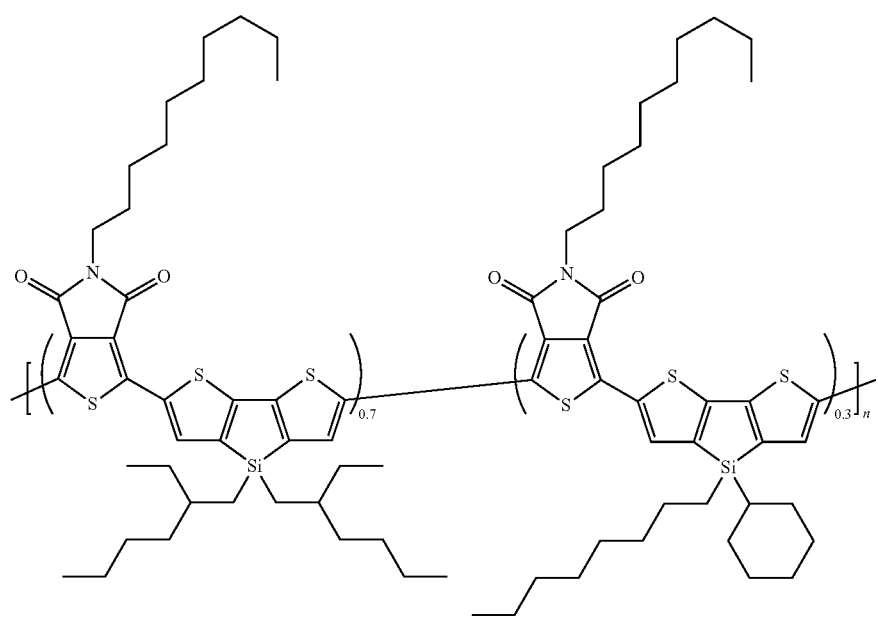

103
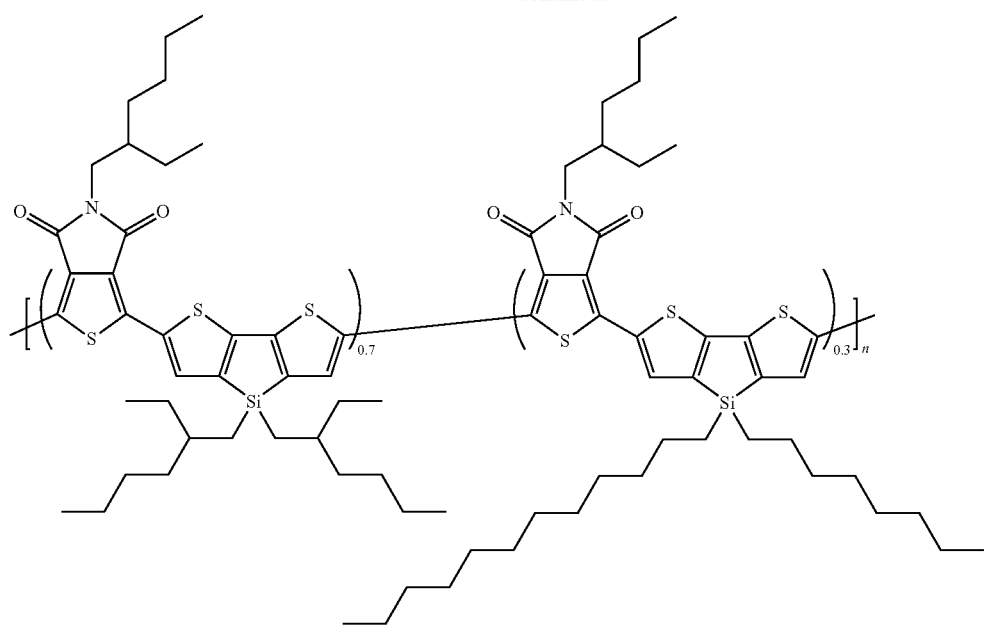
104
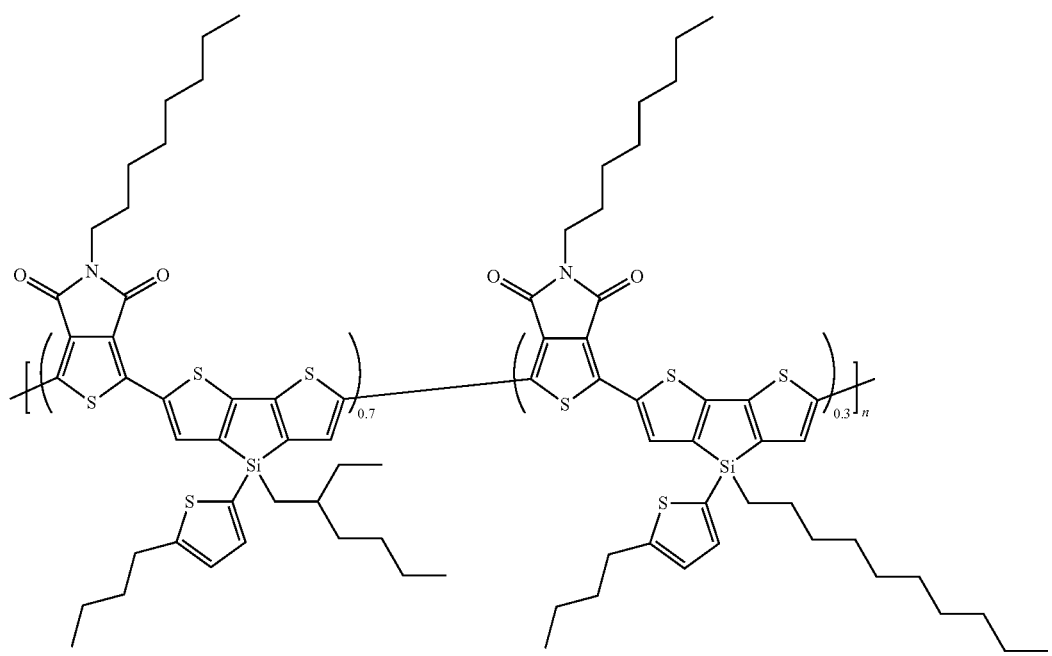

[Chemical Formula 33]
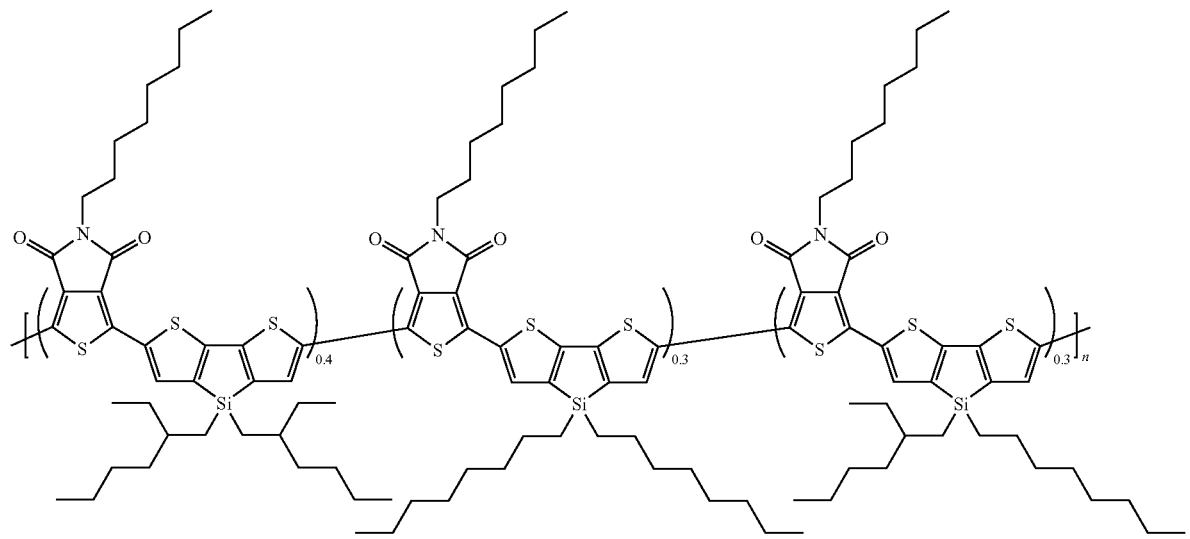
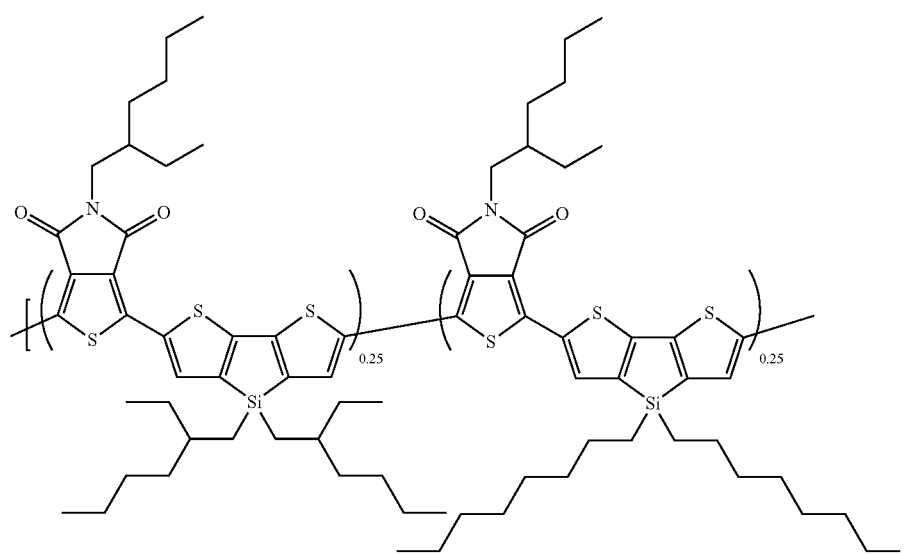

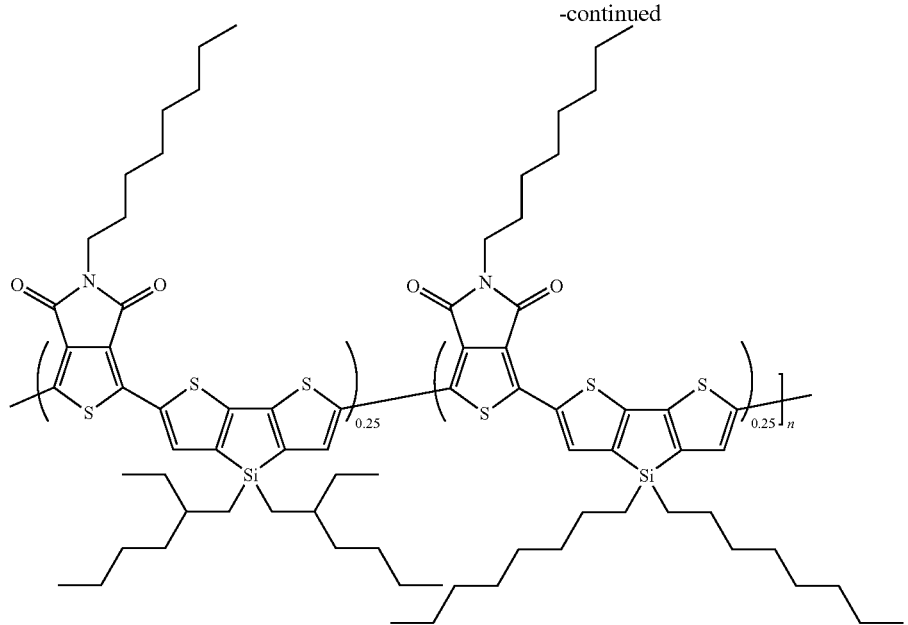

The weight-average molecular weight (Mw) of the copolymer of the present invention (polystyrene conversion) is normally at least $2.0×10^4$, or preferably at least $3.0×10^4$, or more preferably at least $4.0×10^4$, or still more preferably at least $5.0×10^4$, or yet more preferably at least $7.0×10^4$, or especially at least $1.0×10^5$. Moreover, it is preferably $1.0×10^7$ or less, or more preferably $1.0×10^6$ or less, or still more preferably $5.0×10^5$ or less. A weight-average molecular weight within this range is desirable from the standpoint of increasing the light absorption wavelengths, for achieving a higher absorbancy, for achieving a higher carrier mobility, and from the standpoint of solubility to an organic solvent.

The number-average molecular weight (Mn) of the copolymer of the present invention (polystyrene conversion) is normally at least $1.0×10^3$, or preferably at least $3.0×10^3$, or more preferably at least $5.0×10^3$, or still more preferably at least $1.0×10^4$, or yet more preferably at least $1.5×10^4$, or especially at least $2.0×10^4$, or most preferably at least $2.5×10^4$. Moreover, it is preferably $1.0×10^8$ or less, or more preferably $1.0×10^7$ or less, or still more preferably $9.0×10^6$ or less, or yet more preferably $5.0×10^5$ or less, or especially preferably $2.0×10^5$ or less, or most preferably $1.0×10^5$ or less. A number-average molecular weight within this range is desirable from the standpoint of increasing the light absorption wavelengths, and for achieving a higher absorbancy.

The molecular weight distribution of the copolymer of the present invention (PDI: weight-average molecular weight/ number-average molecular weight (Mw/Mn)) is normally at least 1.0, or preferably at least 1.1, or more preferably at least 1.2, or still more preferably at least 1.3. Moreover, it is preferably 20.0 or less, or more preferably 15.0 or less, or still more preferably 10.0 or less. A molecular weight distribution within this range is desirable because within this range, the solubility of the copolymer may be within a range suited to coating.

The weight-average molecular weight, the number-average molecular weight and the molecular weight distribution of the copolymer of the present invention (polystyrene conversion) can be determined by gel permeation chromatography (GPC). Specifically, it can be measured using Polymer Laboratories columns for GPC (PLgel MIXED-B 10 μm, inner diameter 7.5 mm, length 30 cm) connected two in a series, with a LC-10AT pump (Shimadzu Corporation), a CTO-10A oven (Shimadzu Corporation), and a refractive index detector (Shimadzu Corporation: RID-10A) and a UV-vis detector (Shimadzu Corporation: SPD-10A) as the detecting equipment. For the measurement method, the copolymer to be measured (1 mg) is dissolved in chloroform (200 mg), and 1 μL of the resulting solution is injected into a column. Using chloroform as the mobile phase, measurement is performed at a flow rate of 1.0 mL/min. LC-Solution (Shimadzu Corporation) is used for analysis.

The light absorption maximum wavelength ($\lambda_{max}$) of the copolymer of the present invention is normally 470 nm or more, or preferably 480 or more, and is normally 1200 nm or less, or preferably 1000 nm or less, or more preferably 900 nm or less. The half-value width of the absorption maximum wavelength on the longest wavelength side in the range of 350 nm to 850 nm is normally at least 10 nm, or preferably at least 20 nm, and is normally 300 nm or less. When the copolymer of the present invention is used for a photovoltaics application, the absorption wavelength range of the copolymer preferably matches the wavelength range of sunlight as closely as possible.

The solubility of the copolymer of the present invention is not particularly limited, but its solubility in chlorobenzene at 25° C. is normally at least 0.1 mass %, or preferably at least 0.5 mass %, or more preferably at least 1 mass %, and is normally 30 mass % or less, or preferably 20 mass % or less. High solubility is preferable for forming a thicker film by coating.

The copolymer of the present invention is preferably one in which appropriate intermolecular interactions occur. In this Description, intermolecular interactions means that the distance between polymer chains is reduced by interactions such as pi-pi stacking and the like between molecules. Stronger interactions tend to produce greater mobility and/or crystallinity and are therefore considered preferable for a semiconductor material. That is, it is thought that because electron transfer between molecules is more likely to occur in a copolymer with intermolecular interactions, the holes generated in an active layer at the boundary of a p-type semiconductor compound and an n-type semiconductor compound can be transported efficiently to the electrode (anode) when, for example, the copolymer of the present invention is used in the active layer in a photoelectric conversion element.

One method of measuring crystallinity is by X-ray diffraction (XRD). Having crystallinity in this Description means that the X-ray diffraction spectrum obtained by XRD measurement has a diffraction peak. Having crystallinity here is thought to mean that the molecules align with each other to form layered structures, which is desirable because it may make it possible to increase the film thickness of the active layer to be described later. XRD measurement may be performed based on the methods described in known literature (A Practical Guide for X-ray Crystal Structure Analysis (Applied Physics Library Vol. 4)).

The hole mobility of the copolymer of the present invention (sometimes called hole mobility) is normally at least $1.0 \times 10^{-7}$ cm$^2$/Vs, or preferably at least $1.0 \times 10^{-6}$ cm$^2$/Vs, or more preferably at least $1.0 \times 10^{-5}$ cm$^2$/Vs, or still more preferably at least $1.0 \times 10^{-4}$ cm$^2$/Vs. Also, the hole mobility of the copolymer of the present invention is normally $1.0 \times 10^{4}$ cm$^2$/Vs or less, or preferably $1.0 \times 10^{3}$ cm$^2$/Vs or less, or more preferably $1.0 \times 10^{2}$ cm$^2$/Vs or less, or especially preferably $1.0 \times 10$ cm$^2$/Vs or less. With a hole mobility within this range, the copolymer of the present invention can be used favorably as a semiconductor material. Further, the balance between the mobility of the n-type semiconductor compound and the mobility of the p-type semiconductor compound is important for obtaining high conversion efficiency in a photoelectric conversion element. The hole mobility of the copolymer of the present invention is preferably within this range from the standpoint of bringing the hole mobility of the copolymer of the present invention closer to the electron mobility of the n-type semiconductor compound when the copolymer of the present invention is used as a p-type semiconductor compound in a photoelectric conversion element. One way of measuring hole mobility is by the FET method. The FET method may be carried out by methods described in known literature (Japanese Patent Application Laid-Open Publication No. 2010-045186).

The copolymer of the present invention preferably has good storage stability in solution. Good storage stability means that it is unlikely to aggregate in solution. More specifically, when 2 mg of the copolymer of the present invention is placed in a 2 mL screw-top vial, heat dissolved in o-xylene to a concentration of 1.5 mass % and cooled to room temperature, the copolymer preferably does not gel within 5 minutes or more after the start of cooling, and more preferably does not gel within 1 hour or more.

The copolymer of the present invention preferably contains as few impurities as possible. In particularly, if a transition metal catalyst such as palladium and copper remain in the copolymer they may inhibit charge transfer by causing exciton traps due to the heavy atom effect of the transition metal, thereby reducing the photoelectric conversion efficiency when the copolymer of the present invention is used in a photoelectric conversion element. The concentration of transition metal catalysts is normally 1,000 ppm or less, or preferably 500 ppm or less, or more preferably 100 ppm or less per 1 g of copolymer. On the other hand, it is normally more than 0 ppm, or may be at least 1 ppm, or may be at least 3 ppm.

In the copolymer including repeating units represented by Formulae (1A) and (1B) or the copolymer including repeating units represented by Formulae (1A), (1B), and (1C) of the present invention, the residual amount of the constituent atoms of terminal residues (for example, X and Y in Formulae (3A) and (3C) described below in the case of the copolymer including the repeating units represented by Formulae (1A) and (1C), and X and Y in Formulae (3A) to (3B) described below in the case of the copolymer including the repeating units represented by Formulae (1A), (1B) and (1C)) is not particularly limited, but is normally 6,000 ppm or less or preferably 4,000 ppm or less or more preferably 3,000 ppm or less or still more preferably 2,000 ppm or less or yet more preferably 1,000 ppm or less or especially preferably 500 ppm or less or most preferably 200 ppm or less per 1 g of the copolymer. On the other hand, it is normally more than 0 ppm, or preferably at least 1 ppm, or more preferably at least 3 ppm.

In particular, the residual amount of Sn atoms in the copolymer of the present invention is normally 5,000 ppm or less, or preferably 4,000 ppm or less, or more preferably 2,500 ppm or less, or still more preferably 1,000 ppm or less, or yet more preferably 750 ppm or less, or especially preferably 500 ppm or less, or most preferably 100 ppm or less per 1 g of the copolymer. On the other hand, it is normally more than 0 ppm, or preferably at least 1 ppm, or more preferably at least 3 ppm. A residual amount of 5,000 ppm or less of Sn atoms is desirable because it means that there are fewer alkylstannyl groups and the like which are vulnerable to thermal decomposition, resulting in high performance from the standpoint of stability.

Further, the residual amount of halogen atoms in the copolymer of the present invention is normally 5,000 ppm or less, or preferably 4,000 ppm or less, or more preferably 2,500 ppm or less, or still more preferably 1,000 ppm or less, or yet more preferably 750 ppm or less, or especially preferably 500 ppm or less, or most preferably 100 ppm or less per 1 g of the copolymer. On the other hand, it is normally more than 0 ppm, or preferably at least 1 ppm, or more preferably at least 3 ppm. A residual amount of 5,000 ppm or less of halogen atoms is desirable because it tends to improve the photoelectrical conversion efficiency, durability and other properties of the copolymer.

The residual amount of atoms constituting terminal residues in the copolymer (for example, X and Y in Formulae (3A) and (3B) described below or X and Y in Formulae (3A) to (3C) described below) is determined by measuring the element content. Elemental analysis of the copolymers can be performed by ICP mass spectrometry for, for example, Pd and Sn, and also by ICP mass spectrometry for boron ions (Br$^-$) and iodine ions (I$^-$).

ICP mass spectrometry can be performed by the methods described in known literature ("Inductively Coupled Plasma Mass Spectrometry" (Gakkai Shuppan Center)). Specifically, Pd and Sn can be measured subjecting a sample to wet decomposition, and assaying the Pd and Sn in the decomposition liquid by a calibration curve method using an ICP mass spectrometer (Agilent Technologies, Inc. 7500ce ICP mass spectrometer). Meanwhile, Br$^-$ and I$^-$ can be measured by burning a sample in a sample burner (MITSUBISHI CHEMICAL ANALYTECH CO., LTD. QF-02 sample burner), absorbing the combustion gas with an alkali absorbing solution containing a reducing agent, and subsequently assaying the Br$^-$ and I$^-$ in the absorbing solution by a calibration curve method using an ICP mass spectrometer (Agilent Technologies, Inc. 7500ce ICP mass spectrometer).

<2. Method of Producing Copolymer of the Present Invention>

The method of producing the copolymer of the present invention is not particularly limited, and it can be produced by publicly known methods using a compound having a dioxopyrrole condensed ring and a compound having a dithieno condensed ring for example. An example of a preferred method of producing the copolymer including the repeating units represented by Formulae (1A) and (1B) is a method of polymerizing the compound represented by General Formula (3A) below and the compound represented by General Formula (3B) below in the presence of a suitable catalyst as necessary. An example of a preferred method of producing the copolymer including the repeating units represented by Formulae (1A), (1B), and (1C) is a method of polymerizing the compound represented by General Formula (3A) below, the compound represented by General Formula (3B) below, and the compound represented by General Formula (3C) below in the presence of a suitable catalyst as necessary.

[Chemical Formula 34]

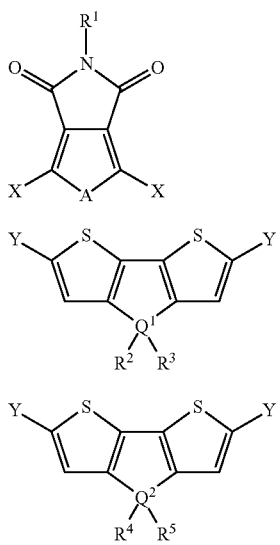

(3A)

(3B)

(3C)

In Formula (3A), $R^1$ and A are defined as in Formula (1A). In Formula (3B), $R^2$, $R^3$ and $Q^1$ are defined as in Formula (1B). In Formula (3C), $R^4$, $R^5$ and $Q^2$ are defined as in Formula (1C).

In Formulae (3A) to (3C), X and Y are selected appropriate according to the type of polymerization reaction. For example, the copolymer of the present invention can be manufactured by a polymerization reaction using a coupling reaction. Reactions which can be used include the Suzuki-Miyaura cross-coupling reaction method, the Stille coupling reaction method, the Yamamoto coupling reaction method, the Grignard reaction method, the Heck reaction method, the Sonogashira reaction method, reaction methods using $FeCl_3$ and other oxidizing agents, methods using electrochemical oxidation reactions, and reaction methods by decomposition of intermediate compounds having suitable leaving groups. Of these, the Suzuki-Miyaura cross-coupling reaction method, Stille coupling reaction method, Yamamoto coupling reaction method and Grignard reaction method are preferred for ease of structural control. In particular, the Suzuki-Miyaura cross-coupling reaction method, Stille coupling reaction method and Grignard reaction method are preferred from the standpoint of availability of materials and simplicity of the reaction operations. These reactions can be carried out in accordance with the methods described in known literature, such as "CROSS-COUPLING REACTIONS: BASIC CHEMISTRY AND INDUSTRIAL APPLICATIONS" (CMC Publishing CO., LTD.), "Yuukigousei no tame no seni-kinzokusyokubaihannou (Transition Metal Catalyst Reactions for Organic Synthesis)" (Tsuji Jiro, The Society of Synthetic Organic Chemistry, Japan), and "Yuukigousei no tame no syokubaihannou (Catalyst Reactions for Organic Synthesis) 103" (Hiyama Tamejiro, Tokyo Kagaku Dojin Co., Ltd.) and the like.

X and Y may each independently be, for example, a halogen atom, alkylstannyl group, alkylsulfo group, arylsulfo group, arylalkylsulfo group, boric acid ester residue, sulfonium methyl group, phosphonium methyl group, phosphonate methyl group, monohalogenated methyl group, boric acid residue (—$B(OH)_2$), formyl group, silyl group, alkenyl group or alkynyl group.

A halogen atom is preferably a bromine atom or iodine atom. Examples of alkenyl groups include C2-12 alkenyl groups for example.

Examples of boric acid ester residues include the groups represented by the following formulae for example. In the formulae below, Me represents a methyl group and Et represents an ethyl group.

[Chemical Formula 35]

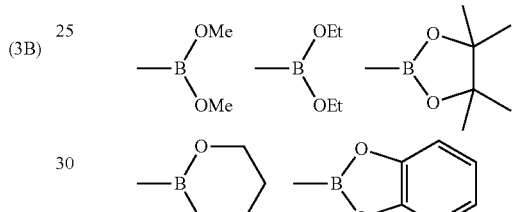

Examples of alkylstannyl groups include the groups represented by the following formulae. In the formula below, Me represents a methyl group, and Bu represents an n-butyl group.

[Chemical Formula 36]

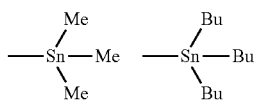

For purposes of synthesizing the compounds represented by Formulae (3A) to (3C) and for ease of the reaction, one of X and Y is preferably a halogen atom, and the other is preferably an alkylstannyl group, boric acid ester residue, or boric acid residue (—$B(OH)_2$).

The polymerization reaction may be performed by known methods. For example, when X or Y is an alkylstannyl group, the reaction may be performed under the conditions for a known Stille coupling reaction. When X or Y is a boric acid ester residue or boric acid residue, on the other hand, the reaction may be performed under the conditions for a known Suzuki-Miyaura coupling reaction. When X or Y is a silyl group, the reaction may be performed under the conditions for a known Hiyama coupling reaction. A combination of a transition metal such as palladium and a ligand (such as a triphenylphosphine or other phosphine ligand) for example may be used as the catalyst in the coupling reaction.

The method of producing the copolymer of the present invention by using the Stille coupling reaction method is discussed below. When using the Stille coupling reaction method, X is preferably a halogen atom while Y is an alkylstannyl group, or X is preferably an alkylstannyl group while Y is a halogen atom in Formulae (3A) to (3C).

When manufacturing a copolymer containing repeating units represented by Formula (1A) and Formula (1B), the ratio of the amount of the compound represented by Formula (3B) to the amount of the compound represented by Formula (3A) used in the polymerization reaction (3B/3A) is normally 0.90 or more or preferably 0.95 or more (molar conversion), and is normally 1.3 or less or preferably 1.2 or less. When manufacturing a copolymer containing the repeating units represented by Formula (1A), Formula (1B), and Formula (1C), on the other hand, the ratio of the total of the amount of the compound represented by Formula (3B) and the amount of the compound represented by Formula (3C) to the amount of the compound represented by Formula (3A) used in the polymerization reaction ((3B+3C)/3A) is preferably within the range described above. It is desirable that the ratio be in such a range from the standpoint that a polymeric product can be obtained with a higher yield.

When manufacturing a copolymer containing the repeating units represented by Formula (1A), Formula (1B), and Formula (1C), the ratio of the amount of the compound represented by Formula (3C) to the amount of the compound represented by Formula (3B) (3C/3B) is not particularly limited, and can be set appropriately according to the object, but is normally at least 0.01, or preferably at least 0.1, or more preferably at least 0.5 (molar conversion).

When it is desirable for the copolymer of the present invention to be highly pure, the polymerization reaction is preferably performed after the monomers (compounds represented by Formulae (3A) to (3C)) have been purified prior to polymerization. Examples of purification methods include distillation, sublimation, column chromatography and recrystallization.

When the copolymer of the present invention is to be used as a material of an organic photoelectric conversion element for example, the copolymer is preferably highly pure because the element characteristics can be improved with a high degree of purity. When the copolymer of the present invention is used as a material of an organic photoelectric conversion element, the purity of each compound represented by Formulae (3A) to (3C) is normally at least 90%, or preferably at least 95%.

Examples of catalysts for use in promoting polymerization in the polymerization reaction include transition metal catalysts and the like. The transition metal catalyst can be selected according to the type of polymerization. Examples of transition metal catalysts include homogeneous transition metal catalysts and heterogeneous transition metal catalysts.

The homogeneous transition metal catalyst is preferably one that dissolves thoroughly in the solvent used in the polymerization reaction. Desirable examples include late transition metal complex catalysts, especially those containing palladium, nickel, iron, or copper. Specific examples include a palladium catalyst such as tetrakis(triphenylphosphine)palladium $(Pd(PPh_3)_4)$, tris(dibenzylideneacetone)dipalladium $(Pd_2(dba)_3)$ or another 0-valent palladium catalyst; or palladium (Pd) catalyst such as bis(triphenylphosphine)palladium chloride $(PdCl_2(PPh_3)_2)$, palladium acetate or another bivalent palladium catalyst or the like; a nickel catalyst such as $Ni(dppp)Cl_2$ or $Ni(dppe)Cl_2$; an iron catalyst such as iron chloride; or a copper catalyst such as copper iodide or the like. dba here represents dibenzylideneacetone, dppp represents 1,2-bis(diphenylphosphino)propane, and dppe represents 1,2-bis(diphenylphosphino)ethane.

As a 0-valent Pd catalyst, specific examples include $Pd(PPh_3)_4$, $Pd(P(o-tolyl)_3)_4$, $Pd(PCy_3)_2$, $Pd_2(dba)_3$, $PdCl_2$ $(PPh_3)_2$ and the like. When a bivalent Pd catalyst such as $PdCl_2(PPh_3)_2$ or palladium acetate is used, it is preferably used in combination with an organic ligand such as $PPh_3$ or $P(o-tolyl)_3$. Ph here represents a phenyl group, Cy represents a cyclohexyl group, and o-tolyl represents a 2-tolyl group.

A heterogeneous transition metal catalyst may be a catalyst obtained by supporting a homogeneous transition metal catalyst such as those described above on a carrier. Preferred examples of transition metals contained in heterogeneous transition metal catalysts are late transition metals such as palladium, nickel, iron and copper. The organic ligand of the heterogeneous transition metal catalyst may be similar to those described with respect to the homogeneous transition metal catalyst. An organic catalyst described in known literature (Strem Co., "Heterogeneous Catalysts" (2011)) can also be used. Examples of carriers include metals, nanocolloids, nanoparticles, magnetic compounds, metal oxides, porous materials, clays, polymers such as urea resin for example, and dendrimers and the like. Specific examples of porous materials include microporous materials, mesoporous materials, active carbon, silica gel, alumina, zeolite and the like. In particular, it is desirable to use a heterogeneous transition metal complex catalyst carried on a polymer carrier because this makes it easy to recover the heterogeneous transition metal complex catalyst. A porous polymer is desirable for promoting the reaction.

It is desirable to use two or more kinds of transition metal complex catalysts in the polymerization reaction because this yields a copolymer with a high molecular weight. For example, two or more kinds of homogeneous transition metal complexes may be used, or two or more kinds of heterogeneous transition metal complexes may be used, or a combination of a homogeneous transition metal complex and a heterogeneous transition metal complex may be used. It is desirable that at least one of these two or more kinds of transition metal complex catalysts be a heterogeneous metal complex catalyst because this allows the monomers to be rapidly converted to oligomers under coupling reaction conditions. Because the speed of a polymerization reaction catalyzed by a heterogeneous metal catalyst tends to fall as the monomers are converted to oligomers, induction of polymers from oligomers is preferably performed with a homogeneous metal catalyst in order to obtain a high-molecular-weight polymer. From this perspective, preferably at least one of the two or more kinds of transition metal complex catalysts is a heterogeneous metal complex catalyst, and at least one is a homogeneous metal complex catalyst.

For the transition metal complex, normally at least $1 \times 10^{-4}$ mol %, or preferably at least $1 \times 10^{-3}$ mol %, or more preferably at least $1 \times 10^{-2}$ mol %, and normally $1 \times 10^{2}$ mol % or less, or preferably 5 mol % or less of transition metal complex is used relative to the total amount of the compound represented by Formulae (3A) and (3B) for producing the copolymer including the repeating units represented by Formulae (1A) and (1B), or relative to the total amount of the compound represented by Formulae (3A) to (3C) for producing the copolymer including the repeating units represented by Formulae (1A), (1B) and (1B). An amount of catalyst within this range is desirable from the standpoint of low cost and high efficiency, and for obtaining a copolymer with a higher molecular weight.

When using a transition metal catalyst, an alkali, co-catalyst or phase transfer catalyst may also be used in combination.

Examples of alkalis include potassium carbonate, sodium carbonate, cesium carbonate and other inorganic bases and triethylamine and other organic bases, and the like.

Examples of co-catalysts include cesium fluoride, copper oxide, copper halide or other inorganic salts. For the co-catalyst, normally at least $1\times10^{-4}$ mol %, or preferably at least $1\times10^{-3}$ mol %, or more preferably at least $1\times10^{-2}$ mol %, and normally $1\times10^{4}$ mol % or less, or preferably $1\times10^{3}$ mol % or less, or more preferably $1.5\times10^{2}$ mol % or less of co-catalystist is used relative to the total amount of the compound represented by Formulae (3A) and (3B) for producing the copolymer including the repeating units represented by Formulae (1A) and (1B), or relative to the total amount of the compound represented by Formulae (3A) to (3C) for producing the copolymer including the repeating units represented by Formulae (1A), (1B), and (1C). An amount of co-catalyst within this range is desirable for obtaining a copolymer with a lower cost and higher yield.

Examples of phase transfer catalysts include tetraethyl ammonium hydroxide, Aliquat 336 (Aldrich) and other quaternary ammonium salts, and the like. The amount of the phase transfer catalyst that is used relative to the total of the amounts of the compounds represented by Formula (3A) and Formula (3B) when manufacturing a copolymer containing the repeating units represented by Formula (1A) and Formula (1B), or the amount of the phase transfer catalyst that is used relative to the total of the amounts of the compound represented by Formulae (3A) to (3C) when manufacturing a copolymer containing the repeating units represented by Formula (1A), Formula (1B), and Formula (1C), is normally at least $1\times10^{-4}$ mol %, or preferably at least $1\times10^{-3}$ mol %, or more preferably at least $1\times10^{-2}$ mol %, and is normally 5 mol % or less, or preferably 3 mol % or less. An amount of phase transfer catalyst within this range is desirable for obtaining a copolymer with a lower cost and higher yield.

Examples of solvent used in the polymerization reaction include saturated hydrocarbons such as pentane, hexane, heptane, octane or cyclohexane; aromatic hydrocarbons such as benzene, toluene, ethylbenzene or xylene; halogenated aromatic hydrocarbons such as chlorobenzene, dichlorobenzene or trichlorobenzene; alcohols such as methanol, ethanol, propanol, isopropanol, butanol or t-butyl alcohol; water; ethers such as dimethyl ether, diethyl ether, methyl-t-butyl ether, tetrahydrofuran, tetrahydropyran or dioxane; and aprotic polar organic solvents such as DMF and the like. One kind of solvent may be used, or two or more may be combined.

For the solvent, normally at least $1\times10^{-2}$ mL, or preferably at least $1\times10^{-1}$ mL, or more preferably at least 1 mL, and normally $1\times10^{5}$ mL or less, or preferably $1\times10^{3}$ mL or less, or more preferably $2\times10^{2}$ mL or less of solvent is used per 1 g of the total of the compound represented by Formulae (3A) and (3B) for producing the copolymer including the repeating units represented by Formulae (1A) and (1B), or per 1 g of the total of the compound represented by Formulae (3A) to (3C) for producing the copolymer including the repeating units represented by Formulae (1A), (1B), and (1C). An amount of solvent in this range is desirable because it makes it easier to control the reaction.

The reaction temperature of polymerization reaction is normally at least 0° C. or preferably at least 20° C. or more preferably at least 40° C. or still more preferably at least 60° C. Moreover, it is normally 300° C. or less, or preferably 250° C. or less, or more preferably 200° C. or less, or still more preferably 180° C. or less, or most preferably 160° C. or less. The heating method is not particularly limited, but may be oil bath heating, thermocouple heating, infrared heating or microwave heating, or heating by contact using an IH heater. The reaction time of the polymerization reaction is normally at least 1 minute, or preferably at least 10 minutes, and is normally 160 hours or less, or preferably 120 hours or less, or more preferably 100 hours or less. The polymerization reaction is preferably performed in a nitrogen ($N_2$) or argon (Ar) atmosphere. The copolymer can be obtained more in a shorter time and with a higher yield by performing the reaction under these conditions.

The copolymer obtained from the polymerization reaction is preferably further subjected to terminal treatment. By terminally treating the copolymer, it is possible to reduce the residual amounts of terminal residues (X and Y above) in the copolymer. When the copolymer is, for example, polymerized by the Stille coupling method, the boron (Br), iodine (I) and other halogen atoms and alkylstannyl groups present in the termini of the copolymer can be reduced by terminal treatment. Performing this terminal treatment is desirable because it can provide a copolymer with enhanced performance in terms of efficiency and durability.

The method of terminally treating the copolymer after the polymerization reaction is not particularly limited, but may be a method of, for example, substituting a terminal residue with another substituent such as an aromatic group.

For example, the following method can be used as a terminal treatment method when the copolymer has been polymerized by a Stille coupling reaction. As a method of terminally treating the halogen atoms of the copolymer, an aryl trialkyltin can be added as a terminal treatment agent to the reaction system after the polymerization reaction and before purification, which is then heated and agitated to perform the reaction. The aryl trialkyltin may be phenyl trimethyltin, thienyl trimethyltin or the like. Substituting the halogen atoms at the termini of the copolymer with aromatic groups is desirable because the copolymer is made more stable by the conjugation stabilization effect.

The added amount of the terminal treatment agent is not particularly limited, but is normally at least $1.0\times10^{-2}$ molar equivalents, or preferably at least 0.1 molar equivalents, or more preferably at least 1 molar equivalent, and is normally 50 molar equivalents or less, or preferably 20 molar equivalents or less, or more preferably 10 molar equivalents or less with respect to the amount of the monomers (3A, or 3B and 3C) having at the termini the halogen atoms used in the polymerization reaction. The reaction temperature for the terminal treatment of the halogen atoms is normally at least 0° C., or preferably at least 20° C., or more preferably at least 40° C., or still more preferably at least 60° C. Moreover, it is normally 300° C. or less, or preferably 250° C. or less, or more preferably 200° C. or less, or still more preferably 180° C. or less, or especially preferably 160° C. or less. The heating method is not particularly limited, but may be oil bath heating, thermocouple heating, infrared heating or microwave heating, or heating by contact using an IH heater. The reaction time for terminal treatment of the halogen atoms in the copolymer is not particularly limited, but it is normally at least 30 minutes, or preferably at least 1 hour, and is normally 50 hours or less, or preferably 20 hours or less. Terminal treatment can be accomplished in a short time and with a high conversion rate when the reaction is performed under these conditions.

Further, the method of terminally treating the alkylstannyl groups of the copolymer may be a method of first adding an aryl halide as a terminal treatment agent to the reaction system after the polymerization reaction and before purification, which is then heated and agitated to perform the reaction. The aryl halide may be iodothiophene, iodobenzene, bromothiophene or bromobenzene for example. When the alkylstannyl groups at the termini of the copolymer are substituted with other substituents, the Sn atoms of the alkylstannyl groups which are vulnerable to thermal decomposition are no longer present in the copolymer, and it should thus be possible to control deterioration of the copolymer over time. Substituting alkylstannyl groups with aryl groups at the termini of the copolymer is desirable for obtaining greater stability of the copolymer by the conjugation stabilization effect.

The added amount of the terminal treatment agent is not particularly limited, but is normally at least $1.0 \times 10^{-2}$ molar equivalents, or preferably at least 0.1 molar equivalents, or more preferably at least 1 molar equivalent, and is normally 50 molar equivalents or less, or preferably 20 molar equivalents or less, or more preferably 10 molar equivalents or less with respect to the amount of the monomers (3B and 3C, or 3A) with the terminal-added alkylstannyl groups used in the polymerization reaction. The reaction temperature and reaction conditions for terminal treatment for the alkylstannyl groups are similar to those for the terminal treatment for the halogen atoms of the copolymer. Terminal treatment can be accomplished in a short time and with a high conversion rate when the reaction is performed under these conditions.

When the copolymer is polymerized by the Suzuki-Miyaura cross-coupling reaction, the terminal treatment method may be the following. The Method of terminally treating the halogen atoms of the copolymer may be a method in which an arylboronic acid is added, which is then heated and agitated. The method of terminally treating the Boron atom-containing groups of the copolymer may be a method in which an aryl halide is added as a terminal treatment agent, which is then heated and agitated.

The method of terminal treating the terminal residue X and the method of terminal treating the terminal residue Y are not particularly limited, but each is preferably performed independently. The procedures for each kind of terminal treatment are not particularly limited, and may be selected appropriately.

The terminal treatment may be performed either before copolymer purification or after copolymer purification. When terminal treatment is performed after copolymer purification, the copolymer and one of the terminal treatment agents (aryl halide or aryl trialkyl tin, for example) can be dissolved in an organic solvent, after which a palladium catalyst or other transition metal catalyst is added and reaction is performed, the other terminal treatment agent (aryl trialkyl tin or aryl halide) is added and reaction is performed. To promote the reaction, terminal treatment is preferably performed with heating and agitation as in the case of terminal treatment before copolymer purification. Also, the reaction is preferably performed under nitrogen conditions in order to improve the yield. The reaction time is not particularly limited, but is normally at least 30 minutes, or preferably at least 1 hour, and is normally 25 hours or less, or preferably 10 hours or less.

The added amount of the transition metal catalyst is not particularly limited, but is normally at least $5.0 \times 10^{-3}$ molar equivalents, or preferably at least $1.0 \times 10^{-2}$ molar equivalents, and is normally $1.0 \times 10^{-1}$ molar equivalents or less, or preferably $5.0 \times 10^{-2}$ molar equivalents or less relative to the total amount of the compound represented by Formulae (3A) and (3B) for producing the copolymer including the repeating units represented by Formulae (1A) and (1B), or relative to the total amount of the compound represented by Formulae (3A) to (3C) for producing the copolymer including the repeating units represented by Formulae (1A), (1B), and (1C). Termination treatment can be accomplished at a lower cost and with a higher conversion efficiency if the added amount of the catalyst is within this range.

The added amount of the terminal treatment agent for the alkylstannyl groups in the terminal treatment after purification of the copolymer is not particularly limited, but is normally at least $1.0 \times 10^{-2}$ molar equivalents, or preferably at least $1.0 \times 10^{-1}$ molar equivalents, or more preferably at least 1 molar equivalents, and is normally 50 molar equivalents or less, or preferably 20 molar equivalents or less, or more preferably 10 molar equivalents or less with respect to the amount of the monomers (3B and 3C, or 3A) having at the termini the alkylstannyl groups used in the polymerization reaction. Termination treatment can be accomplished at a lower cost and with a higher conversion efficiency if the added amount of the terminal treatment agent is within this range.

The added amount of the terminal treatment agent of the halogen atom in the terminal treatment after production of the copolymer is not particularly limited, but is normally at least $1.0 \times 10^{-2}$ molar equivalents, or preferably at least $1.0 \times 10^{-1}$ molar equivalents, or more preferably at least 1 molar equivalent, and is normally 50 molar equivalents or less, or preferably 20 molar equivalents or less, or more preferably 10 molar equivalents or less with respect to the amount of the monomers (3A, or 3B and 3C) having at the termini halogen atoms used in the polymerization reaction. Termination treatment can be accomplished at a lower cost and with a higher conversion efficiency if the added amount of the terminal treatment agent is within this range.

Although there are no particular limitations on what steps are performed following the polymerization reaction, a copolymer separation step is normally performed. When the copolymer is subjected to terminal treatment, a copolymer separation step is preferably performed after terminal treatment. Additional copolymer separation, and purification can also be performed as necessary before copolymer terminal treatment. From the perspective of obtaining the copolymer in a shorter treatment step, copolymer terminal treatment, copolymer separation and copolymer purification are preferably performed in that order after the polymerization reaction.

Methods of copolymer separation include for example a method of mixing the reaction solution with a poor solvent and precipitating the copolymer, or a method of first quenching the active species in the reactive solution with water or hydrochloric acid, and then extracting the copolymer with an organic solvent, and distilling away this organic solvent.

Methods of purifying the copolymer include known methods such as reprecipitation purification, extraction with a Soxhlet extractor, gel permeation chromatography, metal removal with a scavenger, or the like.

[2-1. Method of Manufacturing Compounds Represented by the Formulae (3A) to (3C)]

The compound represented by Formula (3A), which is used as a raw material in the polymerization reaction, can be manufactured according to the methods described in J. Am. Chem. Soc., 2010, 132(22), 7595-7597. The compounds represented by Formulae (3B) and (3C) can be manufactured according to the methods described in J. Mater. Chem., 2011, 21, 3895 and J. Am. Chem. Soc. 2008, 130, 16144-16145.

An especially desirable method of manufacturing the compound represented by Formula (3B) or (3C) is a method using a compound represented by a Formula (4B) or (4C) below as a raw material. More specifically, the compound represented by Formula (3B) or (3C) can be obtained by first reacting a non-nucleophilic base with a compound represented by Formula (4B) or (4C), and then reacting an electrophile. With this method, it is possible to reduce the amount of by-products having only one substituent Y for example, which occur when manufacturing the compound represented by Formula (3B) or (3C). Having few by-products is desirable so that the copolymer of the present invention obtained by the polymerization reaction can have a higher molecular weight.

[Chemical Formula 37]

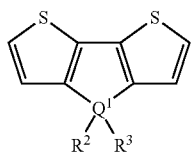
(4B)

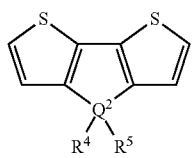
(4C)

In Formulae (4B) and (4C), $Q^1$ and $Q^2$ and $R^2$ to $R^5$ are defined as in Formulae (3B) and (3C).

Examples of non-nucleophilic bases include metal hydrides, metal alkoxides having bulky substituents, amines, phosphazene bases, metal magnesium reagents having bulky substituents (Grignard reagents), metal amides and the like. Using a non-nucleophilic base is desirable for controlling the production of by-products because it makes it possible to effectively suppress nucleophilic attack on the condensed rings of the compound represented by Formula (4B) or (4C). A metal amide is preferred as a non-nucleophilic base because of its high basicity and low nucleophilicity, and a metal amide having a bulky substituent is particularly desirable.

Once the compound represented by General Formula (4B) or (4C) has been deprotonated with the non-nucleophilic base, the resulting anions can be reacted with an electrophile to obtain the compound represented by General Formula (3B) or (3C).

When the substituent Y is an alkylstannyl group, the electrophile is not particularly limited, but may be a halogenated trialkyltin compound for example. When the substituent Y is a boric acid residue or boric acid ester residue, the electrophile is not particularly limited, but is preferably a boric acid triester. A compound with a boric acid ester residue obtained by a reaction with a boric acid triester compound may be isolated as is, or the compound may be isolated after the boric acid ester residue has been hydrolyzed to produce a boric acid residue.

The method of purifying the compound represented by Formula (3B) or (3C) after the reaction is not particularly limited, and a known method may be used. Especially desirable methods include methods using zeolites. Specifically, it is sufficient to bring the resulting compound into contact with a zeolite. This method is desirable because the compound can be purified more easily while inhibiting decomposition of the compound represented by Formula (3B) or (3C). Examples of the zeolite include aluminosilicates, metallosilicates, silicalites and other aluminosilicate zeolites; and aluminophosphates, gallophosphates, beryllophosphates and other phosphate zeolites.

Methods of bringing the resulting compound represented by Formula (3B) or (3C) into contact with the zeolite include (1) a method of preparing a layer containing the zeolite, and passing the compound through it, and (2) a method of adding the zeolite to a composition, and then removing the zeolite.

The amount of the non-nucleophilic base added to the compound represented by Formula (4B) or (4C) is not particularly limited, but normally the non-nucleophilic base is used in the amount of at least 2 molar equivalents of the compound represented by Formula (4B) or (4C). Moreover, the amount of the non-nucleophilic base is normally no more than 20 molar equivalents, or preferably no more than 10 molar equivalents, or still more preferably no more than 5 molar equivalents in order to reduce the amount of the reagents used. The amount of the electrophile added to the compound represented by Formula (4B) or (4C) is also not particularly limited, but normally the electrophile is added in the amount of at least 2 molar equivalents of the compound represented by Formula (4B) or (4C). To reduce the amount of the reagents used, moreover, the amount of the electrophile is normally no more than 20 molar equivalents, or preferably no more than 10 molar equivalents, or still more preferably no more than 5 molar equivalents.

The compound represented by Formula (4B) or (4C) can be manufactured by known methods, but is more preferably manufactured by the methods shown below. That is, the compound represented by Formula (4B) or (4C) can be obtained by desorbing the silyl group from a compound comprising the compound represented by Formula (4B) or (4C) with a silyl group added thereto. This method is desirable because it allows the compound represented by the Formula (4B) or (4C) to be obtained with a higher yield.

For example, the compound represented by the Formula (4B) or (4C) can be manufactured by a desilylation reaction using an acid on a compound represented by a Formula (5B) or (5C) below.

[Chemical Formula 38]

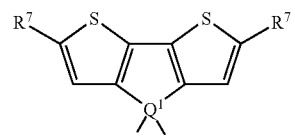
(5B)

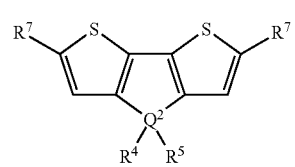
(5C)

In Formulae (5B) and (5C), $Q^1$ and $Q^2$ and $R^2$ to $R^5$ are defined in the same way as $Q^1$ and $Q^2$ and $R^2$ to $R^5$ in Formulae (3B) and (3C). In Formulae (5B) and (5C), $R^7$ represents an optionally substituted silyl group. The two substituents $R^7$ may be different from each other. Silyl groups which may have a substituent include a trialkylsilyl group, a dialkyl aryl silyl group, an alkyldiarylsilyl group, a triarylsilyl group or the like. The acid used in the desilylation reaction is not particularly limited, and an inorganic acid or organic acid may be used. The type of inorganic acid is not particularly limited, and hydrochloric acid, sulfuric acid, nitric acid, phosphoric acid or the like may be used. The type of organic acid is not particularly limited, and acetic acid, trifluoroacetic acid, oxalic acid, citric acid, benzoic acid, chlorobenzoic acid, p-toluenesulfonic acid or the like may be used.

When $Q^1$ is a silicon atom or germanium atom, the compound represented by Formula (5B) may be obtained for example by treating a bithiophene compound with a base, and then reacting it with a silyl halide or germanium halide. As a more specific example, 5,5'-bis(trimethylsilyl)-3,3'-dibromo-2,2'-bithiophene can be treated with n-butyl lithium, and then reacted with $R^2R^3SiCl_2$, $R^2R^3SiBr_2$, $R^2R^3GeCl_2$ or $R^2R^3GeBr_2$ to obtain the compound represented by Formula (5B). Moreover, a compound represented by the Formula (3B) or (4B) can also be synthesized by using $R^2R^3SiCl_2$, $R^2R^3SiBr_2$, $R^2R^3GeCl_2$ or $R^2R^3GeBr_2$. In this case, the $R^2R^3SiCl_2$, $R^2R^3SiBr_2$, $R^2R^3GeCl_2$ or $R^2R^3GeBr_2$ is preferably purified by distillation under reduced pressure. The numbers of carbon atoms in $R^2$ and $R^3$ are preferably 15 or less, or more preferably 8 or less so that distillation under reduced pressure can be performed at a lower temperature and an easily achievable pressure reduction degree. The same applies to the compounds represented by Formulae (3C) to (5C), and to $R^4$ and $R^5$.

<3. Organic Semiconductor Material Containing Copolymer of Invention>

The copolymer of the present invention is suitable as an organic semiconductor material because of its solubility to solvent and its light absorption in long wavelength regions.

The organic semiconductor material of the present invention contains at least the copolymer of the present invention. With respect to the organic semiconductor material of the present invention, one kind of the copolymer of the present invention may be included, or any combination of two or more kinds may be included. Further, with respect to the organic semiconductor material of the present invention, the material may consist of the copolymer of the present invention alone, or may also contain other components (for example, other polymers or monomers or various additives or the like).

The organic semiconductor material of the present invention is suitable for the material of the organic semiconductor layer or organic active layer of the organic electronic device discussed below. In this case, the organic semiconductor material is preferably formed as a film. It is thus possible to take full advantage of the superior workability, solubility in organic solvents and other properties of the copolymer of the present invention. The method of using the organic semiconductor of the present invention in an organic electronic device will be described later.

The organic semiconductor material of the present invention exhibits semiconductor properties, and for example in field-effect mobility measurement its hole mobility is normally at least $1.0 \times 10^{-7}$ cm$^2$/Vs, or preferably at least $1.0 \times 10^{-6}$ cm$^2$/Vs, or more preferably at least $1.0 \times 10^{-5}$ cm$^2$/Vs, or especially preferably at least $1.0 \times 10^{-4}$ cm$^2$/Vs, while at the same time the hole mobility is normally $1.0 \times 10^4$ cm$^2$/Vs or less, or preferably $1.0 \times 10^3$ cm$^2$/Vs or less, or more preferably $1.0 \times 10^2$ cm$^2$/Vs or less, or especially preferably $1.0 \times 10$ cm$^2$/Vs or less. One way of measuring hole mobility is by the FET method. The FET method can be carried out by the methods described in known literature (Japanese Patent Application Laid-open Publication No. 2010-045186).

The organic semiconductor material of the present invention can be used by itself as the material of the organic semiconductor layer of an organic electronic device, but it can also be mixed and/or laminated with other organic semiconductor materials. Examples of other organic semiconductor materials that can be used in combination with the organic semiconductor material of the present invention include poly (3-hexylthiophene) (P3HT), poly[2,6-(4,4-bis[2-ethyl-hexyl]-4H-cyclopenta[2,1-b:3,4-b']dithiophene)-alt-4,7-(2,1,3-benzothiadiazole)](PCPDTBT), benzoporphyrin (BP), pentacene, and other known organic semiconductor materials, and further include the known n-type semiconductor compound perylene-bisimide, [6,6]-phenyl-$C_{61}$-butyric acid methyl ester ([60]PCBM) or PCBM having $C_{70}$ and other larger fullerenes, [6,6]-phenyl-$C_{61}$-butyric acid n-butyl ester ([60]PCBNB) or PCBNB having $C_{70}$ and other larger fullerenes, and other fullerene derivatives and the like, without any particular limitations.

The organic semiconductor material of the present invention may also be in the form of a solution. Because the copolymer of the present invention is highly stable in solution, a solution containing the organic semiconductor material of the present invention and a solvent, or in other words a solution containing the copolymer of the present invention and a solvent, can be used favorably to form an organic semiconductor layer by a coating method. In this case, the semiconductor layer obtained by applying the solution preferably exhibits the aforementioned semiconductor properties.

Solvents are not particularly limited as long as they can uniformly dissolve or disperse the copolymer of the present invention, but examples include aliphatic hydrocarbons such as hexane, heptane, octane, isooctane, nonane or decane; aromatic hydrocarbons such as toluene, xylene, chlorobenzene or o-dichlorobenzene; lower alcohols such as methanol, ethanol or propanol; ketones such as acetone, methyl ethyl ketone, cyclopentanone or cyclohexanone; esters such as ethyl acetate, butyl acetate or methyl lactate; halogen hydrocarbons such as chloroform, methylene chloride, dichloroethane, trichloroethane or trichloroethylene; ethers such as ethyl ether, tetrahydrofuran or dioxane; and amides such as dimethylformamide or dimethylacetamide and the like. Of these, an aromatic hydrocarbon such as toluene, xylene, chlorobenzene or o-dichlorobenzene or a halogen hydrocarbon such as chloroform, methylene chloride, dichloroethane, trichloroethane or trichloroethylene is preferred.

<4. Electronic Device Containing Organic Semiconductor Material of Invention>

The organic electronic device of the present invention is explained below. The organic electronic device of the present invention is produced using the organic semiconductor material of the present invention. Namely, the organic electronic device of the present invention includes the organic semiconductor material of the present invention. The type of organic electronic device of the present invention is not particularly limited as long as the organic semiconductor material of the present invention is applicable thereto. Examples include light-emitting elements, switching elements, photoelectric conversion elements, optical sensors using photoconductivity, and the like.

Examples of light-emitting elements include various light-emitting elements used in display devices. Specific examples include liquid crystal display elements, polymer-dispersed liquid crystal display elements, electrophoretic display elements, electroluminescent elements, electrochromic elements and the like.

Specific examples of switching elements include diodes (pn junction diodes, Schottky diodes, MOS diodes, etc.), transistors (bipolar transistors, field effect transistors (FET), etc.), thyristors, and composite elements (such as TTL) and the like.

Specific examples of photoelectric conversion elements include a thin photovoltaics, charge coupled devices (CCD), photomultiplier tubes, photocouplers and the like. Examples of optical sensors using photoconductivity include optical sensors using these photoelectric conversion elements.

The organic semiconductor material of the present invention can be used in any part of an organic electronic device, without any particular limitations. To take advantage of the semiconductor properties of the organic semiconductor material of the present invention, the organic semiconductor material of the present invention is preferably used in the semiconductor layer of an organic electronic device. In the case of a photoelectric conversion element in particular, an organic semiconductor layer containing the organic semiconductor material of the present invention is normally used as an organic active layer.

<5. Photoelectric Conversion Element>

The photoelectric conversion element of the present invention is a photoelectric conversion element, comprising a pair of electrodes, and an active layer disposed between the electrodes, wherein the active layer contains the copolymer of the present invention.

[5-1. Structure of Photoelectric Conversion Element]

FIG. 1 shows one embodiment of the photoelectric conversion element of the present invention. FIG. 1 shows a photoelectric conversion element for use in an ordinary organic thin photovoltaics, but the photoelectric conversion element of the present invention is not limited to the photoelectric conversion element shown in FIG. 1. A photoelectric conversion element 107 of one embodiment of the present invention has a layered structure comprising a base material 106, an anode 101, a hole extraction layer 102, an active layer 103 (mixed layer of a p-type semiconductor material and an n-type semiconductor material), an electron extraction layer 104 and a cathode 105. Other layers can be inserted between the various layers as long as this does not affect that various layer functions described below.

[5-2. Active Layer 103]

The active layer 103 is the layer where photoelectric conversion occurs, and contains a p-type semiconductor material and an n-type semiconductor material. The active layer 103 contains the organic semiconductor material of the present invention. That is, the active layer 103 contains the copolymer of the present invention. The copolymer of the present invention is normally used as a p-type semiconductor material. When the photoelectric conversion element 107 receives light, the light is absorbed by the active layer 103, electricity is generated at the boundary between the p-type semiconductor material and the n-type semiconductor material, and the generated electricity is extracted from the electrodes 101 and 105.

As the material of the active layer 103, either an inorganic compound or an organic compound may be used, but the layer is preferably a layer that can be formed by a simple coating process. More preferably, the active layer 103 is an organic active layer consisting of an organic compound. The active layer 103 is explained as an organic active layer below.

[5-2-1. Layer Structure of Active Layer]

The active layer 103 may be constituted as a thin-film laminated layer comprising a p-type semiconductor material laminated with an n-type semiconductor material, or as a bulk heterojunction layer comprising a layer of a mixture of a p-type semiconductor material and an n-type semiconductor material. In addition to a mixed layer containing both a p-type semiconductor material and an n-type semiconductor material, a bulk heterojunction-type active layer may also have at least one of a p-type semiconductor layer containing a p-type semiconductor material and an n-type semiconductor layer containing an n-type semiconductor material. From the standpoint of photoelectric conversion efficiency, the active layer 103 is preferably of the bulk heterojunction type.

(Thin-Film Laminated Active Layer)

An active layer of the thin-film laminated type has a structure comprising a p-type semiconductor layer containing a p-type semiconductor material, laminated with an n-type semiconductor layer containing an n-type semiconductor material. An active layer of the thin-film laminated type may be prepared by forming a p-type semiconductor layer and an n-type semiconductor layer, respectively. The p-type semiconductor layer and n-type semiconductor layer may be formed by different methods.

(p-Type Semiconductor Layer)

The p-type semiconductor layer is a layer containing the copolymer of the present invention. The p-type semiconductor layer may also contain the p-type semiconductor material described below. The film thickness of the p-type semiconductor layer is not limited. However, it is normally at least 5 nm, or preferably at least 10 nm, and is normally 500 nm or less, or preferably 200 nm or less. A film thickness of 500 nm or less of the p-type semiconductor layer is desirable for lowering serial resistance. A film thickness of 5 nm or more of the p-type semiconductor layer is desirable because more light can be absorbed.

The p-type semiconductor layer can be formed by any method including coating methods and vapor deposition methods, but a coating method and particularly a wet coating method is preferred for forming the p-type semiconductor layer more easily. The copolymer of the present invention is preferred in that it has solubility to solvents and has excellent coating film formation properties.

To prepare the p-type semiconductor layer by a coating method, it is sufficient to prepare coating solution containing the p-type semiconductor material, and then apply this coating solution. Any method can be used as the coating method, but examples include spin coating, inkjet methods, doctor blade methods, drop casting methods, reverse roll coating, gravure coating, kiss coating, roll brushing methods, spray coating, air knife coating, wire bar coating, pipe doctor methods, impregnation and coating methods, curtain coating and the like. After the coating solution is applied, it can be dried by heating or the like.

The copolymer of the present invention constitutes normally at least 50 mass % or preferably at least 70 mass % or more preferably at least 90 mass % of the p-type semiconductor material contained in the p-type semiconductor layer. Because the copolymer of the present invention has desirable properties as a p-type semiconductor material, it is particularly desirable that the p-type semiconductor layer contain only the copolymer of the present invention as a p-type semiconductor material.

(n-Type Semiconductor Layer)

The n-type semiconductor layer is a layer containing the n-type semiconductor material discussed below. The film thickness of the n-type semiconductor layer is not particularly limited, but is normally at least 5 nm or preferably at least 10 nm, and is normally 500 nm or less or preferably 200 nm or less. A film thickness of 500 nm or less of the n-type semiconductor layer is desirable for lowering serial resistance. A film thickness of 5 nm or more of the n-type semiconductor layer is desirable because more light can be absorbed.

The n-type semiconductor layer can be formed by any method including coating methods and vapor deposition methods, but a coating method is preferred because it allows the n-type semiconductor layer to be formed more easily. To prepare the n-type semiconductor layer by a coating method, it is sufficient to prepare coating solution containing the n-type semiconductor material, and then apply this coating solution. Any method can be used as the coating method, and examples include the methods used for forming the p-type semiconductor layer. After the coating solution is applied, it can be dried by heating or the like.

(Bulk Heterojunction-Type Active Layer)

A bulk heterojunction-type active layer has a layer (i-layer) comprising a mixture of the p-type semiconductor material and n-type semiconductor material. The p-type semiconductor material and n-type semiconductor material are phase separated in the structure of the i-layer, so that carrier separation occurs at the phase interface, and the resulting carriers (holes and electrons) are transported to the electrodes.

The copolymer of the present invention constitutes normally at least 50 mass % or preferably at least 70 mass % or more preferably at least 90 mass % of the p-type semiconductor material contained in the i-layer. Because the copolymer of the present invention has desirable properties as a p-type semiconductor material, it is particularly desirable that the i-layer contain only the copolymer of the present invention as a p-type semiconductor material.

The film thickness of the i-layer is not limited. However, it is normally at least 5 nm, or preferably at least 10 nm, and is normally 500 nm or less, or preferably 200 nm or less. A film thickness of 500 nm or less of the i-layer is desirable for lowering serial resistance. A film thickness of 5 nm or more of the i-layer is desirable because more light can be absorbed.

The i-layer can be formed by any method including coating methods and vapor deposition methods (co-evaporation for example), but a coating method is preferred because it allows the i-layer to be formed more easily. Because the copolymer of the present invention has solubility to solvents, it has excellent coating film formation properties and is therefore preferred. To prepare the i-layer by a coating method, it is sufficient to prepare a coating solution containing the p-type semiconductor material and the n-type semiconductor material, and then apply this coating solution. The coating solution containing the p-type semiconductor material and the n-type semiconductor material can be prepared by preparing a solution containing the p-type semiconductor material and a solution containing the n-type semiconductor material and then mixing the two, and may also be prepared by dissolving the p-type semiconductor material and the n-type semiconductor material in the solvent discussed below. As discussed below, moreover, the i-layer may also be formed by preparing a coating solution containing a semiconductor material precursor, applying this coating solution, and then converting the semiconductor material precursor into the semiconductor material. Examples of the coating method include the methods used for forming the p-type semiconductor layer. After the coating solution is applied, it can be dried by heating or the like.

When forming a bulk heterojunction-type active layer by a coating method, an additive may also be added to the coating solution containing the p-type semiconductor material and the n-type semiconductor material. The phase-separated structure of the p-type semiconductor material and n-type semiconductor material in the bulk heterojunction-type active layer affects the light absorption process, exciton diffusion process, exciton dissociation (carrier separation) process, carrier transport process and the like. Thus, it is thought that good photoelectric conversion efficiency can be achieved by optimizing the phase separation structure. Because the coating solution contains an additive having different volatility from the solvent, an active layer having a desirable phase separation structure can be obtained, thereby improving photoelectric conversion efficiency.

Examples of additives include the compounds described in WO 2008/066933 and the like. More specific examples of additives include substituted aliphatic hydrocarbons or substituted aromatic compounds such as naphthalene and the like. Examples of substituents include aldehyde groups, oxo groups, hydroxy groups, alkoxy groups, thiole groups, thioalkyl groups, carboxyl groups, ester groups, amine groups, amide groups, halogen atoms, nitrile groups, epoxy groups, aromatic groups, arylalkyl groups and the like. The number of substituents may be 1 or more, such as 2 for example. A substituent of an alkane is preferably a thiole group or iodine atom. A substituent of a naphthalene or other aromatic compound is preferably a bromine atom or a chlorine atom.

An additive with a high boiling point is preferred, and the number of carbon atoms in an aliphatic hydrocarbon used as an additive is preferably at least 6, or more preferably at least 8. Because the additive is preferably a liquid at room temperature, the number of carbon atoms in the aliphatic hydrocarbon is preferably 14 or less, or more preferably 12 or less. For similar reasons, the number of carbon atoms in an aromatic hydrocarbon used as an additive is normally at least 6, or preferably at least 8, or more preferably at least 10, and is normally 50 or less, or preferably 30 or less, or more preferably 20 or less. Similarly, the number of carbon atoms in an aromatic heterocyclic compound used as an additive is normally at least 2, or preferably at least 3, or more preferably at least 6, and is normally 50 or less, or preferably 30 or less, or more preferably 20 or less. The boiling point of the additive is normally at least 100° C., or preferably at least 200° C., and is normally 600° C. or less, or more preferably 500° C. or less at normal pressure (1 atmosphere).

The amount of the additive contained in the coating solution containing the p-type semiconductor material and the n-type semiconductor material is preferably at least 0.1 mass %, or more preferably at least 0.5 mass % of the total of the coating solution. It is also preferably 10 mass % or less, or more preferably 3 mass % or less of the total of the coating solution. If the amount of the additive is within this range, it is possible to obtain a desirable phase-separated structure while reducing the amount of the additive remaining in the active layer. It is thus possible to form a bulk heterojunction-type active layer by coating a coating solution (ink) containing a p-type semiconductor material and an n-type semiconductor material together with an additive as necessary.

(Coating Solution Solvent)

The solvent in the coating solution containing the p-type semiconductor material, the coating solution containing the n-type semiconductor material and the coating solution containing the p-type semiconductor material and the n-type semiconductor material is not particularly limited as long as it can uniformly dissolve the p-type semiconductor material and/or the n-type semiconductor material, but examples include aliphatic hydrocarbons such as hexane, heptane, octane, isooctane, nonane or decane; aromatic hydrocarbons such as toluene, xylene, mesitylene, cyclohexylbenzene, tetralin, chlorobenzene or o-dichlorobenzene; alicyclic hydrocarbons such as cyclopentane, cyclohexane, methylcyclohexane, cycloheptane, cyclooctane, tetralin or decalin; lower alcohols such a methanol, ethanol or propanol; aliphatic ketones such as acetone, methyl ethyl ketone, cyclopentanone or cyclohexanone; aromatic ketones such as acetophenone or propiophenone; esters such as ethyl acetate, butyl acetate or methyl lactate; halogen hydrocarbons such as chloroform, methylene chloride, dichloroethane, trichloroethane or trichloroethylene; ethers such as ethyl ether, tetrahydrofuran or dioxane; or amides such as dimethyl formamide or dimethylacetamide.

Of these, an aromatic hydrocarbon such as toluene, xylene, mesitylene, cyclohexylbenzene, tetralin, chlorobenzene or o-dichlorobenzene; an alicyclic hydrocarbon such as cyclopentane, cyclohexane, methylcyclohexane, cycloheptane, cyclooctane, tetralin or decalin; a ketone such as acetone, methyl ethyl ketone, cyclopentanone or cyclohexanone; a halogen hydrocarbon such as chloroform, methylene chloride, dichloroethane, trichloroethane or trichloroethylene; or an ether such as ethyl ether, tetrahydrofuran or dioxane is preferred. More preferred is a halogen-free aromatic hydrocarbon such as toluene, xylene, mesitylene, tetralin or cyclohexylbenzene; a halogen-free ketone such as cyclopentanone or cyclohexanone; an aromatic ketone such as acetophenone or propiophenone; an alicyclic hydrocarbon such as tetrahydrofuran, cyclopentane, cyclohexane, methylcyclohexane, cycloheptane, cyclooctane, tetralin or decalin; a ketone such as acetone, methyl ethyl ketone, cyclopentanone or cyclohexanone; or a halogen-free aliphatic ether such as 1,4-dioxane or the like. Most preferred are halogen-free aromatic hydrocarbons such as toluene, xylene, mesitylene, tetralin or cyclohexylbenzene.

One kind of solvent may be used alone as the solvent, or any two or more kinds of solvents may be combined in any proportions. When combining two or more kinds of solvents, it is desirable to combine a low boiling point solvent having a boiling point of 60° C. to 150° C. with a high boiling point solvent having a boiling point of 180° C. to 250° C. Examples of combinations of a low boiling point solvent with a high boiling point solvent include a halogen-free aromatic hydrocarbon and an alicyclic hydrocarbon, a halogen-free aromatic hydrocarbon and an aromatic ketone, an ether and an alicyclic hydrocarbon, an ether and an aromatic ketone, an aliphatic ketone and an alicyclic hydrocarbon, or an aliphatic ketone and an aromatic ketone, or the like. Examples of desirable combinations include toluene and tetralin, xylene and tetralin, toluene and acetophenone, xylene and acetophenone, tetrahydrofuran and tetralin, tetrahydrofuran and acetophenone, methyl ethyl ketone and tetralin, methyl ethyl ketone and acetophenone, and the like.

[5-2-2. p-Type Semiconductor Material]

Active layer 103 contains at least the copolymer of the present invention as a p-type semiconductor material. However, the copolymer of the present invention may also be combined with another organic semiconductor material by mixing and/or lamination. Organic semiconductor materials that may be combined, such as polymeric organic semiconductor materials and low-molecular-weight organic semiconductor materials, are explained below.

(Polymeric Organic Semiconductor Materials)

There are no particular limitations on what polymeric organic semiconductor materials can be combined as the p-type semiconductor material, and specific examples include polythiophene, polyfluorene, polyphenylenevinylene, polythienylenevinylene, polyacetylene or polyaniline and other conjugated copolymer semiconductor materials, oligothiophenes substituted with alkyl groups and other substituents, and other copolymer semiconductor materials. Other examples include copolymer semiconductor materials obtained by copolymerizing two or more kinds of monomer units. The copolymers and derivatives thereof described in known literature such as the Handbook of Conducting Polymers, 3rd Ed. (2 volumes), 2007; Materials Science and Engineering, 2001, 32, 1-40; Pure Appl. Chem. 2002, 74, 2031-3044; and the Handbook of THIOPHENE-BASED MATERIALS (2 volumes), 2009 and the like and copolymers that can be synthesized by combining these described monomers can be used as conjugated copolymers. The polymeric organic semiconductor materials that can be combined as the p-type semiconductor material may be one kind of compound or a mixture of a plurality of kinds of compounds.

Specific examples of polymeric organic semiconductor materials that can be combined as the p-type semiconductor material include, but are not limited to, the following.

[Chemical Formula 39]

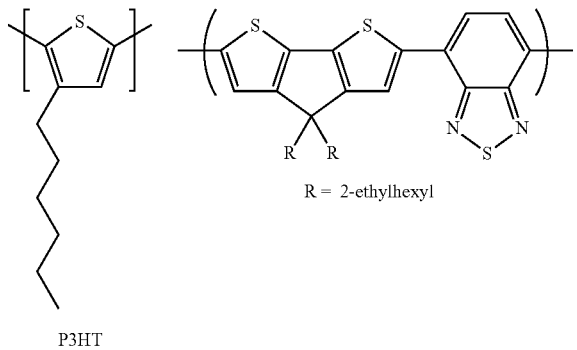

R = 2-ethylhexyl

P3HT

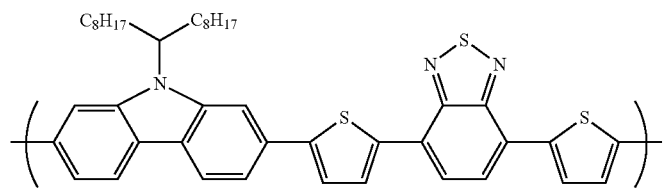
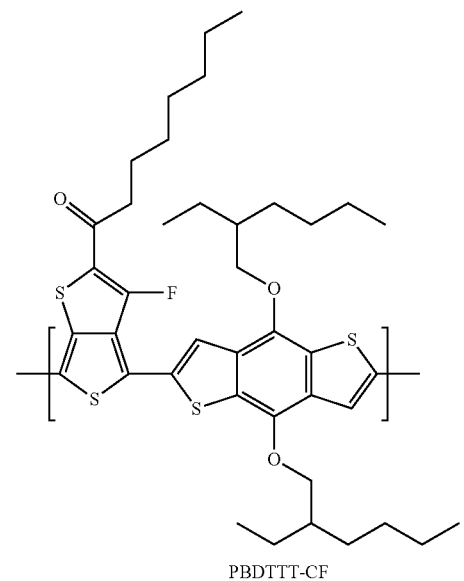
PBDTTT-CF
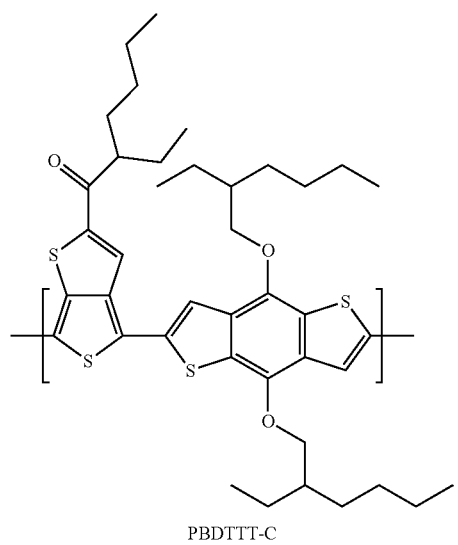
PBDTTT-C
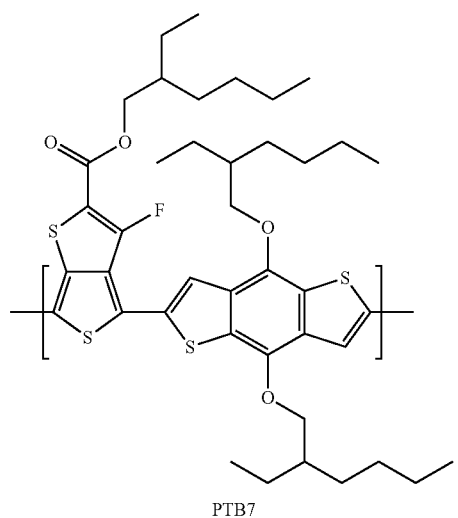
PTB7

-continued
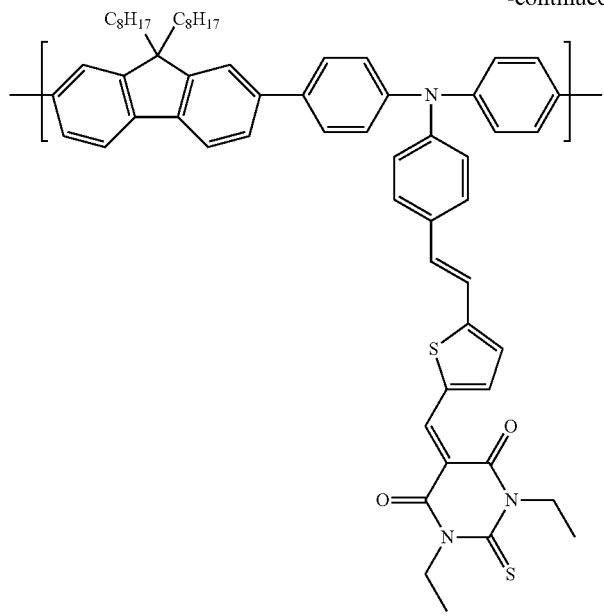
PFPDT
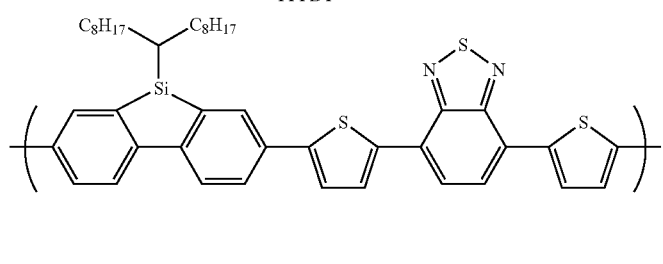
PCPDTBT
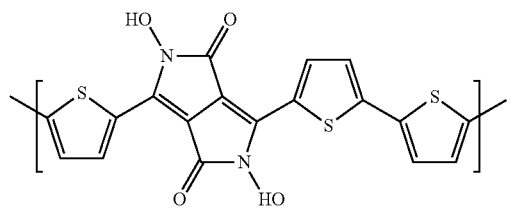
PDPP3T
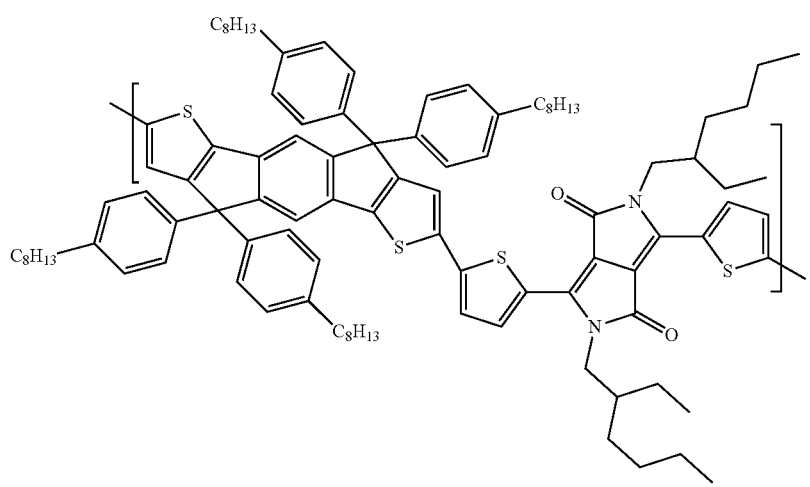

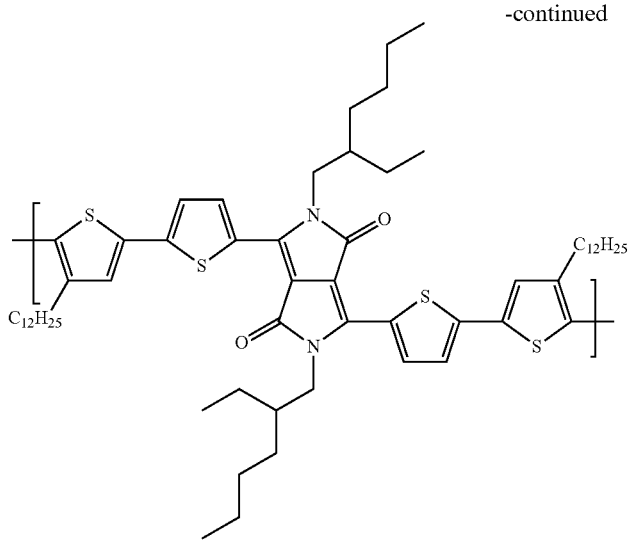

P22

[Chemical Formula 40]

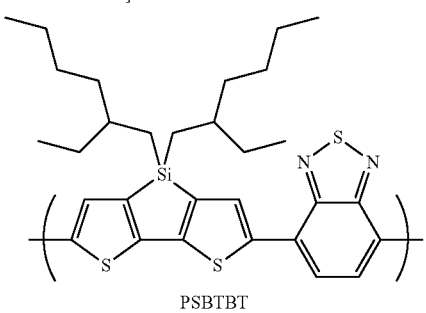

PSBTBT

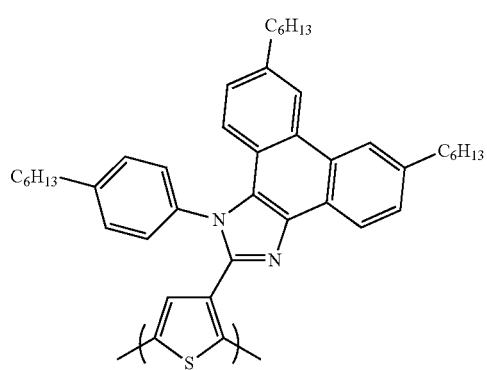

PHPIT (Low-Molecular-Weight Semiconductor Materials)

There are no particular limitations on what low-molecular-weight organic semiconductor materials can be combined as the p-type semiconductor material, and specific examples include condensed aromatic hydrocarbons such as naphthacene, pentacene or pyrene; alpha-sexithiophene and other oligothiophenes containing 4 or more thiophene rings; those comprising a total of 4 or more linked rings of at least one kind selected from the thiophene, benzene, fluorene, naphthalene, anthracene, thiazole, thiadiazole and benzothiazole rings; and phthalocyanine compounds and metal complexes thereof, tetrabenzoporphyrin and other porphyrin compounds and metal complexes thereof, and other macrocyclic compounds and the like. Phthalocyanine compounds and metal complexes thereof or porphyrin compounds and metal complexes thereof are preferred.

Compounds having structures such as the following are examples of porphyrin compounds and metal complexes thereof (with $Z^1$ being CH in the figures) and phthalocyanine compounds and metal complexes thereof (with $Z^1$ being N in the figures).

[Chemical Formula 41]

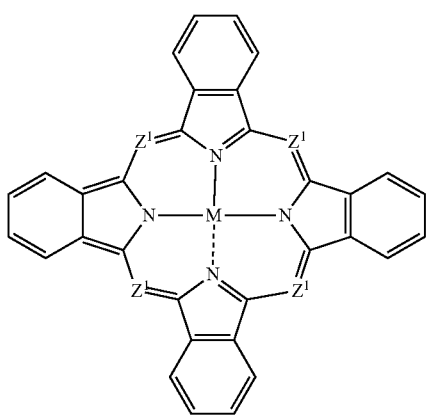

135
-continued
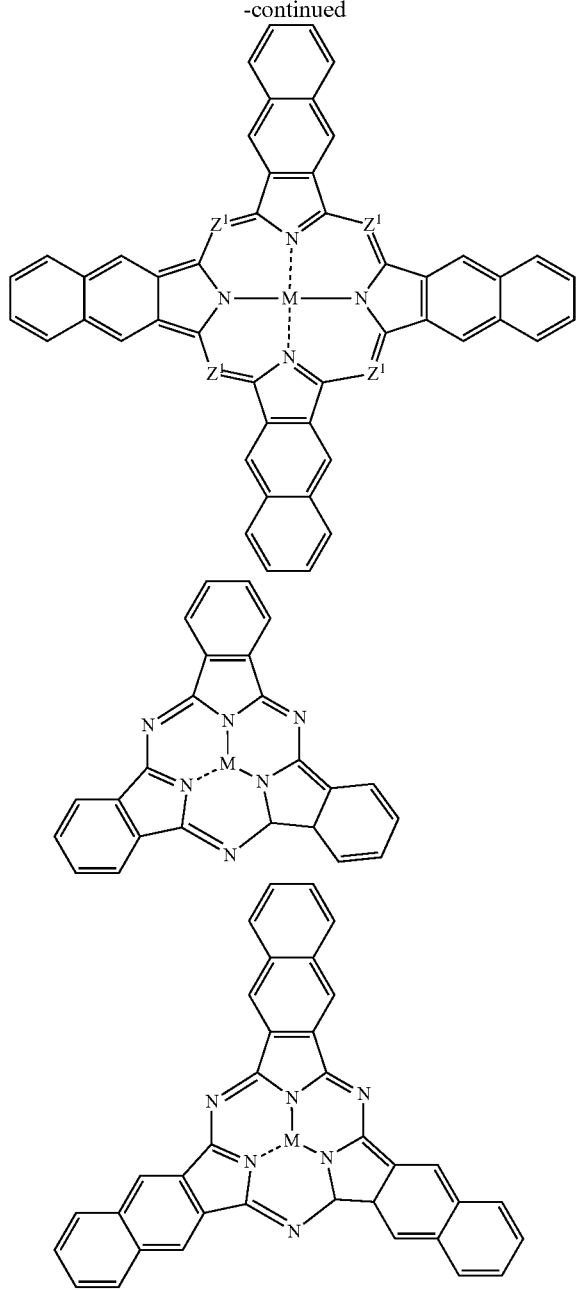
[Chemical Formula 42]
136
-continued
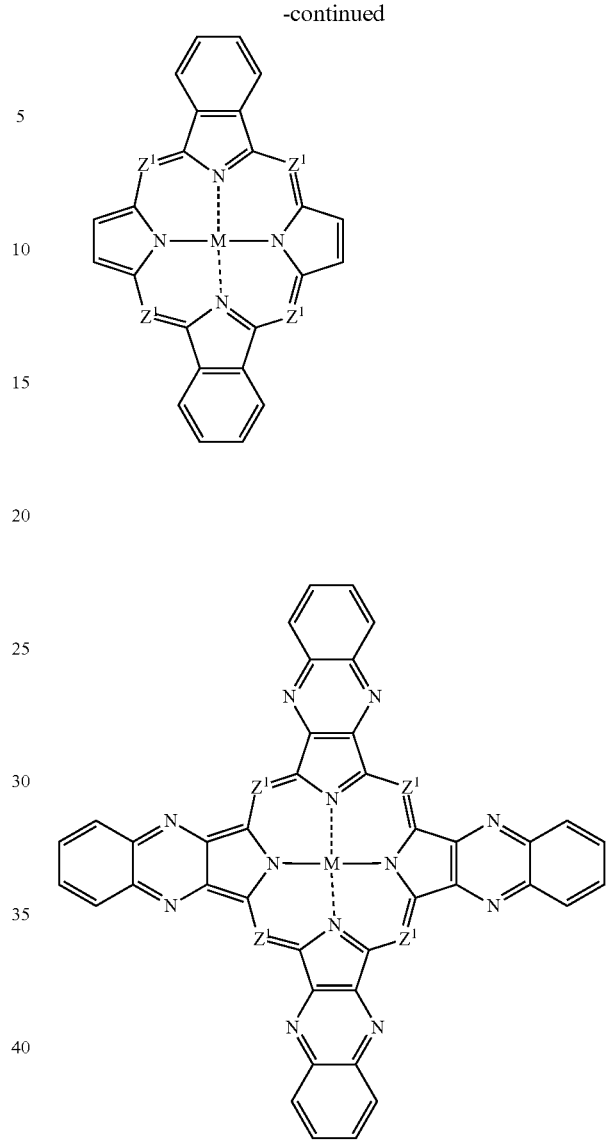
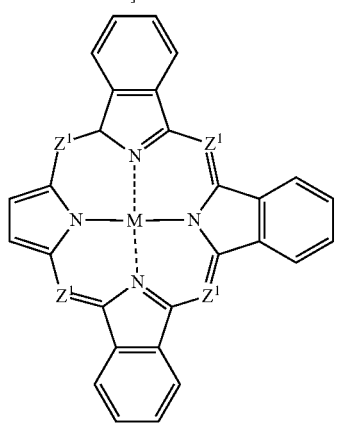
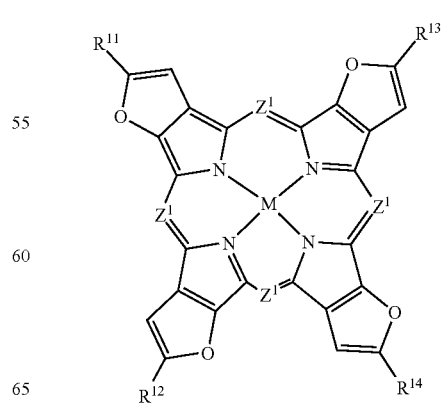

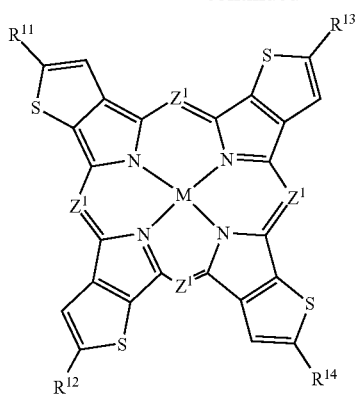

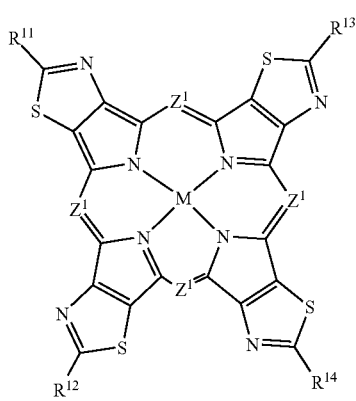

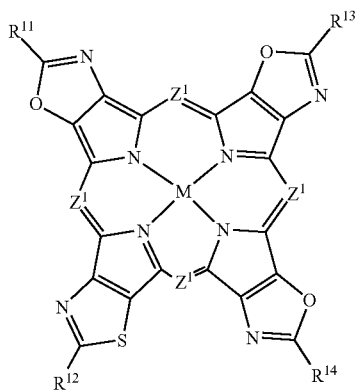

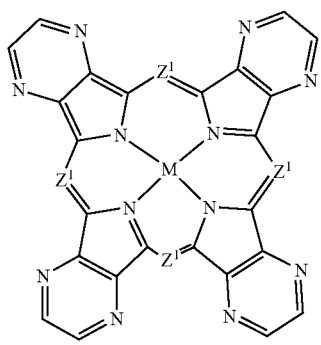

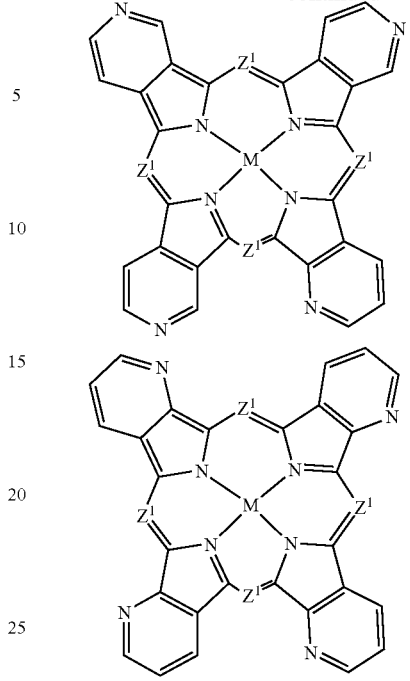

M here represents a metal or two hydrogen atoms, with the metal being Cu, Zn, Pb, Mg, Co, Ni or another bivalent metal, or a trivalent or higher metal having an axial ligand, such as TiO, VO, $SnCl_2$, AlCl, InCl, Si or the like.

$R^{11}$ to $R^{14}$ are each independently a hydrogen atom or C1-24 alkyl group. A C1-24 alkyl group is a C1-24 saturated or unsaturated chain hydrocarbon group or a C3-24 saturated or unsaturated cyclic hydrocarbon. Of these, a C1-12 saturated or unsaturated chain hydrocarbon group or a C3-12 saturated or unsaturated cyclic hydrocarbon is preferred.

Of the phthalocyanine compounds and metal complexes thereof, a 29H,31H-phthalocyanine, copper phthalocyanine complex, zinc phthalocyanine complex, magnesium phthalocyanine complex, lead phthalocyanine complex, titanium phthalocyanine oxide complex, vanadium phthalocyanine oxide complex, indium phthalocyanine halogen complex, gallium phthalocyanine halogen complex, aluminum phthalocyanine halogen complex, tin phthalocyanine halogen complex, silicon phthalocyanine halogen complex, or copper 4,4', 4'',4'''-tetraaza-29H,31H-pthalocyanine complex is preferred, and a titanium phthalocyanine oxide complex, vanadium phthalocyanine oxide complex, indium phthalocyanine chloro complex or aluminum phthalocyanine chloro complex is preferred. Of the above, one kind of compound or a mixture of a plurality of kinds of compounds may be used.

Of the porphyrin compounds and metal complexes thereof, 5,10,15,20-tetraphenyl-21H,23H-porphine, 5,10,15,20-tetraphenyl-21H,23H-porphine cobalt (II), 5,10,15,20-tetraphenyl-21H,23H-porphine copper (II), 5,10,15,20-tetraphenyl-21H,23H-porphine zinc (II), 5,10,15,20-tetraphenyl-21H,23H-porphine nickel (II), 5,10,15,20-tetraphenyl-21H,23H-porphine vanadium (IV) oxide, 5,10,15,20-tetra(4-pyridyl)-21H,23H-porphine, 29H,31H-tetrabenzo[b,g,l,q]porphine, 29H,31H-tetrabenzo[b,g,l,q]porphine cobalt (II), 29H,31H-tetrabenzo[b,g,l,q]porphine copper (II), 29H,31H-tetrabenzo[b,g,l,q]porphine zinc (II), 29H,31H-tetrabenzo[b,g,l,q]porphine nickel (II) or 29H,31H-tetrabenzo[b,g,l,q]porphine vanadium (IV) oxide is preferred, and 5,10,15,20-tetraphenyl-21H,23H-porphine or 29H,31H-tetrabenzo[b,g,l,q]porphine is more preferred. Of the above, one kind of compound or a mixture of a plurality of kinds of compounds may be used.

Methods of forming a film of a low-molecular-weight organic semiconductor material include vapor deposition methods and coating methods. The latter is preferred because of the process advantages of coating film formation. When a coating method is used, a method of coating a precursor of the low-molecular-weight organic semiconductor material and then converting it to the low-molecular-weight organic semiconductor material is preferred from the standpoint of superior film-forming properties. Although not particularly limited, specific examples include the methods described in Japanese Patent Application Publication No. 2007-324587 and Japanese Patent Application Publication No. 2011-119648.

Of the p-type semiconductor materials that can be combined with the copolymer of the present invention, a polythiophene or other conjugated copolymer semiconductor material is preferred as a polymeric organic semiconductor material, while a condensed aromatic hydrocarbon such as naphthacene, pentacene or pyrene, a phthalocyanine compound or metal complex thereof, or a tetrabenzoporphyrine (BP) or other porphyrine compound or metal complex thereof is preferred as a low-molecular-weight organic semiconductor material. Of the above, one kind of compound or a mixture of a plurality of kinds of compounds may be used.

When the p-type semiconductor material is formed as a film, it may have some kind of self-organized structure, or may be in an amorphous state.

The HOMO (highest occupied molecular orbital) energy level of the p-type semiconductor material is not particularly limited, and can be selected according to the type of n-type semiconductor material as described below. In particular, when a fullerene compound is used as the n-type semiconductor material, the HOMO energy level of the p-type semiconductor material is normally at least −5.7 eV, or preferably at least −5.5 eV, and is normally no more than −4.6 eV, or preferably no more than −4.8 eV. Giving the p-type semiconductor material a HOMO energy level of at least −5.7 eV has the effect of improving the properties of the p-type semiconductor, while giving the p-type semiconductor material a HOMO energy level of −4.6 eV or less has the effect of improving the stability of the compound and increasing the open voltage (Voc).

The LUMO (lowest unoccupied molecular orbital) of the p-type semiconductor material is not particularly limited, and can be selected according to the type of n-type semiconductor material as described below. In particular, when a fullerene compound is used as the n-type semiconductor material, the LUMO energy level of the p-type semiconductor material is normally at least −3.7 eV, or preferably at least −3.6 eV. However, it is normally −2.5 eV or less, or preferably −2.7 eV or less. Giving the p-type semiconductor a LUMO energy level of −2.5 eV or less allows it to effectively absorb light energy at long wavelengths with an adjusted bandgap, and serves to improve short-circuit current density. Giving the p-type semiconductor material a LUMO energy level of −3.7 eV or more has the effect of facilitating electron transfer to the n-type semiconductor material and improving short-circuit current density.

[5-2-3. n-Type Semiconductor Material]

The n-type semiconductor material is not particular limited, but specific examples include fullerene compounds; 8-hydroxyquinoline aluminum and other quinolinol derivative metal complexes; condensed ring tetracarboxylic diimides such as naphthalene tetracarboxylic diimide or perylene tetracarboxylic diimide; perylene diimide derivatives, terpyridine metal complexes, tropolone metal complexes, flavonol metal complexes, perinone derivatives, benzimidazole derivatives, benzoxazole derivatives, thiazole derivatives, benzthiazole derivatives, benzothiadiazole derivatives, oxadiazole derivatives, thiadiazole derivatives, triazole derivatives, aldazine derivatives, bisstyryl derivatives, pyrazine derivatives, phenanthroline derivatives, quinoxaline derivatives, benzoquinoline derivative, bipyridine derivatives, borane derivatives; total fluorides of anthracene, pyrene, napthacene, pentacene and other condensed polycyclic aromatic hydrocarbons; and monolayer carbon nanotubes, n-type polymers (n-type polymer semiconductor materials) and the like.

Of these a fullerene compound, borane derivative, thiazole derivative, benzothiazole derivative, benzothiadiazole derivative, N-alkyl substituted naphthalene tetracraboxylic diimide, N-alkyl substituted perylene diimide derivative or n-type polymer semiconductor material is preferred, and a fullerene compound, N-alkyl substituted perylene diimide derivative, N-alkyl substituted naphthalene tetracarboxylic diimide or n-type polymer semiconductor material is more preferred. Of the above, one kind of compound or a mixture of a plurality of kinds of compounds may be used.

The LUMO energy level of the n-type semiconductor material is not particularly limited, but for example the value relative to the vacuum level calculated by the cyclic voltammogram measurement method is normally at least −3.85 eV, or preferably at least −3.80 eV. The relationship between the LUMO energy levels of the p-type semiconductor material and n-type semiconductor material is important for efficiently transferring electrons from the p-type semiconductor material to the n-type semiconductor material. Specifically, it is desirable that the LUMO energy level of the p-type semiconductor material be higher than the LUMO energy level of the n-type semiconductor material by a specific value, or in other words, that the electron affinity of the n-type semiconductor material be greater than the electron affinity of the p-type semiconductor material by a specific energy. Because the open voltage (Voc) is dependent on the difference between the HOMO energy level of the p-type semiconductor material and the LUMO energy level of the n-type semiconductor material, the Voc tends to increase when the LUMO of the n-type semiconductor is higher. Meanwhile, the LUMO value is normally −1.0 eV or less, or preferably −2.0 eV or less, or more preferably −3.0 eV or less, or still more preferably −3.3 eV or less. Lowering the LUMO energy of the n-type semiconductor material tends to facilitate electron transfer and increase the short-circuit current (Jsc).

The method of calculating the LUMO energy level of the n-type semiconductor material may be a method of calculating a theoretical value or a method of measuring the actual value. Methods of calculating the theoretical value are the semiempirical molecular orbital method and the non-empirical molecular orbital method. Methods of actual measurement are ultraviolet-visible absorption spectrum measurement or cyclic voltammogram measurement. Of these, the cyclic voltammogram measurement method is preferred, and the cyclic voltammogram measurement method is used in this Specification. Specifically, measurement can be performed by methods described in known literature (WO 2011/016430).

The HOMO energy level of the n-type semiconductor material is not particularly limited, but is normally −5.0 eV or less, or preferably −5.5 eV or less. Meanwhile, it is normally at least −7.0 eV, or preferably at least −6.6 eV. A HOMO energy level of at least −7.0 eV of the n-type semiconductor material is desirable in that the light absorption of the n-type semiconductor material can also be used for power generation. A HOMO energy level of −5.0 eV or less of the n-type semiconductor material is desirable for preventing reverse hole transfer.

The electron mobility of the n-type semiconductor material is not particularly limited, but is normally at least $1.0 \times 10^{-6}$ cm²/Vs, or preferably at least $1.0 \times 10^{-5}$ cm²/Vs, or more preferably at least $5.0 \times 10^{-5}$ cm²/Vs, or still more preferably at least $1.0 \times 10^{-4}$ cm²/Vs. Moreover, it is normally no more than $1.0 \times 10^{3}$ cm²/Vs, or preferably no more than $1.0 \times 10^{2}$ cm²/Vs, or more preferably no more than $5.0 \times 10^{1}$ cm²/Vs. An electron mobility of the n-type semiconductor material of at least $1.0 \times 10^{-6}$ cm²/Vs is desirable for efficiently improving the electron diffusion rate, short-circuit current, conversion efficiency and the like of the photoelectric conversion element. Measurement of electron mobility may be by the FET method, which can be accomplished by the methods described in known literature (Japanese Patent Application Publication No. 2010-045186).

The solubility of the n-type semiconductor material in toluene at 25° C. is normally at least 0.5 mass %, or preferably at least 0.6 mass %, or more preferably at least 0.7 mass %. Also, it is normally 90 mass % or less, or preferably 80 mass % or less, or more preferably 70 mass % or less.

Giving the n-type semiconductor material a solubility of 0.5 mass % or more in toluene at 25° C. is desirable for improving the dispersion stability of the n-type semiconductor material in the solution and suppressing coagulation, precipitation, separation and the like.

Examples of the desirable n-type semiconductor materials are explained below.

(Fullerene Compounds)

Preferable examples of the fullerene compounds include the fullerene compound having partial structures represented by General Formulae (n1), (n2), (n3), and (n4).

[Chemical Formula 43]

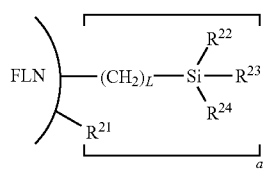

(n1)

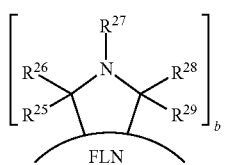

(n2)

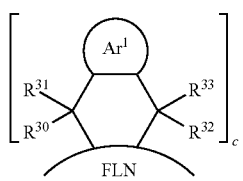

(n3)

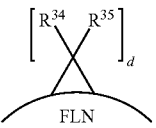

(n4)

In the formula above, FLN represents a fullerene, which is a carbon cluster with a closed-shell structure. The number of carbons in the fullerene may normally be any even number between 60 and 130. Examples of fullerenes include $C_{60}$, $C_{70}$, $C_{76}$, C78, $C_{82}$, $C_{84}$, $C_{90}$, $C_{94}$, $C_{96}$ and higher-order carbon clusters having even more carbon atoms. Of these, $C_{60}$ or $C_{70}$ is preferred. A fullerene may be one in which the carbon-carbon bonds have been broken on part of the fullerene ring. Some of the carbon atoms forming the fullerene may also be substituted with other atoms. Furthermore, the fullerene may also enclose a metal atom or non-metal atom or an atom group formed from these inside the fullerene cage.

a, b, c, and d are integers, and the total of a, b, c and d is normally 1 or more, but is normally no more than 5 or preferably no more than 3. The partial structures in (n1), (n2), (n3), and (n4) are binding to the same 5-membered ring or 6-membered ring in the fullerene structure. In General Formula (n1), $—R^{21}$ and $—(CH_2)_L$ are binding, respectively, to two adjacent carbon atoms on the same 5-membered ring or 6-membered ring of the fullerene structure. In General Formula (n2), $—C(R^2)(R^{26})—N(R^{27})—C(R^{28})(R^{29})—$ is added to two adjacent carbon atoms on the same 5-membered ring or 6-membered ring of the fullerene structure so as to form a 5-membered ring. In General Formula (n3), $—C(R^{30})(R^{31})—C—C—C\ (R^{32})(R^{33})—$ is added to two adjacent carbon atoms on the same 5-membered ring or 6-membered ring of the fullerene structure so as to form a 6-membered ring. In General Formula (n4), $—C\ (R^{34})(R^{35})—$ is added to two adjacent carbon atoms on the same 5-membered ring or 6-membered ring of the fullerene structure so as to form a 3-membered ring. L is an integer from 1 to 8. L is preferably an integer from 1 to 4, or more preferably 1 or 2.

$R^{21}$ in General Formula (n1) is an optionally substituted C1-14 alkyl group, optionally substituted C1-14 alkoxy group or optionally substituted aromatic group.

The alkyl group is preferably a C1-10 alkyl group, and more preferably a methyl group, ethyl group, n-propyl group, isopropyl group, n-butyl group or isobutyl group, or still more preferably a methyl group or ethyl group. The alkoxy group is preferably a C1-10 alkoxy group, or more preferably a C1-6 alkoxy group, or especially a methoxy or ethoxy group. The aromatic group is preferably a C6-20 aromatic hydrocarbon group or C2-20 aromatic heterocyclic group, or more preferably a phenyl group, thienyl group, furyl group or pyridyl group, or still more preferably a phenyl or thienyl group.

An optional substituent of the aforementioned alkyl group, alkoxy group and aromatic group is not particularly limited, but is preferably a halogen atom or silyl group. A fluorine atom is preferred as the halogen atom. A diarylalkylsilyl group, dialkylarylsilyl group, triarylsilyl group or trialkylsilyl group is preferred as a silyl group, a dialkylarylsilyl group is more preferred, and a dimethylarylsilyl group is especially preferred.

$R^{22}$ to $R^{24}$ in General Formula (n1) are each independently a hydrogen atom, an optionally substituted C1-14 alkyl group or optionally substituted aromatic group.

A C1-10 alkyl group is preferred as the alkyl group, and a methyl, ethyl, n-propyl, isopropyl, n-butyl, isobutyl, t-butyl or n-hexyl group is more preferred. The optional substituent of the alkyl group is preferably a halogen atom. A fluorine atom is preferred as the halogen atom. A perfluorooctyl group, perfluorohexyl group or perfluorobutyl group is preferred as an alkyl group substituted with a fluorine atom.

The aromatic group is preferably a C6-20 aromatic hydrocarbon group or C2-20 aromatic heterocyclic group, or more preferably a phenyl group, thienyl group, furyl group or pyridyl group, or still more preferably a phenyl or thienyl group. The optional substituent of the aromatic group is not particularly limited, but is preferably a fluorine atom, C1-14 alkyl group, C1-14 alkyl fluoride group, C1-14 alkoxy group or C3-10 aromatic group, or more preferably a fluorine atom or a C1-14 alkoxy group, or still more preferably a methoxy group, n-butoxy group or 2-ethylhexyloxy group. When the aromatic group has a substituent, the number thereof is not limited, but is preferably 1 to 3 or more preferably 1. When the aromatic group has a plurality of substituents, the substituents may be of different kinds but are preferably of the same kind.

$R^{25}$ to $R^{29}$ in General Formula (n2) are each independently a hydrogen atom, an optionally substituted C1-14 alkyl group or optionally substituted aromatic group.

A methyl, ethyl, n-propyl, isopropyl, n-butyl, isobutyl, n-hexyl or octyl group is preferred as the alkyl group, and a methyl group is more preferred. The optional substituent of the alkyl group is not particularly limited, but is preferably a halogen atom. A fluorine atom is preferred as the halogen atom. A perfluorooctyl group, perfluorohexyl group or perfluorobutyl group is preferred as an alkyl group substituted with a fluorine atom.

The aromatic group is preferably a C6-20 aromatic hydrocarbon group or C2-20 aromatic heterocyclic group, and is more preferably a phenyl group or pyridyl group, or still more preferably a phenyl group. The optional substituent of the aromatic group is not particularly limited, but is preferably a fluorine atom, C1-14 alkyl group or C1-14 alkoxy group. The alkyl group may also be substituted with a fluorine atom. A C1-14 alkoxy group is more preferred, and a methoxy group is still more preferred. When there is a substituent, the number thereof is not limited, but is preferably 1 to 3 or more preferably 1. The substituents may be of different kinds but are preferably of the same kind.

$Ar^1$ in General Formula (n3) is an optionally substituted C6-20 aromatic hydrocarbon group or C2-20 aromatic heterocyclic group, and is preferably a phenyl, naphthyl, biphenyl, thienyl, furyl, pyridyl, pyrimidyl, quinolyl or quinoxalyl group, or more preferably a phenyl, thienyl or furyl group.

The optional substituent is not limited, but is preferably a fluorine atom, chlorine atom, hydroxyl group, cyano group, silyl group or boryl group, an amino group optionally substituted with an alkyl group, a C1-14 alkyl group, a C1-14 alkoxy group, a C2-14 alkylcarbonyl group, a C1-14 alkylthio group, a C2-14 alkenyl group, a C2-14 alkynyl group, a C2-14 ester group, a C3-20 arylcarbonyl group, a C2-20 arylthio group, a C2-20 aryloxy group, a C6-20 aromatic hydrocarbon group or a C2-20 heterocyclic group, or more preferably a fluorine atom, C1-14 alkyl group, C1-14 alkoxy group, C2-14 ester group, C2-14 alkylcarbonyl group or C3-20 arylcarbonyl group. The C1-14 alkyl group may be substituted with one or two or more fluorine atoms.

The C1-14 alkyl group is preferably a methyl, ethyl or propyl group. The C1-14 alkoxy group is preferably a methoxy, ethoxy or propoxy group. The C1-14 alkylcarbonyl group is preferably an acetyl group. The C2-14 ester group is preferably a methyl ester group or n-butyl ester group. The C3-20 arylcarbonyl group is preferably a benzoyl group.

When there is a substituent, the number thereof is not limited, but is preferably 1 to 4 or more preferably 1 to 3. When there are a plurality of substituents, they may be of different kinds but are preferably of the same kind.

$R^{30}$ to $R^{33}$ in General Formula (n3) are each independently a hydrogen atom, optionally substituted alkyl group, optionally substituted amino group, optionally substituted alkoxy group or optionally substituted alkylthio group. $R^{30}$ or $R^{31}$ may form a ring by binding to either $R^{32}$ or $R^{33}$. When a ring is formed, its structure is represented for example by General Formula (n5), which is a bicyclo structure of condensed aromatic groups.

[Chemical Formula 44]

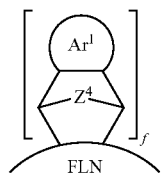

(n5)

In General Formula (n5), f is the same as c, and $Z^4$ is an oxygen atom, sulfur atom, amino group, alkylene group or arylene group. As an alkylene group, it preferably has 1 or 2 carbon atoms. As an arylene group, it preferably has 5 to 12 carbon atoms, and is a phenylene group for example. An amino group may be substituted with a methyl, ethyl or other C1-6 alkyl group. The alkylene group may be substituted with a methoxy group or other C1-6 alkoxy group, a C1-5 aliphatic hydrocarbon group, a C6-20 aromatic hydrocarbon group or a C2-20 aromatic heterocyclic group. The arylene group may be substituted with a methoxy group or other C1-6 alkoxy group, a C1-5 aliphatic hydrocarbon group, a C6-20 aromatic hydrocarbon group or a C2-20 aromatic heterocyclic group.

The structure represented by Formula (n6) or (n7) below is particularly desirable as the structure represented by Formula (n5).

[Chemical Formula 45]

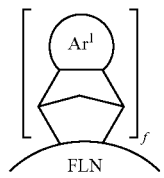

(n6)

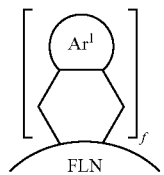

(n7)

$R^{34}$ and $R^{35}$ in General Formula (n4) are each independently a hydrogen atom, alkoxycarbonyl group, optionally substituted C1-14 alkyl group or optionally substituted aromatic group.

The alkoxy group which forms the alkoxycarbonyl group is preferably a C1-12 alkoxy group or C1-12 alkoxy fluoride group, and more preferably a C1-12 alkoxy group, and a methoxy, ethoxy, n-propoxy, isopropoxy, n-butoxy, isobutoxy, n-hexoxy, octoxy, 2-propylpentoxy, 2-ethylhexoxy, cyclohexylmethoxy or benzyloxy group is still more preferred, and a methoxy, ethoxy, isopropoxy, n-butoxy, isobutoxy or n-hexoxy group is especially preferred.

The alkyl group is preferably a C1-8 linear alkyl group, and more preferably a n-propyl group. The optional substituent of the alkyl group is not particularly limited, but an alkoxycarbonyl group is preferred. The alkoxy group which forms the alkoxycarbonyl group is preferably a C1-14 alkoxy group or alkoxy fluoride group, and more preferably a C1-14 hydrocarbon group, and a methoxy, ethoxy, n-propoxy, isopropoxy, n-butoxy, isobutoxy, n-hexoxy, octoxy, 2-propylpentoxy, 2-ethylhexoxy, cyclohexylmethoxy or benzyloxy group is still more preferable, and a methoxy, or n-butoxy group is especially preferable.

The aromatic group is preferably a C6-20 aromatic hydrocarbon or C2-20 aromatic heterocyclic group, and a phenyl, biphenyl, thienyl, furyl or pyridyl group is preferred, while a phenyl group or thienyl group is more preferred. The optional substituent of the aromatic group is preferably a C1-14 alkyl group, C1-14 alkyl fluoride group or C1-14 alkoxy group, or more preferably a C1-14 alkoxy group, or especially preferably a methoxy or 2-ethylhexyloxy group. When there is a substituent, the number thereof is not limited, but is preferably 1 to 3 or more preferably 1. The substituents may be of the same or different kinds but are preferably of the same kind.

Examples of a preferred structure of General Formula (n4) include a structure in which $R^{34}$ and $R^{35}$ are both alkoxycarbonyl groups, or $R^{34}$ and $R^{35}$ are both aromatic groups, or $R^{34}$ is an aromatic group and $R^{35}$ is a 3-(alkoxycarbonyl)propyl group.

One of the aforementioned compounds or a mixture of multiple kinds of compounds may be used as the fullerene compound.

In order to form a fullerene compound as a film by coating methods, preferably either a fullerene compound itself is coatable in a liquid state, or else a fullerene compound is highly soluble in some solvent so that it can be coated in a solution. A suitable range of solubility is a solubility of normally at least 0.1 mass %, or preferably at least 0.4 mass %, or more preferably at least 0.7 mass % in toluene at 25° C. A solubility of at least 0.1 mass % of the fullerene compound is desirable for increasing the dispersion stability of the fullerene compound in a solution and suppressing coagulation, precipitation, separation and the like.

The solvent for dissolving the fullerene compound is not particularly limited as long as it is a non-polar organic solvent, but a halogen-free solvent is preferred. Dichlorobenzene and other halogen solvents can be used, but alternatives are desirable for environmental reasons and the like. Examples of halogen-free solvents include halogen-free aromatic hydrocarbons. Of these, toluene, xylene or cyclohexylbenzene or the like is preferred.

(Fullerene Compound Production Method)

The method of producing the fullerene compound is not particularly limited, but a fullerene compound having the partial structure (n1) can be synthesized for example in accordance with descriptions in known literature, such as WO 2008/059771 and J. Am. Chem. Soc., 2008, 130(46), 15429-15436.

A fullerene compound having the partial structure (n2) can be synthesized for example in accordance with descriptions in known literature, such as J. Am. Chem. Soc. 1993, 115, 9798-9799, Chem. Mater. 2007, 19, 5363-5372 and Chem. Mater. 2007, 19, 5194-5199.

A fullerene compound having the partial structure (n3) can be synthesized in accordance with descriptions in known literature, such as Angew. Chem. Int. Ed. Engl. 1993, 32, 78-80, Tetrahedron Lett. 1997, 38, 285-288, WO 2008/018931 and WO 2009/086210.

A fullerene compound having the partial structure (n4) can be synthesized in accordance with descriptions in known literature, such as J. Chem. Soc., Perkin Trans. 1, 1997, 1595, Thin Solid Films 489 (2005) 251-256, Adv. Funct. Mater. 2005, 15, 1979-1987 and J. Org. Chem. 1995, 60, 532-538.

Further, commercially available fullerene compounds such as PCBM (Frontier Carbon Ltd. Company), PCBNB (Frontier Carbon Ltd. Company) and the like can also be used favorably.

(N-Alkyl Substituted Perylene Diimide Derivative)

The N-alkyl substituted perylene diimide derivative is not particularly limited, but specific examples include compounds described in WO 2008/063609, WO 2009/115513, WO 2009/098250, WO 2009/000756 and WO 2009/091670. These compounds are desirable for contributing to both charge transport and power generation because they have high electron mobility and they can absorb light in the visible range.

(Naphthalene Tetracarboxylic Diimide)

The naphthalene tetracarboxylic diimide is not particularly limited, but specific examples include compounds described in WO 2008/063609, WO 2007/146250 and WO 2009/000756. These compounds are desirable because they have high electron mobility and solubility and excellent coating properties.

(n-Type Polymeric Semiconductor Materials)

The n-type polymeric semiconductor material is not particularly limited, but may be an n-type polymeric semiconductor material having at least one selected from the naphthalene tetracarboxylic diimides, perylene tetracarboxylic diimides and other condensed ring tetracarboxylic diimides, perylene diimide derivatives, benzoimidazole derivatives, benzoxazole derivatives, thiazole derivatives, benzothiazole derivatives, benzothiadiazole derivatives, oxadiazole derivatives, thiadiazole derivatives, triazole derivatives, pyrazine derivatives, phenanthroline derivatives, quinoxaline derivatives, bipyridine derivatives and borane derivatives as a constituent unit.

Of these, a polymer having at least one selected from the borane derivatives, thiazole derivatives, benzothiazole derivatives, benzothiadiazole derivatives, N-alkyl substituted naphthalene tetracarboxylic diimides and N-alkyl substituted perylene diimide derivatives as a constituent unit is preferred, and an n-type polymeric semiconductor material having at least one selected from the N-alkyl substituted perylene diimide derivatives and N-alkyl substituted naphthalene tetracarboxylic diimides as a constituent unit is more preferred. One of the aforementioned compounds may be used as the n-type polymer semiconductor material, or a mixture of multiple kinds of compounds may be used.

Specific examples of the n-type polymeric semiconductor material include the compounds described in WO 2009/098253, WO 2009/098250, WO 2010/012710 and WO 2009/098250. These compounds are desirable because they have excellent viscosity and coating properties, and they can contribute to power generation because they can absorb light in the visible range.

[5-3. Buffer Layers (102, 104)]

The photoelectric conversion element 107 has buffer layers 102 and 104 between the active layer 103 and the electrodes 101 and 105. The buffer layers can be classified into an electron extraction layer 104 and a hole extraction layer 102. When a buffer layer is provided, it serves to facilitate the electron and hole transfer between the active layer 103 and the electrodes 101 and 105, and it can prevent short circuits between the electrodes. In fact, however, the buffer layers 102 and 104 need not be present in the present invention.

The electron extraction layer 104 and hole extraction layer 102 are disposed on either side of the active layer 103, between the pair of electrodes (101, 105). That is, when the photoelectric conversion element 107 of the present invention contains both an electron extraction layer 104 and a hole extraction layer 102, the electrode 101, hole extraction layer 102, active layer 103, electron extraction layer 104 and electrode 105 are disposed in that order. When the photoelectric conversion element 107 of the present invention contains an electron extraction layer 104 but no hole extraction layer 102, the electrode 101, active layer 103, electron extraction layer 104 and electrode 105 are disposed in that order. The layering sequence of the electron extraction layer 104 and the hole extraction layer 102 may be reversed, and one or both of the electron extraction layer 104 and the hole extraction layer 102 may be composed of a plurality of different films.

[5-3-1. Electron Extraction Layer 104]

The material of electron extraction layer 104 is not particularly limited as long as it is a material that improves the efficiency of electron extraction from active layer 103 to electrode 101, but examples include inorganic compounds and organic compounds.

Examples of the inorganic compound material which is preferred to be used in combination with the copolymer of the present invention include salts of alkali metals such as Li, Na, K and Cs, and n-type semiconductor oxides such as titanium oxide (TiOx), zinc oxide (ZnO) and the like. Of these, the alkali metal salt is preferably a fluoride salt such as LiF, NaF, KF or CsF, and the n-type semiconductor oxide is preferably zinc oxide (ZnO). The mechanism of action of such materials is unknown, but it may be that when combined with the cathode 105 formed by Al and the like, they reduce the work function of the cathode 105, thereby increasing the voltage applied inside the photovoltaics element.

Examples of organic compound materials that are preferably used in combination with the copolymer of the present invention include triaryl phosphine oxide compounds and other phosphine compounds having double bonds between phosphorus atoms and Group 16 elements; bathocuproine (BCP), bathophenanthroline (Bphen) and other optionally substituted phenanthrene compounds optionally having heteroatoms substituted at the 1 and 10 positions; triarylboron and other boron compounds; (8-hydroxyquinolinate)aluminum (Alq3) and other organic metal oxides; oxadiazole compounds, benzoimidazole compounds and other compounds having one or two optionally substituted ring structures; and naphthalene tetracarboxylic dianhydride (NTCDA), perylene tetracarboxylic dianhydride (PTCDA) and other aromatic compounds comprising dicarboxylic acid anhydrides or other condensed dicarboxylic acid structures.

The LUMO energy level of the material of the electron extraction layer 104 is not particularly limited, but is normally at least −4.0 eV, and preferably at least −3.9 eV. However, it is normally −1.9 eV or less, or preferably −2.0 eV or less. From the standpoint of promoting charge transfer, it is desirable that the material of the electron extraction layer 104 have a LUMO energy level of −1.9 eV or less. From the standpoint of preventing reverse electron transfer to the n-type material, it is desirable that the material of the electron extraction layer 104 have a LUMO energy level of at least −4.0 eV.

The HOMO energy level of the material of the electron extraction layer 104 is not particularly limited, but is normally at least −9.0 eV, and preferably at least −8.0 eV. However, it is normally −5.0 eV or less, or preferably −5.5 eV or less. Giving the material of the electron extraction layer 104 a HOMO energy level of −5.0 eV or less is desirable from the standpoint of inhibiting incoming hole transfer.

The LUMO energy level and HOMO energy level of the material of the electron extraction layer 104 can be calculated by the cyclic voltammogram measurement method. This can be performed with reference to the methods described in known literature (WO 2011/016430).

When the material of the electron extraction layer 104 is an organic compound, if DSC is used for measurement, the glass transition temperature (hereunder sometimes called the Tg) of this compound is not particularly limited, but is preferably either not observed, or at least 55° C. If no glass transition temperature is observed according to DSC, this means that there is no glass transition temperature. Specifically, this is determined according to whether or not there is a glass transition temperature at 400° C. or less. A material for which no glass transition temperature is observed according to DSC is desirable because it is thermally extremely stable.

Of the materials having glass transition temperatures of 55° C. or more when measured according to DSC, one with a glass transition temperature of preferably at least 65° C., more preferably at least 80° C., still more preferably at least 110° C. or especially at least 120° C. is desirable. There is no particular upper limit to the glass transition temperature, but is normally 400° C. or less, and preferably 350° C. or less, and more preferably 300° C. or less. Moreover, the material of the electron extraction layer 104 is preferably one for which no glass transition temperature according to DSC is observed at temperatures 30° C. or more and less than 55° C.

The glass transition temperature in this Description is the temperature at which local molecular movement is initiated by thermal energy in a solid in an amorphous state, and is defined as the point at which the specific heat changes. When the temperature continues to rise above the Tg, the solid structure changes and crystallization occurs (the temperature at this point is called the crystallization temperature (Tc)). If the temperature rises still further, the compound generally melts at the melting point (Tm), changing to a liquid state. However, these phase transitions may not occur if the molecules decompose or sublimate at high temperatures.

The DSC method (differential scanning calorimetry) is a method of measuring thermophysical properties as defined in JIS K-0129 "General rules for thermal analysis". To determine the glass transition temperature more exactly, it is preferably measured after the sample has been first heated to a temperature equal to or above the glass transition point and then cooled rapidly. The measurement can be accomplished by the methods described in known literature (WO 2011/016430) for example.

If the glass transition temperature of a compound used in the electron extraction layer is at least 55° C., the compound is resistant to structural changes in response to external stress such as applied electrical fields, flowing current, bending and stress from temperature changes and the like, which is desirable from the standpoint of durability. Since a thin film of the compound is also less likely to crystallize, moreover, changes between amorphous state and crystal state are less likely in this compound at the operating temperature range, which is desirable for improving the stability and therefore the durability of the electron extraction layer. This effect is more conspicuous the higher the glass transition temperature of the material.

The film thickness of the electron extraction layer 104 is not particularly limited, but is normally at least 0.01 nm or preferably at least 0.1 nm or more preferably at least 0.5 nm. Also, it is normally 40 nm or less, or preferably 20 nm or less. When the film thickness of the electron extraction layer 104 is at least 0.01 nm it can function as a buffer material, while when the film thickness of the electron extraction layer 104 is 40 nm or less, electrons are more easily extracted, and photoelectric conversion efficiency may be improved.

[5-3-2. Hole Extraction Layer 102]

The material of the hole extraction layer 102 is not particularly limited as long as it is one that can improve the efficiency of hole extraction from the active layer 103 to the anode 101. Specific examples include conductive polymers comprising polythiophene, polypyrrole, polyacetylene, triphenylenediamine, polyaniline or the like doped with sulfonic acid and/or iodine or the like, polythiophene derivatives having sulfonyl groups as substituents, arylamines and other electrically conductive organic compounds, and the p-type semiconductor materials discussed above and the like. Of these, an electrically conductive polymer doped with sulfonic acid is preferred, and poly(3,4-ethylenedioxythiophene)poly(styrenesulfonic acid) (PEDOT:PSS) comprising a polythiophene derivative doped with polystyrene sulfonic acid is more preferred. A thin film of gold, indium, silver, palladium or another metal or the like may also be used. The metal or other thin film may be formed independently, but may also be used in combination with the organic materials discussed above.

The film thickness of the hole extraction layer 102 is not particularly limited, but is normally at least 2 nm. Also, it is normally 40 nm or less, or preferably 20 nm or less. Giving the hole extraction layer 102 a film thickness of at least 2 nm allows it to function as a buffer material, while giving the hole extraction layer 102 a film thickness of 40 nm or less serves to facilitate hole extraction, and may improve photoelectric conversion efficiency.

The method of forming the electron extraction layer 104 and the hole extraction layer 102 is not limited. For example, they can be formed by vacuum deposition or the like using a material that sublimates. Alternatively, they can be formed by a wet coating method such as spin coating or an ink jet method when using a material that is soluble in a solvent. When a semiconductor material is used for the hole extraction layer 102, the layer containing a semiconductor material precursor can be formed, and then the precursor can be converted to a semiconductor material as in the case of the active layer 103.

[5-4. Electrodes 101, 105]

The electrodes (101 and 105) have the function of collecting holes and electrons generated by light absorption. Thus, an electrode 101 suited to hole collection (hereunder sometimes called an anode) and an electrode 105 suited to electron collection (hereunder sometimes called a cathode) are preferably used as the pair of electrodes. Either one of the pair of electrodes may be translucent, or both may be translucent. Translucent here means the property of transmitting 40% or more of sunlight. Moreover, the transparent electrode preferably has solar ray transmittance of 70% or more to allow light to pass through the transparent electrode and reach the active layer 103. Light transmittance can be measured with an ordinary spectrophotometer.

The anode 101 is normally made of a conductive material having a higher work function than the cathode, and has the function of smoothly extracting the holes generated in the active layer 103.

The anode 101 may be of a material such as nickel oxide, tin oxide, indium oxide, indium tin oxide (ITO), indium-zirconium oxide (IZO), titanium oxide, indium oxide, zinc oxide or another conductive metal oxide, or a metal such as gold, platinum, silver, chromium or cobalt, or an alloy thereof. They are desirable because these materials have high work functions and they also can be laminated with conductive polymeric materials such as PEDOT/PSS (comprising a polythiophene derivative doped with polystyrene sulfonic acid). When such a conductive polymeric material is laminated as the anode material, a wide range of metals suited to cathodes, such as Al and Mg, can also be used even though these materials do not have such high work functions because the work function of the conductive polymeric material is high.

Moreover, PEDOT/PSS (comprising a polythiophene derivative doped with polystyrene sulfonic acid) and conductive polymeric materials comprising polypyrrole or polyaniline doped with iodine or the like can also be used as anode materials.

When the anode 101 is a transparent electrode, it is desirable to use a translucent conductive metal oxide such as ITO, zinc oxide or tin oxide, and ITO is especially desirable.

The film thickness of the anode 101 is not particularly limited, but is normally at least 10 nm, or preferably at least 20 nm, or more preferably at least 50 nm. Also, it is normally 10 µm or less, or preferably 1 µm or less, or more preferably 500 nm or less. Sheet resistance can be controlled if the film thickness of the anode 101 is at least 10 nm, while light can be efficiently converted to electricity without loss of light transmittance if the film thickness of the anode 101 is 10 µm or less. When the anode 101 is a transparent electrode, the film thickness must be chosen so as to achieve both light transmittance and sheet resistance.

The sheet resistance of the anode 101 is not particularly limited, but is normally at least $1\Omega/\square$, and is normally $1,000\Omega/\square$ or less, or preferably $500\Omega/\square$ or less, or more preferably $100\Omega/\square$ or less.

The methods of forming the anode 101 include vacuum film-forming methods such as a vapor deposition method or a sputtering method or the like, or a wet coating method of film formation by applying an ink containing nanoparticles or a precursor.

The cathode 105 is normally made of a conductive material having a higher work function value than that of the anode, and has the function of smoothly extracting the electrons generated in the active layer 103.

The material of the cathode 105 may be a metal or an alloy of a metal such as platinum, gold, silver, copper, iron, tin, zinc, aluminum, indium, chromium, lithium, sodium, potassium, cesium, calcium or magnesium; an inorganic salt such as lithium fluoride or cesium fluoride; or a metal oxide such as nickel oxide, aluminum oxide, lithium oxide or cesium oxide. These materials are desirable because they have low work functions. As in the case of the anode 101, a material having a high work function suited to the anode 101 can also be used as the cathode 105 if titania or another n-type semiconductor having electrical conductivity is used as the electron extraction layer 104. From the standpoint of electrode protection, platinum, gold, silver, copper, iron, tin, aluminum, calcium, indium and other metals and oxides using these metals are preferred as the material of the cathode 105.

The film thickness of the cathode 105 is not particularly limited, but is normally at least 10 nm, or preferably at least 20 nm, or more preferably at least 50 nm. Also, it is normally 10 µm or less, or preferably 1 µm or less, or more preferably 500 nm or less. Sheet resistance is controlled if the film thickness of the cathode 105 is at least 10 nm, while light can be efficiently converted to electricity without loss of light transmittance if the film thickness of the cathode 105 is 10 μm or less. When the cathode 105 is used as a transparent electrode, the film thickness needs to be chosen so as to achieve both light transmittance and sheet resistance.

The sheet resistance of the cathode 105 is not particularly limited, but is normally 1,000Ω/□ or less, or preferably 500Ω/□ or less, or more preferably 100Ω/□ or less. There is no particular lower limit, but normally it is at least 1Ω/□.

The method of forming the cathode 105 is preferably a vacuum film-forming method such as a sputtering method or a vapor deposition method or the like, or a wet coating method of film formation by applying an ink containing nanoparticles or a precursor.

Moreover, anode 101 and cathode 105 may also have layered structures formed of two or more layers. The properties (electrical properties, wetting properties and the like) of the anode 101 and cathode 105 may also be improved by carrying out surface treatment.

After the anode 101 and cathode 105 are laminated, a photoelectrical conversion element is preferably heat treated at a temperature range of normally at least 50° C., or preferably at least 80° C., and is normally 300° C. or less or preferably 280° C. or less or more preferably 250° C. or less (this step is sometimes called the annealing step). A temperature of 50° C. or more is desirable in an annealing step because it has the effect of improving the adhesion between the layers of the photoelectrical conversion element, for example the adhesion between the electron extraction layer 104 and the electrode 101 and/or between the electron extraction layer 104 and the active layer 103. The heat stability, durability and the like of the photoelectric conversion element can be improved by improving the adhesiveness between the layers. Self-assembly of the active layer can also be promoted by the annealing step. A temperature of 300° C. or less is preferred in an annealing step because there is less likelihood of thermal decomposition of the organic compound in the active layer 103. Heating may also be accomplished in stages within the aforementioned temperature range in the annealing step.

The heating time is normally at least 1 minute, or preferably at least 3 minutes, and is normally 3 hours or less, or preferably 1 hour or less. An annealing step is preferably terminated when the photovoltaics performance values (open voltage, short-circuit current and fill factor) reach specific values. Moreover, an annealing step is preferably performed under normal pressure in an inactive gas atmosphere.

Heating may be accomplished by placing a photoelectric conversion element on a hot plate or other heat source, or by placing a photoelectric conversion element in a heated atmosphere in an oven or the like. Heating may also be accomplished either by a batch process or a continuous process.

[5-5. Base Material (106)]

A photoelectric conversion element 107 normally has a base material 106 as a support. That is, electrodes 101 and 105, an active layer 103 are formed on a base material. Incidentally, the photoelectric conversion element of the present invention may omit a substrate 106.

The material of the base material 106 is not particularly limited as long as it does not greatly detract from the effects of the present invention. Desirable examples of the material of the base material 106 include quartz, glass, sapphire, titania and other inorganic materials; polyethylene terephthalate, polyethylene naphthalate, polyethersulfone, polyimide, nylon, polystyrene, polyvinyl alcohol, ethylene vinyl alcohol copolymer, fluorine resin film, vinyl chloride, polyethylene and other polyolefins, cellulose, polyvinylidene chloride, aramide, polyphenylene sulfide, polyurethane, polycarbonate, polyarylate, polynorbornene, epoxy resin and other organic materials; paper, synthetic paper and other paper materials; and composite materials comprising stainless steel, titanium, aluminum and other metals that have been surface coated or laminated to convey insulating properties and the like.

Examples of glass include soda glass, green sheet glass, alkali-free glass and the like. Of these, alkali-free glass is preferred as a glass material in terms of lower ion elution from the glass.

The shape of the base material 106 is not limited, and a plate shape, film shape, sheet shape or other shape may be used. The film thickness of the base material 106 is not limited, but is normally at least 5 μm or preferably at least 20 μm, and is normally 20 mm or less or preferably 10 mm or less. A film thickness of the base material of at least 5 μm is desirable because it is less likely that the photoelectric conversion element will not be strong enough. A film thickness of the base material of 20 mm or less is desirable for controlling costs and mass. When the material of the base material 106 is glass, the film thickness is normally at least 0.01 mm, or preferably at least 0.1 mm, and is preferably 1 cm or less, or preferably 0.5 cm or less. The glass base material 106 with a film thickness of at least 0.01 mm is desirable for increasing mechanical strength and preventing breakage. A film thickness of 0.5 cm or less of the glass base material 106 is preferred for controlling mass.

[5.6 Photoelectric Conversion Properties]

The photoelectric conversion properties of the photoelectric conversion element 107 can be determined as follows. The photoelectric conversion element 107 is exposed to light with an irradiation intensity of 100 mW/cm$^2$ under conditions of AM 1.5 G with a solar simulator, and the current-voltage characteristics are measured. The photoelectric conversion properties of photoelectric conversion efficiency (PCE), short-circuit current density (Jsc), open voltage (Voc), fill factor (FF), serial resistance and shunt resistance can be determined from the resulting current-voltage curve.

The photoelectric conversion efficiency of the photoelectric conversion element of the present invention is not particular limited, but is normally at least 1%, or preferably at least 1.5%, or more preferably at least 2%. There is no particular upper limit to the photoelectric conversion efficiency, which is preferably as high as possible.

One method of measuring the durability of the photoelectric conversion element is a method of determining the retention rate from the photoelectric conversion efficiency before and after exposure of the photoelectric conversion element to atmosphere.

(Retention rate)=(photoelectric conversion efficiency after N hours' atmospheric exposure)/(photoelectric conversion efficiency before atmospheric exposure)

For purposes of practical use, it is important that the photoelectric conversion element not only be cheap and easy to manufacture, but also have high photoelectric conversion efficiency and durability. From this perspective, the retention rate of photoelectric conversion efficiency after one week of exposure to atmosphere is preferably at least 60%, or more preferably 80%, and is preferably as high as possible.

6. [Photovoltaics of Invention]

The photoelectric conversion element 107 of the present invention is preferably used as an photovoltaics element of a solar cell and particularly a thin photovoltaics.

Figure 2:
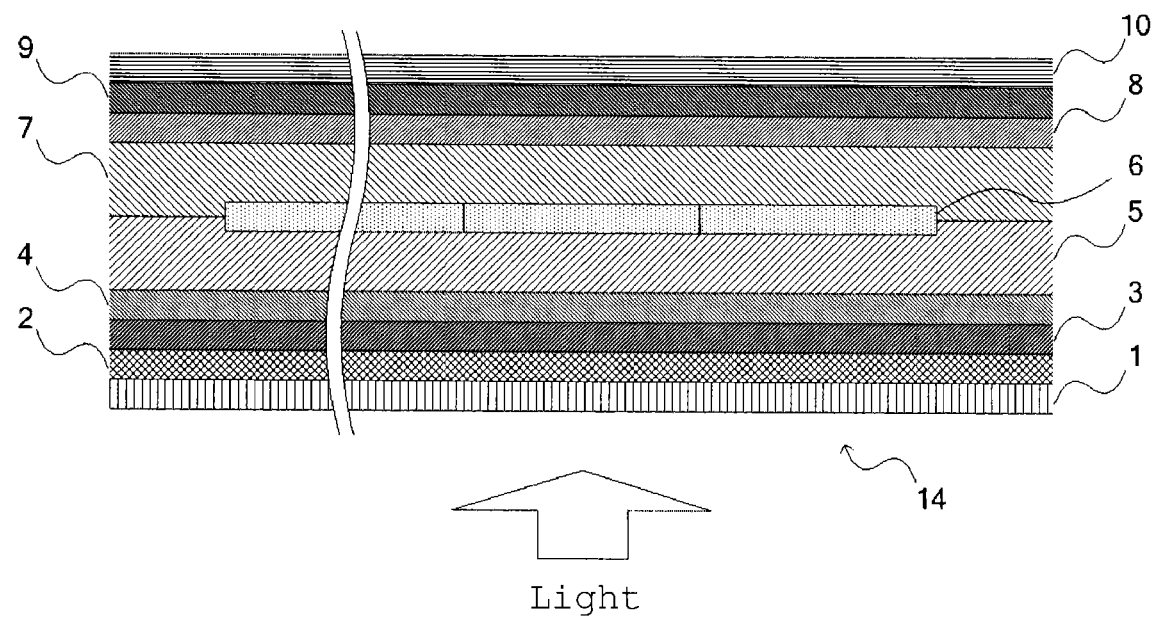
FIG. 2 is a cross-section schematically illustrating the configuration of a photovoltaics as one embodiment of the present invention.

FIG. 2 is a cross-section schematically illustrating the configuration of a thin photovoltaics of one embodiment of the present invention. As shown in FIG. 2, the thin photovoltaics 14 of this embodiment comprises a weather-resistant protective film 1, an ultraviolet protection film 2, a gas barrier film 3, a getter film 4, a seal material 5, a photovoltaics element 6, a seal material 7, a getter film 8, a gas barrier film 9, and a back sheet 10 in that order. The photovoltaics element 6 generates electricity when it is exposed to light from the side with the formed weather-resistant film 1 (bottom of drawing). The getter film 8 and/or the gas barrier film 9 may be omitted when using a highly water-resistant sheet as the back sheet 10 (discussed below), such as a sheet comprising a fluorine resin film affixed to both surfaces of an aluminum foil.

[6.1 Weather-Resistant Protective Film (1)]

The weather-resistant protective film 1 is a film that protects the photovoltaics element 6 from weather changes. Therefore, the photovoltaics element 6 and the like are protected from weather changes and the like, and high power-generating performance is maintained by covering the photovoltaics element 6 with the weather-resistant protective film 1. Because the weather-resistant protective film 1 is located in the outermost layer of the thin photovoltaics 14, it preferably has properties suited to a surface covering material for the thin photovoltaics 14, including weather resistance, heat resistance, transparency, water repellency, stain resistance and/or mechanical strength, and also preferably maintains these properties for a long period of time when exposed outdoors.

The weather-resistant protective film 1 also preferably transmits visible light so as not to impede the light absorption of the photovoltaics element 6. For example, it preferably has at least 80% transmittance of visible light (wavelength 360 nm to 830 nm), and there is no upper limit. Because the thin photovoltaics 14 is heated when it receives light, moreover, the weather-resistant protective film 1 is preferably resistant to heat. From this standpoint, the melting point of the constituent material of the weather-resistant protective film 1 is normally at 100° C. or higher and 350° C. or lower.

The material that constitutes the weather-resistant protective film 1 may be any that can protect the photovoltaics element 6 from weather changes. Examples of this material include polyethylene resin, polypropylene resin, cyclic polyolefin resin, AS (acrylonitrile-styrene) resin, ABS (acrylonitrile-butadiene-styrene) resin, polyvinyl chloride resin, fluorine resin, polyethylene terephthalate, polyethylene naphthalate and other polyester resins, phenol resin, polyacrylic resin, various nylons and other polyamide resins, polyimide resin, polyamide-imide resin, polyurethane resin, cellulose resin, silicone resin, polycarbonate resin and the like.

The weather-resistant protective film 1 may be formed of one kind of material, or of two or more kinds of materials. Moreover, the weather-resistant protective film 1 may be formed as a monolayer film, or as a laminate film comprising two or more film layers.

The thickness of the weather-resistant protective film 1 is not limited, but is normally at 10 μm or more and 200 μm or less.

The weather-resistant protective film 1 may also be subjected to corona treatment and/or plasma treatment or other surface treatment to improve adhesion with the other films.

The weather-resistant protective film 1 is preferably provided as much as possible on the outside of the thin photovoltaics 14, so that it can protect as many as possible of the constituent parts of the thin photovoltaics 14.

[6.2 Ultraviolet Protection Film (2)]

The ultraviolet protection film 2 is a film for blocking transmission of ultraviolet rays. Therefore, ultraviolet protection film 2 is provided on the light-receiving part of the thin photovoltaics 14 so as to cover the light-receiving surface 6a of the photovoltaics element 6, thereby protecting the photovoltaics element 6 and the gas barrier films 3 and 9 and the like as necessary from ultraviolet rays, so that the electric generating capacity can be maintained at a high level.

The required UV transmittance inhibition ability of the ultraviolet protection film 2 is preferably such as to achieve no more than 50% transmittance of UV rays (for example, at a wavelength of 300 nm), and there is no lower limit. Moreover, the ultraviolet protection film 2 preferably transmits visible light so as not to hinder the light absorption of the photovoltaics element 6. For example, it preferably has at least 80% transmittance of visible light (wavelength 360 nm to 830 nm), and there is no upper limit.

Moreover, the ultraviolet protection film 2 is preferably resistant to heat because the thin photovoltaics 14 is heated when it receives light. From this standpoint, the melting point of the constituent material of the ultraviolet protection film 2 is normally at 100° C. or higher and 350° C. or lower.

The ultraviolet protection film 2 is preferably highly flexible, preferably has good adhesiveness with the adjacent films, and is also preferably capable of excluding water vapor and oxygen.

The material making up the ultraviolet protection film 2 may be any that can weaken the strength of ultraviolet rays. Examples of such materials include films and the like comprising ultraviolet absorbers compounded with epoxy-based, acrylic-based, urethane-based or ester-based resins. It is also possible to use a film comprising a layer of an ultraviolet absorber dispersed or dissolved in a resin (hereunder called an "UV absorbing layer"), formed on a base film.

The ultraviolet absorber may be a salicylic acid series, benzophenone series, benzotriazole series or cyanoacrylate series ultraviolet absorber, or the like. One kind of ultraviolet absorber may be used, or any two or more kinds may be combined and used in any proportions. As discussed above, a film comprising a UV absorbing layer formed on a base film may be used as an ultraviolet absorbing film. Such a film may be prepared for example by coating a base film with a coating solution containing an ultraviolet absorber, and drying the solution.

The material of the base film is not particularly limited, but may be polyester for example in order to provide a film with a good balance of heat resistance and flexibility.

Examples of specific products for ultraviolet protection film 2 include Cut-Ace (MKV plastic Co., Ltd.) and the like. The ultraviolet protection film 2 may be formed of one kind of material, or of two or more kinds of materials.

Also, the ultraviolet protection film 2 may be formed as a monolayer film, or as a laminate film comprising two or more film layers. The thickness of the ultraviolet protection film 2 is not limited, but is normally at 5 μm or more and 200 μm or less.

The ultraviolet protection film 2 can be provided in a location where it covers at least part of the light-receiving surface 6a of the photovoltaics element 6, but is preferably provided in a location where it covers all of the light-receiving surface 6a of the photovoltaics element 6. However, the ultraviolet protection film 2 may also be provided in another location in addition to the location where it covers the light-receiving surface 6a of the photovoltaics element 6.

[6.3 Gas Barrier Film (3)]

The gas barrier film 3 is a film to prevent permeation of water and oxygen. It is possible to protect the photovoltaics element 6 against water and oxygen and maintain the electric generating capacity at a high level by covering the photovoltaics element 6 with a gas barrier film 3.

The degree of moisture-proofing performance required of the gas barrier film 3 varies according to the type of the photovoltaics element 6 and the like, but the water vapor transmission rate per day per unit area (1 m$^2$) is normally $1\times10^{-1}$ g/m$^2$/day or less, with no lower limit.

The degree of oxygen permeability required of the gas barrier film 3 varies depending on the type of the photovoltaics element 6 and the like, but the oxygen transmission rate per day per unit area (1 m$^2$) is normally $1\times10^{-1}$ cc/m$^2$/day/atm or less, with no lower limit.

The gas barrier film 3 also preferably transmits visible light so as not to impede the light absorption of the photovoltaics element 6. For example, the transmittance of visible light (wavelength 360 to 830 nm) is normally at least 60%, with no upper limit.

Moreover, the gas barrier film 3 is preferably also resistant to heat because the thin photovoltaics 14 is often heated when it receives light. From this standpoint, the melting point of the constituent material of the gas barrier film 3 is normally at 100° C. or higher and 350° C. or lower.

The gas barrier film 3 may be constituted in any way as long as it can protect the photovoltaics element 6 from water. However, because a film that allows less water vapor and oxygen to pass through the gas barrier film 3 also has higher manufacturing costs, these considerations need to be balanced when selecting the film.

Of these, a film comprising SiOx vacuum deposited on a polyethylene terephthalate (PET) or polyethylene naphthalate (PEN) or other base film is an example of preferred gas barrier film 3.

The gas barrier film 3 may be formed of one kind of material or of two or more kinds of materials. Also, the gas barrier film 3 may be formed as a monolayer film, but may also be a laminate film comprising two or more film layers.

The thickness of the gas barrier film 3 is not limited, but is normally at 5 μm or more and 200 μm or less.

The location where the barrier film 3 is formed is not limited as long as it can cover the photovoltaics element 6 and protect it from moisture and oxygen, but preferably it covers the front surface (surface on the light-receiving side; lower surface in FIG. 2) and the reverse surface (surface opposite the light-receiving side; upper surface in FIG. 2) of the photovoltaics element 6. This is because the front surface and reverse surface are often formed with larger areas than other surfaces in the thin photovoltaics 14. In this embodiment, the gas barrier film 3 covers the front surface of the photovoltaics element 6, and a gas barrier film 9 (discussed below) covers the reverse surface of the photovoltaics element 6. The getter film 8 and/or the gas barrier film 9 may be omitted when using a highly water-resistant sheet as the back sheet 10 (discussed below), such as a sheet comprising a fluorine resin film affixed to both surfaces of an aluminum foil.

[6.4 Getter Film (4)]

A getter film 4 is a film that absorbs moisture and/or oxygen. Therefore, covering the photovoltaics element 6 with the getter film 4 serves to protect the photovoltaics element 6 and the like from moisture and/or oxygen, so that the electric generating capacity can be maintained at a high level. Unlike the gas barrier film 3 above, the getter film 4 does not prevent moisture permeation, but instead absorbs moisture. By using a film that absorbs moisture, the slight amount of moisture that penetrates the space formed by the gas barrier films 3 and 9 can be captured by the getter film 4, thereby eliminating the effects of moisture on the photovoltaics element 6.

The moisture absorption ability of the getter film 4 is normally at least 0.1 mg/cm$^2$, and has no upper limit, but is normally 10 mg/cm$^2$ or less. Because the getter film 4 absorbs oxygen, if the photovoltaics element 6 is covered with the gas barrier films 3, 9 and the like, the slight amount of oxygen that penetrates the space formed by the gas barrier films 3 and 9 can be captured by the getter film 4, thereby eliminating the effects of oxygen on the photovoltaics element 6.

The getter film 4 preferably transmits visible light so as not to impede the light absorption of the photovoltaics element 6. For example, the transmittance of visible light (wavelength 360 to 830 nm) is normally at least 60%, with no upper limit.

Moreover, the getter film 4 is preferably also resistant to heat because the thin photovoltaics 14 is often heated when it receives light. From this standpoint, the melting point of the constituent material of the getter film 4 is normally at 100° C. or higher and 350° C. or lower.

The material making up the getter film 4 may be any that is capable of absorbing moisture and/or oxygen. Examples of such materials include such water-absorbing substances as alkali metals, alkali earth metals or alkaline-earth metal oxides; alkali metal or alkaline-earth metal hydroxides; silica gel, zeolite compounds, magnesium sulfate, sodium sulfate, nickel sulfate or other sulfate salts; and aluminum metal complexes, aluminum oxide octylate or other organic metal compounds and the like. Specific examples of alkali earth metals include Ca, Sr, Ba and the like. Oxides of alkaline-earth metals include CaO, SrO, BaO and the like. Other examples include Zr—Al—BaO, aluminum metal complexes and the like. Specific products include OleDry (FUTABA CORPORATION) and the like.

Examples of substances that absorb oxygen include active carbon, silica gel, active alumina, molecular sieves, magnesium oxide, iron oxide and the like. Other examples include Fe, Mn, Zn and sulfate salts, chloride salts, nitrate salts and other inorganic salts of these metals.

The getter film 4 may be formed of one kind of material or of two or more kinds of materials. Moreover, the getter film 4 may be formed as a monolayer film, or as a laminate film having two or more film layers.

The thickness of the getter film 4 is not limited, but is normally at 5 μm or more and 200 μm or less.

There are no limitations on the location where the getter film 4 is formed as long as it is within the space formed by the gas barrier films 3 and 9, but preferably it covers the front surface (surface on the light-receiving side; lower surface in FIG. 2) and the reverse surface (surface opposite the light-receiving side; upper surface in FIG. 2) of the photovoltaics element 6. This is because the front surface and reverse surface are often formed with larger areas than other surfaces in the thin photovoltaics 14, and therefore moisture and oxygen tend to penetrate via these surfaces. From this standpoint, the getter film 4 is preferably provided between the gas barrier film 3 and the photovoltaics element 6. In this embodiment, the getter film 4 covers the front surface of the photovoltaics element 6, a getter film 8 (discussed below) covers the reverse surface of the photovoltaics element 6, and the getter films 4 and 8 are disposed between the photovoltaics element 6 and the gas barrier films 3 and 9, respectively. The getter film 8 and/or the gas barrier film 9 may be omitted when using a highly water-resistant sheet as the back sheet 10 (discussed below), such as a sheet comprising a fluorine resin film affixed to both surfaces of an aluminum foil.

[6.5 Seal Material (5)]

The seal material 5 is a film that reinforces the photovoltaics element 6. Because the photovoltaics element 6 is thin it is normally weak, which tends to weaken the thin photovoltaics, but strength is maintained at a high level by means of the seal material 5.

Moreover, the seal material 5 is preferably strong in order to maintain the strength of the thin photovoltaics 14. The specific degree of strength is difficult to be pre-determined since it is also related to the strength of the weather-resistant protective film 1 and the back sheet 10 as well as the seal material 5, but preferably the thin photovoltaics 14 as a whole has good bending workability, and is strong enough to prevent peeling of the bent parts.

Moreover, the seal material 5 preferably transmits visible light so as not to impede the light absorption of the photovoltaics element 6. For example, the transmittance of visible light (wavelength 360 to 830 nm) is normally at least 60%, with no upper limit.

The thickness of the seal material 5 is not particularly limited, but is normally 2 μm to 700 μm.

The T-type peel adhesion strength of the seal material 5 relative to the substrate is normally 1 N/inch or more and normally 2000 N/inch or less. A T-type peel adhesion strength of 1 N/inch or more is desirable for ensuring the long-term durability of the module. A T-type peel adhesion strength of 2000 N/inch or less is desirable so that the substrate and adhesive material can be disposed of separately when the photovoltaics is scrapped. The T-type peel adhesion strength is measured by methods conforming to JIS K6854.

The constituent material of the seal material 5 is not particularly limited as long as it has the aforementioned properties, and it is possible to use a sealing material that is commonly used for the seals of organic and inorganic solar cells, the seals of organic and inorganic LED elements, or the seals of electronic circuit boards and the like.

Specific examples include thermosetting resin compositions, thermoplastic resin compositions, and active energy ray-curable resin compositions. An active energy ray-curable resin composition is for example a resin that is curable by ultraviolet rays, visible light, electron rays or the like. More specific examples include ethylene-vinyl acetate copolymer (EVA) resin compositions, hydrocarbon resin compositions, epoxy resin compositions, polyester resin compositions, acrylic resin compositions, urethane resin compositions, silicon resin compositions and the like, and the desired thermosetting properties, thermoplastic properties, active energy ray-curing properties and other properties can be achieved by adjusting the main chain, branched chains, terminal chemical modifications, and molecular weight of the respective polymers and by adding additives and the like.

Moreover, the seal material 5 is preferably also resistant to heat because the thin photovoltaics 14 is often heated when it receives light. From this perspective, the melting point of the constituent material of the seal material 5 is normally 100° C. to 350° C.

The density of the constituent material in the seal material 5 is preferably at least 0.80 g/cm$^3$, with no upper limit. The density may be measured and evaluated by methods conforming to JIS K7712.

The location of the seal material 5 is not particularly limited, but it is normally provided on both sides of the photovoltaics element 6. This is to ensure protection of the photovoltaics element 6. In this embodiment, a seal material 5 and a seal material 7 are provided on the front side and reverse side, respectively, of the photovoltaics element 6.

[6.6 Photovoltaics Element (6)]

The photovoltaics element 6 is similar to the photoelectric conversion element 107 discussed above.

One photovoltaics element 6 may be provided per one thin photovoltaics 14, but normally two or more photovoltaics elements 6 are provided. The specific number of photovoltaics elements 6 may be set any number. When a plurality of photovoltaics elements 6 are provided, the photovoltaics elements 6 are normally aligned in an array.

When a plurality of photovoltaics elements 6 are provided, the photovoltaics elements 6 are normally electrically connected to each other, so that the electricity from a group of connected photovoltaics elements 6 can be extracted from a terminal (not shown), and in this case the photovoltaics elements are normally serially connected so as to increase the voltage.

When photovoltaics elements 6 are connected to each other in this way, the distance between photovoltaics elements 6 is preferably small, or in other words the gap between photovoltaics element 6 and photovoltaics element 6 is preferably narrow. This is in order to increase the amount of received light by increasing the light-receiving area of the photovoltaics elements 6, thereby increasing the amount of power generated by the thin photovoltaics 14.

[6.7 Seal Material (7)]

The seal material 7 is a film similar to the seal material 5 described above, and one similar to the seal material 5 may be used in the same way apart from the installed location. One that does not transmit visible light may also be used because the component parts on the reverse side of the photovoltaics element 6 do not necessarily have to transmit visible light.

[6.8 Getter Film (8)]

The getter film 8 is a film similar to the getter film 4 described above, and one similar to the getter film 4 may be used in the same way as necessary apart from the provided location. One that does not transmit visible light may also be used because the component parts on the reverse side of the photovoltaics element 6 do not necessarily have to transmit visible light.

[6.9 Gas Barrier Film (9)]

The gas barrier film 9 is a film similar to the gas barrier film 3 described above, and one similar to the gas barrier film 3 can be used in the same way as necessary apart from the installed location. One that does not transmit visible light may also be used because the component parts on the reverse side of the photovoltaics element 6 do not necessarily have to transmit visible light.

[6.10 Back Sheet (10)]

The back sheet 10 is a film similar to the weather-resistant protective film 1 above, and one similar to the weather-resistant protective film 1 may be used in the same way apart from the installed location. If this back sheet 10 is resistant to water and oxygen permeation, the back sheet 10 can also be made to function as a gas barrier layer. One that does not transmit visible light may also be used because the component parts on the reverse side of the photovoltaics element 6 do not necessarily have to transmit visible light.

[6.11 Dimensions, Etc.]

The thin photovoltaics 14 of this embodiment is normally a thin film-shaped member. If the thin photovoltaics 14 is formed as such a film-shaped member, the thin-film photovoltaics 14 can be easily installed in an automobile or home interior or the like. The thin photovoltaics 14 photovoltaics can be used for many applications because it can provide a light weight, breakage-resistant and highly safe photovoltaics and it is also applicable to curved surfaces. It is also desirable from the perspective of distribution including storage and transport because it is thin and light weight. Moreover, costs can be greatly reduced because the film shape allows for roll-to-roll manufacture.

The specific dimensions of the thin photovoltaics 14 are not limited, but the thickness of the thin photovoltaics 14 is normally at 300 μm or more, and is normally 3,000 μm or less.

[6.12 Manufacturing Methods]

The method of manufacturing the thin photovoltaics 14 of this embodiment is not limited, but one method of manufacturing a photovoltaics of the type shown in FIG. 2 is to first prepare the laminate shown in FIG. 2, and then perform a laminate sealing step. Because the photovoltaics element of this embodiment is highly heat resistant, this is desirable from the standpoint of reducing deterioration in the laminate sealing step.

The laminate shown in FIG. 2 may be prepared by well-known techniques. The method used in the laminate sealing step is not particularly limited as long as it does not detract from the effects of the present invention, but examples include wet lamination, dry lamination, hot melt lamination, extrusion lamination, co-extrusion lamination, extrusion coating, lamination with a light curing adhesive, thermal lamination and the like. Of these, lamination with a light curing adhesive (which is used for sealing organic EL devices) and hot melt lamination or thermal lamination (which are used in photovoltaics) are preferred, and hot melt lamination and thermal lamination are more preferred because they use sheet-shaped seal materials.

The heating temperature in the laminate sealing step is normally at least 130° C., or preferably at least 140° C., and is normally 180° C. or less, or preferably 170° C. or less. The heating time of the laminate sealing step is normally at least 10 minutes, or preferably at least 20 minutes, and is normally 100 minutes or less, or preferably 90 minutes or less. The pressure of the laminate sealing step is normally at least 0.001 MPa, or preferably at least 0.01 MPa, and is normally 0.2 MPa or less, or preferably 0.1 MPa or less. Within this pressure range it is possible to obtain a secure seal, to prevent protrusion of seal materials 5 and 7 beyond the ends and loss of film thickness due to excess pressure, and to ensure dimensional stability. Two or more photovoltaics elements 6 connected either serially or in parallel may also be manufactured in the same way.

[6.13 Applications]

The applications of the photovoltaics of the present invention and of the thin photovoltaics 14 described above in particular are not limited, and they can be used for any applications. Examples of fields to which the thin photovoltaics of the present invention is applicable include solar cells for building construction, solar cells for automobiles, solar cells for home interiors, solar cells for railroads, solar cells for ships, solar cells for airplanes, solar cells for spacecraft, solar cells for home appliances, solar cells for cellular phones, and solar cells for toys and the like.

Figure 3:
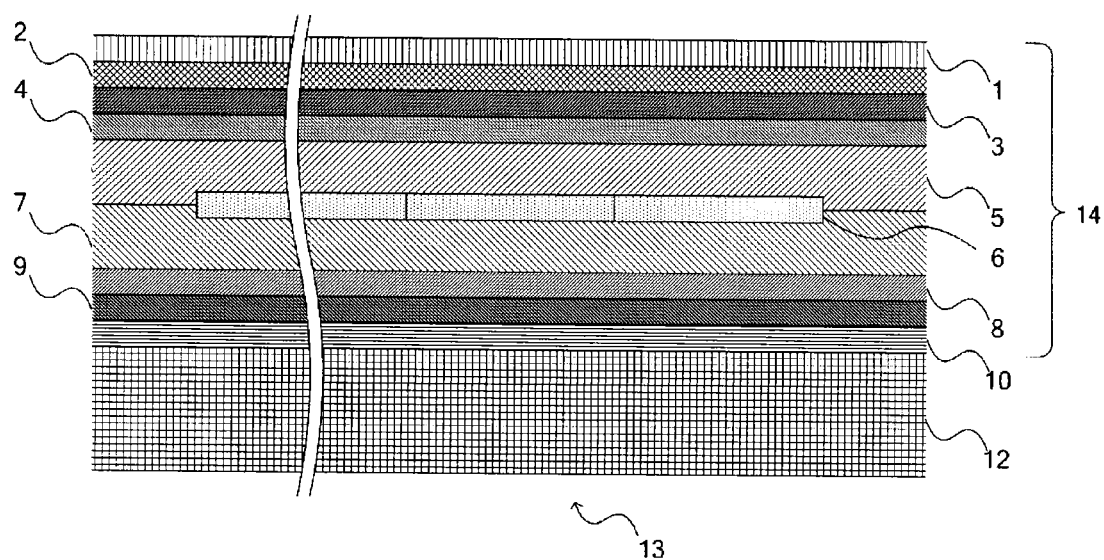
FIG. 3 is a cross-section schematically illustrating the configuration of a photovoltaic module as one embodiment of the present invention.

The photovoltaics of the present invention and the thin photovoltaics in particular can be used as is, and they can also be used in a photovoltaic module comprising a photovoltaics disposed on a base material. For example, as schematically illustrated in FIG. 3, a photovoltaic module 13 can be prepared comprising the thin-film photovoltaics 14 on a base material 12, and installed in a desired location. To give a specific example, when using a building construction board as the base material 12, the thin photovoltaics 14 can be provided on the surface of this board, and a photovoltaics panel can be thereby prepared as a photovoltaic module 13.

The base material 12 is a supporting base that supports the thin photovoltaics 14. The material forming the base material 12 may be an inorganic material such as glass, sapphire and titania; an organic material such as polyethylene terephthalate, polyethylene naphthalate, polyether sulfone, polyimide, nylon, polystyrene, polyvinyl alcohol, ethylene vinyl alcohol copolymer, fluorine resin, vinyl chloride, polyethylene, cellulose, polyvinylidene chloride, aramide, polyphenylene sulfide, polyurethane, polycarbonate, polyarylate and polynorbornene; a paper material such as paper and synthetic paper; a metal such as stainless steel, titanium and aluminum; and a composite material comprising a metal such as stainless steel, titanium and aluminum that has been surface coated or laminated to convey insulating properties and the like.

The material of the base may be of one kind, or any two or more kinds may be used together in any proportions. The mechanical strength of the organic materials or paper materials may also be enhanced by including carbon fibers. Examples of base materials 12 include Alpolic (Registered Trademark of MITSUBISHI PLASTICS, INC.) and the like.

The form of the base material 12 is not limited, but normally a board is used. The material, dimensions and the like of the base material 12 can be arbitrarily set according to the usage environment. This photovoltaics panel can be installed on the outer wall of a building or the like.

EXAMPLES

The embodiment of the present invention is explained below using examples, but the present invention is not limited to these examples as long as its intent is not exceeded. The measurements described in these examples are obtained by the following methods.

[Methods for Measuring Weight-Average Molecular Weight and Number-Average Molecular Weight]

The weight-average molecular weight (Mw) and number-average molecular weight (Mn) are determined by gel permeation chromatography (GPC). The molecular weight distribution (PDI) represents Mw/Mn.

Gel permeation chromatography (GPC) measurement was performed under the following conditions.

Column: Two Polymer Laboratories GPC columns (PLgel MIXED-B 10 μm, internal diameter 7.5 mm, length 30 cm) connected serially Pump: LC-10AT (Shimadzu Corporation)

Oven: CTO-10A (Shimadzu Corporation)

Detector: Differential refractive index detector (Shimadzu Corporation RID-10A) and UV-vis detector (Shimadzu Corporation SPD-10A)

Sample: 1 mg sample dissolved in chloroform (200 mg): 1 μL liquid

Mobile phase: Chloroform

Flow rate: 1.0 mL/min

Analysis: LC-Solution (Shimadzu Corporation)

[Absorption Spectrum Measurement]

A spectrophotometer (Hitachi, Ltd. U-3500) was used to measure the absorption spectrum. Specifically, a chloroform solution of each copolymer (adjusted to obtain a maximum absorbancy value of 0.8 or less) was measured in the range of 350 nm to 850 nm using a 1 cm-square quartz cell.

[Storage Stability Test of Copolymer-Containing Ink]

A storage stability test of a copolymer-containing ink was performed as follows. 2 mg of the copolymer was added to a 2 mL screw-top vial, and o-xylene was added to obtain a concentration of 1.5 mass %. The container was sealed with a lid, and heated until the copolymer dissolved. The resulting copolymer-containing ink was cooled to room temperature, and the time until gelling was measured. Gelling was evaluated by inverting the screw-top vial after a fixed amount of time, and leaving it to stand upside-down for one minute: gelling was determined to have occurred if no fluidity was observed. Specifically, gelling was evaluated 5 minutes after and 1 hour after the container was removed from the heat source and left at room temperature.

[Photoelectric Conversion Properties]

A 4 mm-square metal mask was attached to the photoelectric conversion element, and the current-voltage characteristics between the ITO electrode and silver electrode were measured with a source meter (Keithley Instruments, Inc. 2400) using a solar simulator (WACOM ELECTRIC CO., LTD., WXS-100SU-10, AM1.5G) as the light source with an Air Mass (AM) of 1.5 G and an irradiance of 100 mW/cm$^2$. Open voltage Voc (V), short-circuit density Jsc (mA/cm$^2$), form factor FF and photoelectric conversion efficiency PCE (%) were calculated. The open voltage Voc here is the voltage value when the current value is 0 (mA/cm$^2$), while the short-circuit current density Jsc is the current density when the voltage value is 0 (V). The form factor FF is a factor representing internal resistance, and is represented by the following Formula with Pmax being the maximum output.

$$FF = P\text{max}/(Voc \times Jsc)$$

The photoelectric conversion efficiency PCE is given by the following Formula with Pin being the incident energy.

$$PCE = (P\text{max}/Pin) \times 100$$
$$= (Voc \times Jsc \times FF/Pin) \times 100$$

The first example (Example A) of the present invention is shown first below.

Synthesis Example A1

Synthesis of Compound E2

[Chemical Formula 46]

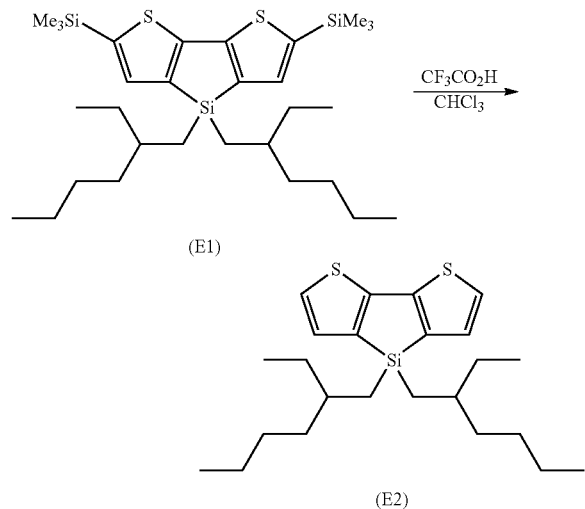

(E1)

(E2)

4-4-bis(2-ethylhexyl)-2,6-bis(trimethylsilyl)-dithieno[3,2-b:2',3'-d]silole (Compound E1, synthesized in accordance with the Non-patent Document J. Am. Chem. Soc. 2008, 130, 16144-16145, 1.03 g, 1.786 mmol) was placed in a 200 mL four-necked recovery flask in a nitrogen atmosphere, and dissolved in chloroform (50 mL). Trifluoroacetic acid (0.265 mL, 3.573 mmol) was added dropwise, and the mixture was agitated for about 3.5 hours. Water was added to the reaction solution, and the lower layer was washed with water, dried with sodium sulfate, and concentrated under reduced pressure. This was dissolved in hexane and subjected to silica gel column chromatography (solvent: hexane) to obtain 4,4-bis(2-ethylhexyl)-dithieno[3,2-b:2',3'-d]silole (Compound E2) as a light yellow oily substance (702 mg, yield 94%).

Compound E2: $^1$H-NMR (400 MHz, solvent: deuterated chloroform): δ7.18 (d, 2H, J=4.8 Hz), 7.08 (d, 2H, J=4.8 Hz), 1.43-1.35 (m, 2H), 1.28-1.09 (m, 16H), 0.98-0.80 (m, 10H), 0.75 (d, 6H, J=7.3 Hz)

Synthesis Example A2

Synthesis of Compound E3

[Chemical Formula 47]

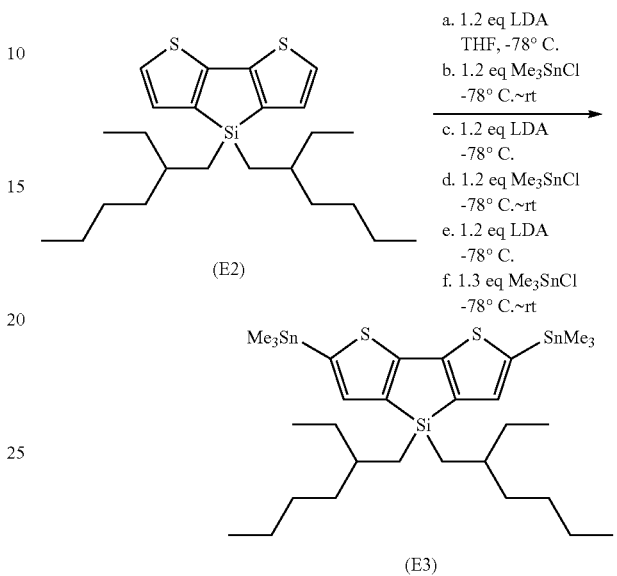

(E2)

a. 1.2 eq LDA THF, -78° C.
b. 1.2 eq Me$_3$SnCl -78° C.~rt
c. 1.2 eq LDA -78° C.
d. 1.2 eq Me$_3$SnCl -78° C.~rt
e. 1.2 eq LDA -78° C.
f. 1.3 eq Me$_3$SnCl -78° C.~rt (E3)

The Compound E2 (100 mg, 0.239 mmol) obtained in Synthesis Example A$^1$ was placed in a 20 mL Schlenk flask in a nitrogen atmosphere, dissolved in tetrahydrofuran (THF, 2.5 mL), and cooled to −78° C. A solution of lithium diisopropylamide (LDA) in tetrahydrofuran/hexane (KANTO CHEMICAL CO., INC., concentration 1.11 M, 0.258 mL, 1.2 eq) was added dropwise, and the mixture was agitated for about 1 hour. A solution of trimethyltin chloride in tetrahydrofuran (Sigma-Aldrich Co. LLC., 1.0 M, 0.287 mL, 1.2 eq) was further added dropwise, after which the temperature was gradually raised to room temperature. This was cooled again to −78° C., a solution of lithium diisopropylamide (LDA) in tetrahydrofuran/hexane (KANTO CHEMICAL CO., INC., concentration 1.11 M, 0.258 mL, 1.2 eq) was added dropwise, and the mixture was agitated for about 1 hour. A solution of trimethyltin chloride in tetrahydrofuran (Sigma-Aldrich Co. LLC., 1.0 M, 0.287 mL, 1.2 eq) was again added dropwise, after which the temperature was gradually raised to room temperature. This was cooled again to −78° C., a solution of lithium diisopropylamide (LDA) in tetrahydrofuran/hexane (KANTO CHEMICAL CO., INC., concentration 1.11 M, 0.258 mL, 1.2 eq) was added dropwise, and the mixture was agitated for about 1 hour. A solution of trimethyltin chloride in tetrahydrofuran (Sigma-Aldrich Co. LLC., 1.0 M, 0.310 mL, 1.3 eq) was added dropwise, and the temperature was gradually raised to room temperature. Water was added to the reaction solution, which was then extracted with hexane, after which the organic layer was washed with water. The organic layer was dried over sodium sulfate, filtered, concentrated under reduced pressure, and dried in vacuum to obtain 4,4-bis(2-ethylhexyl)-2,6-bis(trimethyltin)-dithieno[3,2-b:2',3'-d]silole (Compound E3) quantitatively as a yellow-green oily substance.

Compound E3: $^1$H-NMR (400 MGz, solvent: deuterated chloroform): δ7.07 (s, 2H), 1.45-1.37 (m, 2H), 1.32-1.08 (m, 16H), 0.99-0.80 (m, 10H), 0.77 (t, 6H, J=7.3 Hz), 0.36 (s, 18H)

Synthesis Example A3
Synthesis of Compound E5

[Chemical Formula 48]

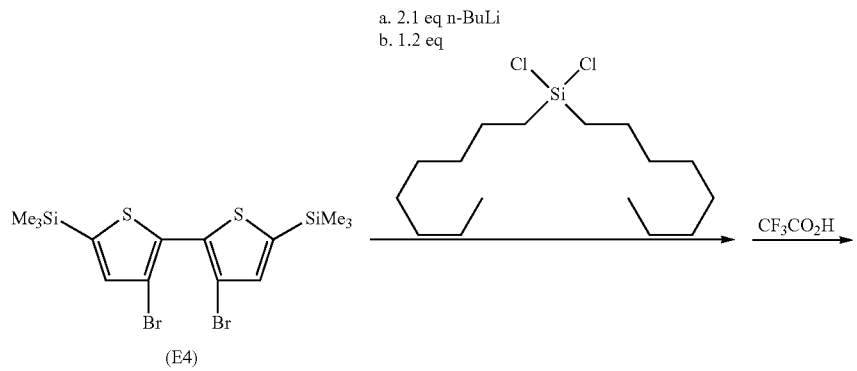

3,3'-dibromo-5,5'-bis(trimethylsilyl)-2,2'-bithiophene (Compound E4, synthesized in accordance with WO 2010/136353, 1.60 g) was placed in a 50 mL Schlenk flask in a nitrogen atmosphere, and dissolved in tetrahydrofuran (32 mL). This was cooled to −78° C., and a solution of n-butyl lithium in hexane (KANTO CHEMICAL CO., INC., 1.63 M, 4.40 mL) was added dropwise. After about 15 minutes of agitation, dichlorodi-n-octylsilane (Alfa Aeser, 1.6 mL) was added dropwise. The temperature was gradually raised to room temperature over the course of about 2 hours, after which water was added, and the product was extracted with hexane. The organic layer was washed with water, dried over sodium sulfate, and concentrated by filtration. The resulting yellow-orange oily substance was dissolved in chloroform (32 mL), trifluoroacetic acid (0.53 mL) was added, and the mixture was agitated for about 2 hours at room temperature. Heptane (32 mL) was added to the reaction solution, which was then concentrated under reduced pressure. The resulting yellow-green oily substance was dissolved in hexane, and subjected to silica gel column chromatography (solvent: hexane) to obtain the target 4,4-di-n-octyldithieno[3,2-b:2',3'-d]silole (Compound E5, 956 mg, yield 67%).

Compound E5: $^1$H-NMR (400 MHz, solvent: deuterated chloroform): δ7.05 (d, 2H, J=4.8 Hz), 7.19 (d, 2H, J=4.8 Hz), 1.42-1.33 (m, 4H), 1.31-1.18 (m, 20H), 0.91-0.85 (m, 10H).

Synthesis Example A4
Synthesis of Compound E6

[Chemical Formula 49]

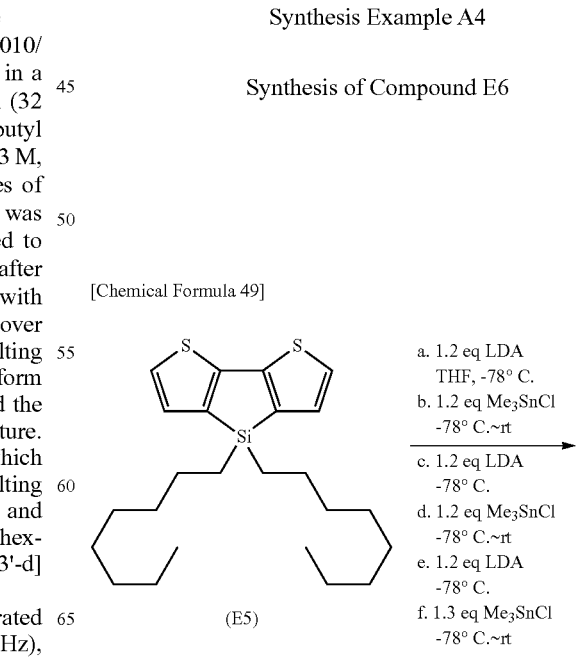

a. 1.2 eq LDA
   THF, -78° C.
b. 1.2 eq Me$_3$SnCl
   -78° C.~rt
c. 1.2 eq LDA
   -78° C.
d. 1.2 eq Me$_3$SnCl
   -78° C.~rt
e. 1.2 eq LDA
   -78° C.
f. 1.3 eq Me$_3$SnCl
   -78° C.~rt

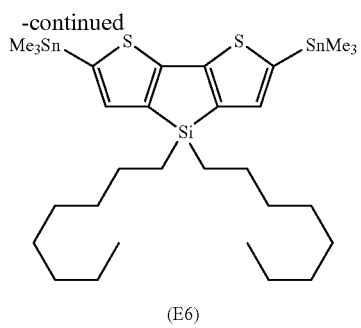

(E6)

A reaction was performed as in Synthesis Example A2 except that the Compound E5 (1.00 g, 2.39 mmol) was used instead of the Compound E2, while the other reagents were used in similar proportions, to quantitatively obtain 4,4-di-n-octyl-2,6-bis(trimethyltin)-dithieno[3,2-b:2',3'-d]silole (Compound E6).

Compound E6: $^1$H-NMR (400 MHz, solvent: deuterated chloroform): δ7.08 (s, 2H), 1.45-1.38 (m, 4H), 1.33-1.19 (m, 20H), 0.90-0.85 (m, 10H), 0.38 (s, 18H).

Synthesis Example A5

Synthesis of Compound E7

[Chemical Formula 50]

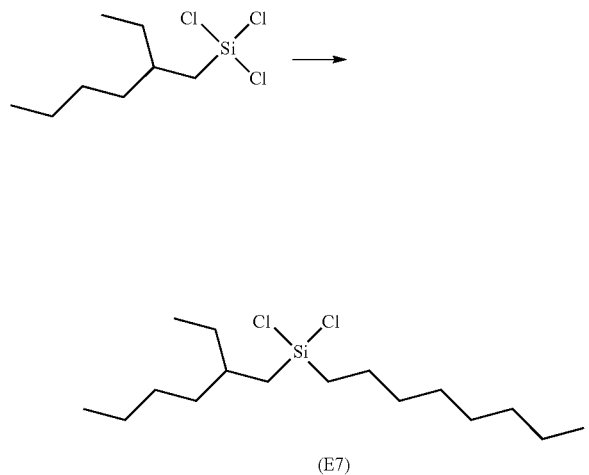

(E7)

Trichloro(2-ethylhexyl)silane (synthesized in accordance with J. Am. Chem. Soc. 2008, 130, 16144-16145, 24.8 g) was placed in a 300 mL four-necked flask in a nitrogen atmosphere, and dissolved in tetrahydrofuran (100 mL). The resulting solution was cooled to 0° C., and a solution of n-octyl magnesium bromide in diethyl ether (Sigma-Aldrich Co. LLC., 2.00 M, 50.0 mL) was added dropwise. The reaction solution was agitated for about 30 minutes at 7° C., and then agitated for about 3 hours at room temperature. The solvent was then distilled away with an evaporator. Hexane was added to the resulting crude product, which was then filtered, after which the solvent was again distilled off. This was finally purified by distillation (111° C., 0.61 torr) to obtain the target dichloro(2-ethylhexyl)n-octylsilane (Compound E7, 15.9 g, yield 49%).

Compound E7: $^1$H-NMR (400 MHz, solvent: deuterated chloroform): δ1.72 (m, 1H), 1.49-1.55 (m, 2H), 1.24-1.50 (m, 18H), 1.07-1.13 (m, 4H), 0.85-0.92 (m, 9H)

Synthesis Example A6

Synthesis of Compound E8

[Chemical Formula 51]

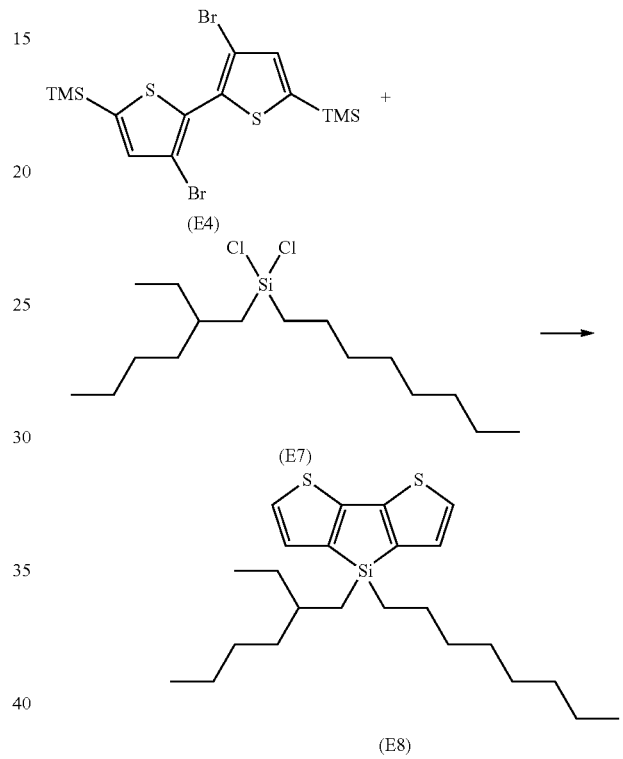

3,3'-dibromo-5,5'-bis(trimethylsilyl)-2,2'-bithiophene (Compound E4, synthesized in accordance with WO 2010/136353, 4.0 g) was placed in a 200 mL four-necked flask in a nitrogen atmosphere, and dissolved in tetrahydrofuran (68 mL). The resulting solution was cooled to −78° C., and a solution of n-butyl lithium in hexane (KANTO CHEMICAL CO., INC., 1.65 M, 11.2 mL) was added dropwise. After about 15 minutes of agitation, the Compound E7 (3.6 mL, 10.3 mmol) obtained in Synthesis Example A5 was added dropwise. The temperature was gradually raised to room temperature over the course of about 2 hours, water was added, the product was extracted with hexane, and the organic layer was washed with water, dried over sodium sulfate, and concentrated by filtration. The resulting yellow-orange oily substance was dissolved in chloroform (20 mL), trifluoroacetic acid (1.31 mL) was added, and the mixture was agitated for about 2 hours at room temperature. Heptane (40 mL) was added to the reaction solution, which was concentrated under reduced pressure. The resulting yellow-green oily substance was dissolved in hexane, and subjected to silica gel column chromatography (solvent: hexane) to obtain the target 4-n-octyl-4-(2-ethylhexyl)dithieno[3,2-b:2',3'-d]silole (Compound E8, 2.3 g, yield 64%).

Compound E8: $^1$H-NMR (400 MHz, solvent: deuterated chloroform): δ7.05 (d, 2H, J=4.8 Hz), 7.19 (d, 2H, J=4.8 Hz), 1.42-1.33 (m, 4H), 1.31-1.18 (m, 20H), 0.96-0.75 (m, 10H)

Synthesis Example A7

Synthesis of Compound E9

[Chemical Formula 52]

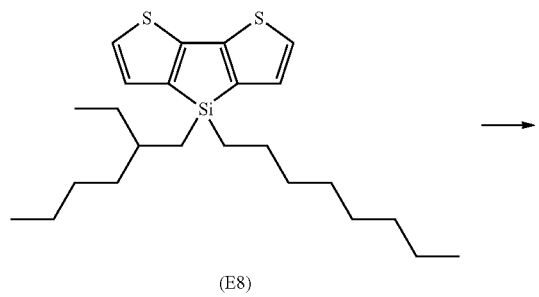

(E8)

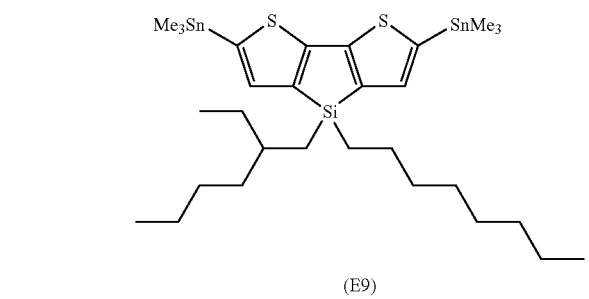

(E9)

A reaction was formed as in Synthesis Example A2 except that the Compound E8 (1.00 g, 2.39 mmol) obtained in Synthesis Example A6 instead of the Compound E2, while the other reagents were used in similar proportions, to quantitatively obtain 4-n-octyl-4-(2-ethylhexyl)-2,6-bis(trimethyltin)-dithieno[3,2-b:2',3'-d]silole (Compound E9).

Synthesis Example A8

Synthesis of Compound E10

[Chemical Formula 53]

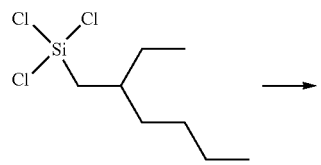

-continued

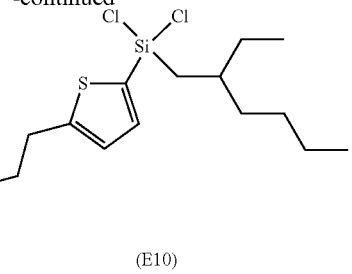

(E10)

Magnesium flakes (2.27 g, 93.4 mmol) were placed in a 200 mL four-necked flask in a nitrogen atmosphere and heat dried with a drier, after which tetrahydrofuran (30 mL) was added, and then 2-bromo-5-n-butylthiophene (19.9 g, 90.7 mmol) was gradually added dropwise. After it was confirmed that the internal temperature had fallen to 30° C., dehydrated tetrahydrofuran (40 mL) was added to prepare a Grignard solution.

Trichloro(2-ethylhexyl)silane (synthesized with reference to J. Am. Chem. Soc. 2008, 130, 16144-16145, 21.4 g, 86.4 mmol) was placed in a 500 mL four-necked flask in a nitrogen atmosphere, and dissolved in tetrahydrofuran (100 mL). The resulting solution was cooled to 5° C., and the previous Grignard solution was transferred to a dropping funnel and gradually added dropwise with the internal temperature maintained at 10° C. or less. After completion of dropping, the mixture was returned to room temperature and left standing overnight. About 100 mL of the tetrahydrofuran was distilled off under reduced pressure, hexane (100 mL) was added, and the precipitate was filtered out. The filtrate was concentrated under reduced pressure, and further distilled under reduced pressure (boiling point 140-144° C./0.68-0.70 Torr) to obtain dichloro (5-n-butylthiophene-2-yl)(2-ethylhexyl)silane (Compound E10, 21.4 g, yield 70%) as a colorless transparent liquid.

Synthesis Example A9

Synthesis of Compound E11

[Chemical Formula 54]

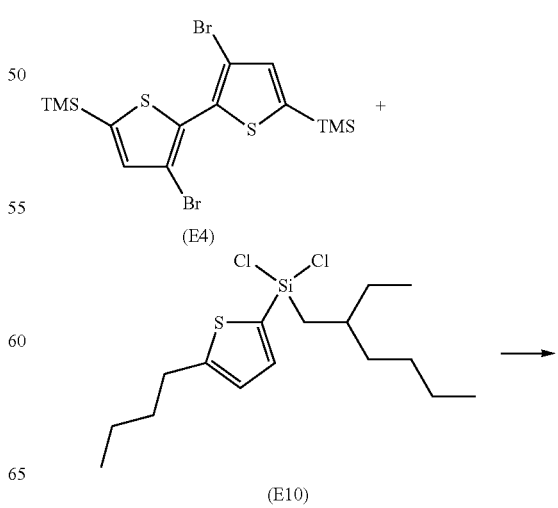

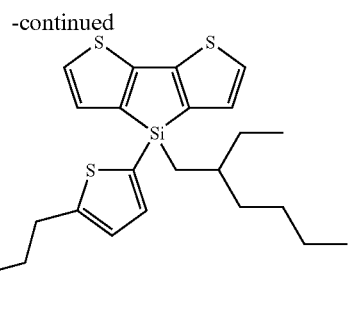

(E11)

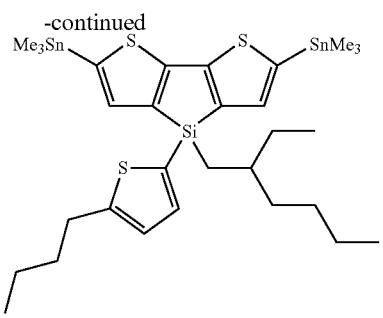

(E12)

5,5'-bis(trimethylsilyl)-3,3'-dibromo-2,2'-bithiophene (Compound E4, synthesized in accordance with WO 2010/136353, 11.1 g, 23.7 mmol) was placed in a 500 mL four-necked flask in a nitrogen atmosphere, and dissolved in tetrahydrofuran (200 mL). The resulting solution was cooled to −78° C., and a solution of n-butyl lithium in hexane (KANTO CHEMICAL CO., INC., 1.62 M, 30.2 mL) was gradually added dropwise. After 15 minutes of agitation, the Compound E10 (10.0 g, 28.4 mmol) obtained in Synthesis Example A8 was added dropwise. After 15 minutes of agitation at −78° C., the mixture was gradually warmed to room temperature over the course of 1 hour, and left standing overnight. About 100 mL of the tetrahydrofuran was distilled off under reduced pressure, water was added, the product was extracted with hexane, and the organic layer was washed with water, dried over sodium sulfate, and concentrated by filtration. Hexane (80 mL) and chloroform (40 mL) were added to dissolve the resulting yellow oily substance, trifluoroacetic acid (5 mL) was added, and the mixture was agitated for about 1 hour at room temperature. This was concentrated under reduced pressure, and the resulting yellow oily substance was dissolved in hexane and subjected to silica gel column chromatography (solvent: hexane) to obtain the target 4-(5-n-butylthiophene-2-yl)-4-(2-ethylhexyl)dithieno[3,2-b:2',3'-d]silole (Compound E11, 6.8 g, yield 65%).

Compound E11: $^1$H-NMR (400 MHz, solvent: deuterated chloroform): δ 7.21 (d, 2H, J=4.6 Hz), 7.15 (d, 1H, J=3.3 Hz), 7.11 (d, 2H, J=4.8 Hz), 6.81 (d, 1H, J=3.3 Hz), 2.81 (t, 2H), 1.63 (m, 2H), 1.54 (m, 1H), 1.43-1.10 (m, 12H), 0.91 (t, 3H), 0.82 (t, 3H), 0.78 (t, 3H).

Synthesis Example A10

Synthesis of Compound E12

[Chemical Formula 55]

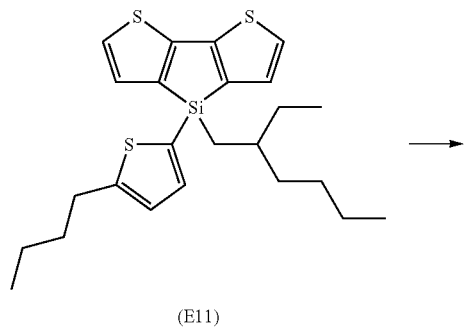

(E11)

A reaction was performed as in Synthesis Example A2 except that the Compound E11 (3.0 g, 6.74 mmol) obtained in Synthesis Example A9 was used instead of the Compound E2, while the other reagents were used in similar proportions, to quantitatively obtain 4-(5-n-butylthiophene-2-yl)-4-(2-ethylhexyl)-2,6-bis(trimethyltin)-dithieno[3,2-b:2',3'-d]silole (Compound E12).

Compound E12: $^1$H-NMR (400 MHz, solvent: deuterated chloroform): δ7.15 (d, 1H, J=3.3 Hz), 7.14 (s, 2H), 6.81 (d, 1H, J=3.3 Hz), 2.81 (t, 2H), 1.69 (m, 2H), 1.54 (m, 1H), 1.45-1.08 (m, 12H), 0.91 (t, 3H), 0.82 (t, 3H), 0.78 (t, 3H), 0.37 (s, 18H)

Synthesis Example A11

Synthesis of Compound E13

[Chemical Formula 56]

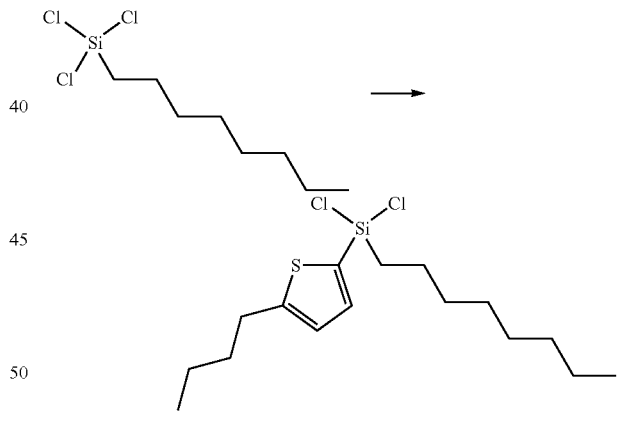

(E13)

Magnesium flakes (1.87 g, 77.1 mmol) were placed in a 200 mL four-necked flask in a nitrogen atmosphere and heat dried with a drier, after which tetrahydrofuran (30 mL) was added, and then 2-bromo-5-n-butylthiophene (19.9 g, 90.7 mmol) was gradually added dropwise. After completion of dropping, the internal temperature was 60° C. After it was confirmed that the internal temperature had fallen to 30° C., tetrahydrofuran (40 mL) was added to prepare a Grignard solution.

n-octyltrichlorosilane (Tokyo Chemical Industry Co., Ltd., 17.7 g, 71.3 mmol) was placed in a 500 mL four-necked flask in a nitrogen atmosphere, and dissolved in tetrahydrofuran (100 mL). The resulting solution was cooled to 5° C., and the previous Grignard solution was transferred to a dropping funnel and gradually added dropwise with the internal temperature maintained at 10° C. or less. After completion of dropping, the mixture was returned to room temperature and left standing overnight. About 100 mL of the tetrahydrofuran was distilled off under reduced pressure, hexane (100 mL) was added, and the precipitate was filtered out. The filtrate was concentrated under reduced pressure, and further distilled under reduced pressure (boiling point: 153° C.-157° C./0.89-1.0 Torr) to obtain dichloro(5-n-butylthiophene-2-yl)n-octylsilane (Compound E13, 20.5 g, yield 82%) as a colorless transparent liquid.

Compound E13: $^1$H-NMR (400 MHz, solvent: deuterated chloroform): δ7.37 (d, 1H, J=3.3 Hz), 6.91 (d, 1H, J=3.5 Hz), 2.88 (t, 2H), 1.73-1.65 (m, 2H), 1.61-1.52 (m, 2H), 1.46-1.18 (m, 14H), 0.94 (t, 3H), 0.88 (t, 3H)

Synthesis Example A12

Synthesis of Compound E14

[Chemical Formula 57]

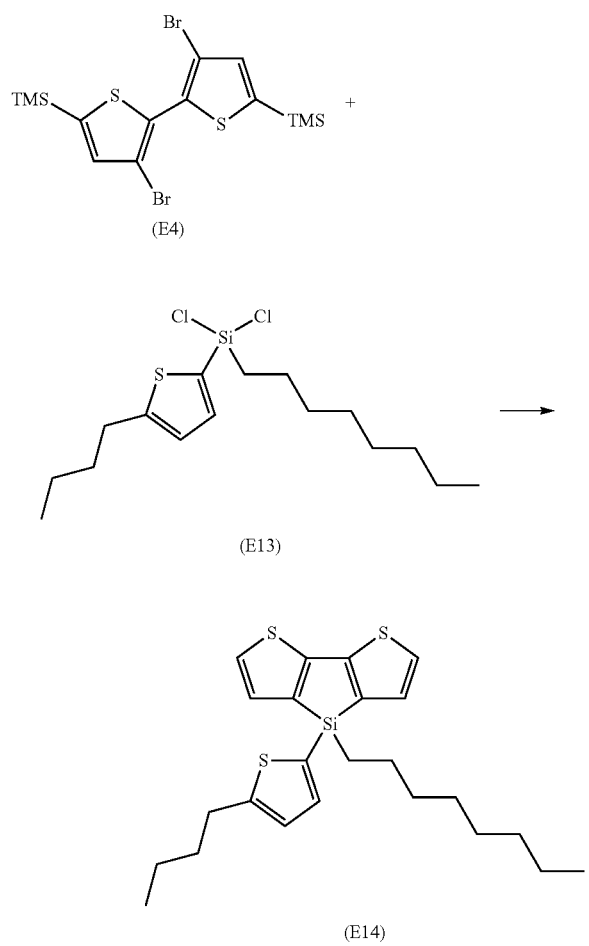

5,5'-bis(trimethylsilyl)-3,3'-dibromo-2,2'-bithiophene (Compound E4, synthesized in accordance with WO 2010/136353, 6.7 g, 14.2 mmol) was placed in a 300 mL four-necked flask in a nitrogen atmosphere, and dissolved in tetrahydrofuran (100 mL). The resulting solution was cooled to −78° C., and a solution of n-butyl lithium in hexane (KANTO CHEMICAL CO., INC., 1.62 M, 18.4 mL) was gradually added dropwise. After about 15 minutes of agitation, the Compound E13 (6.0 g, 17.1 mmol) obtained in Synthesis Example A11 was added dropwise. The reaction solution was agitated for 15 minutes at −78° C., the temperature was gradually raised to room temperature over the course of 1 hour, and the mixture was left standing overnight. About 80 ml of the tetrahydrofuran was distilled off under reduced pressure, water was added, the product was extracted with hexane, and the organic layer was washed with water, dried over sodium sulfate, and concentrated by filtration. Hexane (50 mL) and chloroform (25 mL) were added to dissolve the resulting yellow oily substance, trifluoroacetic acid (2.6 mL) was added, and the mixture was agitated for about 1 hour at room temperature. This was concentrated under reduced pressure, and the resulting yellow oily substance was dissolved in hexane and subjected to silica gel column chromatography (solvent: hexane) to obtain the target 4-(5-n-butylthiophene-2-yl)-4-n-octyldithieno[3,2-b:2',3'-d]silole (Compound E14, 3.8 g, yield 60%).

Synthesis Example A13

Synthesis of Compound E15

[Chemical Formula 58]

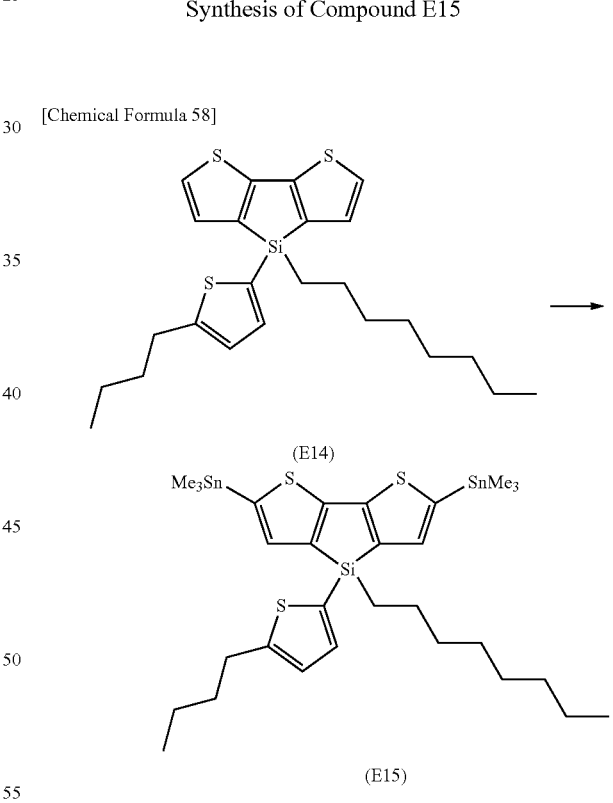

A reaction was performed as in Synthesis Example A2 except that the Compound E14 (1.3 g, 2.92 mmol) obtained in Synthesis Example A12 was used instead of the Compound E2, while the other reagents were used in similar proportions, to quantitatively obtain 4-(5-n-butylthiophene-2-yl)-4-n-octyl-2,6-bis(trimethyltin)-dithieno[3,2-b:2',3'-d]silole (Compound E15).

Compound E15: $^1$H-NMR (400 MHz, solvent: deuterated chloroform): δ7.16 (d, 1H, J=3.3 Hz), 7.15 (s, 2H), 6.82 (d, 1H, J=3.2 Hz), 2.82 (t, 2H), 1.64 (m, 2H), 1.54 (m, 2H), 1.42-1.11 (m, 14H), 0.91 (t, 3H), 0.86 (t, 3H), 0.37 (s, 18H)

Example A1

Synthesis Example of Copolymer 1

[Chemical Formula 59]

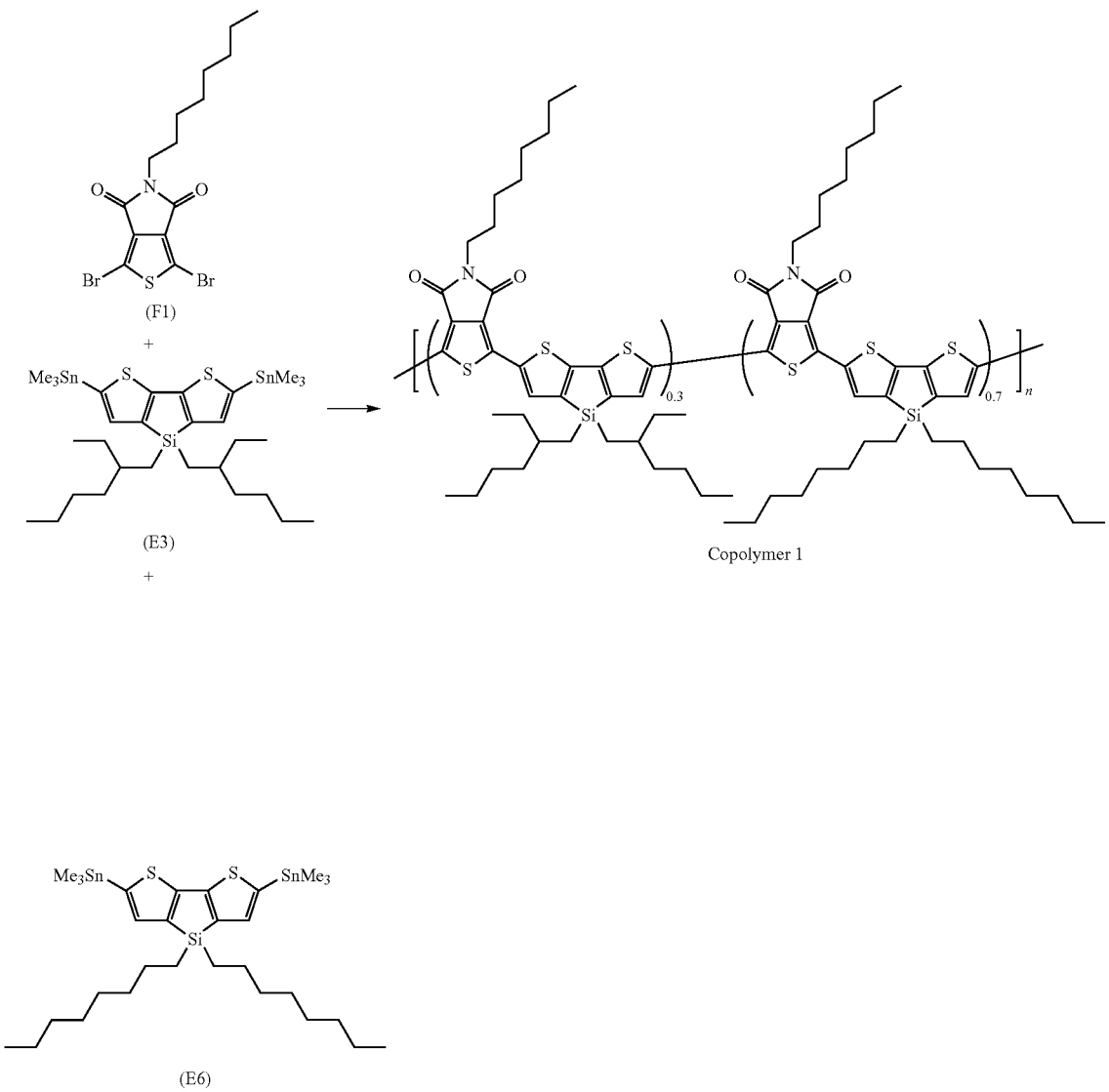

1,3-dibromo-5-octyl-4H-thieno[3,4-c]pyrrole-4,6-(5H)-dione (Compound F1 (imidothiophene dibromide), 111 mg, 0.26 mmol) obtained with reference to methods described in known literature (Organic Letters 2004, 6, 3381-3384), the Compound E3 (61 mg, 0.082 mmol) obtained in Synthesis Example A2 and the Compound E6 (150 mg, 0.20 mmol) obtained in Synthesis Example A4 as monomers were placed in a 50 mL two-necked recovery flask in a nitrogen atmosphere, tetrakis(triphenylphosphine)palladium (0) (10 mg, 3 mol %), the triphenylphosphine-containing heterogeneous palladium complex catalyst Pd-EnCat TPP30 (Sigma-Aldrich Co. LLC., 21 mg, 3 mol %), toluene (4.7 mL) and N,N-dimethylformamide (1.2 mL) were added, and the mixture was agitated for 1 hour at 90° C. and 10 hours at 100° C. The reaction solution was diluted 4 times with toluene, and heated and agitated for another 0.5 hours at 100° C., after which terminal treatment was performed by adding trimethyl(phenyl)tin (0.3 mL) and heating and agitating for 8 hours at 100° C., then adding bromobenzene (1.5 mL) and heating and agitating for 8 hours at 100° C., after which the reaction solution was poured into methanol and the precipitate was filtered out. The resulting solid was dissolved in chloroform, diamine silica gel (Fuji Silysia Chemical Ltd.) was added, and the mixture was agitated for 1 hour at room temperature and passed through a short column of acidic silica gel. The solution was concentrated and recrystallized with chloroform/ethyl acetate as the solvent, and the precipitate was filtered out to obtain a target Copolymer 1 (156 mg). The resulting Copolymer 1 had a weight-average molecular weight Mw of $1.69 \times 10^5$, and a PDI of 5.5.

Example A2

Synthesis Example of Copolymer 2

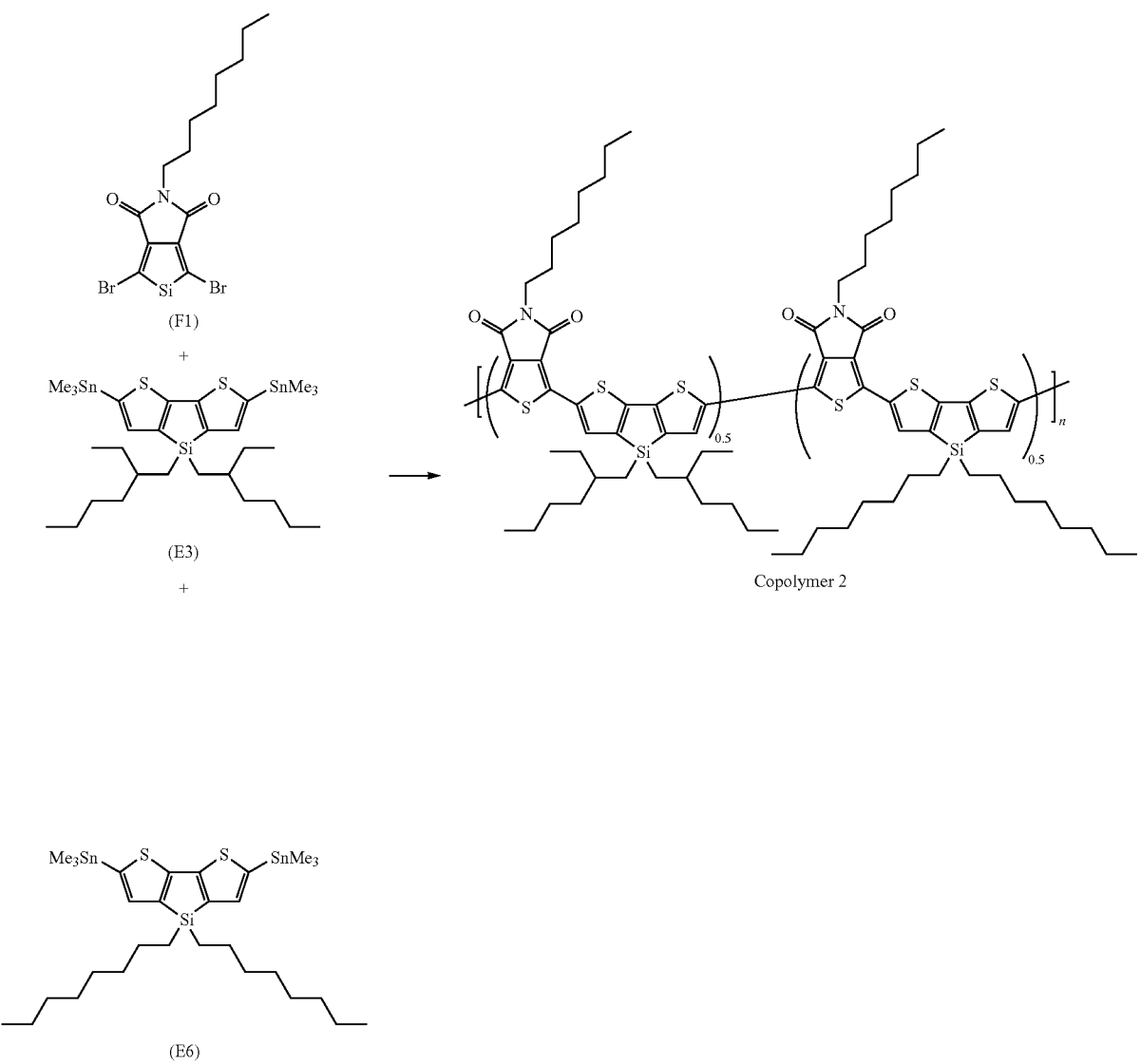

1,3-dibromo-5-octyl-4H-thieno[3,4-c]pyrrole-4,6-(5H)-dione (Compound F1 (imidothiophene dibromide), 86 mg, 0.204 mmol) obtained with reference to the methods described in known literature (Organic Letters 2004, 6, 3381-3384), the Compound E3 (80 mg, 0.108 mmol) obtained in Synthesis Example A2 and the Compound E6 (80 mg, 0.108 mmol) obtained in Synthesis Example A4 as monomers were placed in a 50 mL two-necked recovery flask in a nitrogen atmosphere, tetrakis(triphenylphosphine)palladium (0) (7.5 mg, 3 mol %), the triphenylphosphine-containing heterogeneous palladium complex catalyst Pd-EnCat TPP30 (Sigma-Aldrich Co. LLC., 16 mg, 3 mol %), toluene (3.3 mL) and N,N-dimethylformamide (0.82 mL) were added, and the mixture was agitated for 1 hour at 90° C. and 2.5 hours at 100° C. The reaction solution was diluted 4 times with toluene, and heated and agitated for another 0.5 hours at 100° C., after which terminal treatment was performed by adding trimethyl(phenyl)tin (0.040 mL) and heating and agitating for 8 hours at 100° C., then adding bromobenzene (2 mL) and heating and agitating again for 8 hours at 100° C., after which the reaction solution was poured into methanol and the precipitate was filtered out. The resulting solid was dissolved in chloroform, diamine silica gel (Fuji Silysia Chemical Ltd.) was added, and the mixture was agitated for 1 hour at room temperature and passed through a short column of acidic silica gel. The solution was concentrated and recrystallized with chloroform/ethyl acetate as the solvent, and the precipitate was filtered out to obtain a target Copolymer 2 (114 mg). The resulting Copolymer 2 had a weight-average molecular weight Mw of $1.67 \times 10^5$, and a PDI of 4.2.

Example A3

Synthesis Example of Copolymer 3

[Chemical Formula 61]

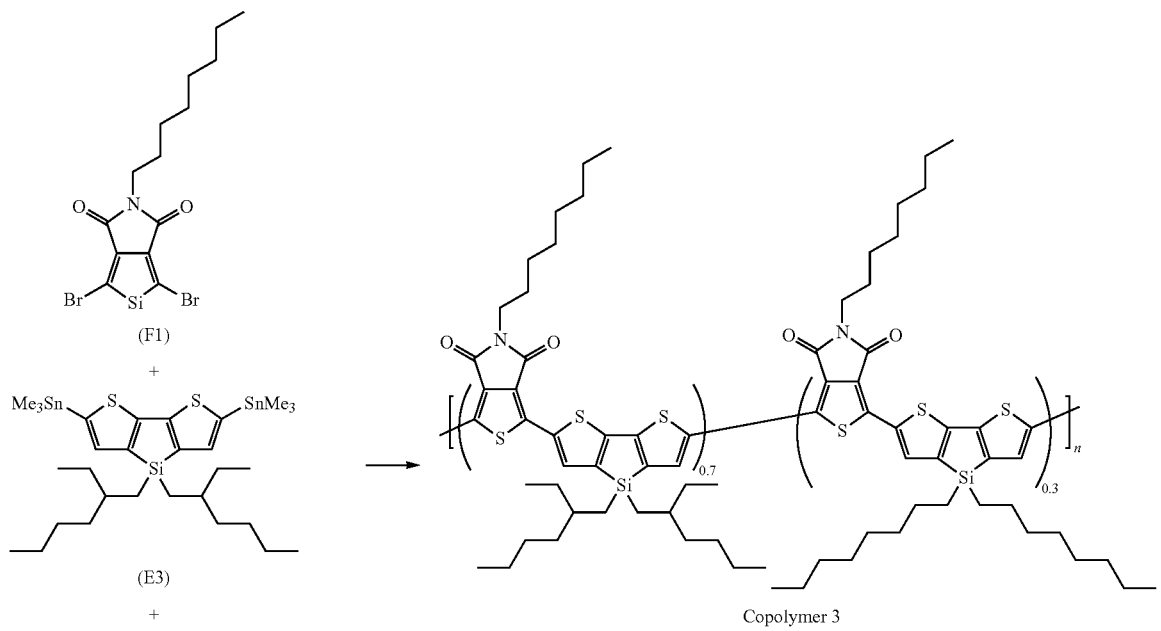

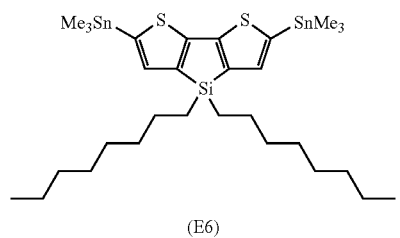

(E6)

1,3-dibromo-5-octyl-4H-thieno[3,4-c]pyrrole-4,6-(5H)-dione (Compound F11 (imidothiophene dibromide), 126 mg, 0.30 mmol) obtained with reference to the methods described in known literature (Organic Letters 2004, 6, 3381-3384), the Compound E3 (167 mg, 0.22 mmol) obtained in Synthesis Example A2 and the Compound E6 (71 mg, 0.095 mmol) obtained in Synthesis Example A4 as monomers were placed in a 50 mL two-necked recovery flask in a nitrogen atmosphere, tetrakis(triphenylphosphine)palladium (0) (11 mg, 3 mol %), the triphenylphosphine-containing heterogeneous palladium complex catalyst Pd-EnCat TPP30 (Sigma-Aldrich Co. LLC., 24 mg, 3 mol %), toluene (5.3 mL) and N,N-dimethylformamide (1.3 mL) were added, and the mixture was agitated for 1 hour at 90° C. and 10 hours at 100° C. The reaction solution was diluted 4 times with toluene, and heated and agitated for another 0.5 hours at 100° C., after which terminal treatment was performed by adding trimethyl(phenyl)tin (0.3 mL) and heating and agitating for 8 hours at 100° C., then adding bromobenzene (1.5 mL) and heating and agitating for 8 hours at 100° C., after which the reaction solution was poured into methanol and the precipitate was filtered out. The resulting solid was dissolved in chloroform, diamine silica gel (Fuji Silysia Chemical Ltd.) was added, and the mixture was agitated for 1 hour at room temperature and passed through a short column of acidic silica gel. The solution was concentrated and recrystallized with chloroform/ethyl acetate as the solvent, and the precipitate was filtered out to obtain a target Copolymer 3 (161 mg). The resulting Copolymer 3 had a weight-average molecular weight Mw of $1.72 \times 10^5$, and a PDI of 3.6.

Example A4

Synthesis Example of Copolymer 4

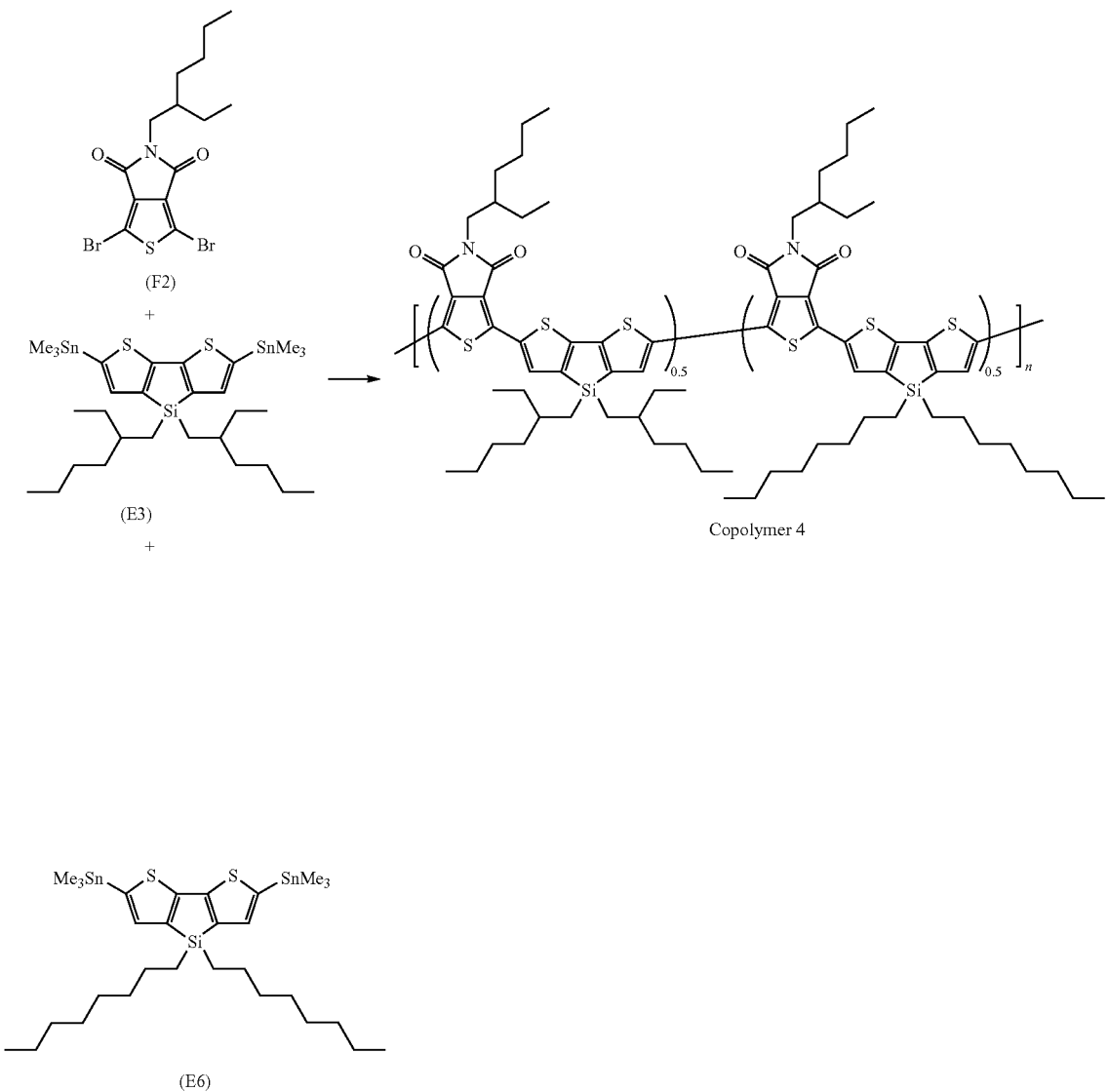

1,3-dibromo-5-(2-ethylhexyl)-4H-thieno[3,4-c]pyrrole-4,6-(5H)-dione (Compound F2 (imidothiophene dibromide), 86 mg, 0.204 mmol) obtained with reference to the methods described in known literature (J. Am. Chem. Soc. 2010, 132, 7595-7597), the Compound E3 (80 mg, 0.108 mmol) obtained in Synthesis Example A2 and the Compound E6 (80 mg, 0.108 mmol) obtained in Synthesis Example A4 as monomers were placed in a 50 mL two-necked recovery flask in a nitrogen atmosphere, tetrakis(triphenylphosphine)palladium (0) (7.5 mg, 3 mol %), the triphenylphosphine-containing heterogeneous palladium complex catalyst Pd-EnCat TPP30 (Sigma-Aldrich Co. LLC., 16 mg, 3 mol %), toluene (3.3 mL) and N,N-dimethylformamide (0.82 mL) were added, and the mixture was agitated for 1 hour at 90° C. and 2.5 hours at 100° C. The reaction solution was diluted 4 times with toluene, and heated and agitated for another 0.5 hours at 100° C., after which terminal treatment was performed by adding trimethyl(phenyl)tin (0.040 mL) and heating and agitating for 8 hours at 100° C., then adding bromobenzene (2 mL) and heating and agitating for 8 hours at 100° C., after which the reaction solution was poured into methanol and the precipitate was filtered out. The resulting solid was dissolved in chloroform, diamine silica gel (Fuji Silysia Chemical Ltd.) was added, and the mixture was agitated for 1 hour at room temperature and passed through a short column of acidic silica gel. The solution was concentrated and recrystallized with chloroform/ethyl acetate as the solvent, and the precipitate was filtered out to obtain a target Copolymer 4 (110 mg). The resulting Copolymer 4 had a weight-average molecular weight Mw of $3.69 \times 10^5$ and a PDI of 9.4.

Example A5

Synthesis Example of Copolymer 5

[Chemical Formula 63]

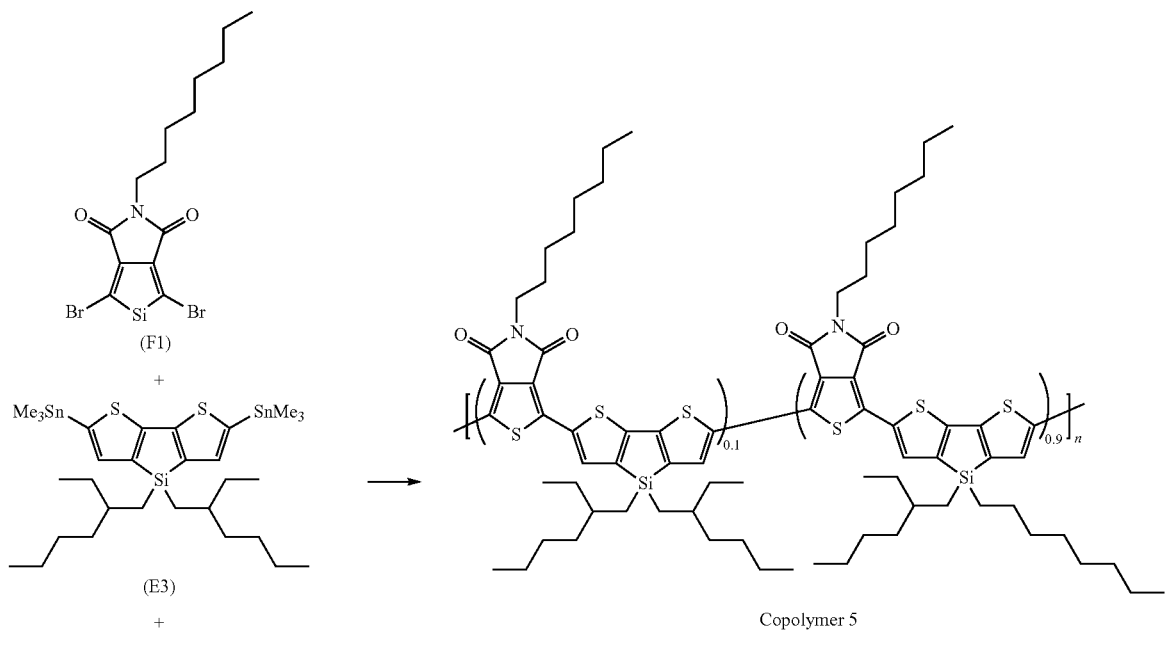

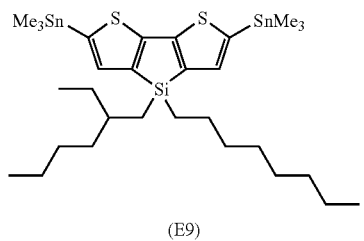

1,3-dibromo-5-octyl-4H-thieno[3,4-c]pyrrole-4,6-(5H)-dione (Compound F11 (imidothiophene dibromide), 194 mg, 0.46 mmol) obtained with reference to the methods described in known literature (Organic Letters 2004, 6, 3381-3384), the Compound E3 (36 mg, 0.049 mmol) obtained in Synthesis Example A2 and the Compound E9 (327 mg, 0.44 mmol) obtained in Synthesis Example A7 as monomers were placed in a 50 mL two-necked recovery flask in a nitrogen atmosphere, tetrakis(triphenylphosphine)palladium (0) (17 mg, 3 mol %), the triphenylphosphine-containing heterogeneous palladium complex catalyst Pd-EnCat TPP30 (Sigma-Aldrich Co. LLC., 36 mg, 3 mol %), toluene (7.6 mL) and N,N-dimethylformamide (1.9 mL) were added, and the mixture was agitated for 1 hour at 90° C. and 10 hours at 100° C. The reaction solution was diluted 4 times with toluene, and heated and agitated for another 0.5 hours at 100° C., after which terminal treatment was performed by adding trimethyl(phenyl)tin (0.4 mL) and heating and agitating for 8 hours at 100° C., then adding bromobenzene (3.5 mL) and heating and agitating again for 8 hours at 100° C., after which the reaction solution was poured into methanol and the precipitate was filtered out. The resulting solid was dissolved in chloroform, diamine silica gel (Fuji Silysia Chemical Ltd.) was added, and the mixture was agitated for 1 hour at room temperature and passed through a short column of acidic silica gel. The solution was concentrated and recrystallized with chloroform/ethyl acetate as the solvent, and the precipitate was filtered out to obtain a target Copolymer 5 (180 mg). The resulting Copolymer 5 had a weight-average molecular weight Mw of $3.64 \times 10^5$, and a PDI of 7.4.

Example A6

Synthesis Example of Copolymer 6

[Chemical Formula 64]

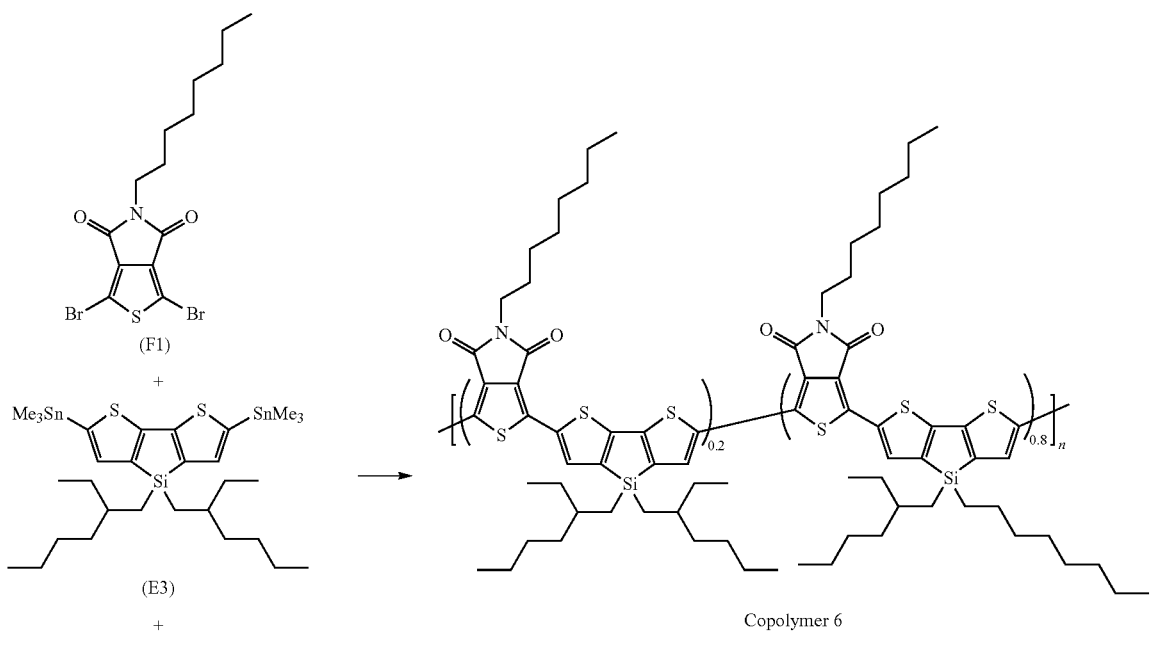

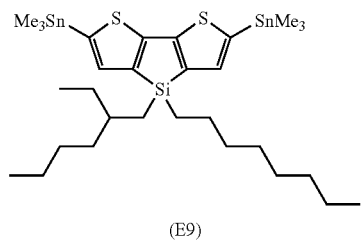

1,3-dibromo-5-octyl-4H-thieno[3,4-c]pyrrole-4,6-(5H)-dione (Compound F1 (imidothiophene dibromide), 257 mg, 0.61 mmol) obtained with reference to the methods described in known literature (Organic Letters 2004, 6, 3381-3384), the Compound E3 (97 mg, 0.13 mmol) obtained in Synthesis Example A2 and the Compound E9 (385 mg, 0.52 mmol) obtained in Synthesis Example A7 as monomers were placed in a 50 mL two-necked recovery flask in a nitrogen atmosphere, tetrakis(triphenylphosphine)palladium (0) (22 mg, 3 mol %), the triphenylphosphine-containing heterogeneous palladium complex catalyst Pd-EnCat TPP30 (Sigma-Aldrich Co. LLC., 48 mg, 3 mol %), toluene (8.0 mL) and N,N-dimethylformamide (2.0 mL) were added, and the mixture was agitated for 1 hour at 90° C. and 10 hours at 100° C. The reaction solution was diluted 4 times with toluene, and heated and agitated for another 0.5 hours at 100° C., after which terminal treatment was performed by adding trimethyl(phenyl)tin (0.4 mL) and heating and agitating for 8 hours at 100° C., then adding bromobenzene (3.5 mL) and heating and agitating again for 8 hours at 100° C., after which the reaction solution was poured into methanol and the precipitate was filtered out. The resulting solid was dissolved in chloroform, diamine silica gel (Fuji Silysia Chemical Ltd.) was added, and the mixture was agitated for 1 hour at room temperature and passed through a short column of acidic silica gel. The solution was concentrated and recrystallized with chloroform/ethyl acetate as the solvent, and the precipitate was filtered out to obtain a target Copolymer 6 (210 mg). The resulting Copolymer 6 had a weight-average molecular weight Mw of $2.99 \times 10^5$, and a PDI of 5.3.

Example A7

Synthesis Example of Copolymer 7

[Chemical Formula 65]

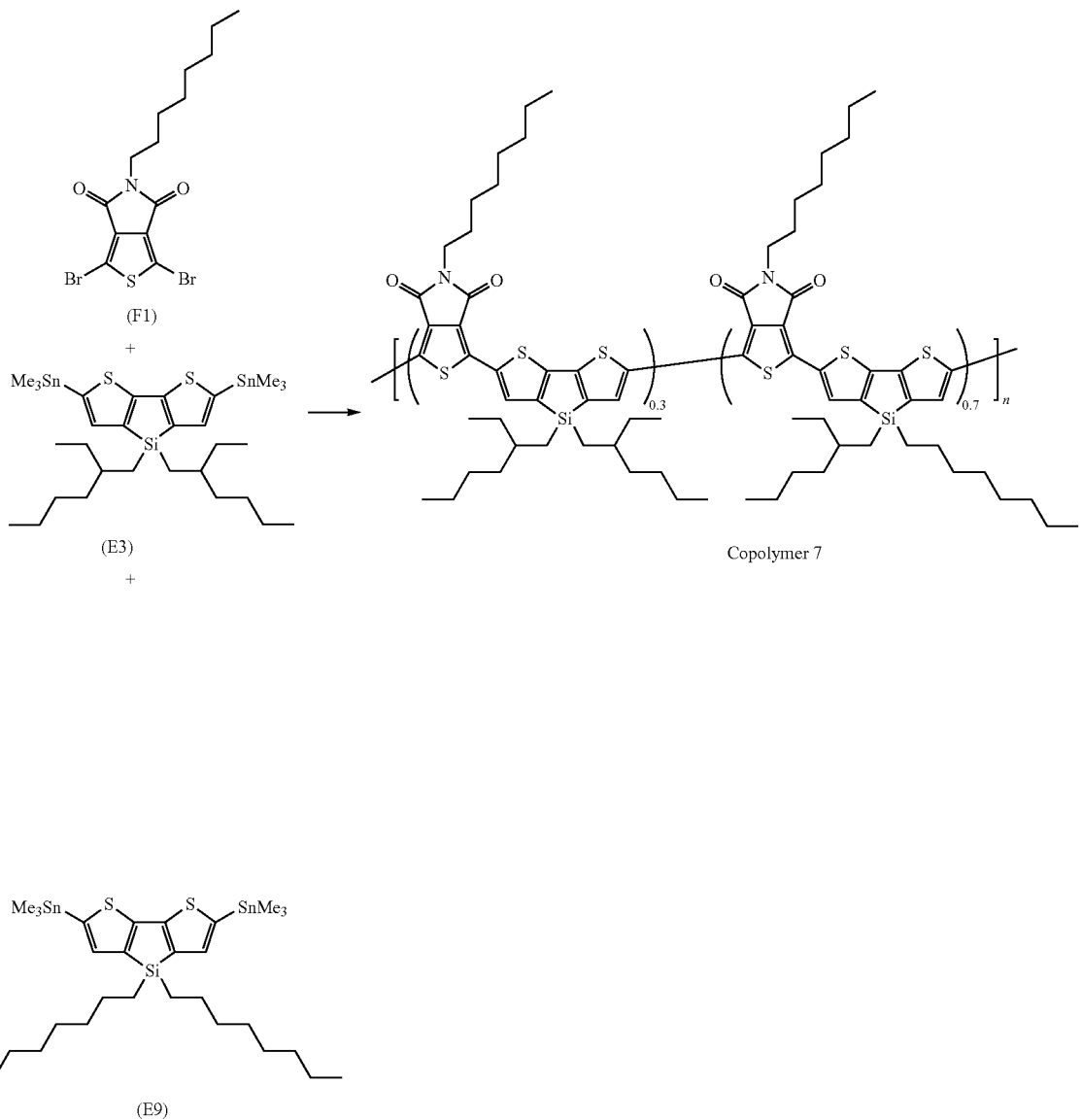

1,3-dibromo-5-octyl-4H-thieno[3,4-c]pyrrole-4,6-(5H)-dione (Compound F1 (imidothiophene dibromide), 242 mg, 0.57 mmol) obtained with reference to the methods described in known literature (Organic Letters 2004, 6, 3381-3384), the Compound E3 (136 mg, 0.18 mmol) obtained in Synthesis Example A2 and the Compound E9 (317 mg, 0.43 mmol) obtained in Synthesis Example A7 as monomers were placed in a 50 mL two-necked recovery flask in a nitrogen atmosphere, tetrakis(triphenylphosphine)palladium (0) (21 mg, 3 mol %), the triphenylphosphine-containing heterogeneous palladium complex catalyst Pd-EnCat TPP30 (Sigma-Aldrich Co. LLC., 45 mg, 3 mol %), toluene (7.5 mL) and N,N-dimethylformamide (1.8 mL) were added, and the mixture was agitated for 1 hour at 90° C. and 10 hours at 100° C. The reaction solution was diluted 4 times with toluene, and heated and agitated for another 0.5 hours at 100° C., after which terminal treatment was performed by adding trimethyl(phenyl)tin (0.4 mL) and heating and agitating for 8 hours at 100° C., then adding bromobenzene (3.5 mL) and heating and agitating again for 8 hours at 100° C., after which the reaction solution was poured into methanol and the precipitate was filtered out. The resulting solid was dissolved in chloroform, diamine silica gel (Fuji Silysia Chemical Ltd.) was added, and the mixture was agitated for 1 hour at room temperature and passed through a short column of acidic silica gel. The solution was concentrated and recrystallized with chloroform/ethyl acetate as the solvent, and the precipitate was filtered out to obtain a target Copolymer 7 (190 mg). The resulting Copolymer 7 had a weight-average molecular weight Mw of $1.67 \times 10^5$, and a PDI of 4.0.

Example A8
Synthesis Example of Copolymer 8
[Chemical Formula 66]
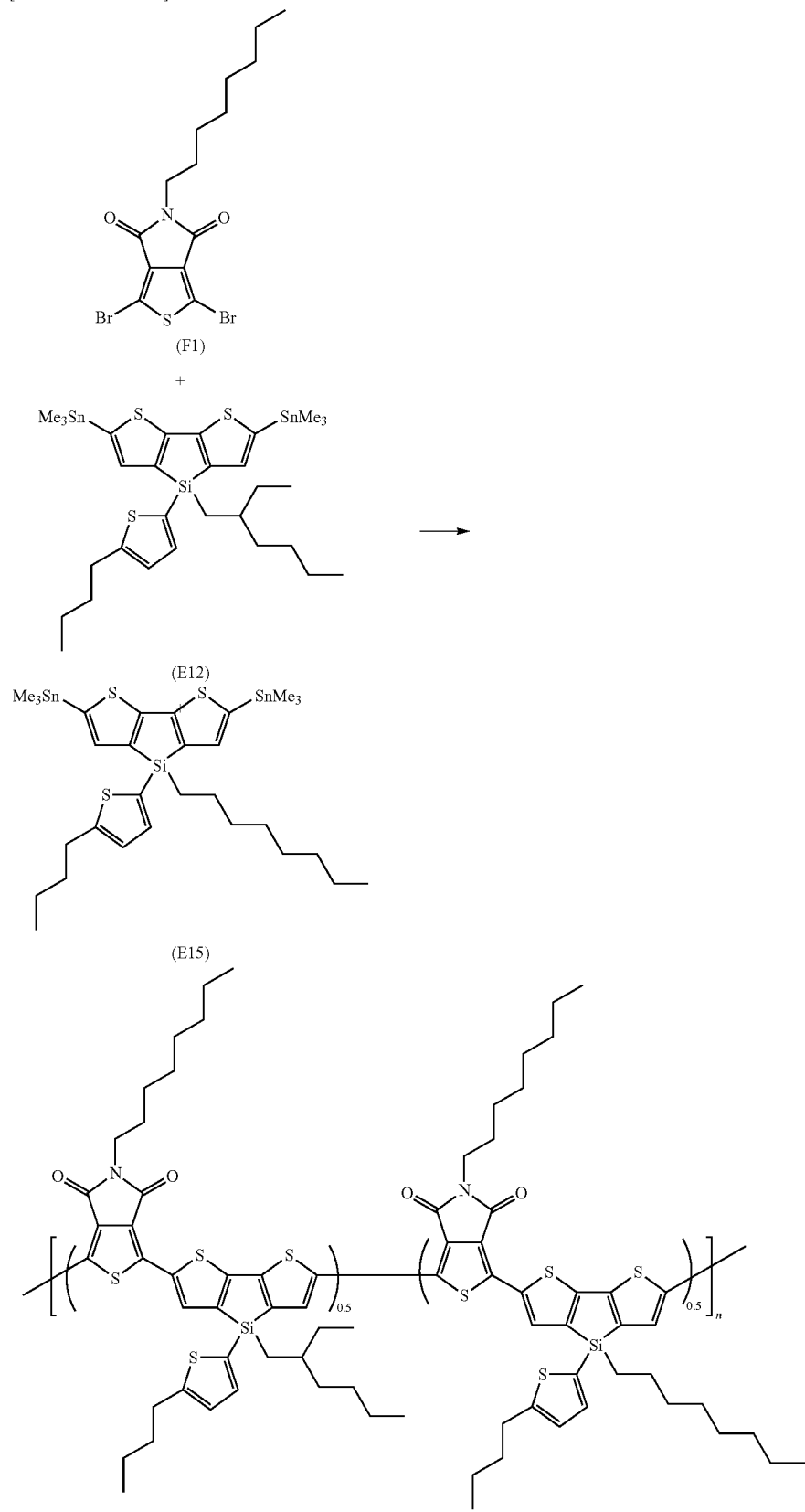
Copolymer 8

1,3-dibromo-5-octyl-4H-thieno[3,4-c]pyrrole-4,6-(5H)-dione (Compound F1 (imidothiophene dibromide), 157 mg, 0.371 mmol) obtained with reference to the methods described in known literature (Organic Letters 2004, 6, 3381-3384), the Compound E12 (154 mg, 0.200 mmol) obtained in Synthesis Example A10 and the Compound E15 (149 mg, 0.193 mmol) obtained in Synthesis Example A13 as monomers were placed in a 50 mL two-necked recovery flask in a nitrogen atmosphere, tetrakis(triphenylphosphine)palladium (0) (22.5 mg, 5 mol %), toluene (6.1 mL) and N,N-dimethylformamide (1.5 mL) were added, and the mixture was agitated for 1 hour at 90° C. and 6 hours at 100° C. The reaction solution was diluted 4 times with toluene, and heated and agitated for another 0.5 hours at 100° C., after which terminal treatment was performed by adding trimethyl(phenyl)tin (0.1 mL) and heating and agitating for 8 hours at 100° C., then adding bromobenzene (1.0 mL) and agitating again for 8 hours at 100° C., after which the reaction solution was poured into methanol and the precipitate was filtered out. The resulting solid was dissolved in chloroform, diamine silica gel (Fuji Silysia Chemical Ltd.) was added, and the mixture was agitated for 1 hour at room temperature and passed through a short column of acidic silica gel. The solution was concentrated and recrystallized with chloroform/ethyl acetate as the solvent, and the precipitate was filtered out to obtain a target Copolymer 8 (186 mg). The resulting Copolymer 8 had a weight-average molecular weight Mw of $2.39 \times 10^5$, and a PDI of 5.2.

Example A9

Synthesis Example of Copolymer 9

[Chemical Formula 67]

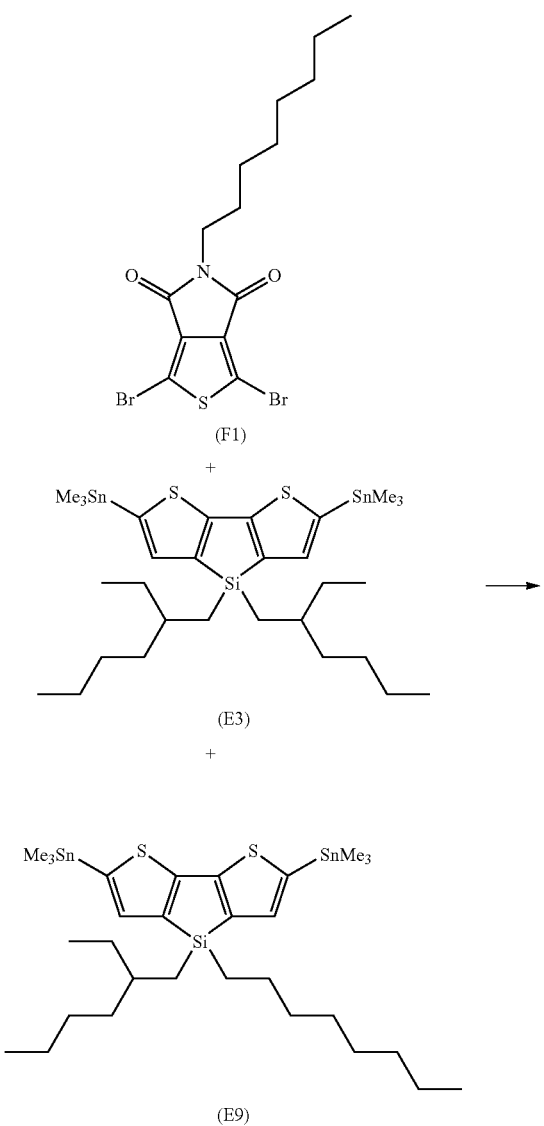

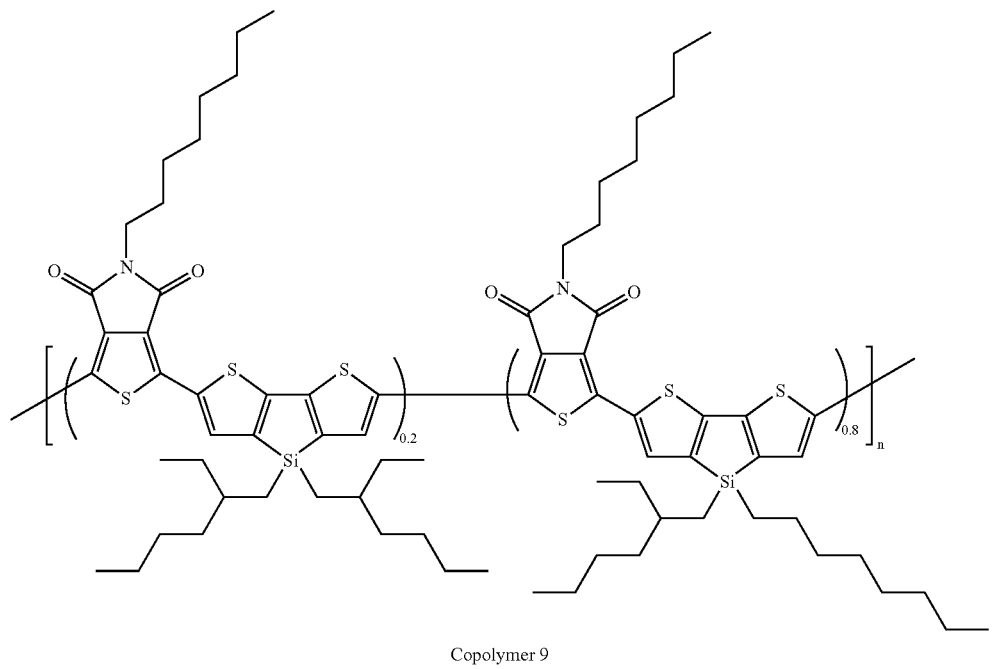

Copolymer 9

1,3-dibromo-5-octyl-4H-thieno[3,4-c]pyrrole-4,6-(5H)-dione (Compound F11 (imidothiophene dibromide), 211 mg, 0.50 mmol) obtained with reference to the methods described in known literature (Organic Letters 2004, 6, 3381-3384) and the Compound E9 (400 mg, 0.54 mmol) obtained in Synthesis Example A7 as monomers were placed in a first 50 mL two-necked recovery flask (A) in a nitrogen atmosphere, tetrakis(triphenylphosphine)palladium (0) (20 mg, 3 mol %), the triphenylphosphine-containing heterogeneous palladium complex catalyst Pd-EnCat TPP30 (Sigma-Aldrich Co. LLC., 44 mg, 3 mol %), toluene (9.2 mL) and N,N-dimethylformamide (2.2 mL) were added, and the mixture was agitated for 1 hour at 90° C. and 1 hour at 100° C.

Next, 1,3-dibromo-5-octyl-4H-thieno[3,4-c]pyrrole-4,6-(5H)-dione (Compound F1 (imidothiophene dibromide), 53 mg, 0.13 mmol) obtained with reference to the methods described in known literature (Organic Letters 2004, 6, 3381-3384) and the Compound E3 (100 mg, 0.13 mmol) obtained in Synthesis Example A2 as monomers were placed in a second 50 mL two-necked recovery flask (B) in a nitrogen atmosphere, tetrakis(triphenylphosphine)palladium (0) (5.1 mg, 3 mol %), the triphenylphosphine-containing heterogeneous palladium complex catalyst Pd-EnCat TPP30 (Sigma-Aldrich Co. LLC., 11 mg, 3 mol %), toluene (2.3 mL) and N,N-dimethylformamide (0.6 mL) were added, and the mixture was agitated for 1 hour at 90° C. and 1 hour at 100° C.

At this point, the copolymer in the reaction solution in flask (A) had a weight-average molecular weight Mw of $6.5 \times 10^3$ and a PDI of 1.5, while the copolymer in the reaction solution in flask (B) had a weight-average molecular weight Mw of $6.6 \times 10^3$ and a PDI of 1.6. The reaction solution of flask (B) was then added to the reaction solution of flask (A), and agitated for 10 hours at 100° C. This was diluted 4 times with toluene, and further heated and agitated for another 0.5 hours at 100° C., and terminal treatment was performed by adding trimethyl(phenyl)tin (0.5 mL) and heating and agitating for 8 hours at 100° C. then adding bromobenzene (4.0 mL) and heating and agitating for 8 hours at 100° C., after which the reaction solution was poured into methanol and the precipitate was filtered out. The resulting solid was dissolved in chloroform, diamine silica gel (Fuji Silysia Chemical Ltd.) was added, and the mixture was agitated for 1 hour at room temperature and passed through a short column of acidic silica gel. The solution was concentrated and recrystallized with chloroform/ethyl acetate as the solvent, and the precipitate was filtered out to obtain a target Copolymer 9 (220 mg). The resulting Copolymer 9 had a weight-average molecular weight Mw of $4.66 \times 10^5$, and a PDI of 7.9.

Example A10
Synthesis Example of Copolymer 10
[Chemical Formula 68]
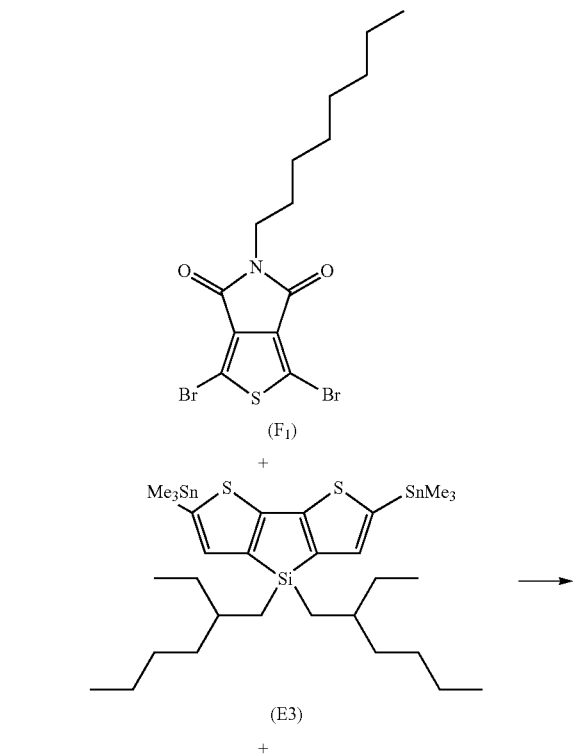
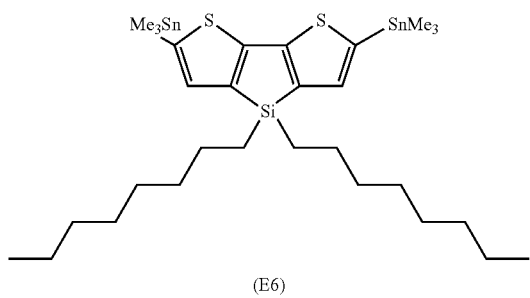

-continued

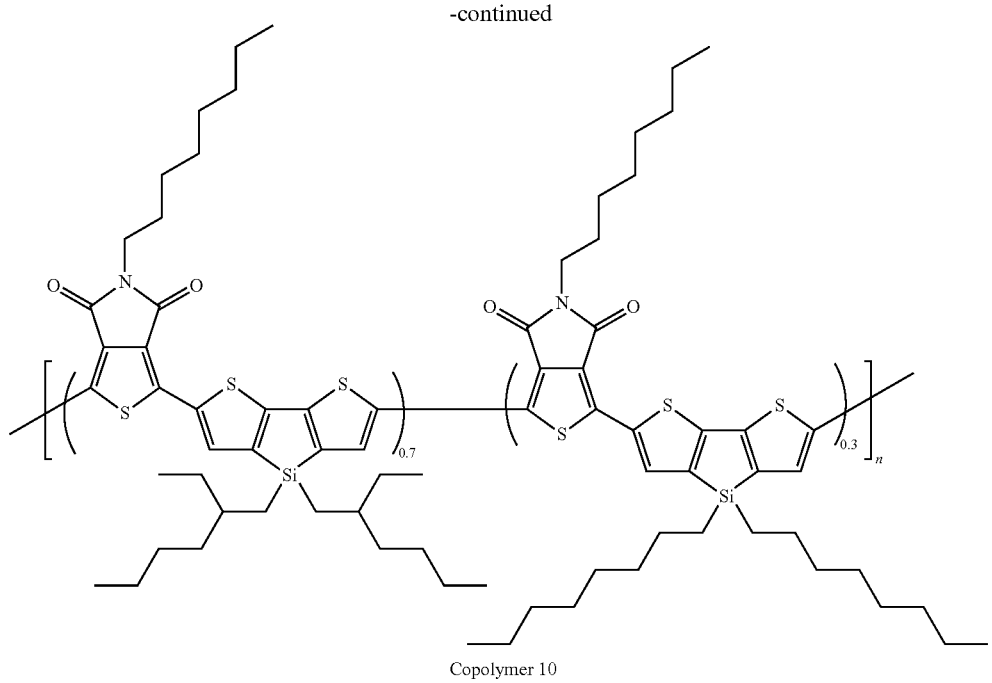

Copolymer 10

1,3-dibromo-5-octyl-4H-thieno[3,4-c]pyrrole-4,6-(5H)-dione (Compound F1 (imidothiophene dibromide), 45 mg, 0.106 mmol) obtained with reference to the methods described in known literature (Organic Letters 2004, 6, 3381-3384) and the Compound E3 (85 mg, 0.114 mmol) obtained in Synthesis Example A2 as monomers were placed in a first 50 mL two-necked recovery flask (A) in a nitrogen atmosphere, tetrakis(triphenylphosphine)palladium (0) (5 mg, 3 mol %), the triphenylphosphine-containing heterogeneous palladium complex catalyst Pd-EnCat TPP30 (Sigma-Aldrich Co. LLC., 9 mg, 3 mol %), toluene (1.9 mL) and N,N-dimethylformamide (0.48 mL) were added, and the mixture was agitated for 1 hour at 90° C. and 30 minutes at 100° C.

Next, 1,3-dibromo-5-octyl-4H-thieno[3,4-c]pyrrole-4,6-(5H)-dione (Compound F1 (imidothiophene dibromide), 102 mg, 0.24 mol) obtained with reference to the methods described in known literature (Organic Letters 2004, 6, 3381-3384) and Compound E6 (193 mg, 0.26 mmol) obtained in Synthesis Example A4 as monomers were placed in a second 50 mL two-necked recovery flask (B) in a nitrogen atmosphere, tetrakis(triphenylphosphine)palladium (0) (9 mg, 3 mol %), the triphenylphosphine-containing heterogeneous palladium complex catalyst Pd-EnCat TPP30 (Sigma-Aldrich Co. LLC., 19 mg, 3 mol %), toluene (4.3 mL) and N,N-dimethylformamide (1.1 mL) were added, and the mixture was agitated for 1 hour at 90° C. and 30 minutes at 100° C.

The reaction solution of flask (B) was transferred through a cannula to the reaction solution of flask (A), and the resulting mixed solution was agitated for 8 hours at 100° C. The reaction solution was diluted 4 times with toluene, and further heated and agitated for another 0.5 hours at 100° C., and terminal treatment was performed by adding trimethyl(phenyl)tin (0.5 mL) and heating and agitating for 8 hours at 100° C., then adding bromobenzene (3.5 mL) and heating and agitating for 8 hours at 100° C., after which the reaction solution was poured into methanol and the precipitate was filtered out. The resulting solid was dissolved in chloroform, diamine silica gel (Fuji Silysia Chemical Ltd.) was added, and the mixture was agitated for 1 hour at room temperature and passed through a short column of acidic silica gel. The solution was concentrated and recrystallized with chloroform/ethyl acetate as the solvent, and the precipitate was filtered to obtain a target Copolymer 10 (210 mg). The resulting Copolymer 10 had a weight-average molecular weight Mw of $3.93 \times 10^5$, and a PDI of 10.5.

Comparative Example A1

Synthesis Example of Copolymer 11

[Chemical Formula 69]

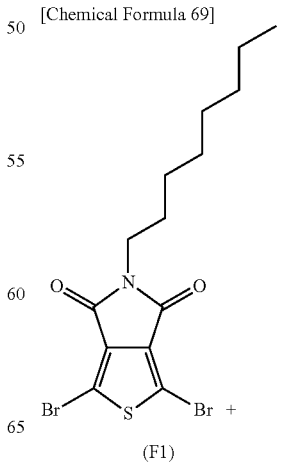

(F1)

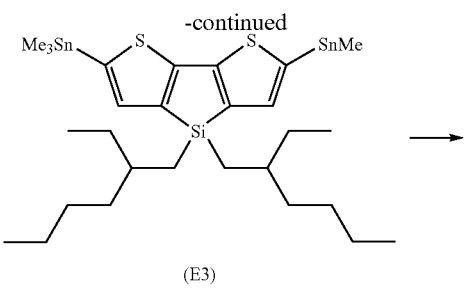

(E3)

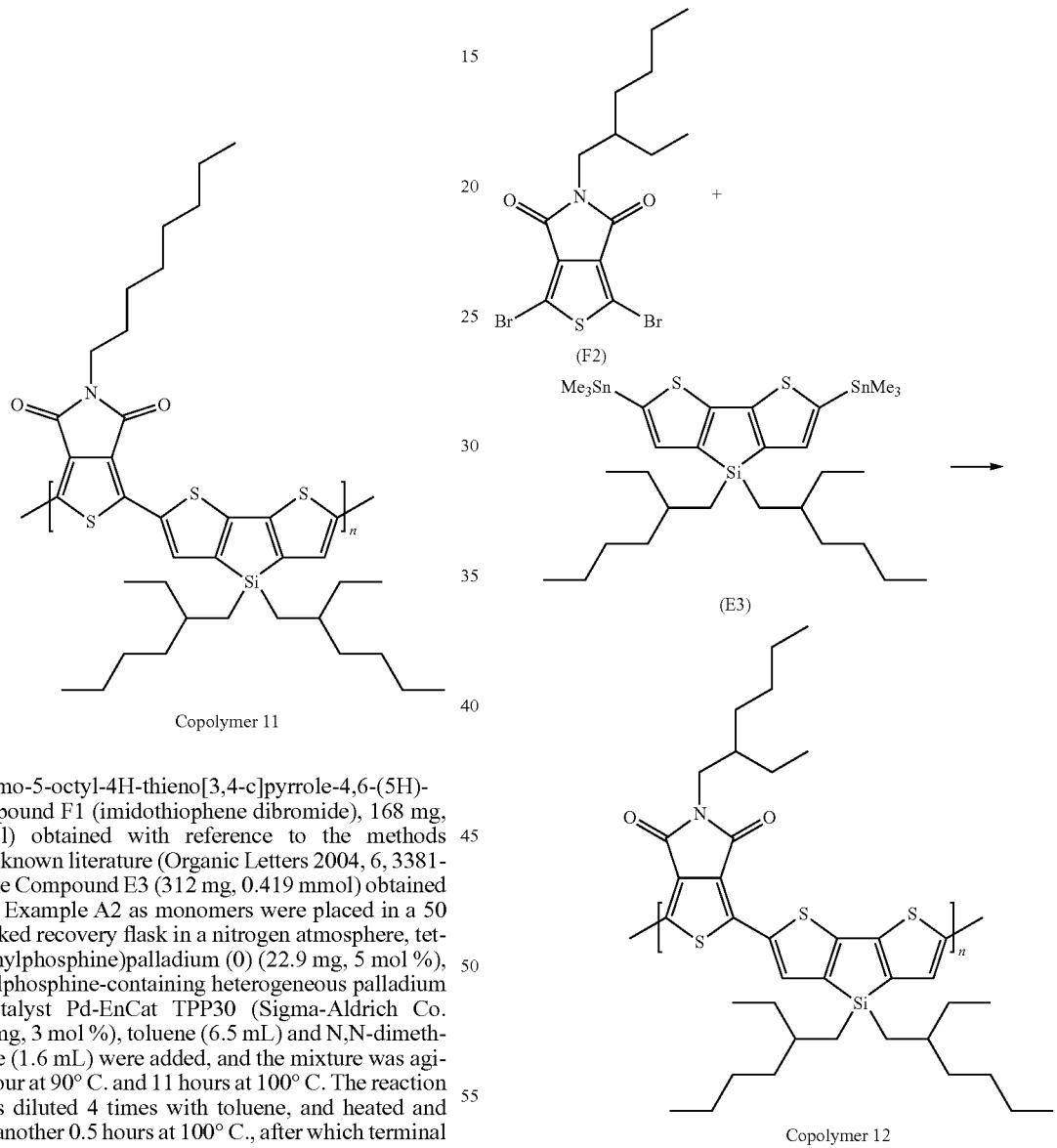

to obtain a target Copolymer 11 (180 mg). The resulting Copolymer 11 had a weight-average molecular weight Mw of $1.35 \times 10^5$, and a PDI of 2.9.

Comparative Example A2

Synthesis Example of Copolymer 12

[Chemical Formula 70]

1,3-dibromo-5-octyl-4H-thieno[3,4-c]pyrrole-4,6-(5H)-dione (Compound F1 (imidothiophene dibromide), 168 mg, 0.398 mmol) obtained with reference to the methods described in known literature (Organic Letters 2004, 6, 3381-3384) and the Compound E3 (312 mg, 0.419 mmol) obtained in Synthetic Example A2 as monomers were placed in a 50 mL two-necked recovery flask in a nitrogen atmosphere, tetrakis(triphenylphosphine)palladium (0) (22.9 mg, 5 mol %), the triphenylphosphine-containing heterogeneous palladium complex catalyst Pd-EnCat TPP30 (Sigma-Aldrich Co. LLC., 29.7 mg, 3 mol %), toluene (6.5 mL) and N,N-dimethylformamide (1.6 mL) were added, and the mixture was agitated for 1 hour at 90° C. and 11 hours at 100° C. The reaction solution was diluted 4 times with toluene, and heated and agitated for another 0.5 hours at 100° C., after which terminal treatment was performed by adding trimethyl(phenyl)tin (0.036 mL) and heating and agitating for 8 hours at 100° C., then adding bromobenzene (0.083 mL) and heating and agitating for 8 hours at 100° C., after which the reaction solution was poured into methanol and the precipitate was filtered out. The resulting solid was dissolved in chloroform, diamine silica gel (Fuji Silysia Chemical Ltd.) was added, and the mixture was agitated for 1 hour at room temperature and passed through a short column of acidic silica gel. The solution was concentrated and recrystallized with chloroform/ethyl acetate as the solvent, and the precipitate was filtered out Synthesis was performed as in the synthesis example of Copolymer 11, except that 1,3-dibromo-5-(2-ethylhexyl)-4H-thieno[3,4-c]pyrrole-4,6-(5H)-dione (Compound F2 (imidothiophene dibromide), 162 mg, 0.383 mmol) obtained with reference to the methods described in known literature (J. Am. Chem. Soc. 2010, 132, 7595-7597) was used instead of the Compound F1, to obtain a target Copolymer 12 (170 mg). The resulting Copolymer 12 had a weight-average molecular weight Mw of 2.00×10⁵, and a PDI of 3.2.

Comparative Example A3

Synthesis Example of Copolymer 13

[Chemical Formula 71]

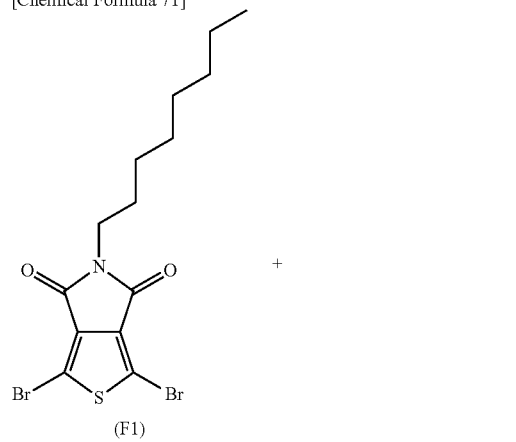

(F1)

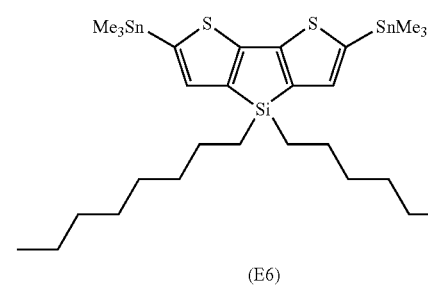

(E6)

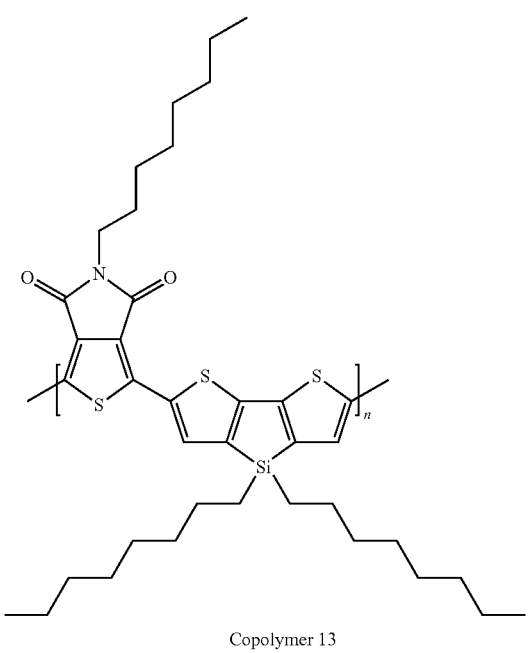

Copolymer 13

Synthesis was performed as in the synthesis example of Copolymer 11 except that the Compound E6 was used instead of the Compound E3. A product was precipitated in the reaction solution after 1 hour of agitation at 90° C. followed by 2 hours of agitation at 100° C. This precipitate did not dissolve in chloroform.

Copolymer-containing inks containing copolymers obtained as described above were each subjected to storage stability testing by the methods described above. The results are shown in Table 1 below. In Table 1, an "x" indicates that gelling was confirmed within 5 minutes after the container was removed from the heat source and left standing at room temperature, while "○" indicates that gelling was not confirmed after 5 minutes but was confirmed after 1 hour, and "⊚" indicates that no gelling was confirmed even after 1 hour. The absorption spectrum of each of the resulting copolymers was also measured by the methods described above. The absorption maximum wavelengths at the longest wavelengths in the range of 350 nm to 850 nm are shown in Table 1 below. The molar ratios in Table 1 are the molar ratios of the repeating units described in the synthesis examples of each copolymer.

Synthesis Example A14

Synthesis of Compound E16

[Chemical Formula 72]

SiCl₄ ⟶

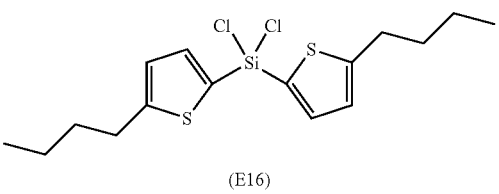

(E16)

Magnesium flakes (5.25 g, 216 mmol) were placed in a 300 ml four-necked flask in a nitrogen atmosphere and heat dried with a drier, and tetrahydrofuran (50 mL) was added, after which 2-bromo-5-n-butylthiophene (46.0 g, 210 mmol) was gradually added dropwise. After it was confirmed that the internal temperature had dropped to 30° C., dehydrated tetrahydrofuran (50 mL) was added to prepare a Grignard solution.

Tetrachlorosilane (17.0 g, 100 mmol) was placed in 1 L four-necked flask in a nitrogen atmosphere, and dissolved in tetrahydrofuran (150 mL). This was cooled to 5° C., and the previous Grignard solution was transferred to a dropping funnel and gradually added dropwise with the internal temperature maintained at 10° C. or less. After completion of dropping, the mixture was returned to room temperature and left standing overnight. About 100 mL of the tetrahydrofuran was distilled off under reduced pressure, hexane (200 mL) was added, and the precipitate was filtered out. The filtrate was concentrated under reduced pressure, and further distilled under reduced pressure (boiling point: 172-176° C./0.71-0.72 Torr) to obtain dichloro-bis(5-n-butylthiophene-2-yl)silane (Compound 16, 16.9 g, yield 45%) as a colorless transparent liquid.

Compound E16: ¹H-NMR (400 MHz, solvent: deuterated chloroform): δ7.43 (d, 2H, J=3.6 Hz), 6.92 (d, 2H, J=3.6 Hz), 2.88 (t, 4H), 1.69 (m, 4H), 1.41 (m, 4H), 0.94 (t, 6H)

Synthesis Example A15
Synthesis of Compound E17

[Chemical Formula 73]

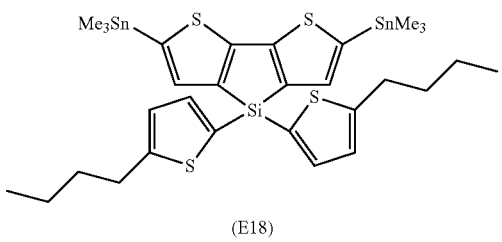

5,5'-bis(trimethylsilyl)-3,3'-dibromo-2,2'-bithiophene (Compound E4, synthesized in accordance with WO 2010/136353, 8.27 g, 17.7 mmol) was placed in a 500 mL four-necked flask in a nitrogen atmosphere, and dissolved in tetrahydrofuran (150 mL). The resulting solution was cooled to −78° C., and a solution of n-butyl lithium in hexane (KANTO CHEMICAL CO., INC., 1.62 M, 22.9 mL) was gradually added dropwise. After about 15 minutes of agitation, the Compound E16 (8.0 g, 21.2 mmol) obtained in Synthesis Example A14 was added dropwise. After 15 minutes of agitation at −78° C., the temperature was gradually raised to room temperature over the course of 1 hour, and the mixture was left standing overnight. About 100 mL of the tetrahydrofuran was distilled off under reduced pressure, water was added, the product was extracted with hexane, and the organic layer was washed with water, dried over sodium sulfate, and concentrated by filtration. Hexane (80 mL) and chloroform (40 mL) were added to dissolve the resulting yellow oily substance, trifluoroacetic acid (5 mL) was added, and the mixture was agitated for about 1 hour at room temperature. This was concentrated under reduced pressure, and the resulting yellow oily substance was dissolved in hexane and subjected to silica gel column chromatography (solvent: hexane) to obtain the target 4,4-bis(5-n-butylthiophene-2-yl)-dithieno[3,2-b:2',3'-d]silole (Compound E17, 2.60 g, yield 31%).

Compound E17: $^1$H-NMR (400 MHz, solvent: deuterated chloroform): δ7.31 (d, 2H, J=3.2 Hz), 7.24 (d, 2H, J=4.8 Hz), 7.18 (d, 2H, J=4.8 Hz), 6.87 (d, 2H, J=3.6 Hz), 2.83 (t, 4H), 1.64 (m, 4H), 1.36 (m, 4H), 0.91 (t, 6H)

Synthesis Example A16
Synthesis of Compound E18

[Chemical Formula 74]

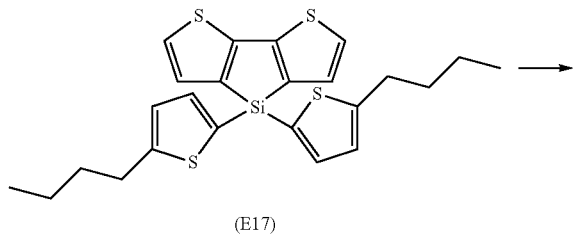

4,4-bis(5-n-butylthiophene-2-yl)-dithieno[3,2-b:2',3'-d]silole (Compound E17, 1.5 g, 3.19 mmol) was placed in a 100 mL four-necked flask in a nitrogen atmosphere, and dissolved in tetrahydrofuran (25 mL). The resulting solution was cooled to −78° C., and trimethyltin chloride (Sigma-Aldrich Co. LLC., 1.0 M, 8.0 ml) was added. A solution of lithium diisopropylamide in tetrahydrofuran/hexane (KANTO CHEMICAL CO., INC., 1.11 M, 6.9 ml) was then gradually added dropwise, the mixture was agitated for 15 minutes, and the temperature was gradually raised to room temperature over the course of 1 hour, after which water was added, the product was extracted with hexane, and the organic layer was washed with water and then dried over sodium sulfate and concentrated to obtain the target 4,4-bis-(5-n-butylthiophene-2-yl)-2,6-bis(trimethyltin)-dithieno[3,2-b:2',3'-d]silole (Compound E18, 930 mg, yield 31%).

Compound E18: $^1$H-NMR (400 MGz, solvent: deuterated chloroform): δ7.34 (d, 2H, J=3.2 Hz), 7.28 (s, 2H), 6.89 (d, 2H, J=2.8 Hz), 2.87 (t, 4H), 1.68 (m, 4H), 1.41 (m, 4H), 0.95 (t, 6H), 0.41 (s, 18H)

Synthesis Example A17

Synthesis of Compound E19

[Chemical Formula 75]

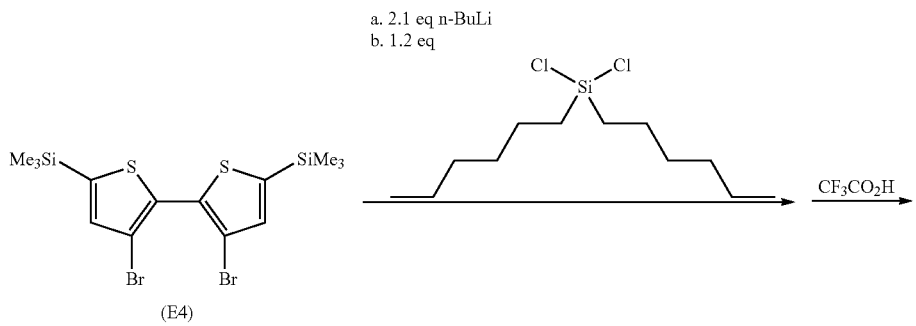

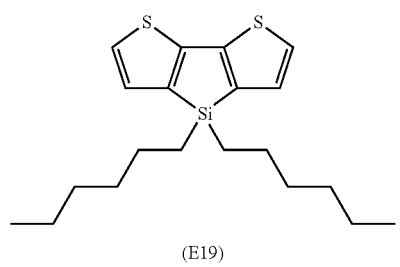

(E19)

3,3'-dibromo-5,5'-bis(trimethylsilyl)-2,2'-bithiophene (Compound E4, synthesized in accordance with WO 2010/136353, 10.0 g) was placed in a 200 mL four-necked flask in a nitrogen atmosphere, and dissolved in tetrahydrofuran (150 mL). This was cooled to −78° C., and a solution of n-butyl lithium in hexane (KANTO CHEMICAL CO., INC., 1.64 M, 27.5 mL) was added dropwise. After about 30 minutes of agitation, dichlorodi-n-hexylsilane (5.7 g) was added dropwise. The temperature was gradually raised to room temperature over the course of about 2 hours, after which water was added, and the product was extracted with hexane. The organic layer was washed with water, dried with anhydrous sodium sulfate, and concentrated by filtration. The resulting yellow-orange oily substance was dissolved in hexane (100 mL) and chloroform (50 mL), trifluoroacetic acid (5 mL) with the internal temperature at 2° C., and after 10 minutes of agitation water was added, and the organic layer was washed, dried with anhydrous sodium sulfate, and then concentrated by filtration. Heptane (70 mL) was added to the reaction solution, which was then concentrated under reduced pressure. The resulting yellow-green oily substance was dissolved in hexane, and subjected to silica gel column chromatography (solvent: hexane) to obtain the target 4,4-di-n-hexyl-dithieno[3,2-b:2',3'-d]silole (Compound E19, 7.1 g, yield 91%).

Compound E19: $^{1}$H-NMR (400 MHz, solvent: deuterated chloroform): δ7.21 (d, 2H, J=5 Hz), 7.06 (d, 2H, J=5 Hz), 1.24-1.41 (m, 16H) 0.85-0.93 (m, 10H)

Synthesis Example A18

Synthesis of Compound E20

[Chemical Formula 76]

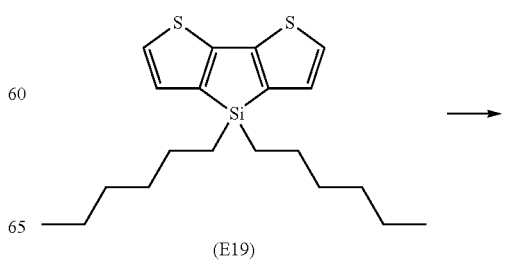

(E19)

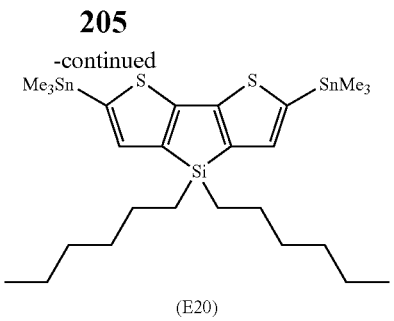

(E20)

A reaction was performed as in Synthesis Example A2 except that the Compound E19 (2.00 g, 5.52 mmol) was used instead of the Compound E2, while the other reagents were used in similar proportions, to quantitatively obtain 4,4-di-n-hexyl-2,6-bis(trimethyltin)-dithieno[3,2-b:2',3'-d]silole (Compound E20).

Compound E20: $^1$H-NMR (400 MHz, solvent: deuterated chloroform): δ7.06 (s, 2H), 1.22-1.32 (m, 16H), 0.86-0.88 (m, 10H), 0.38 (s, 18H)

Synthesis Example A19

Synthesis of Compound E21

[Chemical Formula 77]

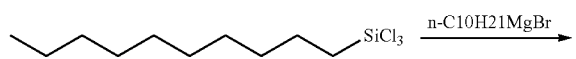

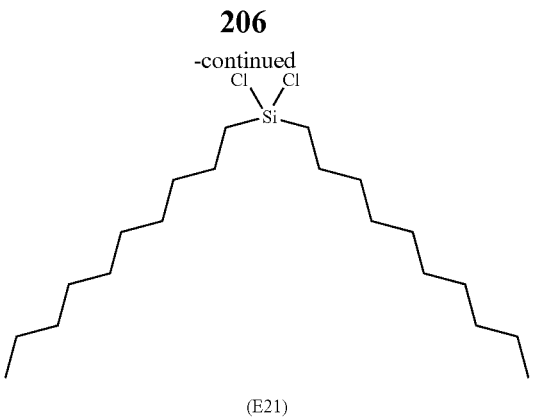

(E21)

Tetrahydrofuran (82 mL) and n-decyltrichlorosilane (Tokyo Chemical Industry Co., Ltd., 14.5 g, 52.6 mmol) were placed in a 500 mL four-necked flask in a nitrogen atmosphere, and cooled to 0° C. n-decyl magnesium bromide (Sigma-Aldrich Co. LLC., 1.0 M, 58 ml) was added dropwise, and the mixture was agitated for 1 hour at 10° C. or less. The temperature was raised gradually to room temperature over the course of about 1 hour, and the mixture was left standing overnight. The precipitated salt was filtered out, the tetrahydrofuran was removed by concentration under reduced pressure, and distillation under reduced pressure was performed to obtain the target dichlorodi-n-decylsilane (Compound E21) (150° C./0.1-0.2 Torr, 13.1 g, yield 65%).

Compound E21: $^1$H-NMR (400 MHz, solvent: deuterated chloroform): δ1.51-1.48 (m, 4H), 1.32-1.20 (m, 28H), 1.10-1.07 (m, 4H), 0.89-0.84 (m, 6H)

Synthesis Example A20

Synthesis of Compound E22

[Chemical Formula 78]

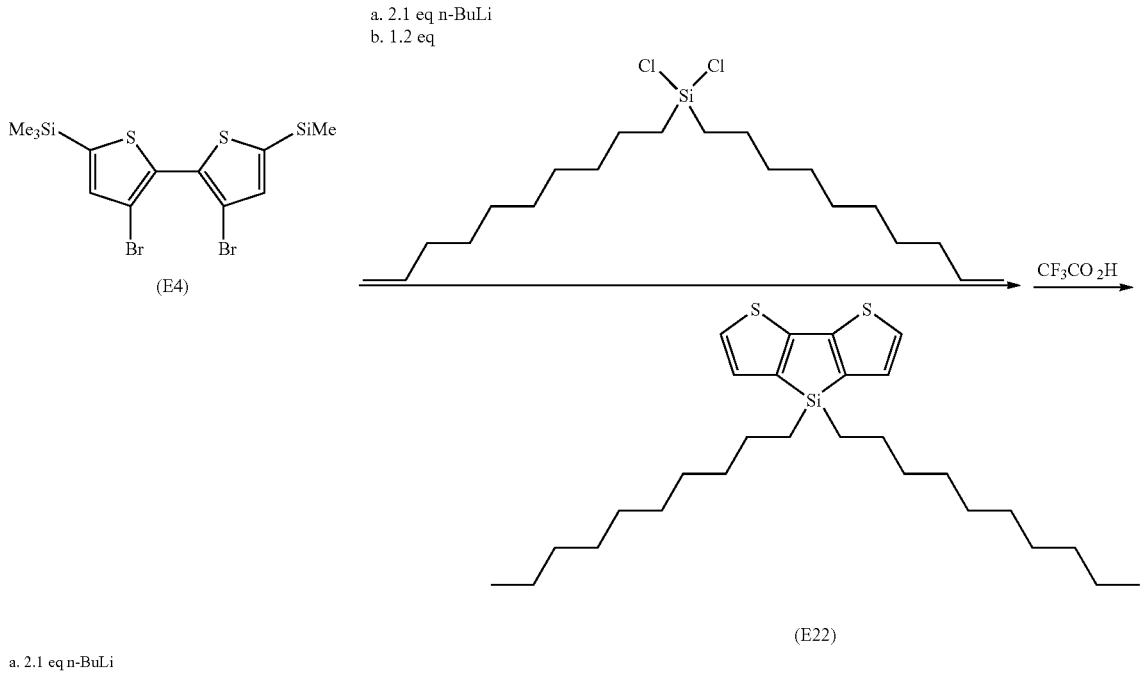

a. 2.1 eq n-BuLi
b. 1.2 eq 3,3'-dibromo-5,5'-bis(trimethylsilyl)-2,2'-bithiophene (Compound E4, synthesized in accordance with WO 2010/136353, 5.0 g) was placed in a 200 mL four-necked flask in a nitrogen atmosphere, and dissolved in tetrahydrofuran (75 mL). This was cooled to −78° C., and a solution of n-butyl lithium in hexane (KANTO CHEMICAL CO., INC., 1.64 M, 13.7 mL) was added dropwise. After about 30 minutes of agitation, the dichlorodi-n-decylsilane (Compound E21) (4.89 g) synthesized in Synthesis Example A19 was added dropwise. The temperature was gradually raised to room temperature over the course of about 2 hours, after which water was added, and the product was extracted with hexane. The organic layer was washed with water, dried with anhydrous sodium sulfate, and concentrated by filtration. The resulting yellow-orange oily substance was dissolved in hexane (50 mL) and chloroform (25 mL), trifluoroacetic acid (2.2 mL) was added with the internal temperature at 2° C., and after 10 minutes of agitation water was added, and the organic layer was washed, dried with anhydrous sodium sulfate and then and concentrated by filtration. Heptane (32 mL) was added to the reaction solution, which was then concentrated under reduced pressure. The resulting yellow-green oily substance was dissolved in hexane, and subjected to silica gel column chromatography (solvent: hexane) to obtain the target 4,4-di-n-decyl-dithieno[3,2-b:2',3'-d]silole (Compound E22, 4.46 g, yield 88%).

Compound E22: $^1$H-NMR (400 MHz, solvent: deuterated chloroform): δ7.19 (d, 2H, J=4.8 Hz), 7.05 (d, 1H, J=5.2 Hz), 7.05 (d, 1H, J=4.0 Hz), 1.40-1.35 (m, 4H), 1.27-1.20 (m, 28H), 1.10-1.07 (m, 4H), 0.89-0.84 (m, 6H)

Synthesis Example A21

Synthesis of Compound E23

[Chemical Formula 79]

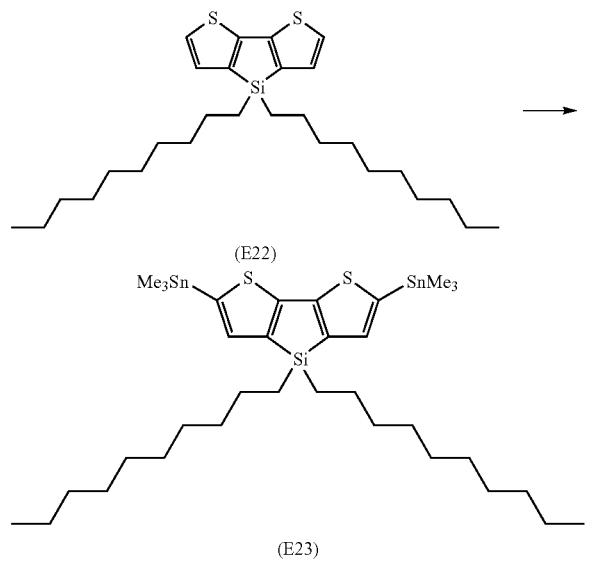

A reaction was performed as in Synthesis Example A2 except that the Compound E22 (4.12 g, 8.68 mmol) was used instead of the Compound E2, while the other reagents were used in similar proportions, to quantitatively obtain 4,4-di-n-decyl-2,6-bis(trimethyltin)-dithieno[3,2-b:2',3'-d]silole (Compound E23).

Compound E23: $^1$H-NMR (400 MHz, solvent: deuterated chloroform): δ7.08 (s, 2H), 1.45-1.38 (m, 4H), 1.32-1.20 (m, 28H), 1.10-1.07 (m, 4H), 0.89-0.84 (m, 6H), 0.38 (s, 18H)

Synthesis Example A22

Synthesis of Compound E24

[Chemical Formula 80]

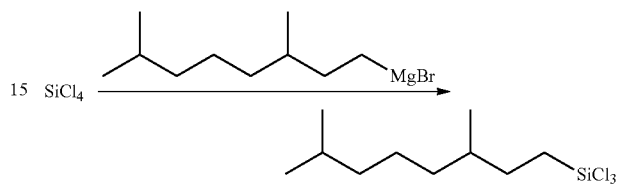

Tetrahydrofuran (100 ml) and tetrachlorosilane (17.0 g, 100 mmol) were placed in a 500 mL four-necked flask in a nitrogen atmosphere, and cooled to −10° C. 3,7-dimethyloctyl magnesium bromide (Sigma-Aldrich Co. LLC., 1.0 M, 100 ml) was added dropwise, and the mixture was agitated for 1 hour at 10° C. or less. The temperature was raised gradually to room temperature over the course of about 1 hour, and the mixture was left standing overnight. The precipitated salt was filtered out, the tetrahydrofuran was removed by concentration under reduced pressure, and the mixture was distilled under reduced pressure to obtain the target 3,7-dimethyloctyl trichlorosilane (99-102° C./0.3 Torr, 22.3 g, yield 81%).

[Chemical Formula 81]

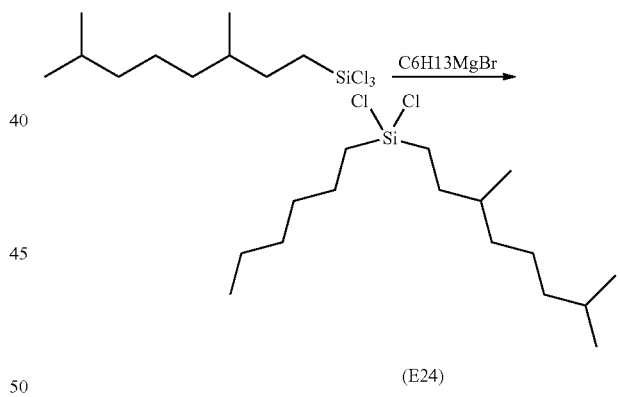

Tetrahydrofuran (50 ml) and 3,7-dimethyloctyl trichlorosilane (11.0 g, 40.0 mmol) were placed in a 200 mL four-necked flask in a nitrogen atmosphere, and cooled to −20° C. n-hexyl magnesium bromide (Sigma-Aldrich Co. LLC., 2.0 M, 21 ml) was added dropwise, and the mixture was agitated for 1 hour at 10° C. or less. The temperature was raised gradually to room temperature over the course of about 1 hour, and the mixture was left standing overnight. The precipitated salt was filtered out, the tetrahydrofuran was removed by concentration under reduced pressure, and the mixture was distilled under reduced pressure to obtain the target 3,7-dimethyloctyl-n-hexyl-dichlorosilane (Compound E24) (127-130° C./0.26 Torr, 9.5 g, yield 73%).

Compound E24: $^1$H-NMR (400 MHz, solvent: deuterated chloroform): δ1.54-1.46 (m, 4H), 1.41-1.21 (m, 11H), 1.17-1.02 (m, 7H0), 0.91-0.86 (m, 12H)

Synthesis Example A23

Synthesis of Compound E25

[Chemical Formula 82]

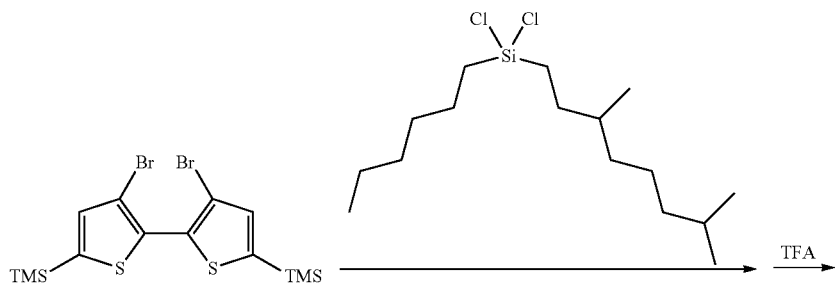

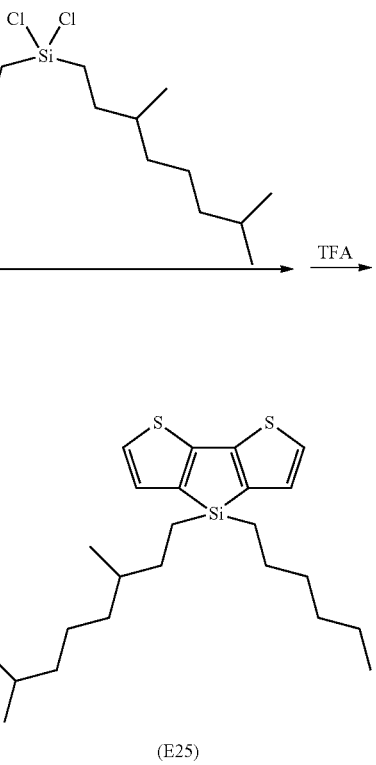

(E25)

3,3'-dibromo-5,5'-bis(trimethylsilyl)-2,2'-bithiophene (Compound E4, synthesized in accordance with WO 2010/136353, 11.4 g, 24.3 mmol) was placed in a 500 mL four-necked flask in a nitrogen atmosphere, and dissolved in tetrahydrofuran (200 mL). This was cooled to −78° C., and a solution of n-butyl lithium in hexane (KANTO CHEMICAL CO., INC., 1.59 M, 32.1 mL) was added dropwise. After about 20 minutes of agitation, the 3,7-dimethyloctyl-n-hexyl-dichlorosilane (Compound E24, 9.5 g) synthesized in Synthesis Example A22 was added dropwise. The temperature was raised gradually to room temperature over the course of about 2 hours, water was added, and the product was extracted with hexane. The organic layer was washed with water, and then dried over sodium sulfate and concentrated by filtration. The resulting oily substance was dissolved in chloroform (40 mL) and hexane (80 mL), trifluoroacetic acid (3.6 mL) was added, and the mixture was agitated for about 10 minutes at room temperature. Saturated sodium bicarbonate solution was added to the reaction solution, which was extracted with hexane and then concentrated under reduced pressure. The resulting yellow oily substance was dissolved in hexane, and subjected to silica gel column chromatography (solvent: hexane) to obtain the target 4-(3,7-dimethyloctyl)-4-n-hexyldithieno[3,2-b:2',3'-d]silole (Compound E25, 8.2 g, yield 81%).

Compound E25: $^1$H-NMR (400 MHz, solvent: deuterated chloroform): δ7.19 (d, 2H, J=4.8 Hz), 7.05 (d, 1H, J=5.2 Hz), 7.05 (d, 1H, J=4.0 Hz), 1.52-1.46 (m, 2H), 1.42-1.34 (m, 2H), 1.30-1.18 (m, 10H), 1.11-1.08 (m, 4H), 0.92-0.88 (m, 4H), 0.85-0.80 (m, 12H)

Synthesis Example A24

Synthesis of Compound E26

[Chemical Formula 83]

(E25)

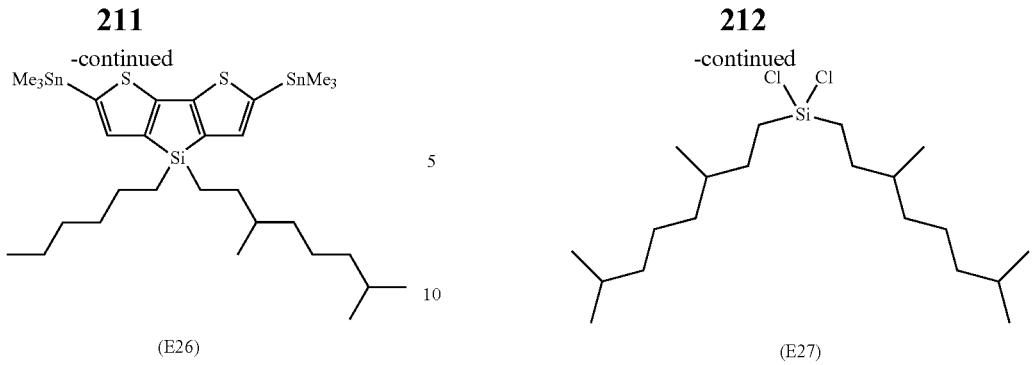

(E26)  (E27)

A reaction was performed as in Synthesis Example 2 except that the Compound E25 (3.06 g, 7.31 mmol) was used instead of the Compound E2, while the other reagents were used in similar proportions, to quantitatively obtain 4-(3,7-dimethyloctyl)-4-n-hexyl-2,6-bis(trimethyltin)-dithieno[3,2-b:2',3'-d]silole (Compound E26).

Compound E26: $^1$H-NMR (400 MHz, solvent: deuterated chloroform): δ7.08 (s, 2H), 1.52-1.46 (m, 2H), 1.42-1.34 (m, 2H), 1.30-1.18 (m, 10H), 1.11-1.08 (m, 4H), 0.92-0.88 (m, 4H), 0.85-0.80 (m, 12H), 0.38 (s, 18H)

Tetrahydrofuran (50 mL) and 3,7-dimethyloctyl trichlorosilane (11.27 g, 40.9 mmol) were placed in a 200 mL four-necked flask in a nitrogen atmosphere, and cooled to −20° C. 3,7-dimethyloctyl magnesium bromide (Sigma-Aldrich Co. LLC., 1.0 M, 42.9 ml) was added dropwise, and the mixture was agitated for 1 hour at 10° C. or less. The temperature was raised gradually to room temperature over the course of about 1 hour, and the mixture was left standing overnight. The precipitated salt was filtered out, the tetrahydrofuran was removed by concentration under reduced pressure, and the mixture was distilled under reduced pressure to obtain the target bis(3,7-dimethyloctyl)dichlorosilane (Compound E27) (150-152° C./0.6 Torr, 11.3 g, yield 73%).

Compound E27: $^1$H-NMR (400 MHz, solvent: deuterated chloroform): δ1.56-1.44 (m, 4H), 1.43-1.37 (m, 2H), 1.35-1.21 (m, 8H), 1.17-0.99 (m, 10H), 0.89-0.86 (m, 18H)

Synthesis Example A25

Synthesis of Compound E27

[Chemical Formula 84]

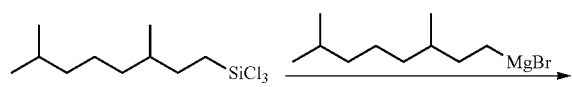

Synthesis Example A26

Synthesis of Compound E28

[Chemical Formula 85]

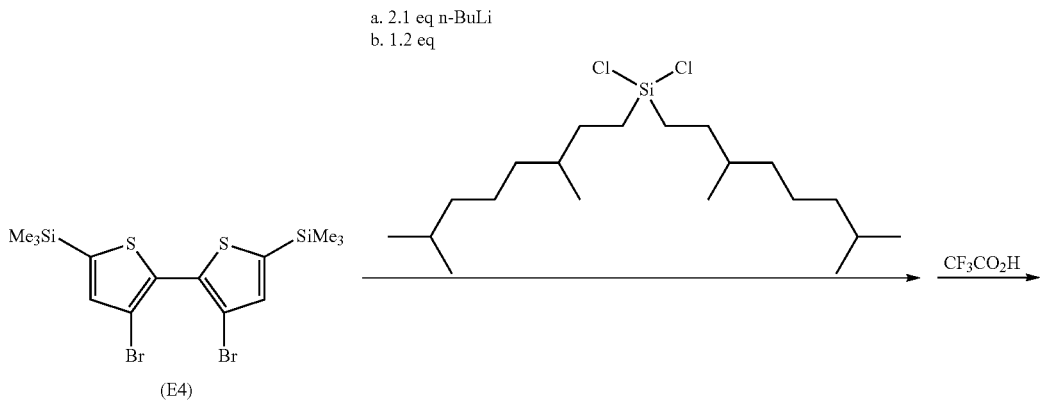

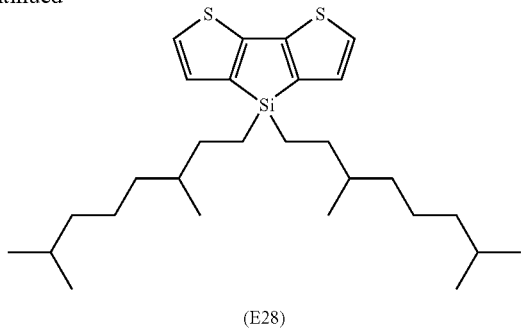

(E28)

3,3'-dibromo-5,5'-bis(trimethylsilyl)-2,2'-bithiophene (Compound E4, synthesized in accordance with WO 2010/136353, 11.6 g, 24.7 mmol) was placed in a 500 mL four-necked flask in a nitrogen atmosphere, and dissolved in tetrahydrofuran (200 mL). This was cooled to −78° C., and a solution of n-butyl lithium in hexane (KANTO CHEMICAL CO., INC., 1.59 M, 32.7 mL) was added dropwise. After about 20 minutes of agitation, the bis(3,7-dimethyloctyl)dichlorosilane synthesized in Synthesis Example A25 (Compound E27, 11.3 g) was added dropwise. The temperature was raised gradually to room temperature over the course of about 2 hours, water was added, and the product was extracted with hexane. The organic layer was washed with water, and then dried over sodium sulfate and concentrated by filtration. The resulting oily substance was dissolved in chloroform (40 mL) and hexane (80 mL), trifluoroacetic acid (3.7 mL) was added, and the mixture was agitated for about 10 minutes at room temperature. Saturated sodium bicarbonate solution was added to the reaction solution, which was extracted with hexane and then concentrated under vacuum pressure. The resulting yellow oily substance was dissolved in hexane, and subjected to silica gel column chromatography (solvent: hexane) to obtain the target 4,4-bis-(3,7-dimethyloctyl)-dithieno[3,2-b:2',3'-d]silole (Compound E28, 6.5 g, yield 56%).

Compound E28: $^1$H-NMR (400 MHz, solvent: deuterated chloroform): δ7.19 (d, 2H J=4.8 Hz), 7.05 (d, 2H, J=4.8 Hz), 1.53-1.46 (m, 2H), 1.41-1.33 (m, 2H), 1.30-1.15 (m, 8H), 1.10-1.00 (m, 8H), 0.94-0.87 (m, 4H), 0.85-0.80 (m, 18H)

Synthesis Example A27

Synthesis of Compound E29

[Chemical Formula 86]

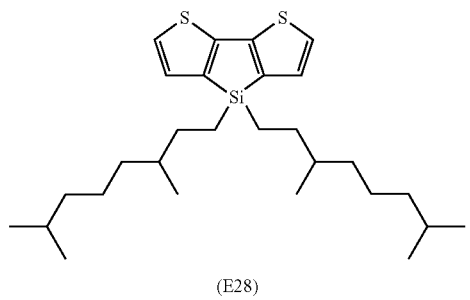

(E28)

→

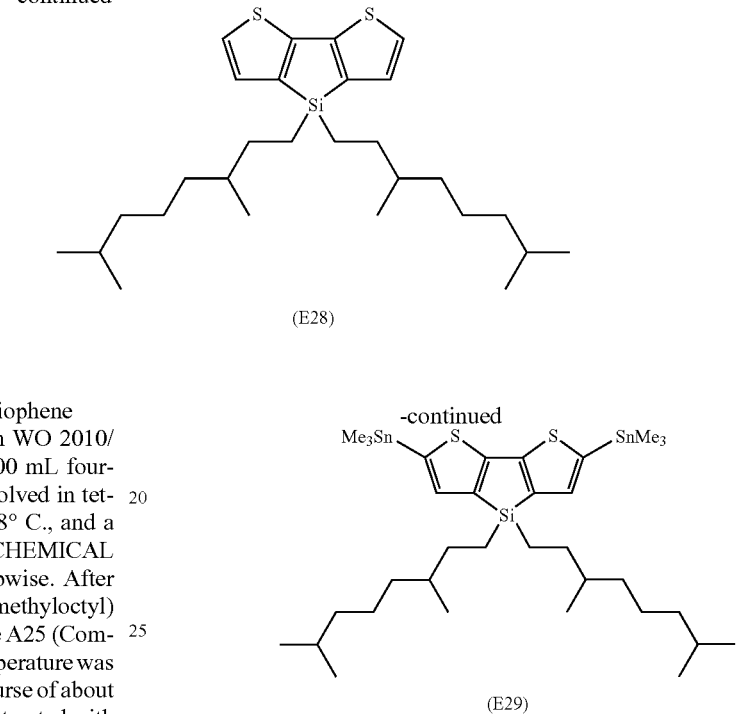

(E29)

A reaction was performed as in Synthesis Example 2 except that the Compound E28 (3.36 g, 6.44 mmol) was used instead of the Compound E2, while the other reagents were used in similar proportions, to quantitatively obtain 4,4-di-n-decyl-2,6-bis(trimethyltin)-dithieno[3,2-b:2',3'-d]silole (Compound E29).

Compound E29: $^1$H-NMR (400 MHz, solvent: deuterated chloroform): δ7.08 (s, 2H), 1.45-1.38 (m, 2H), 1.40-1.32 (m, 2H), 1.30-1.15 (m, 8H), 1.10-1.00 (m, 8H), 0.94-0.87 (m, 4H), 0.85-0.80 (m, 18H)

Comparative Example A4

Synthesis Example of Copolymer 14

[Chemical Formula 87]

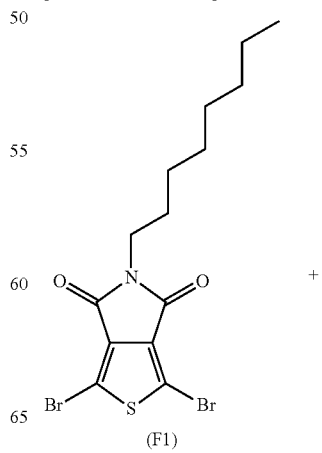

+

(F1)

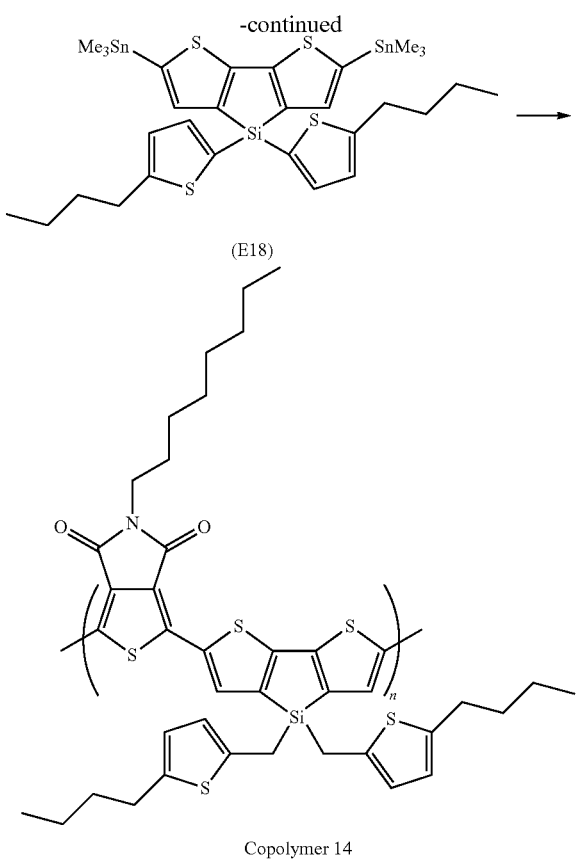

Copolymer 14

1,3-dibromo-5-octyl-4H-thieno[3,4-c]pyrrole-4,6-(5H)-dione (Compound F1 (imidothiophene dibromide), 189 mg, 0.447 mmol) obtained with reference to methods described in known literature (Organic Letters 2004, 6, 3381-3384) and the Compound E18 (387 mg, 0.486 mmol) obtained in Synthesis Example A16 as monomers were placed in a 50 mL two-necked recovery flask in a nitrogen atmosphere, tetrakis (triphenylphosphine)palladium (0) (15.5 mg, 3 mol %), the triphenylphosphine-containing heterogeneous palladium complex catalyst Pd-EnCat TPP30 (Sigma-Aldrich Co. LLC., 20.1 mg, 3 mol %), toluene (7.5 mL) and N,N-dimethylformamide (1.9 mL) were added, and the mixture was agitated for 1 hour at 90° C. and 11 hours at 100° C. The reaction solution was diluted 4 times with toluene, and heated and agitated for another 0.5 hours at 100° C., after which terminal treatment was performed by adding trimethyl(phenyl)tin (0.4 mL) and heating and agitating for 8 hours at 100° C., then adding bromobenzene (1.0 mL) and heating and agitating for 8 hours at 100° C., after which the reaction solution was poured into methanol and the precipitate was filtered out. The resulting solid was dissolved in chloroform, diamine silica gel (Fuji Silysia Chemical Ltd.) was added, and the mixture was agitated for 1 hour at room temperature and passed through a short column of acidic silica gel. The solution was concentrated and recrystallized with chloroform/ethyl acetate as the solvent, and the precipitate was filtered out to obtain the target Copolymer 14 (107 mg). The resulting Copolymer 14 had a weight-average molecular weight Mw of $2.32 \times 10^5$, and a PDI of 4.8.

Example A11

Synthesis Example of Copolymer 15

[Chemical Formula 88]

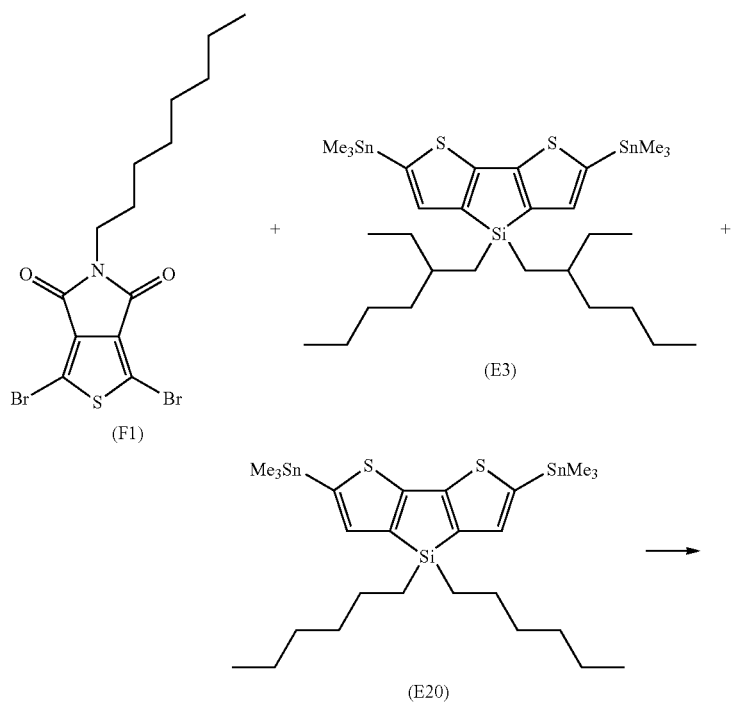

-continued

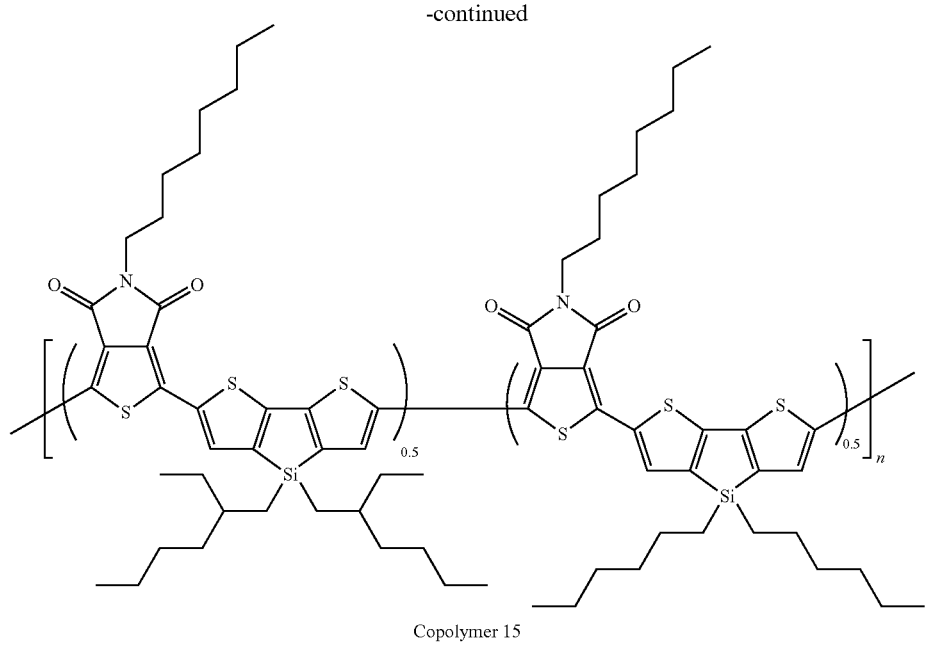

Copolymer 15

1,3-dibromo-5-octyl-4H-thieno[3,4-c]pyrrole-4,6-(5H)-dione (Compound F11 (imidothiophene dibromide), 168.0 mg, 0.40 mmol) obtained with reference to methods described in known literature (Organic Letters 2004, 6, 3381-3384), the Compound E3 (155.9 mg, 0.21 mmol) obtained in Synthesis Example A2 and the Compound E20 (146.6 mg, 0.21 mmol) obtained in Synthesis Example A18 as monomers were placed in a 50 mL two-necked recovery flask in a nitrogen atmosphere, tetrakis(triphenylphosphine)palladium (0) (15 mg, 3 mol %), the triphenylphosphine-containing heterogeneous palladium complex catalyst Pd-EnCat TPP30 (Sigma-Aldrich Co. LLC., 19 mg, 3 mol %), toluene (11.1 mL) and N,N-dimethylformamide (2.3 mL) were added, and the mixture was agitated for 1 hour at 90° C. and 2.5 hours at 100° C. The reaction solution was diluted 4 times with toluene, and heated and agitated for another 0.5 hours at 100° C., after which terminal treatment was performed by adding trimethyl(phenyl)tin (0.080 mL) and heating and agitating for 8 hours at 100° C., then adding bromobenzene (8 mL) and heating and agitating for 8 hours at 100° C., after which the reaction solution was poured into methanol and the precipitate was filtered out. The resulting solid was dissolved in chloroform, diamine silica gel (Fuji Silysia Chemical Ltd.) was added, and the mixture was agitated for 1 hour at room temperature and passed through a short column of acidic silica gel. The solution was concentrated and re-precipitated with chloroform/ethyl acetate as the solvent, and the precipitate was filtered out to obtain the target Copolymer 15 (225 mg). The resulting Copolymer 15 had a weight-average molecular weight Mw of $3.96 \times 10^5$, and a PDI of 7.9.

Example A12

Synthesis Example of Copolymer 16

[Chemical Formula 89]

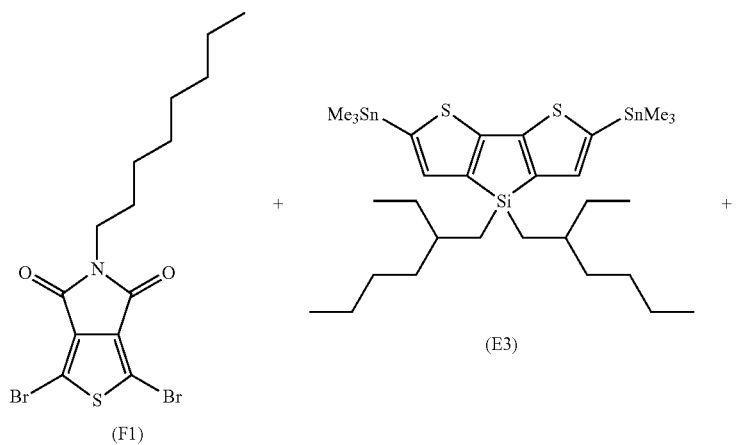

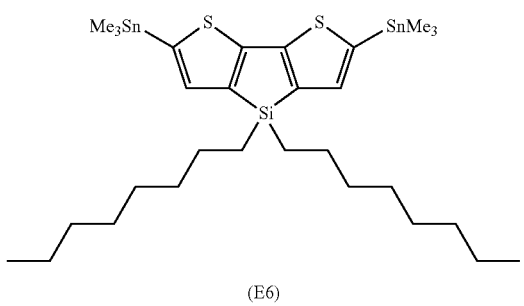

(E6)

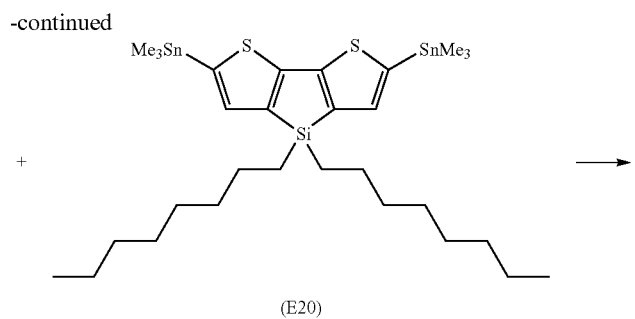

(E20)

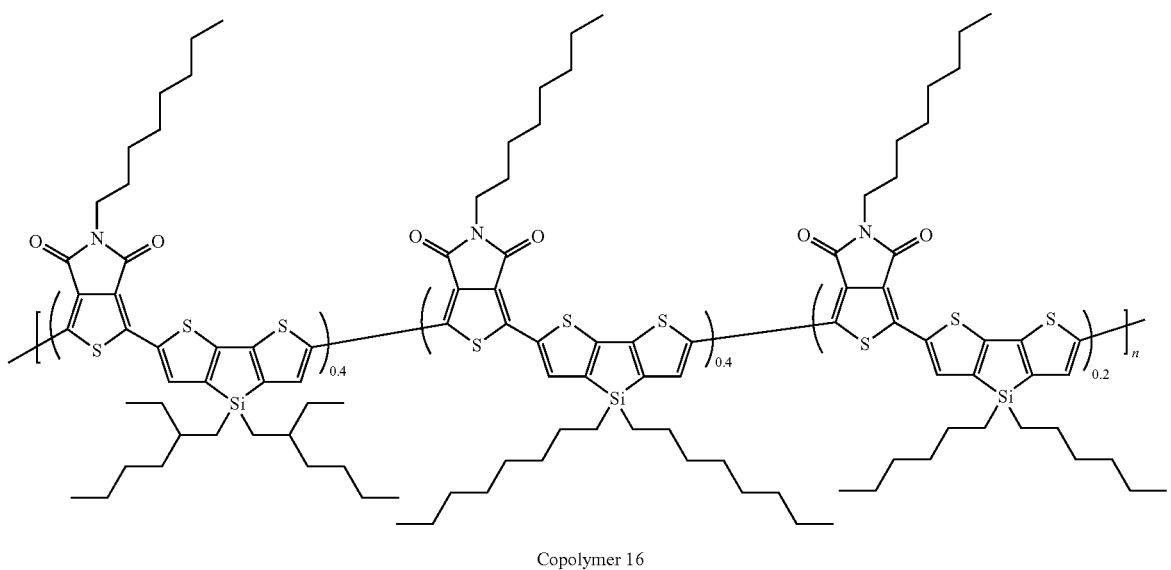

Copolymer 16

1,3-dibromo-5-octyl-4H-thieno[3,4-c]pyrrole-4,6-(5H)-dione (Compound F1 (imidothiophene dibromide), 220.1 mg, 0.52 mmol) obtained with reference to methods described in known literature (Organic Letters 2004, 6, 3381-3384), the Compound E3 (164.3 mg, 0.22 mmol) obtained in Synthesis Example A2 and the Compound E6 (163.7 mg, 0.22 mmol) obtained in Synthesis Example A4 as monomers were placed in a 50 mL two-necked recovery flask in a nitrogen atmosphere, the Compound E20 (77.5 mg, 0.11 mmol) obtained in Synthesis Example A18 was added, tetrakis(triphenylphosphine)palladium (0) (20 mg, 3 mol %), the triphenylphosphine-containing heterogeneous palladium complex catalyst Pd-EnCat TPP30 (Sigma-Aldrich Co. LLC., 25 mg, 3 mol %), toluene (14.5 mL) and N,N-dimethylformamide (3 mL) were added, and the mixture was agitated for 1 hour at 90° C. and 2.5 hours at 100° C. The reaction solution was diluted 4 times with toluene, and heated and agitated for another 0.5 hours at 100° C., after which terminal treatment was performed by adding trimethyl(phenyl)tin (0.080 mL) and heating and agitating for 8 hours at 100° C., then adding bromobenzene (8 mL) and heating and agitating for 8 hours at 100° C., after which the reaction solution was poured into methanol and the precipitate was filtered out. The resulting solid was dissolved in chloroform, diamine silica gel (Fuji Silysia Chemical Ltd.) was added, and the mixture was agitated for 1 hour at room temperature and passed through a short column of acidic silica gel. The solution was concentrated and re-precipitated with chloroform/ethyl acetate as the solvent, and the precipitate was filtered out to obtain the target Copolymer 16 (259 mg). The resulting Copolymer 16 had a weight-average molecular weight Mw of $2.81 \times 10^5$, and a PDI of 6.4.

Example A13

Synthesis Example of Copolymer 17

[Chemical Formula 90]

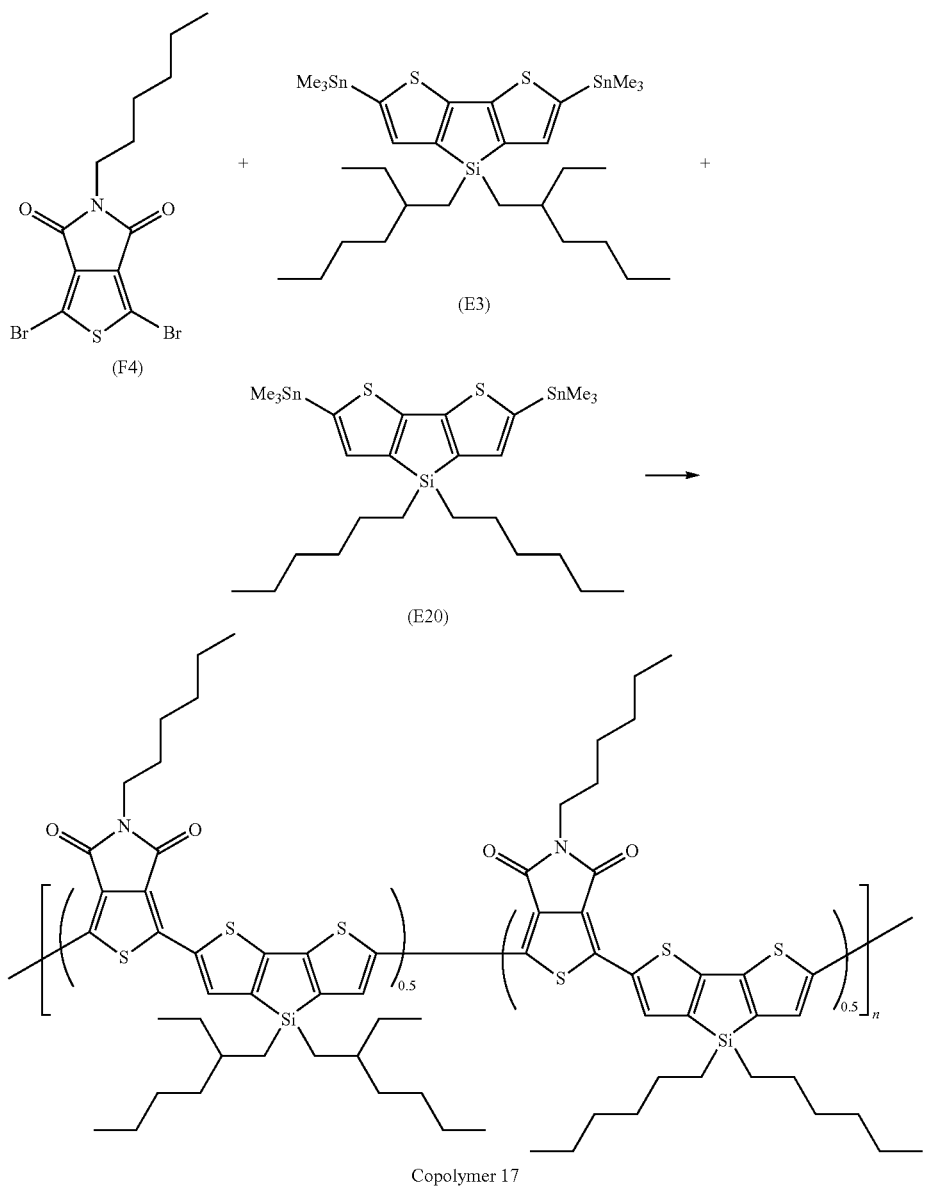

Copolymer 17

1,3-dibromo-5-hexyl-4H-thieno[3,4-c]pyrrole-4,6-(5H)-dione (Compound F4 (imidothiophene dibromide), 182.2 mg, 0.46 mmol) obtained with reference to methods described in known literature (Organic Letters 2004, 6, 3381-3384), the Compound E3 (184.3 mg, 0.248 mol) obtained in Synthesis Example A2 and the Compound E20 (167.3 mg, 0.243 mmol) obtained in Synthesis Example A18 as monomers were placed in a 50 mL two-necked recovery flask in a nitrogen atmosphere, tetrakis(triphenylphosphine)palladium (0) (18 mg, 3 mol %), the triphenylphosphine-containing heterogeneous palladium complex catalyst Pd-EnCat TPP30 (Sigma-Aldrich Co. LLC., 23 mg, 3 mol %), toluene (12.8 mL) and N,N-dimethylformamide (2.6 mL) were added, and the mixture was agitated for 1 hour at 90° C. and 2.5 hours at 100° C. The reaction solution was diluted 4 times with toluene, and heated and agitated for another 0.5 hours at 100° C., after which terminal treatment was performed by adding trimethyl(phenyl)tin (0.080 mL) and heating and agitating for 8 hours at 100° C., then adding bromobenzene (8 mL) and heating and agitating for 8 hours at 100° C., after which the reaction solution was poured into methanol and the precipitate was filtered out. The resulting solid was dissolved in chloroform, diamine silica gel (Fuji Silysia Chemical Ltd.) was added, and the mixture was agitated for 1 hour at room temperature and passed through a short column of acidic silica gel. The solution was concentrated and re-precipitated with chloroform/ethyl acetate as the solvent, and the precipitate was filtered out to obtain the target Copolymer 17 (287 mg). The resulting Copolymer 17 had a weight-average molecular weight Mw of $4.21 \times 10^5$, and a PDI of 6.1.

Example A14

Synthesis Example of Copolymer 18

[Chemical Formula 91]

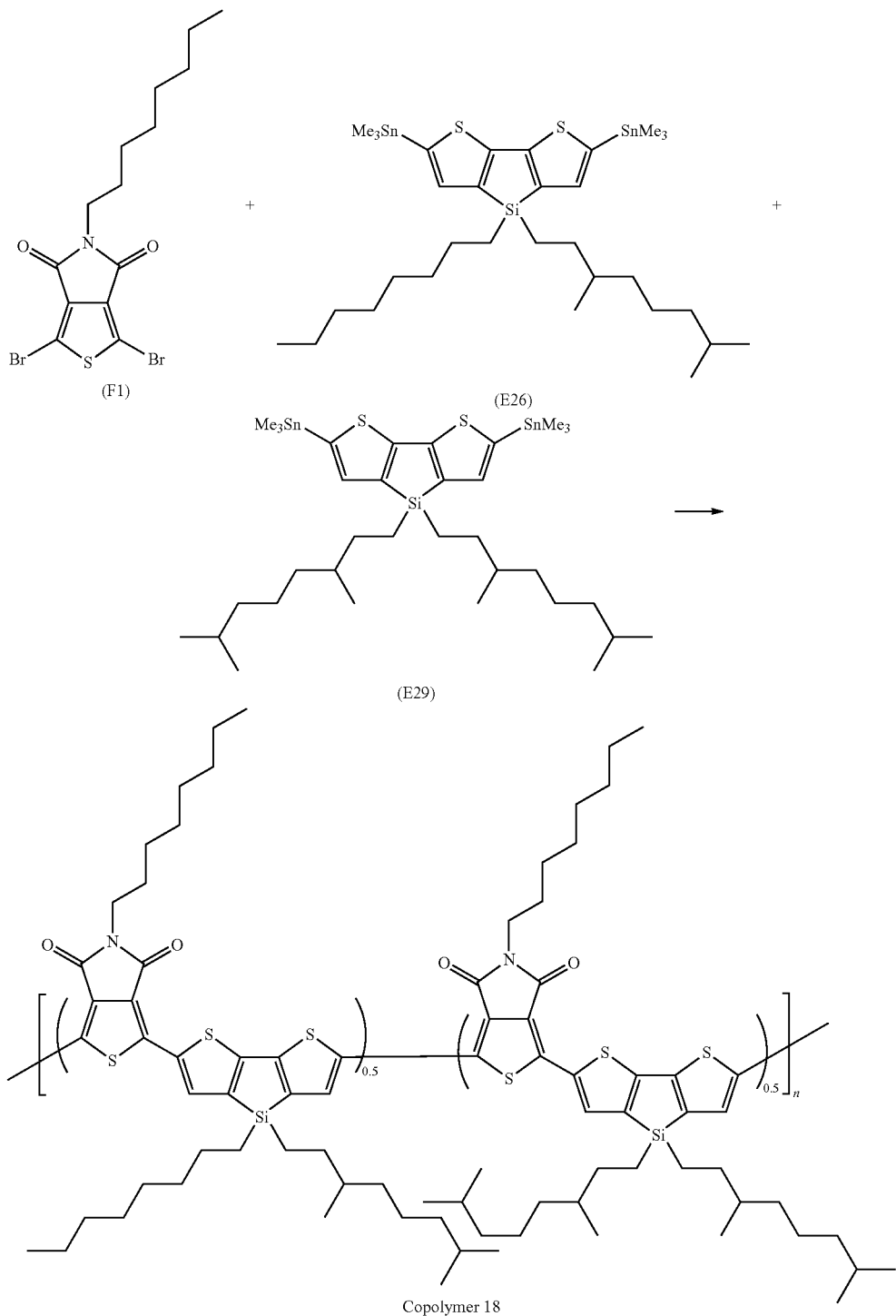

Copolymer 18

1,3-dibromo-5-octyl-4H-thieno[3,4-c]pyrrole-4,6-(5H)-dione (Compound F1 (imidothiophene dibromide), 154.9 mg, 0.366 mmol) obtained with reference to methods described in known literature (Organic Letters 2004, 6, 3381-3384), the Compound E26 (143.4 mg, 0.193 mmol) obtained in Synthesis Example A24 and the Compound E29 (154.2 mg, 0.193 mmol) obtained in Synthesis Example A27 as monomers were placed in a 50 mL two-necked recovery flask in a nitrogen atmosphere, tetrakis(triphenylphosphine)palladium (0) (12.7 mg, 3 mol %), the triphenylphosphine-containing heterogeneous palladium complex catalyst Pd-EnCat TPP30 (Sigma-Aldrich Co. LLC., 16.5 mg, 3 mol %), toluene (10 mL) and N,N-dimethylformamide (2 mL) were added, and the mixture was agitated for 1 hour at 90° C. and 2.5 hours at 100° C. The reaction solution was diluted 4 times with toluene, and heated and agitated for another 0.5 hours at 100° C., after which terminal treatment was performed by adding trimethyl(phenyl)tin (0.10 mL) and heating and agitating for 8 hours at 100° C., then adding bromobenzene (2 mL) and heating and agitating for 8 hours at 100° C., after which the reaction solution was poured into methanol and the precipitate was filtered out. The resulting solid was dissolved in chloroform, diamine silica gel (Fuji Silysia Chemical Ltd.) was added, and the mixture was agitated for 1 hour at room temperature and passed through a short column of acidic silica gel. The solution was concentrated and re=precipitated with chloroform/ethyl acetate as the solvent, and the precipitate was filtered out to obtain the target Copolymer 18 (169 mg). The resulting Copolymer 18 had a weight-average molecular weight Mw of $2.46 \times 10^5$, and a PDI of 7.7.

Example A15

Synthesis Example of Copolymer 19

[Chemical Formula 92]

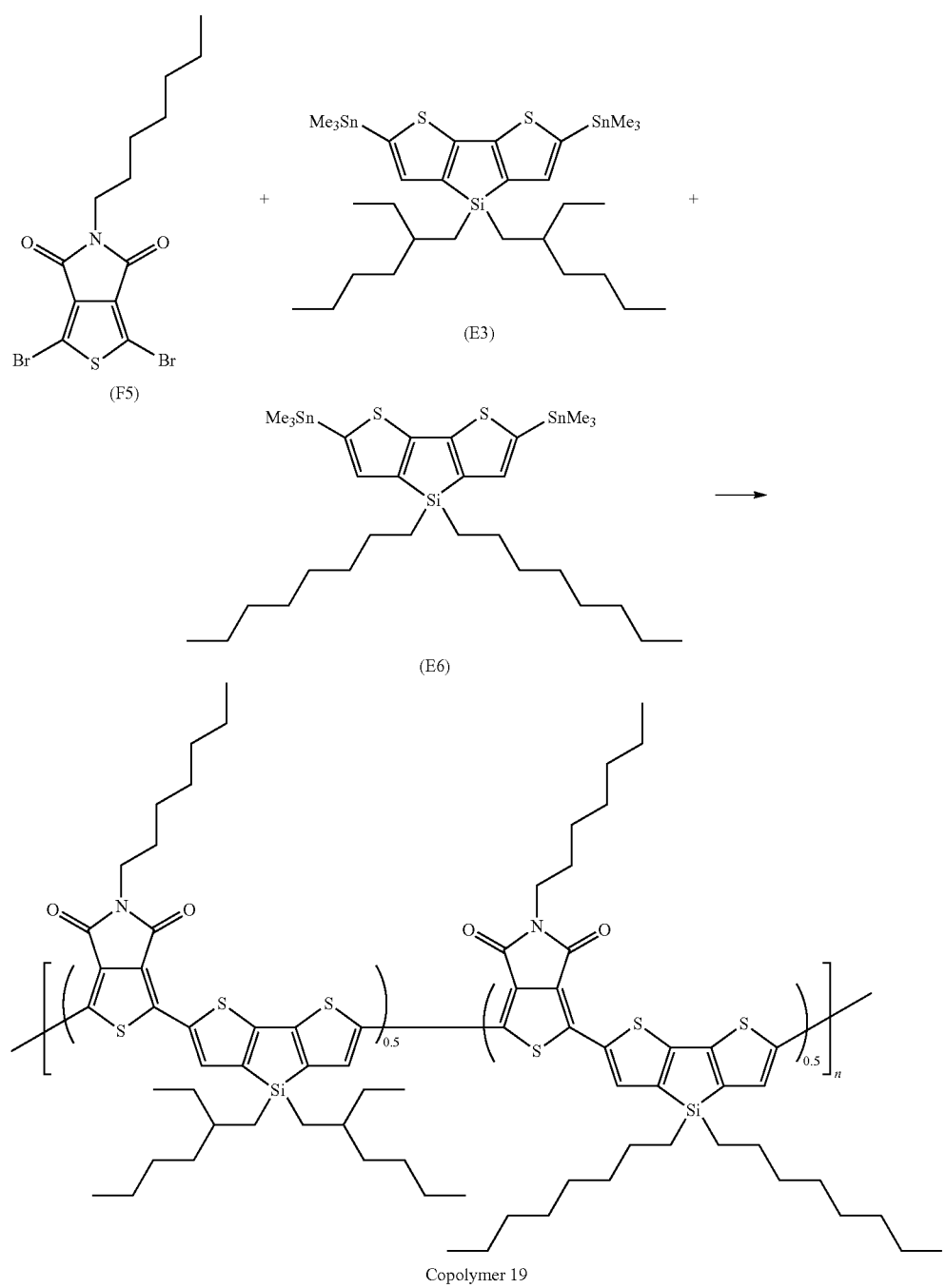

Copolymer 19

1,3-dibromo-5-heptyl-4H-thieno[3,4-c]pyrrole-4,6-(5H)-dione (Compound F5 (imidothiophene dibromide), 187.9 g, 0.46 mmol) obtained with reference to methods described in known literature (Organic Letters 2004, 6, 3381-3384), the Compound E3 (179.4 mg, 0.24 mmol) obtained in Synthesis Example A2 and the Compound E6 (180.5 mg, 0.24 mmol) obtained in Synthesis Example A4 as monomers were placed in a 50 mL two-necked recovery flask in a nitrogen atmosphere, tetrakis(triphenylphosphine)palladium (0) (17 mg, 3 mol %), the triphenylphosphine-containing heterogeneous palladium complex catalyst Pd-EnCat TPP30 (Sigma-Aldrich Co. LLC., 22 mg, 3 mol %), toluene (12.7 mL) and N,N-dimethylformamide (2.6 mL) were added, and the mixture was agitated for 1 hour at 90° C. and 2.5 hours at 100° C. The reaction solution was diluted 4 times with toluene, and heated and agitated for another 0.5 hours at 100° C., after which terminal treatment was performed by adding trimethyl (phenyl)tin (0.080 mL) and heating and agitating for 8 hours at 100° C., then adding bromobenzene (8 mL) and heating and agitating for 8 hours at 100° C., after which the reaction solution was poured into methanol and the precipitate was filtered out. The resulting solid was dissolved in chloroform, diamine silica gel (Fuji Silysia Chemical Ltd.) was added, and the mixture was agitated for 1 hour at room temperature and passed through a short column of acidic silica gel. The solution was concentrated and re-precipitated with chloroform/ethyl acetate as the solvent, and the precipitate was filtered out to obtain the target Copolymer 19 (242 mg). The resulting Copolymer 19 had a weight-average molecular weight Mw of $3.1 \times 10^5$, and a PDI of 4.8.

Example A16

Synthesis Example of Copolymer 20

[Chemical Formula 93]

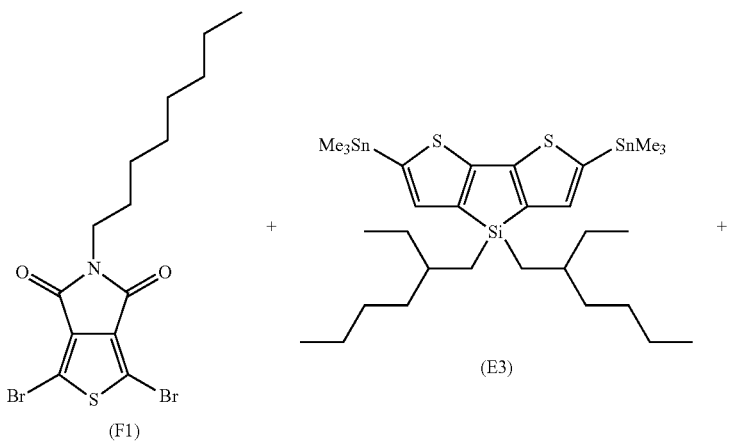

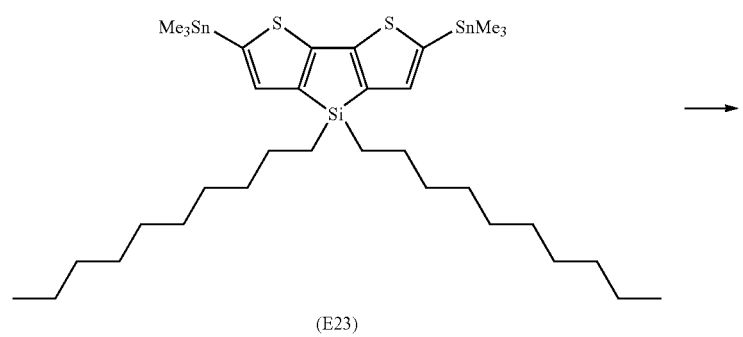

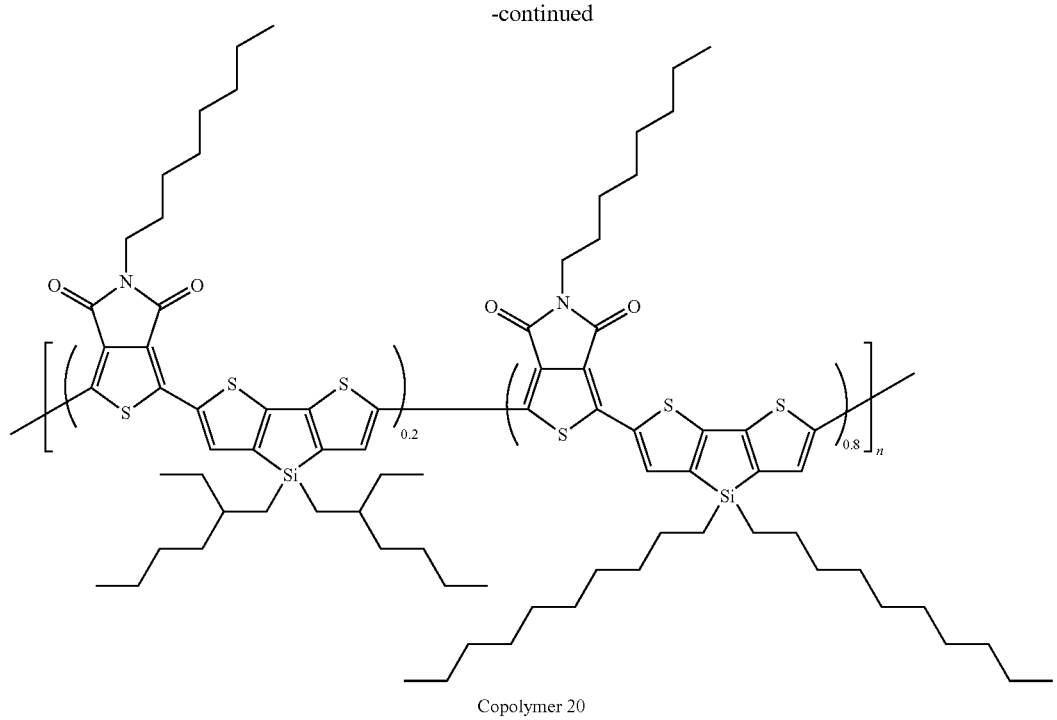

Copolymer 20

1,3-dibromo-5-octyl-4H-thieno[3,4-c]pyrrole-4,6-(5H)-dione (Compound F1 (imidothiophene dibromide), 164.9 mg, 0.390 mmol) obtained with reference to methods described in known literature (Organic Letters 2004, 6, 3381-3384), the Compound E3 (61.5 mg, 0.083 mmol) obtained in Synthesis Example A2 and the Compound E23 (262.1 mg, 0.327 mmol) obtained in Synthesis Example A21 as monomers were placed in a 50 mL two-necked recovery flask in a nitrogen atmosphere, tetrakis(triphenylphosphine)palladium (0) (13.5 mg, 3 mol %), the triphenylphosphine-containing heterogeneous palladium complex catalyst Pd-EnCat TPP30 (Sigma-Aldrich Co. LLC., 17.6 mg, 3 mol %), toluene (11 mL) and N,N-dimethylformamide (2.2 mL) were added, and the mixture was agitated for 1 hour at 90° C. and 2.5 hours at 100° C. The reaction solution was diluted 4 times with toluene, and heated and agitated for another 0.5 hours at 100° C., after which terminal treatment was performed by adding tri-methyl(phenyl)tin (0.040 mL) and heating and agitating for 8 hours at 100° C., then adding bromobenzene (2 mL) and heating and agitating for 8 hours at 100° C., after which the reaction solution was poured into methanol and the precipitate was filtered out. The resulting solid was dissolved in chloroform, diamine silica gel (Fuji Silysia Chemical Ltd.) was added, and the mixture was agitated for 1 hour at room temperature and passed through a short column of acidic silica gel. The solution was concentrated and re-precipitated with chloroform/ethyl acetate as the solvent, and the precipitate was filtered out to obtain the target Copolymer 20 (190.8 mg). The resulting Copolymer 20 had a weight-average molecular weight Mw of $5.60 \times 10^5$, and a PDI of 13.0.

Example A17

Synthesis Example of Copolymer 21

[Chemical Formula 94]

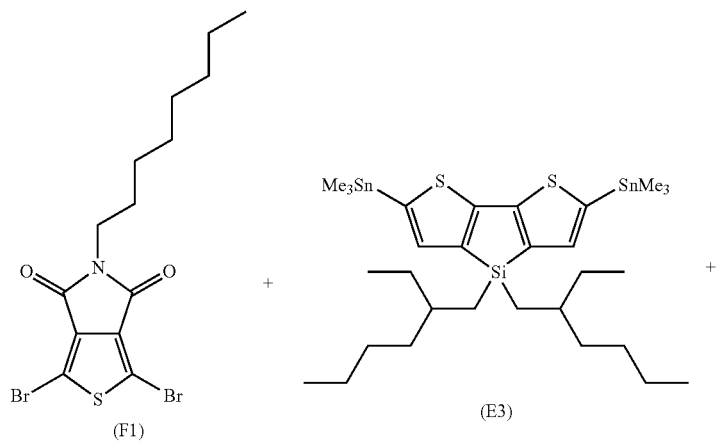

-continued

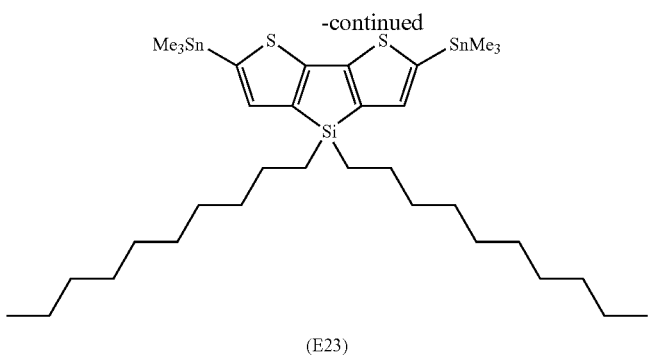

(E23)

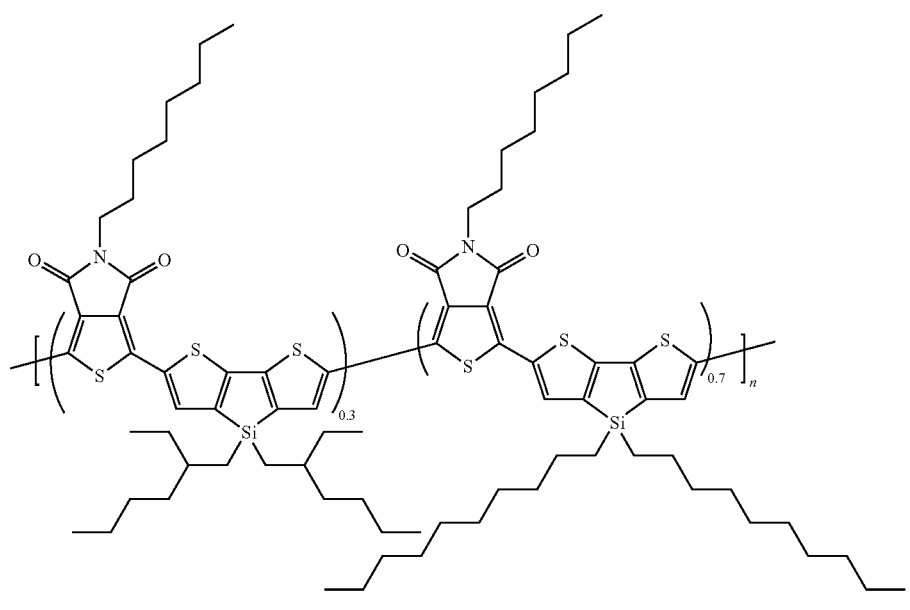

Copolymer 21

1,3-dibromo-5-octyl-4H-thieno[3,4-c]pyrrole-4,6-(5H)-dione (Compound F1 (imidothiophene dibromide), 178 mg, 0.421 mmol) obtained with reference to methods described in known literature (Organic Letters 2004, 6, 3381-3384), the Compound E3 (99.5 mg, 0.134 mmol) obtained in Synthesis Example A2 and the Compound E23 (247.3 mg, 0.309 mmol) obtained in Synthesis Example A21 as monomers were placed in a 50 mL two-necked recovery flask in a nitrogen atmosphere, tetrakis(triphenylphosphine)palladium (0) (14.6 mg, 3 mol %), the triphenylphosphine-containing heterogeneous palladium complex catalyst Pd-EnCat TPP30 (Sigma-Aldrich Co. LLC., 19 mg, 3 mol %), toluene (11.5 mL) and N,N-dimethylformamide (2.3 mL) were added, and the mixture was agitated for 1 hour at 90° C. and 2.5 hours at 100° C. The reaction solution was diluted 4 times with toluene, and heated and agitated for another 0.5 hours at 100° C., after which terminal treatment was performed by adding trimethyl (phenyl)tin (0.11 mL) and heating and agitating for 8 hours at 100° C., then adding bromobenzene (2 mL) and heating and agitating for 8 hours at 100° C., after which the reaction solution was poured into methanol and the precipitate was filtered out. The resulting solid was dissolved in chloroform, diamine silica gel (Fuji Silysia Chemical Ltd.) was added, and the mixture was agitated for 1 hour at room temperature and passed through a short column of acidic silica gel. The solution was concentrated and re-precipitated with chloroform/ethyl acetate as the solvent, and the precipitate was filtered out to obtain the target Copolymer 21 (185 mg). The resulting Copolymer 21 had a weight-average molecular weight Mw of $2.78 \times 10^5$, and a PDI of 6.6.

Example A18

Synthesis Example of Copolymer 22

[Chemical Formula 95]

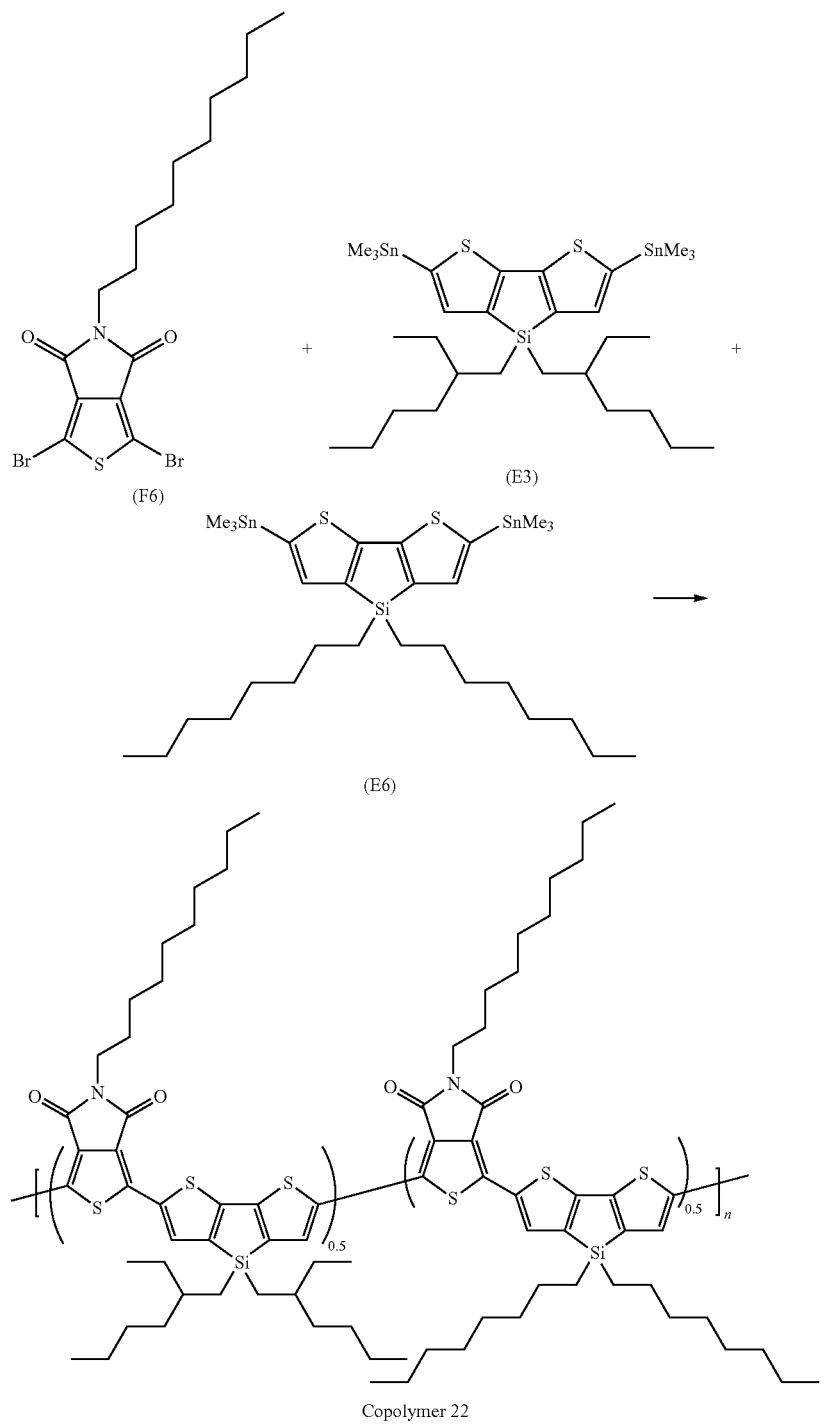

Copolymer 22

1,3-dibromo-5-decyl-4H-thieno[3,4-c]pyrrole-4,6-(5H)-dione (Compound F6 (imidothiophene dibromide), 197.8 mg, 0.438 mmol) obtained with reference to methods described in known literature (Organic Letters 2004, 6, 3381-3384), the Compound E3 (171.5 mg, 0.23 mmol) obtained in Synthesis Example A2, and the Compound E6 (172.0 mg, 0.23 mmol) obtained in Synthesis Example A4 as monomers were placed in a 50 mL two-necked recovery flask in a nitrogen atmosphere, tetrakis(triphenylphosphine)palladium (0) (16 mg, 3 mol %), the triphenylphosphine-containing heterogeneous palladium complex catalyst Pd-EnCat TPP30 (Sigma-Aldrich Co. LLC., 21 mg, 3 mol %), toluene (12 mL)

and N,N-dimethylformamide (2.5 mL) were added, and the mixture was agitated for 1 hour at 90° C. and 2.5 hours at 100° C. The reaction solution was diluted 4 times with toluene, and heated and agitated for another 0.5 hours at 100° C., after which terminal treatment was performed by adding trimethyl (phenyl)tin (0.080 mL) and heating and agitating for 8 hours at 100° C., then adding bromobenzene (8 mL) and heating and agitating for 8 hours at 100° C., after which the reaction solution was poured into methanol and the precipitate was filtered out. The resulting solid was dissolved in chloroform, diamine silica gel (Fuji Silysia Chemical Ltd.) was added, and the mixture was agitated for 1 hour at room temperature and passed through a short column of acidic silica gel. The solution was concentrated and re-precipitated with chloroform/ethyl acetate as the solvent, and the precipitate was filtered out to obtain the target Copolymer 22 (215 mg). The resulting Copolymer 22 had a weight-average molecular weight Mw of $1.67 \times 10^5$, and a PDI of 4.4.

Example A19

Synthesis Example of Copolymer 23

[Chemical Formula 96]

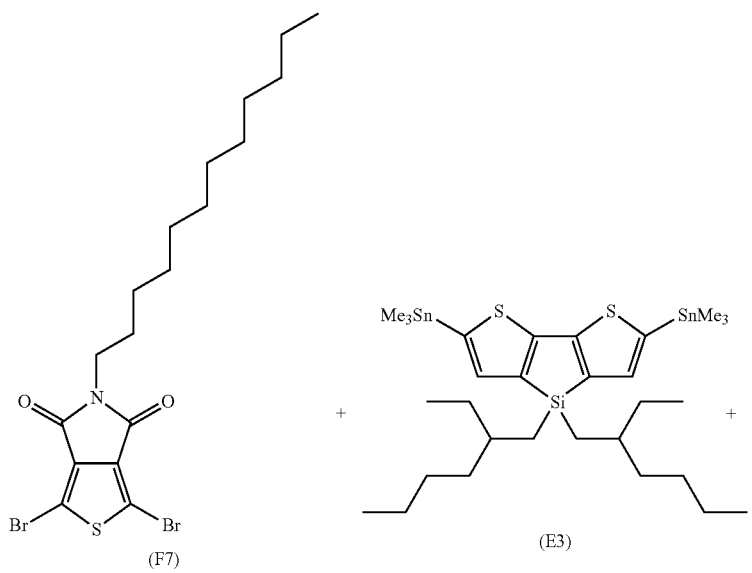

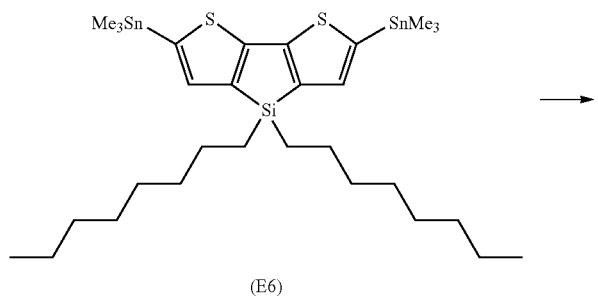

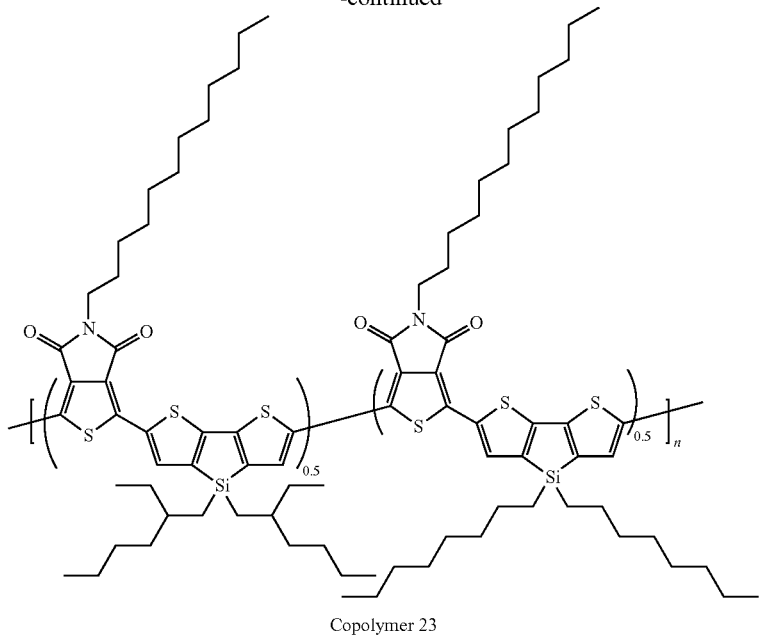

Copolymer 23

1,3-dibromo-5-dodecyl-4H-thieno[3,4-c]pyrrole-4,6-(5H)-dione (Compound F7 (imidothiophene dibromide), 197.8 mg, 0.438 mmol) obtained with reference to methods described in known literature (Organic Letters 2004, 6, 3381-3384), the Compound E3 (171.5 mg, 0.23 mmol) obtained in Synthesis Example A2 and the Compound E6 (172.0 mg, 0.23 mmol) obtained in Synthesis Example A4 as monomers were placed in a 50 mL two-necked recovery flask in a nitrogen atmosphere, tetrakis(triphenylphosphine)palladium (0) (16 mg, 3 mol %), the triphenylphosphine-containing heterogeneous palladium complex catalyst Pd-EnCat TPP30 (Sigma-Aldrich Co. LLC., 21 mg, 3 mol %), toluene (12 mL) and N,N-dimethylformamide (2.5 mL) were added, and the mixture was agitated for 1 hour at 90° C. and 2.5 hours at 100° C. The reaction solution was diluted 4 times with toluene, and heated and agitated for another 0.5 hours at 100° C., after which terminal treatment was performed by adding trimethyl (phenyl)tin (0.080 mL) and heating and agitating for 8 hours at 100° C., then adding bromobenzene (8 mL) and heating and agitating for 8 hours at 100° C., after which the reaction solution was poured into methanol and the precipitate was filtered out. The resulting solid was dissolved in chloroform, diamine silica gel (Fuji Silysia Chemical Ltd.) was added, and the mixture was agitated for 1 hour at room temperature and passed through a short column of acidic silica gel. The solution was concentrated and re-precipitated with chloroform/ethyl acetate as the solvent, and the precipitate was filtered out to obtain the target Copolymer 23 (209 mg). The resulting Copolymer 23 had a weight-average molecular weight Mw of $1.70 \times 10^5$, and a PDI of 4.1.

Preparation of Photoelectric Conversion Element

Example A1-2

The Copolymer 1 as a p-type semiconductor compound and a mixture of the fullerene compounds PC61BM (phenyl C61 butyric acid methyl ester) and PC71BM (phenyl C71 butyric acid methyl ester) as n-type semiconductor compounds (Frontier Carbon Corporation, nanom spectra E123) were dissolved in a mixed o-xylene/tetralin solvent (volume ratio 9:1) in a nitrogen atmosphere to a concentration of 1.8 mass %. This solution was agitated and mixed for 1 hour at a temperature of 80° C. on a hot stirrer. After agitation and mixing, the solution was filtered with a 1 µm polytetrafluoroethylene (PTFE) filter to give an ink for coating an active layer.

A glass substrate (GEOMATEC Co., Ltd.) with a patterned indium-tin oxide (ITO) transparent conductive film was sequentially ultrasound washed with acetone, and then ultrasound washed with isopropanol, and then dried by nitrogen blowing and UV-ozone treated.

Next, about 0.1 mL of a solution of zinc acetate 2-dihydrate (Wako Pure Chemical Industries, Ltd.) dissolved to a concentration of 105 mg/mL in a mixed solvent of 2-methoxyethanol (Sigma-Aldrich Co. LLC.) and ethanolamine (Sigma-Aldrich Co. LLC.) (volume ratio 100:3) was spin coated at a rate of 3000 rpm, UV-ozone treated, and heated for 15 minutes in an oven at 200° C. to form an electron extraction layer.

The substrate with the electron extraction layer formed thereon was put into a glove box, heat treated for 3 minutes at 150° C. in a nitrogen atmosphere and cooled, after which an active layer coating ink prepared as described above (0.12 mL) was spin coated to form an active layer.

Furthermore, a molybdenum trioxide ($MoO_3$) film as the hole extraction layer and then a silver film with a film thickness of 100 nm as the electrode layer were formed sequentially on an active layer by resistance heating vacuum deposition to prepare a 5 mm-square photoelectric conversion element.

Thus prepared photoelectric conversion element was evaluated by measuring the current-voltage characteristics as described above. The results are shown in Table 1 together with the weight ratio of the p-type semiconductor compound and n-type semiconductor compounds, the thickness of the active layer, and the thickness of the molybdenum trioxide ($MoO_3$) film.

Example A2-2

A photoelectric conversion element was prepared and evaluated as in Example A1-2 except that the Copolymer 2 was used as the p-type semiconductor compound. The results are given in Table 1.

Example A3-2

A photoelectric conversion element was prepared and evaluated as in Example A1-2 except that the Copolymer 3 was used as the p-type semiconductor compound. The results are given in Table 1.

Example A4-2

A photoelectric conversion element was prepared and evaluated as in Example A1-2 except that the Copolymer 4 was used as the p-type semiconductor compound. The results are given in Table 1.

Example A5-2

A photoelectric conversion element was prepared and evaluated as in Example A1-2 except that the Copolymer 5 was used as the p-type semiconductor compound. The results are given in Table 1.

Example A6-2

A photoelectric conversion element was prepared and evaluated as in Example A1-2 except that the Copolymer 6 was used as the p-type semiconductor compound. The results are given in Table 1.

Example A7-2

A photoelectric conversion element was prepared and evaluated as in Example A1-2 except that the Copolymer 7 was used as the p-type semiconductor compound. The results are given in Table 1.

Example A8-2

A photoelectric conversion element was prepared and evaluated as in Example A1-2 except that the Copolymer 8 was used as the p-type semiconductor compound. The results are given in Table 1.

Example A9-2

A photoelectric conversion element was prepared and evaluated as in Example A1-2 except that the Copolymer 9 was used as the p-type semiconductor compound. The results are given in Table 1.

Example A10-2

A photoelectric conversion element was prepared and evaluated as in Example A1-2 except that the Copolymer 10 was used as the p-type semiconductor compound. The results are given in Table 1.

Comparative Example A1-2

A photoelectric conversion element was prepared and evaluated as in Example A1-2 except that the Copolymer 11 was used as the p-type semiconductor compound. The results are given in Table 1.

Example A11-2

A photoelectric conversion element was prepared and evaluated as in Example A1-2 except that the Copolymer 15 was used as the p-type semiconductor compound. The results are given in Table 1.

Example A12-2

A photoelectric conversion element was prepared and evaluated as in Example A1-2 except that the Copolymer 16 was used as the p-type semiconductor compound. The results are given in Table 1.

Example A13-2

A photoelectric conversion element was prepared and evaluated as in Example A1-2 except that the Copolymer 17 was used as the p-type semiconductor compound. The results are given in Table 1.

Example A14-2

A photoelectric conversion element was prepared and evaluated as in Example A1-2 except that the Copolymer 18 was used as the p-type semiconductor compound. The results are given in Table 1.

Example A15-2

A photoelectric conversion element was prepared and evaluated as in Example A1-2 except that the Copolymer 19 was used as the p-type semiconductor compound. The results are given in Table 1.

Example A16-2

A photoelectric conversion element was prepared and evaluated as in Example A1-2 except that the Copolymer 20 was used as the p-type semiconductor compound. The results are given in Table 1.

Example A17-2

A photoelectric conversion element was prepared and evaluated as in Example A1-2 except that the Copolymer 21 was used as the p-type semiconductor compound. The results are given in Table 1.

Example A18-2

A photoelectric conversion element was prepared and evaluated as in Example A1-2 except that the Copolymer 22 was used as the p-type semiconductor compound. The results are given in Table 1.

Example A19-2

A photoelectric conversion element was prepared and evaluated as in Example A1-2 except that the Copolymer 23 was used as the p-type semiconductor compound. The results are given in Table 1.

TABLE 1

| | | Weight-Average Molecular Weight (Mw) | R1 | R2 | R3 | R4 | R5 | Molar Ratio | Monomer Sequence | Storage Stability | Absorption Maximum Wavelength [nm] | Film Thickness [nm] | PCE [%] | PN Ratio | $MoO_3$ Film Thickness [nm] |
|---|---|---|---|---|---|---|---|---|---|---|---|---|---|---|---|
| Ex. A1 | Copolymer 1 | $1.69 \times 10^5$ | n-octyl | 2-ethylhexyl | 2-ethylhexyl | n-octyl | n-octyl | 3:7 | Random | ○ | 677 | 180 | 7.57 | 2.0 | 1.5 |
| Ex. A2 | Copolymer 2 | $1.67 \times 10^5$ | n-octyl | 2-ethylhexyl | 2-ethylhexyl | n-octyl | n-octyl | 5:5 | Random | ⊚ | 679 | 220 | 8.69 | 2.0 | 1.5 |
| Ex. A3 | Copolymer 3 | $1.72 \times 10^5$ | n-octyl | 2-ethylhexyl | 2-ethylhexyl | n-octyl | n-octyl | 7:3 | Random | ⊚ | 674 | 200 | 7.88 | 2.0 | 1.5 |
| Ex. A4 | Copolymer 4 | $3.69 \times 10^5$ | 2-ethylhexyl | 2-ethylbexyl | 2-ethylhexyl | n-octyl | n-octyl | 5:5 | Random | ⊚ | 677 | 230 | 7.83 | 2.0 | 1.5 |
| Ex. A5 | Copolymer 5 | $3.64 \times 10^5$ | n-octyl | 2-ethylhexyl | 2-ethylhexyl | n-octyl | 2-ethylhexyl | 1:9 | Random | ○ | 676 | 220 | 7.74 | 2.0 | 1.5 |
| Ex. A6 | Copolymer 6 | $2.99 \times 10^5$ | n-octyl | 2-ethylhexyl | 2-ethylhexyl | n-octyl | 2-ethylhexyl | 2:8 | Random | ○ | 676 | 250 | 8.77 | 2.0 | 1.5 |
| Ex. A7 | Copolymer 7 | $1.67 \times 10^5$ | n-octyl | 2-ethylhexyl | 2-ethylhexyl | n-octyl | 2-ethylhexyl | 3:7 | Random | ⊚ | 675 | 210 | 8.56 | 2.0 | 1.5 |
| Ex. A8 | Copolymer 8 | $2.39 \times 10^5$ | n-octyl | 2-ethylhexyl | 2-butylthienyl | n-octyl | n-butylthienyl | 5:5 | Random | ○ | 672 | 90 | 6.89 | 2.0 | 1.5 |
| Ex. A9 | Copolymer 9 | $4.66 \times 10^5$ | n-octyl | 2-ethylhexyl | 2-ethylhexyl | n-octyl | 2-ethylhexyl | 2:8 | Block | ○ | 677 | 220 | 9.33 | 2.0 | 1.5 |
| Ex. A10 | Copolymer 10 | $3.93 \times 10^5$ | n-octyl | 2-ethylhexyl | 2-ethylhexyl | n-octyl | n-octyl | 7:3 | Block | ○ | 674 | 110 | 8.17 | 2.0 | 1.5 |
| CE A1 | Copolymer 11 | $1.35 \times 10^5$ | n-octyl | 2-ethylhexyl | 2-ethylhexyl | | | — | Alternating Copolymer | X | 671 | 210 | 6.44 | 2.0 | 1.5 |
| CE A2 | Copolymer 12 | $2.00 \times 10^5$ | 2-ethylhexyl | 2-ethylhexyl | 2-ethylhexyl | | | — | Alternating Copolymer | X | 673 | — | No Data | — | — |
| CE A3 | Copolymer 13 | Not analyzable | n-octyl | — | — | n-octyl | n-octyl | — | Alternating Copolymer | X | — | — | No Data | — | — |
| CE A4 | Copolymer 14 | $2.32 \times 10^5$ | n-octyl | — | — | n-butylthienyl | n-butylthienyl | — | Alternating Copolymer | X | — | — | No Data | — | — |
| Ex. A11 | Copolymer 15 | $3.96 \times 10^5$ | n-octyl | 2-ethylhexyl | 2-ethylhexyl | n-hexyl | n-hexyl | 5:5 | Random | ○ | 676 | 120 | 6.78 | 2.5 | 1.5 |
| Ex. A12 | Copolymer 16 | $2.81 \times 10^5$ | n-octyl | 2-ethylhexyl | 2-ethylhexyl | n-octyl, n-hexyl | n-octyl, n-hexyl | 4:4:2 | Random | ⊚ | 677 | 120 | 7.36 | 2.5 | 1.5 |
| Ex. A13 | Copolymer 17 | $4.21 \times 10^5$ | n-hexyl | 2-ethylhexyl | 2-ethylhexyl | n-hexyl | n-hexyl | 5:5 | Random | ○ | 676 | 140 | 7.26 | 2.5 | 1.5 |
| Ex. A14 | Copolymer 18 | $2.46 \times 10^5$ | n-octyl | 3,7-dimetyloctyl | n-hexyl | 3,7-dimetyloctyl | 3,7-dimetyloctyl | 5:5 | Random | ⊚ | 676 | 90 | 6.13 | 2.5 | 1.5 |
| Ex. A15 | Copolymer 19 | $3.1 \times 10^5$ | n-heptyl | 2-ethylhexyl | 2-ethylhexyl | n-octyl | n-octyl | 5:5 | Random | ⊚ | 676 | 120 | 7.16 | 2.5 | 1.5 |
| Ex. A16 | Copolymer 20 | $5.60 \times 10^5$ | n-octyl | 2-ethylhexyl | 2-ethylhexyl | n-decyl | n-decyl | 2:8 | Random | ⊚ | 679 | 100 | 5.82 | 2.5 | 1.5 |
| Ex. A17 | Copolymer 21 | $2.78 \times 10^5$ | n-octyl | 2-ethylhexyl | 2-ethylhexyl | n-decyl | n-decyl | 3:7 | Random | ⊚ | 678 | 100 | 5.49 | 2.5 | 1.5 |
| Ex. A18 | Copolymer 22 | $1.67 \times 10^5$ | n-decyl | 2-ethylhexyl | 2-ethylhexyl | n-octyl | n-octyl | 5:5 | Random | ⊚ | 675 | 300 | 8.88 | 2.5 | 1.5 |
| Ex. A19 | Copolymer 23 | $1.70 \times 10^5$ | n-dodecyl | 2-ethylhexyl | 2-ethylhexyl | n-octyl | n-octyl | 5:5 | Random | ⊚ | 675 | 320 | 8.27 | 2.5 | 1.5 |

As shown above, although the copolymers of Comparative Examples A1, A2 and A4 had relatively high molecular weights, the storage stability of the inks containing these polymers was poor. Moreover, the copolymer of Comparative Example A3 precipitated during the polymerization reaction, and was shown to have poor solubility because the precipitate did not dissolve in chloroform.

On the other hand, the copolymers of Examples A1 to A19 (the copolymers of the present invention) all had high molecular weights, and inks containing these copolymers had good storage stability. Moreover, the inks containing the copolymers had good storage stability even if a substituent of a nitrogen atom in the imidothiophene ring was a 2-ethylhexyl group or a linear octyl group. Thus, an ink containing a copolymer that contains the repeating unit represented by Formula (1A), the repeating unit represented by Formula (1B) and the repeating unit represented by Formula (1C) has good storage stability, and because it is easy to form a coating film with this ink, the copolymer of the present invention is suited to use as a photoelectric conversion element material.

As shown in Table 1, moreover, the photoelectric conversion elements obtained using the copolymers of the present invention according to Examples A1-2 to A19-2 all exhibited high conversion efficiency. These results show that a photoelectric conversion element for a photovoltaics with superior characteristics can be provided using the copolymer of the present invention.

The second example (Example B) of the present invention is shown below.

Synthesis Example B1

Synthesis of Compound G2

[Chemical Formula 97]

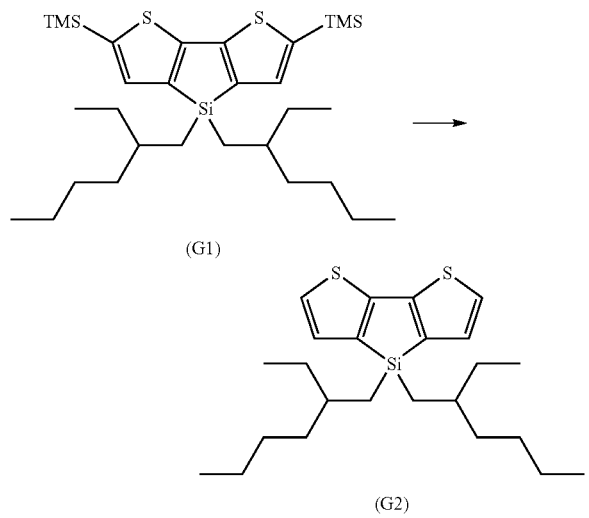

(G1)

(G2)

4,4-bis(2-ethylhexyl)-2,6-bis(trimethylsilyl)-dithieno[3,2-b:2',3'-d]silole (Compound G1, synthesized in accordance with Non-patent Document J. Am. Chem. Soc. 2008, 130, 16144-16145, 1.03 g, 1.786 mmol) was placed in a 200 mL four-necked recovery flask in a nitrogen atmosphere, and dissolved in chloroform (50 mL). Trifluoroacetic acid (0.265 mL, 3.573 mmol) was added dropwise, and the mixture was agitated for about 3.5 hours. Water was added to the reaction solution, and the lower layer was washed with water, dried over sodium sulfate, and concentrated under reduced pressure. This was dissolved in hexane and subjected to silica gel column chromatography (solvent: hexane) to obtain 4,4-bis(2-ethylhexyl)-dithieno[3,2-b:2',3'-d]silole (Compound G2) as a light yellow oily substance (702 mg, yield 94%).

Compound G2: $^1$H-NMR (400 MHz, solvent: deuterated chloroform): δ7.18 (d, 2H, J=4.8 Hz), 7.08 (d, 2H, J=4.8 Hz), 1.43-1.35 (m, 2H), 1.28-1.09 (m, 16H), 0.98-0.80 (m, 10H), 0.75 (d, 6H, J=7.3 Hz)

Synthesis Example B2

Synthesis of Compound G3

[Chemical Formula 98]

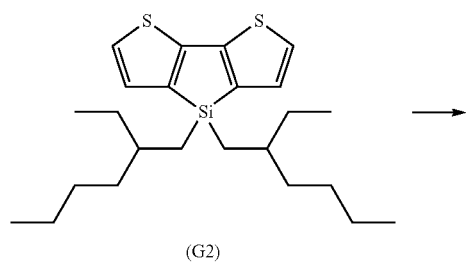

(G2)

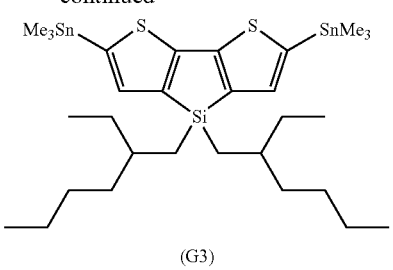

(G3)

Compound G2 (100 mg, 0.239 mmol) was placed in a 20 mL Schlenk flask in a nitrogen atmosphere, dissolved in tetrahydrofuran (THF, 2.5 mL), and cooled to −78° C. A solution of lithium diisopropylamide (LDA) in tetrahydrofuran/hexane (KANTO CHEMICAL CO., INC., concentration 1.11 M, 0.258 mL, 1.2 eq) was added dropwise, and the mixture was agitated for about 1 hour. A solution of trimethyltin chloride in tetrahydrofuran (Sigma-Aldrich Co. LLC., 1.0 M, 0.287 mL, 1.2 eq) was then added dropwise, and the temperature was gradually raised to room temperature. This was then cooled again to −78° C., a solution of lithium diisopropylamide (LDA) in tetrahydrofuran/hexane (KANTO CHEMICAL CO., INC., concentration 1.11 M, 0.258 mL, 1.2 eq) was added dropwise, and the mixture was agitated for about 1 hour. A solution of trimethyltin chloride in tetrahydrofuran (Sigma-Aldrich Co. LLC., 1.0 M, 0.287 mL, 1.2 eq) was then added dropwise, and the temperature was gradually raised to room temperature. This was then cooled again to −78° C., a solution of lithium diisopropylamide (LDA) in tetrahydrofuran/hexane (KANTO CHEMICAL CO., INC., concentration 1.11 M, 0.258 mL, 1.2 eq) was added dropwise, and the mixture was agitated for about 1 hour. A solution of trimethyltin chloride in tetrahydrofuran (Sigma-Aldrich Co. LLC., 1.0 M, 0.310 mL, 1.3 eq) was then added dropwise, and the temperature was gradually raised to room temperature. Water was then added to the reaction solution, which was extracted with hexane, after which the organic layer was washed with water. The organic layer was dried over sodium sulfate, filtered, concentrated under reduced pressure, and then dried in vacuum to quantitatively obtain 4,4-bis(2-ethylhexyl)-2,6-bis(trimethyltin)-dithieno[3,2-b:2',3'-d]silole (Compound G3) as a yellow-green oily substance.

Compound G3: $^1$H-NMR (400 MHz, solvent: deuterated chloroform): δ7.07 (s, 2H), 1.45-1.37 (m, 2H), 1.32-1.08 (m, 16H), 0.99-0.80 (m, 10H), 0.77 (t, 6H, J=7.3 Hz), 0.36 (s, 18H)

Synthesis Example B3

Synthesis of Compound G6

[Chemical Formula 99]

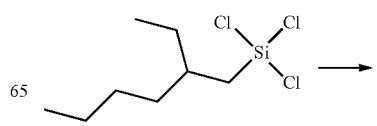

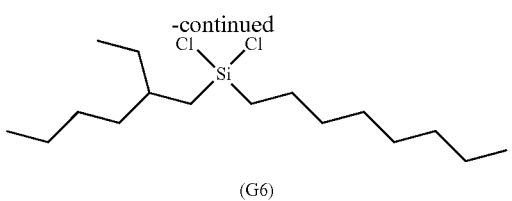

(G6)

Trichloro(2-ethylhexyl)silane (synthesized in accordance with J. Am. Chem. Soc. 2008, 130, 16144-16145, 24.8 g) was placed in a 300 mL four-necked flask in a nitrogen atmosphere, and dissolved in tetrahydrofuran (100 mL). The resulting solution was cooled to 0° C., and a solution of n-octyl magnesium bromide in diethyl ether (Sigma-Aldrich Co. LLC., 2.00 M, 50.0 mL) was added dropwise. The reaction solution was agitated for about 30 minutes at 7° C., and then agitated for about 3 hours at room temperature. The solvent was then distilled off with an evaporator. Hexane was added to the resulting crude product, which was then filtered, after which the solvent was again distilled off. Finally, distillation purification (111° C., 0.61 torr) was performed to obtain the target dichloro(2-ethylhexyl)n-octylsilane (Compound G6, 15.9 g, yield 49%).

Compound G6: $^1$H-NMR (400 MHz, solvent: deuterated chloroform): δ1.72 (m, 1H), 1.49-1.55 (m, 2H), 1.24-1.50 (m, 18H), 1.07-1.13 (m, 4H), 0.85-0.92 (m, 9H)

Synthesis Example B4

Synthesis of Compound G7

[Chemical Formula 100]

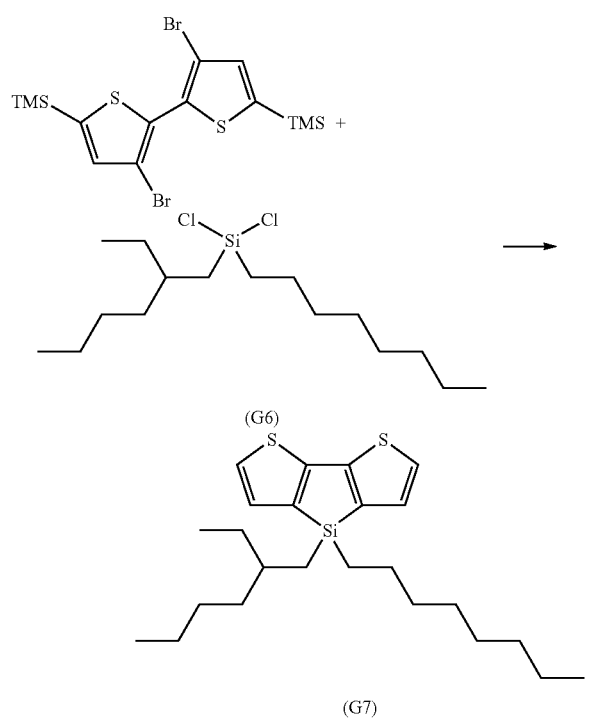

3,3'-dibromo-5,5'-bis(trimethylsilyl)-2,2'-bithiophene (synthesized in accordance with WO 2010/136353, 4.0 g) was placed in a 200 mL four-necked flask in a nitrogen atmosphere, and dissolved in anhydrous tetrahydrofuran (68 mL). The resulting solution was cooled to −78° C., and a solution of n-butyl lithium in hexane (KANTO CHEMICAL CO., INC., 1.65 M, 11.2 mL) was added dropwise. After about 15 minutes of agitation, the Compound G6 (3.6 mL, 12 mmol) obtained in Synthesis Example B3 was added dropwise. The temperature was gradually raised to room temperature over the course of about 2 hours, water was added, and the product was extracted with hexane. The organic layer was washed with water, dried over sodium sulfate, and concentrated by filtration. The resulting yellow-orange oily substance was dissolved in chloroform (20 mL), trifluoroacetic acid (1.31 mL) was added, and the mixture was agitated for about 2 hours at room temperature. Heptane (40 mL) was added, and the mixture was concentrated under reduced pressure. The resulting yellow-green oily substance was dissolved in hexane, and subjected to silica gel column chromatography (solvent: hexane) to obtain the target 4-n-octyl-4-(2-ethylhexyl)dithieno[3,2-b:2',3'-d]silole (Compound G7, 2.3 g, yield 64%).

Compound G7: $^1$H-NMR (400 MHz, solvent: deuterated chloroform): δ7.05 (d, 2H, J=4.8 Hz), 7.19 (d, 2H, J=4.8 Hz), 1.42-1.33 (m, 4H), 1.31-1.18 (m, 20H), 0.96-0.75 (m, 10H)

Synthesis Example B5

Synthesis of Compound G8

[Chemical Formula 101]

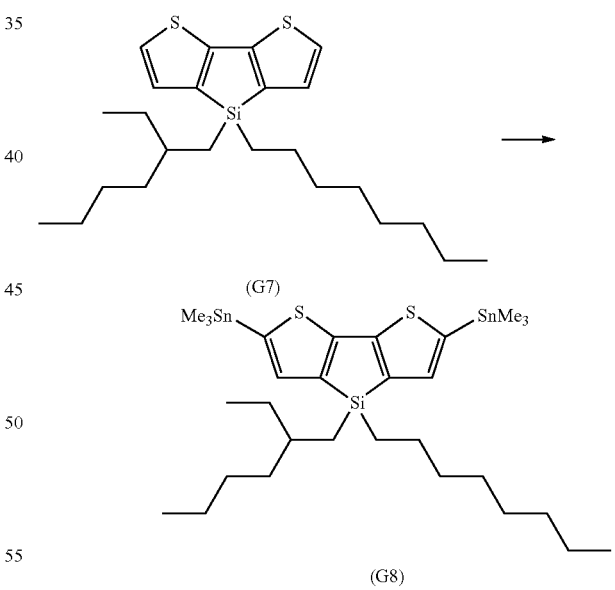

A reaction was performed as in Synthesis Example B2 except that the Compound G7 (2 g, 4.78 mmol) obtained in Synthesis Example B4 was used instead of the Compound G2, while the other reagents were used in similar proportions, to quantitatively obtain 4-n-octyl-4-(2-ethylhexyl)-2,6-bis(trimethyltin)-dithieno[3,2-b:2',3'-d]silole (Compound G8).

Compound G8: $^1$H-NMR (400 MHz, solvent: deuterated chloroform): δ7.08 (s, 2H), 1.42-1.34 (m, 4H), 1.32-1.10 (m, 20H), 0.96-0.75 (m, 10H), 0.36 (s, 18H)

Synthesis Example B6

Synthesis of Compound G9

[Chemical Formula 102]

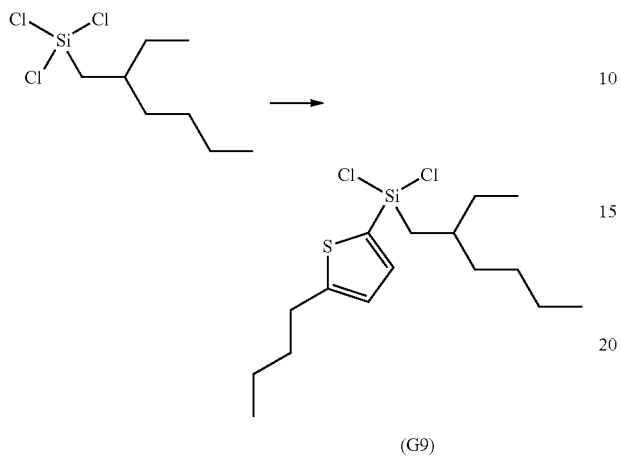

(G9)

Magnesium flakes (2.27 g, 93.4 mmol) were placed in a 200 mL four-necked flask in a nitrogen atmosphere and heat dried with a drier, tetrahydrofuran (30 mL) was added, and 2-bromo-5-n-butylthiophene (19.9 g, 90.7 mmol) was gradually added dropwise. After the internal temperature was confirmed to have fallen to 30° C., dehydrated tetrahydrofuran (40 mL) was added to prepare a Grignard solution.

Trichloro(2-ethylhexyl)silane (synthesized in accordance with J. Am. Chem. Soc. 2008, 130, 16144-16145, 21.4 g, 86.4 mmol) was placed in a 500 mL four-necked flask in a nitrogen atmosphere, and dissolved in anhydrous tetrahydrofuran (100 mL). The resulting solution was cooled to 5° C., and the aforementioned Grignard solution was transferred to a dropping funnel and gradually added dropwise with the internal temperature maintained at 10° C. or less. After completion of dropping, the mixture was returned to room temperature and left standing overnight. About 100 mL of the tetrahydrofuran was distilled off under reduced pressure, hexane (100 mL) was added, and the precipitate was filtered out. The filtrate was concentrated under reduced pressure, and then further distilled under reduced pressure (boiling point: 140-144° C./0.68-0.70 Torr) to obtain dichloro(5-n-butylthiophene-2-yl)(2-ethylhexyl)silane (Compound G9, yield 21.4 g, 70%) as a colorless transparent liquid.

Synthesis Example B7

Synthesis of Compound G10

[Chemical Formula 103]

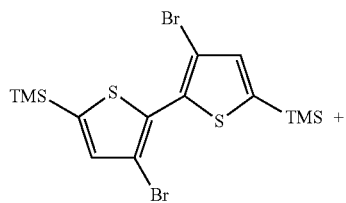

TMS +

-continued (G10)

5,5'-bis(trimethylsilyl)-3,3'-dibromo-2,2'-bithiophene (synthesized in accordance with WO 2010/136353, 11.1 g, 23.7 mmol) was placed in a 500 mL four-necked flask in a nitrogen atmosphere, and dissolved in tetrahydrofuran (200 mL). The resulting solution was cooled to −78° C., and a solution of n-butyl lithium in hexane (KANTO CHEMICAL CO., INC., 1.62 M, 30.2 mL) was gradually added dropwise. After 15 minutes of agitation, the Compound G9 synthesized in Synthesis Example B6 (10.0 g, 28.4 mmol) was added dropwise. After 15 minutes of agitation at −78° C., the temperature was gradually raised to room temperature over the course of 1 hour, and the mixture was left standing overnight. About 100 mL of the tetrahydrofuran was distilled off under reduced pressure, water was added, the product was extracted with hexane, and the organic layer was washed with water, dried over sodium sulfate, and concentrated by filtration. Hexane (80 mL) and chloroform (40 mL) were added to dissolve the resulting yellow oily substance, trifluoroacetic acid (5 mL) was added, and the mixture was agitated for about 1 hour at room temperature. This was concentrated under reduced pressure, and the resulting yellow oily substance was dissolved in hexane and subjected to silica gel column chromatography (solvent: hexane) to obtain the target 4-(5-n-butylthiophene-2-yl)-4-(2-ethylhexyl)dithieno[3,2-b:2',3'-d]silole (Compound G10, 6.8 g, yield 65%).

Compound G10: $^1$H-NMR (400 MHz, solvent: deuterated chloroform): δ7.21 (d, 2H, J=4.6 Hz), 7.15 (d, 1H, J=3.3 Hz), 7.11 (d, 2H, J=4.8 Hz), 6.81 (d, 1H, J=3.3 HZ), 2.81 (t, 2H), 1.63 (m, 2H), 1.54 (m, 1H), 1.43-1.10 (m, 12H), 0.91 (t, 3H), 0.82 (t, 3H), 0.78 (t, 3H)

Synthesis Example B8

Synthesis of Compound G11

[Chemical Formula 104]

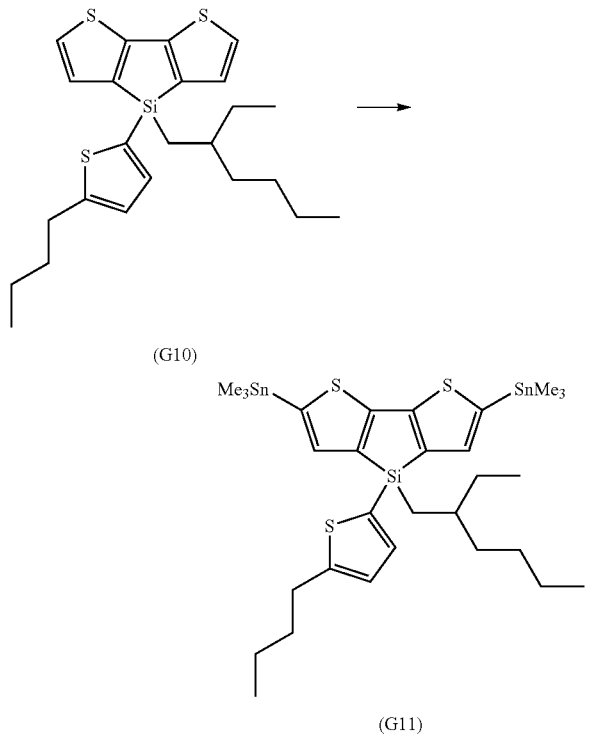

A reaction was performed as in Synthesis Example B2 except that the Compound G10 (1 g, 2.25 mmol) obtained in Synthesis Example B7 was used instead of the Compound G2, while the other reagents were used in similar proportions, to quantitatively obtain 4-(5-n-butylthiophene-2-yl)-4-(2-ethylhexyl)-2,6-bis(trimethyltin)-dithieno[3,2-b:2',3'-d]silole (Compound G11).

Compound G11: $^1$H-NMR (400 MHz, solvent: deuterated chloroform): δ7.15 (d, 1H, J=3.3 Hz), 7.14 (s, 2H), 6.81 (d, 1H, J=3.3 Hz), 2.81 (t, 2H), 1.69 (m, 2H), 1.54 (m, 1H), 1.45-1.08 (m, 12H), 0.91 (t, 3H), 0.82 (t, 3H), 0.78 (t, 3H), 0.37 (s, 18H)

Synthesis Example B9

Synthesis of Compound G12

[Chemical Formula 105]

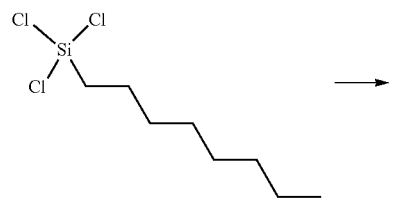

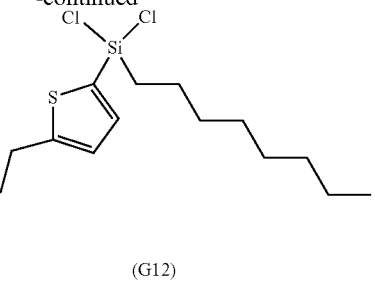

Magnesium flakes (1.87 g, 77.1 mmol) were placed in a 200 mL four-necked flask in a nitrogen atmosphere, and heat dried with a drier, after which tetrahydrofuran (30 mL) was added, and then 2-bromo-5-n-butylthiophene (19.9 g, 90.7 mmol) was gradually added dropwise. The internal temperature was 60° C. upon completion of dropping. After it was confirmed that the internal temperature had fallen to 30° C., tetrahydrofuran (40 mL) was added to prepare a Grignard solution.

n-octyltrichlorosilane (Tokyo Chemical Industry Co., Ltd., 17.7 g, 71.3 mmol) was placed in a 500 mL four-necked flask in a nitrogen atmosphere, and dissolved in tetrahydrofuran (100 mL). The resulting solution was cooled to 5° C., and the previous Grignard solution was transferred to a dropping funnel and gradually added dropwise with the internal temperature maintained at 10° C. or less. After completion of dropping, the mixture was returned to room temperature and left standing overnight. About 100 mL of the tetrahydrofuran was distilled off under reduced pressure, hexane (100 mL) was added, and the precipitate was filtered out. The filtrate was concentrated under reduced pressure, and further distilled under reduced pressure (boiling point 153-157° C./0.89-1.0 Torr) to obtain dichloro(5-n-butylthiophene-2-yl)n-octylsilane (Compound G12, 20.5 g, yield 82%) as a colorless transparent liquid.

Compound G12: $^1$H-NMR (400 MHz, solvent: deuterated chloroform): δ7.37 (d, 1H, J=3.3 Hz), 6.91 (d, 1H, J=3.5 Hz), 2.88 (t, 2H), 1.73-1.65 (m, 2H), 1.61-1.52 (m, 2H), 1.46-1.18 (m, 14H), 0.94 (t, 3H), 0.88 (t, 3H)

Synthesis Example B10

Synthesis of Compound G13

[Chemical Formula 106]

-continued

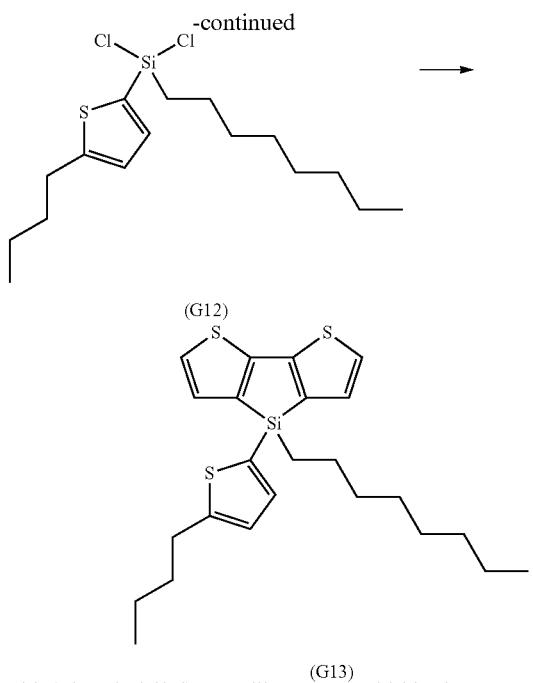
(G12)

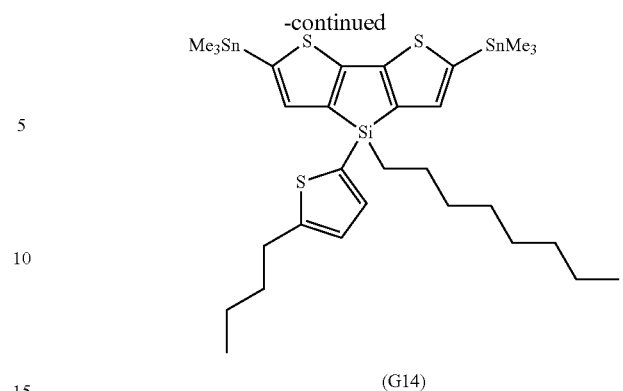
(G14)

A reaction was performed as in Synthesis Example B2 except that the Compound G13 (2 g, 4.50 mmol) obtained in Synthesis Example B10 was used instead of the Compound G2, while the other reagents were used in similar proportions, to quantitatively obtain 4-(5-n-butylthiophene-2-yl)-4-n-octyl-2,6-bis(trimethyltin)-dithieno[3,2-b:2',3'-d]silole (Compound G14).

Compound G14: $^1$H-NMR (400 MHz, solvent: deuterated chloroform): δ7.16 (d, 1H, J=3.3 Hz), 7.15 (s, 2H), 6.82 (d, 1H, J=3.2 Hz), 2.82 (t, 2H), 1.64 (m, 2H), 1.54 (m, 2H), 1.42-1.11 (m, 14H), 0.91 (t, 3H), 0.86 (t, 3H), 0.37 (s, 18H)

5,5'-bis(trimethylsilyl)-3,3'-dibromo-2,2'-bithiophene (synthesized in accordance with WO 2010/136353, 6.7 g, 14.2 mmol) was placed in a 300 mL four-necked flask in a nitrogen atmosphere, and dissolved in tetrahydrofuran (100 mL). The resulting solution was cooled to −78° C., and a solution of n-butyl lithium in hexane (KANTO CHEMICAL CO., INC., 1.62 M, 18.4 mL) was gradually added dropwise. After 15 minutes of agitation, the Compound G12 (6.0 g, 17.1 mmol) obtained in Synthesis Example B9 was added dropwise. The reaction solution was agitated for 15 minutes at −78° C., the temperature was gradually raised to room temperature over the course of 1 hour, and the mixture was left standing overnight. About 80 mL of the tetrahydrofuran was distilled off under reduced pressure, water was added, the product was extracted with hexane, and the organic layer was washed with water, dried over sodium sulfate, and concentrated by filtration. Hexane (50 mL) and chloroform (25 mL) were added to dissolve the resulting yellow oily substance, trifluoroacetic acid (2.6 mL) was added, and the mixture was agitated for about 1 hour at room temperature. This was concentrated under reduced pressure, and the resulting yellow oily substance was dissolved in hexane and subjected to silica gel column chromatography (solvent: hexane) to obtain the target 4-(5-n-butylthiophene-2-yl)-4-n-octyldithieno[3,2-b:2',3'-d]silole (Compound G13, 3.8 g, yield 60%).

Synthesis Example B11

Synthesis of Compound G14

[Chemical Formula 107]

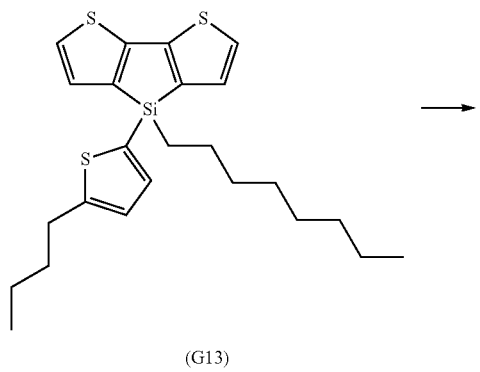
(G13)

Synthesis Example B12

Synthesis of Compound G15

[Chemical Formula 108]

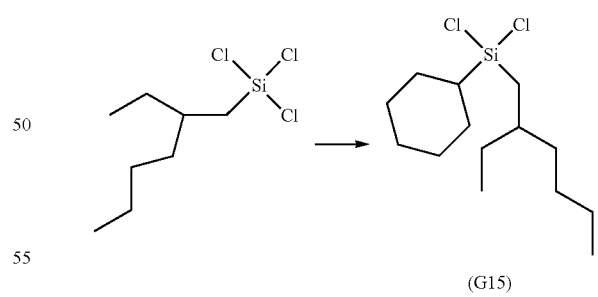
(G15)

A reaction was performed as in Synthesis Example B3 except that a solution of cyclohexyl magnesium bromide in tetrahydrofuran (Tokyo Chemical Industry Co., Ltd., 1M. 65.7 mL) was used instead of n-octyl magnesium bromide, while the other reagents were used in similar proportions, to obtain dichloro(2-ethylhexyl)cyclohexylsilane (Compound G15, 12.9 g, yield 73%, boiling point: 110° C./0.82 Torr) as a colorless transparent liquid.

Synthesis Example B13

Synthesis of Compound G16

[Chemical Formula 109]

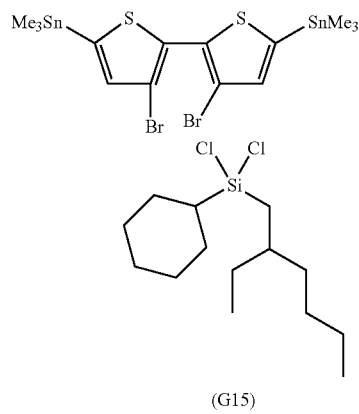
(G15)

+

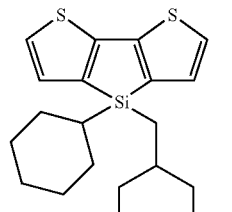

→

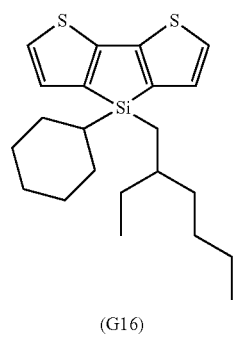
(G16)

A reaction was performed as in Synthesis Example B4 except that the Compound G15 (2 g, 6.73 mmol) obtained in Synthesis Example B12 was used instead of the Compound G6, while the other reagents were used in similar proportions, to obtain 4-(2-ethylhexyl)-4-cyclohexyldithieno[3,2-b:2',3'-d]silole (Compound G16, 1.1 g, yield 44%) as a light yellow liquid.

Synthesis Example B14

Synthesis of Compound G17

[Chemical Formula 110]

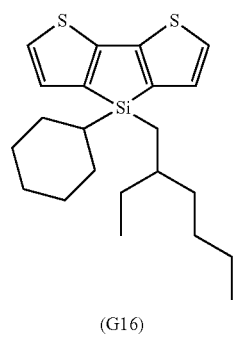
(G16)

→

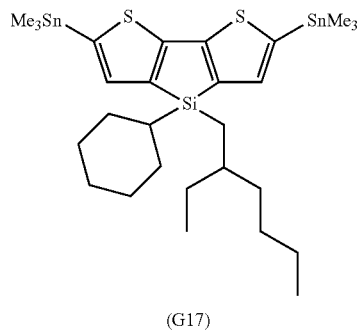
(G17)

A reaction was performed as in Synthesis Example B2 except that the Compound G16 (1.1 g, 2.82 mmol) obtained in Synthesis Example B13 was used instead of the Compound G2, to quantitatively obtain 4-(2-ethylhexyl)-4-cyclohexyl-2,6-bis(trimethyltin)dithieno[3,2-b:2',3'-d]silole (Compound G17).

Example B1

Synthesis Example of Copolymer 1B

[Chemical Formula 111]

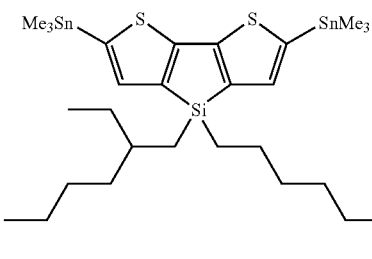
(G8)

+

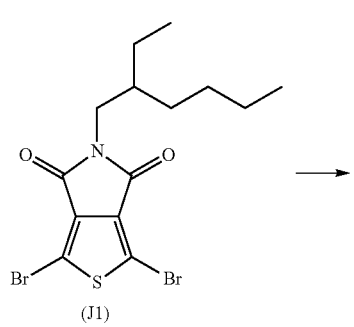
(J1)

→

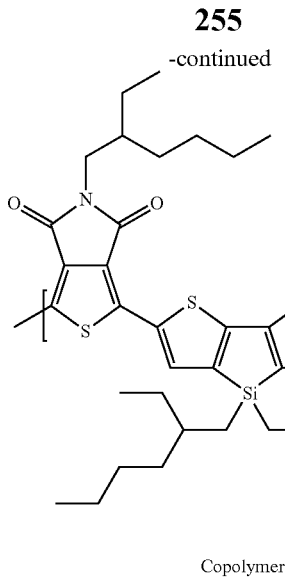

Copolymer 1B 1,3-dibromo-5-(2-ethylhexyl)-4H-thieno[3,4-c]pyrrole-4,6-(5H)-dione (Compound J1 (imidothiophene dibromide), 180 mg, 0.42 mmol) obtained with reference to methods described in known literature (J. Am. Chem. Soc. 2010, 132, 7595-7597) and the Compound G8 (334 mg, 0.45 mmol) obtained in Synthesis Example B5 as monomers were placed in a 50 mL two-necked recovery flask in a nitrogen atmosphere, tetrakis(triphenylphosphine)palladium (0) (16 mg, 3 mol %), the triphenylphosphine-containing heterogeneous palladium complex catalyst Pd-EnCat TPP30 (Sigma-Aldrich Co. LLC., 34 mg, 3 mol %), toluene (7 mL) and N,N-dimethylformamide (1.7 mL) were added, and the mixture was agitated for 1 hour at 90° C. and 10 hours at 100° C. The reaction solution was diluted 4 times with toluene, and heated and agitated for another 0.5 hours at 100° C., after which terminal treatment was performed by adding trimethyl(phenyl)tin (0.4 mL) and heating and agitating for 8 hours at 100° C., then adding bromobenzene (3.4 mL) and heating and agitating for 8 hours at 100° C., after which the reaction solution was poured into methanol and the precipitate was filtered out. The resulting solid was dissolved in chloroform, diamine silica gel (Fuji Silysia Chemical Ltd.) was added, and the mixture was agitated for 1 hour at room temperature and passed through a short column of acidic silica gel. The solution was concentrated and recrystallized with chloroform/ethyl acetate as the solvent, and the precipitate was filtered out to obtain the target Copolymer 1B (200 mg). The resulting Copolymer 1B had a weight-average molecular weight Mw of $1.50 \times 10^5$, and a PDI of 4.3.

Example B2

Synthesis Example of Copolymer 2B

[Chemical Formula 112]

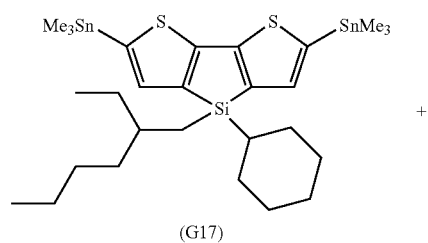

(G17)

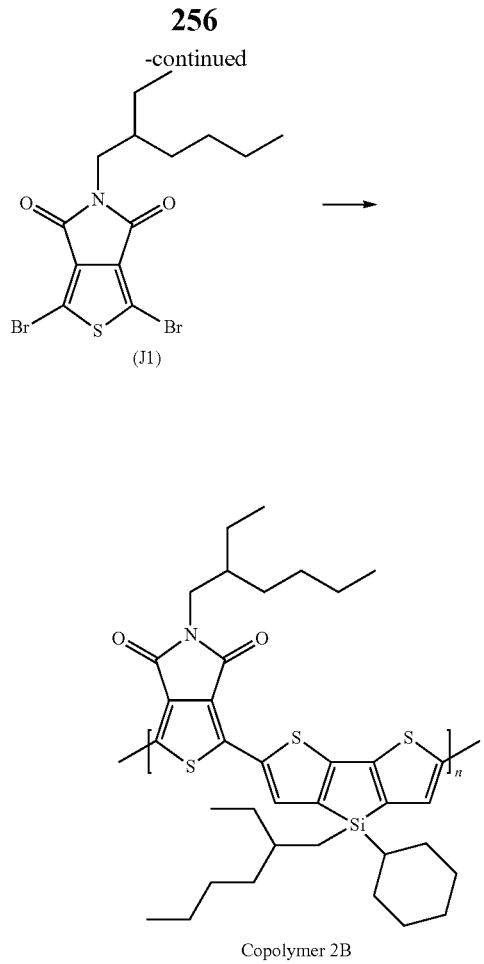

Copolymer 2B 1,3-dibromo-5-(2-ethylhexyl)-4H-thieno[3,4-c]pyrrole-4,6-(5H)-dione (Compound J1 (imidothiophene dibromide), 206 mg, 0.49 mmol) obtained with reference to methods described in known literature (J. Am. Chem. Soc. 2010, 132, 7595-7597) and the Compound G17 (386 mg, 0.53 mmol) obtained in Synthesis Example B14 as monomers were placed in a 50 mL two-necked recovery flask in a nitrogen atmosphere, tetrakis(triphenylphosphine)palladium (0) (18 mg, 3 mol %), the triphenylphosphine-containing heterogeneous palladium complex catalyst Pd-EnCat TPP30 (Sigma-Aldrich Co. LLC., 24 mg, 3 mol %), toluene (8.2 mL) and N,N-dimethylformamide (2.0 mL) were added, and the mixture was agitated for 1 hour at 90° C. and 10 hours at 100° C. The reaction solution was diluted 4 times with toluene, and heated and agitated for another 0.5 hours at 100° C., after which terminal treatment was performed by adding trimethyl(phenyl)tin (0.44 mL) and heating and agitating for 8 hours at 100° C., then adding bromobenzene (1.76 mL) and agitating for 8 hours at 100° C., after which the reaction solution was poured into methanol and the precipitate was filtered out. The resulting solid was dissolved in chloroform, diamine silica gel (Fuji Silysia Chemical Ltd.) was added, and the mixture was agitated for 1 hour at room temperature and passed through a short column of acidic silica gel. The solution was concentrated and recrystallized with chloroform/ethyl acetate as the solvent, and the precipitate was filtered out to obtain the target Copolymer 2B (122 mg). The resulting Copolymer 2B had a weight-average molecular weight Mw of $1.78 \times 10^5$, and a PDI of 4.8.

Example B3

Synthesis Example of Copolymer 3B

[Chemical Formula 113]

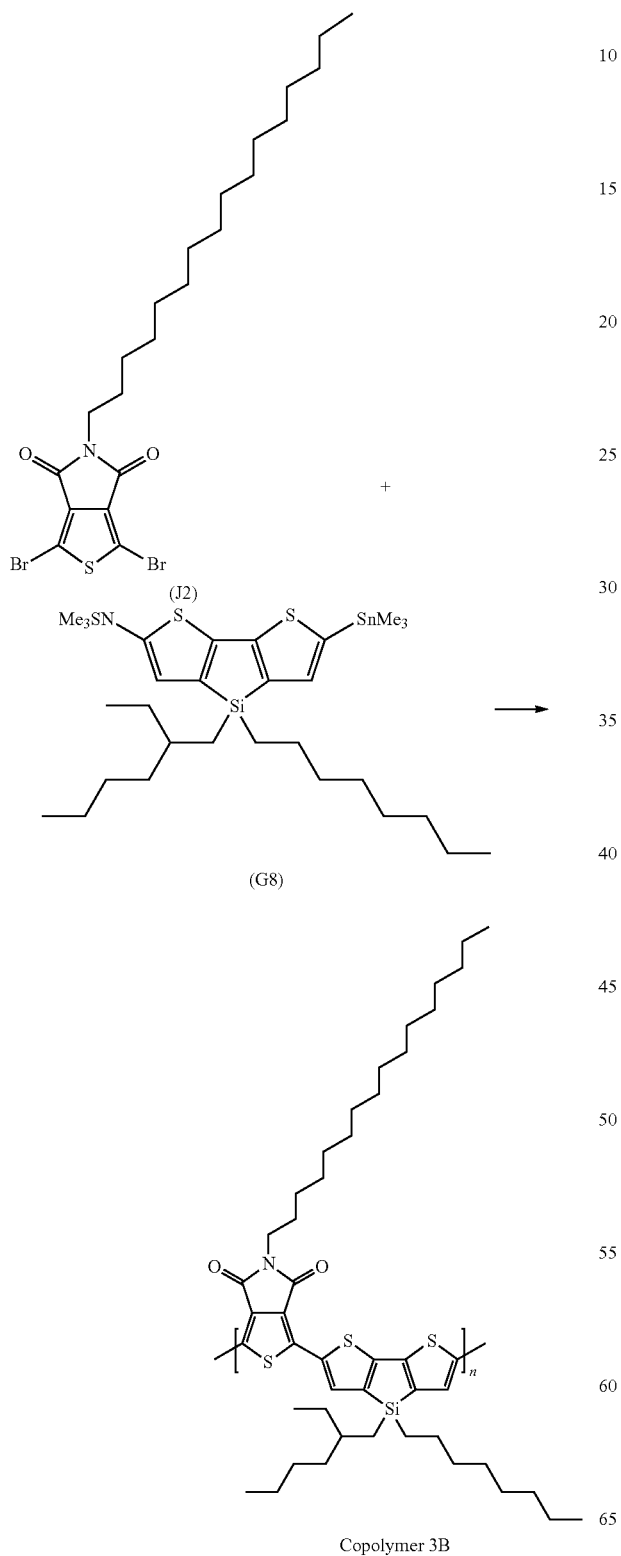

Copolymer 3B 1,3-dibromo-5-hexadecyl-4H-thieno[3,4-c]pyrrole-4,6-(5H)dione (Compound J2 (imidothiophene dibromide), 211 mg, 0.394 mmol) obtained with reference to the methods described in known literature (Organic Letters 2004, 6, 3381-3384) and the Compound G8 (319 mg, 0.429 mmol) obtained in Synthesis Example B5 as monomers were placed in a 50 mL two-necked recovery flask in a nitrogen atmosphere, tetrakis(triphenylphosphine)palladium (0) (12.8 mg, 3 mol %), the triphenylphosphine-containing heterogeneous palladium complex catalyst Pd-EnCat TPP30 (Sigma-Aldrich Co. LLC., 16.6 mg, 3 mol %), toluene (6.6 mL) and N,N-dimethylformamide (1.7 mL) were added, and the mixture was agitated for 1 hour at 90° C. and 10 hours at 100° C. The reaction solution was diluted 4 times with toluene, and heated and agitated for another 0.5 hours at 100° C., after which terminal treatment was performed by adding trimethyl(phenyl)tin (0.39 mL) and heating and agitating for 8 hours at 100° C., then adding bromobenzene (1.56 mL) and heating and agitating for 8 hours at 100° C., after which the reaction solution was poured into methanol and the precipitate was filtered out. The resulting solid was dissolved in chloroform, diamine silica gel (Fuji Silysia Chemical Ltd.) was added, and the mixture was agitated for 1 hour at room temperature and passed through a short column of acidic silica gel. The solution was concentrated and recrystallized with chloroform/ethyl acetate as the solvent, and the precipitate was filtered out to obtain the target Copolymer 3B (255 mg). The resulting Copolymer 3B had a weight-average molecular weight Mw of $2.98 \times 10^5$, and a PDI of 6.6.

Example B4

Synthesis Example of Copolymer 4B

[Chemical Formula 113]

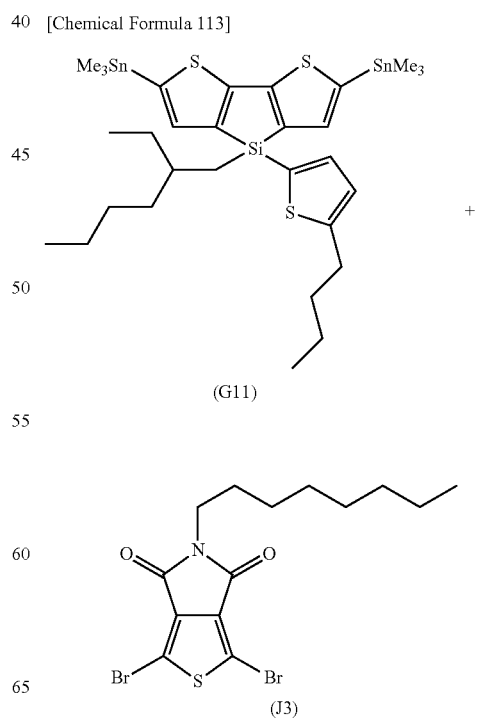

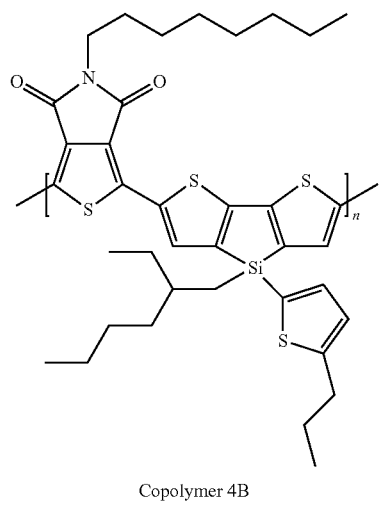

Copolymer 4B 1,3-dibromo-5-octyl-4H-thieno[3,4-c]pyrrole-4,6-(5H)-dione (Compound J3 (imidothiophene dibromide), 224 mg, 0.53 mmol) obtained with reference to methods described in known literature (Organic Letters 2004, 6, 3381-3384) and the Compound G11 (432 mg, 0.56 mmol) obtained in Synthesis Example B8 as monomers were placed in a 50 mL two-necked recovery flask in a nitrogen atmosphere, tetrakis(triphenylphosphine)palladium (0) (19 mg, 3 mol %), the triphenylphosphine-containing heterogeneous palladium complex catalyst Pd-EnCat TPP30 (Sigma-Aldrich Co. LLC., 25 mg, 3 mol %), toluene (8.7 mL) and N,N-dimethylformamide (2.2 mL) were added, and the mixture was agitated for 1 hour at 90° C. and 10 hours at 100° C. The reaction solution was diluted 4 times with toluene, and heated and agitated for another 0.5 hours at 100° C., after which terminal treatment was performed by adding trimethyl(phenyl)tin (0.48 mL) and heating and agitating for 8 hours at 100° C., then adding bromobenzene (1.9 mL) and heating and agitating for 8 hours at 100° C., after which the reaction solution was poured into methanol and the precipitate was filtered out. The resulting solid was dissolved in chloroform, diamine silica gel (Fuji Silysia Chemical Ltd.) was added, and the mixture was agitated for 1 hour at room temperature and passed through a short column of acidic silica gel. The solution was concentrated and recrystallized with chloroform/ethyl acetate as the solvent, and the precipitate was filtered out to obtain the target Copolymer 4B (275 mg). The resulting Copolymer 4B had a weight-average molecular weight Mw of $2.26 \times 10^5$, and a PDI of 4.4.

Example B5

Synthesis Example of Copolymer 5B

[Chemical Formula 115]

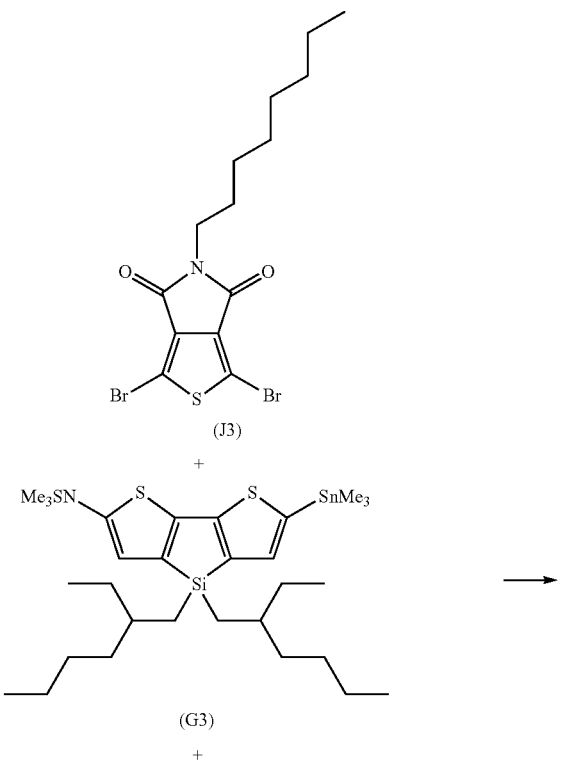

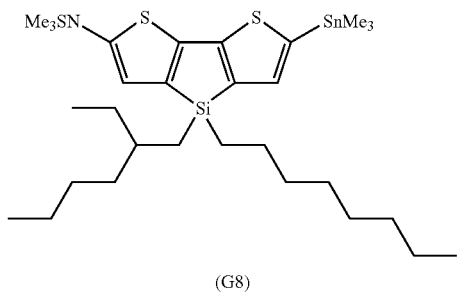

(G8)

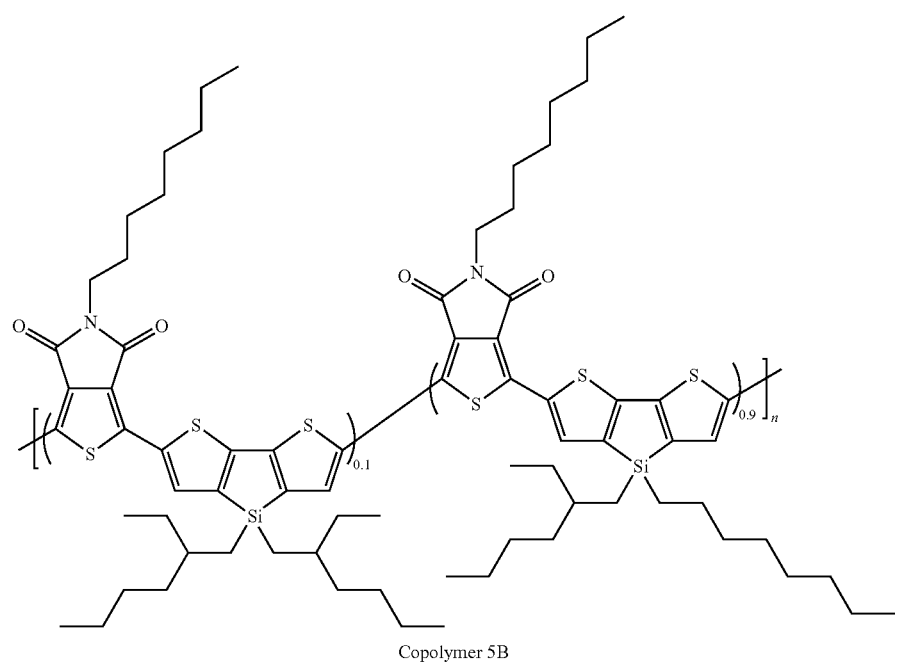

Copolymer 5B 1,3-dibromo-5-octyl-4H-thieno[3,4-c]pyrrole-4,6-(5H)-dione (Compound J3 (imidothiophene dibromide), 194 mg, 0.46 mmol) obtained with reference to methods described in known literature (Organic Letters 2004, 6, 3381-3384), the Compound G3 (36 mg, 0.049 mmol) obtained in Synthesis Example B2 and the Compound G8 (327 mg, 0.44 mmol) obtained in Synthesis Example B5 as monomers were placed in a 50 mL two-necked recovery flask in a nitrogen atmosphere, tetrakis(triphenylphosphine)palladium (0) (17 mg, 3 mol %), the triphenylphosphine-containing heterogeneous palladium complex catalyst Pd-EnCat TPP30 (Sigma-Aldrich Co. LLC., 36 mg, 3 mol %), toluene (7.6 mL) and N,N-dimethylformamide (1.9 mL) were added, and the mixture was agitated for 1 hour at 90° C. and 10 hours at 100° C. The reaction solution was diluted 4 times with toluene, and heated and agitated for another 0.5 hours at 100° C., after which terminal treatment was performed by adding trimethyl(phenyl)tin (0.4 mL) and heating and agitating for 8 hours at 100° C., then adding bromobenzene (3.5 mL) and heating and agitating for 8 hours at 100° C., after which the reaction solution was poured into methanol and the precipitate was filtered out. The resulting solid was dissolved in chloroform, diamine silica gel (Fuji Silysia Chemical Ltd.) was added, and the mixture was agitated for 1 hour at room temperature and passed through a short column of acidic silica gel. The solution was concentrated and recrystallized with chloroform/ethyl acetate as the solvent, and the precipitate was filtered out to obtain the target Copolymer 5B (180 mg). The resulting Copolymer 5B had a weight-average molecular weight Mw of $3.64 \times 10^5$, and a PDI of 7.4.

Example B6

Synthesis Example of Copolymer 6B

[Chemical Formula 116]

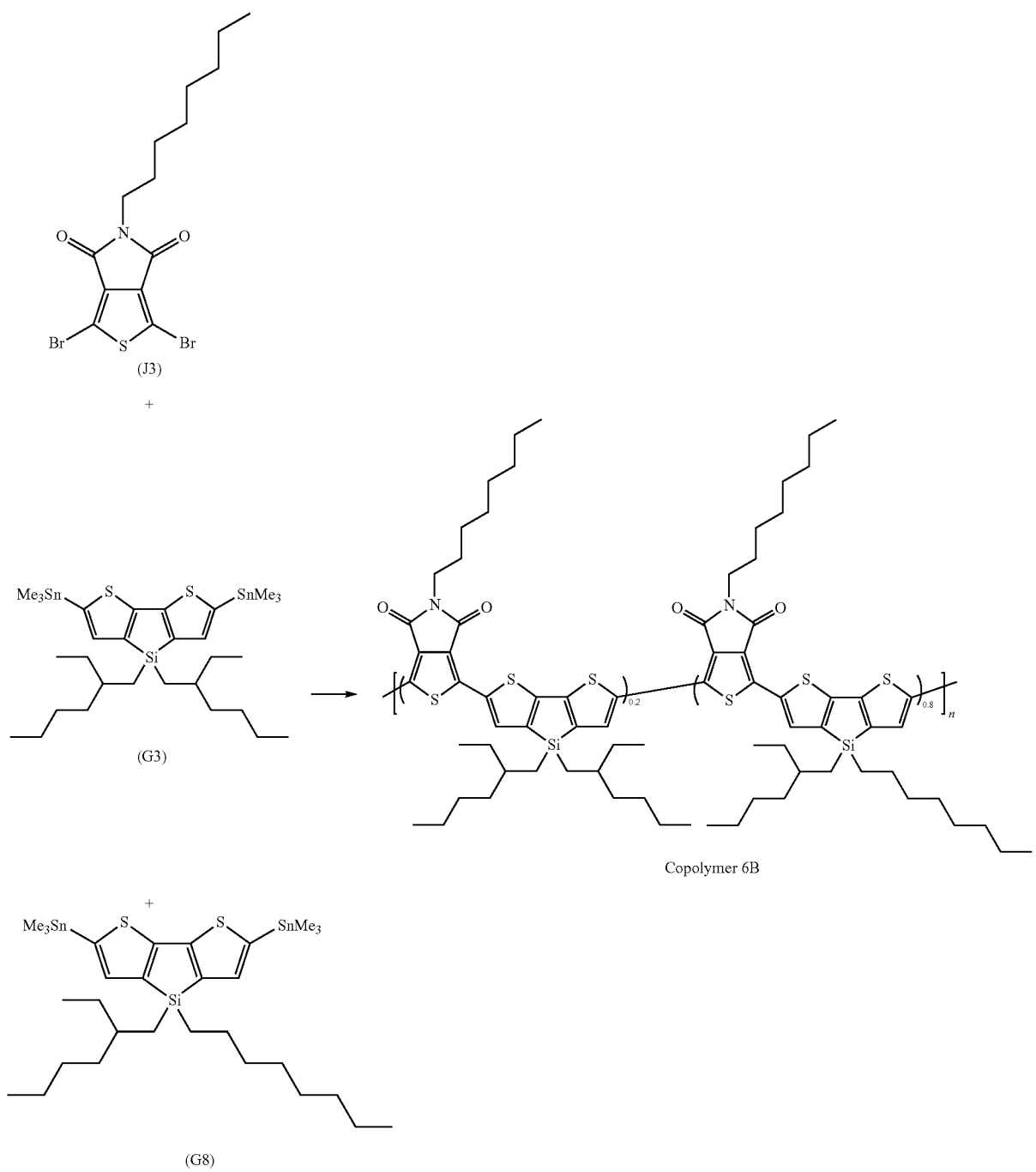

1,3-dibromo-5-octyl-4H-thieno[3,4-c]pyrrole-4,6-(5H)-dione (Compound J3 (imidothiophene dibromide), 257 mg, 0.61 mmol) obtained with reference to methods described in known literature (Organic Letters 2004, 6, 3381-3384), the Compound G3 (97 mg, 0.13 mmol) obtained in Synthesis Example B2 and the Compound G8 (385 mg, 0.52 mmol) obtained in Synthesis Example B5 as monomers were placed in a 50 mL two-necked recovery flask in a nitrogen atmosphere, tetrakis(triphenylphosphine)palladium (0) (22 mg, 3 mol %), the triphenylphosphine-containing heterogeneous palladium complex catalyst Pd-EnCat TPP30 (Sigma-Aldrich Co. LLC., 48 mg, 3 mol %), toluene (8.0 mL) and N,N-dimethylformamide (2.0 mL) were added, and the mixture was agitated for 1 hour at 90° C. and 10 hours at 100° C. The reaction solution was diluted 4 times with toluene, and heated and agitated for another 0.5 hours at 100° C., after which terminal treatment was performed by adding trimethyl(phenyl)tin (0.4 mL) and heating and agitating for 8 hours at 100° C., then adding bromobenzene (3.5 mL) and heating and agitating for 8 hours at 100° C., after which the reaction solution was poured into methanol and the precipitate was filtered out. The resulting solid was dissolved in chloroform, diamine silica gel (Fuji Silysia Chemical Ltd.) was added, and the mixture was agitated for 1 hour at room temperature and passed through a short column of acidic silica gel. The solution was concentrated and recrystallized with chloroform/ethyl acetate as the solvent, and the precipitate was filtered out to obtain the target Copolymer 6B (210 mg). The resulting Copolymer 6B had a weight-average molecular weight Mw of $2.99 \times 10^5$, and a PDI of 5.3.

Example B7

Synthesis Example of Copolymer 7B

[Chemical Formula 117]

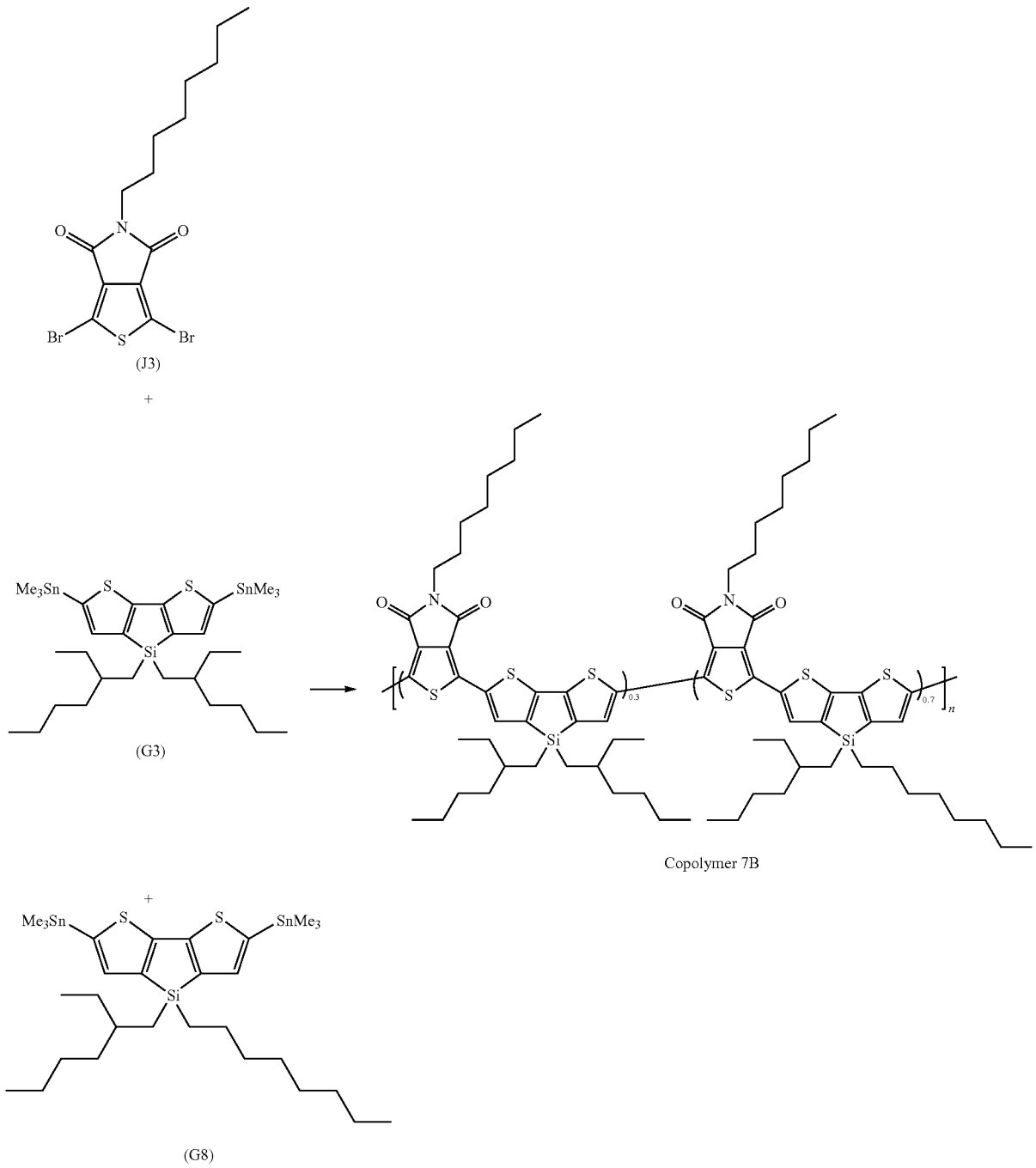

1,3-dibromo-5-octyl-4H-thieno[3,4-c]pyrrole-4,6-(5H)-dione (Compound J3 (imidothiophene dibromide), 242 mg, 0.57 mmol) obtained with reference to methods described in known literature (Organic Letters 2004, 6, 3381-3384), the Compound G3 (136 mg, 0.18 mmol) obtained in Synthesis Example B2 and the Compound G8 (317 mg, 0.43 mmol) obtained in Synthesis Example B5 as monomers were placed in a 50 mL two-necked recovery flask in a nitrogen atmosphere, tetrakis(triphenylphosphine)palladium (0) (21 mg, 3 mol %), the triphenylphosphine-containing heterogeneous

[Chemical Formula 118]

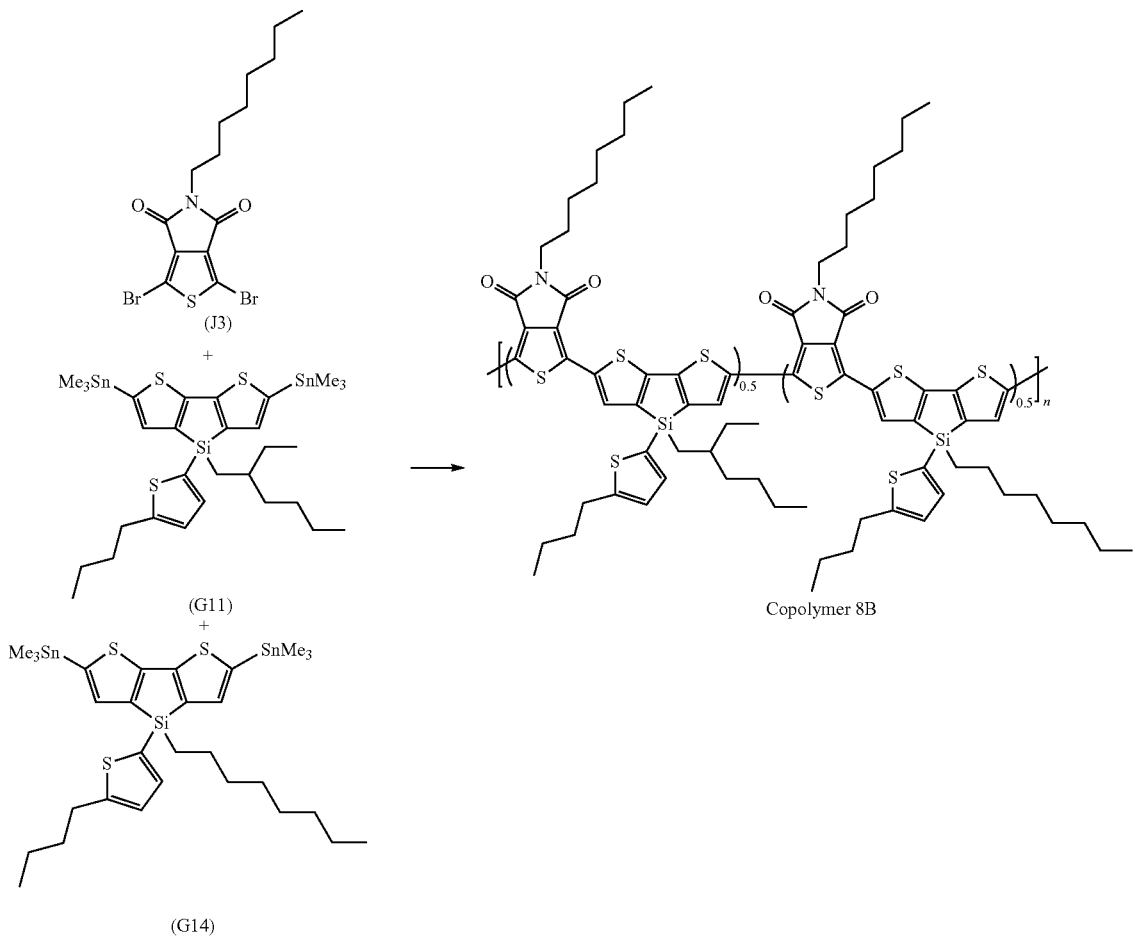

palladium complex catalyst Pd-EnCat TPP30 (Sigma-Aldrich Co. LLC., 45 mg, 3 mol %), toluene (7.5 mL) and N,N-dimethylformamide (1.8 mL) were added, and the mixture was agitated for 1 hour at 90° C. and 10 hours at 100° C. The reaction solution was diluted 4 times with toluene, and heated and agitated for another 0.5 hours at 100° C., after which terminal treatment was performed by adding trimethyl(phenyl)tin (0.4 mL) and heating and agitating for 8 hours at 100° C., then adding bromobenzene (3.5 mL) and heating and agitating for 8 hours at 100° C., after which the reaction solution was poured into methanol and the precipitate was filtered out. The resulting solid was dissolved in chloroform, diamine silica gel (Fuji Silysia Chemical Ltd.) was added, and the mixture was agitated for 1 hour at room temperature and passed through a short column of acidic silica gel. The solution was concentrated and recrystallized with chloroform/ethyl acetate as the solvent, and the precipitate was filtered out to obtain the target Copolymer 7B (190 mg). The resulting Copolymer 7B had a weight-average molecular weight Mw of $1.67 \times 10^5$, and a PDI of 4.0.

Example B8

Synthesis Example of Copolymer 8B 1,3-dibromo-5-octyl-4H-thieno[3,4-c]pyrrole-4,6-(5H)-dione (Compound J3 (imidothiophene dibromide), 157 mg, 0.371 mmol) obtained with reference to methods described in known literature (Organic Letters 2004, 6, 3381-3384), the Compound G11 (154 mg, 0.200 mmol) obtained in Synthesis Example B8 and the Compound G14 (149 mg, 0.193 mmol) obtained in Synthesis Example B11 were placed in a 50 mL two-necked recovery flask in a nitrogen atmosphere, tetrakis (triphenylphosphine)palladium (0) (22.5 mg, 5 mol %), toluene (6.1 mL) and N,N-dimethylformamide (1.5 mL) were added, and the mixture was agitated for 1 hour at 90° C. and 6 hours at 100° C. The reaction solution was diluted 4 times with toluene, and heated and agitated for another 0.5 hours at 100° C., after which terminal treatment was performed by adding trimethyl(phenyl)tin (0.1 mL) and heating and agitating for 8 hours at 100° C., then adding bromobenzene (1.0 mL) and heating and agitating for 8 hours at 100° C., after which the reaction solution was poured into methanol and the precipitate was filtered out. The resulting solid was dissolved in chloroform, diamine silica gel (Fuji Silysia Chemical Ltd.) was added, and the mixture was agitated for 1 hour at room temperature and passed through a short column of acidic silica gel. The solution was concentrated and recrystallized with chloroform/ethyl acetate as the solvent, and the precipitate was filtered out to obtain the target Copolymer 8B (186 mg). The resulting Copolymer 8B had a weight-average molecular weight Mw of 2.39×10⁵, and a PDI of 5.2.

Example B9

Synthesis Example of Copolymer 9B

[Chemical Formula 119]

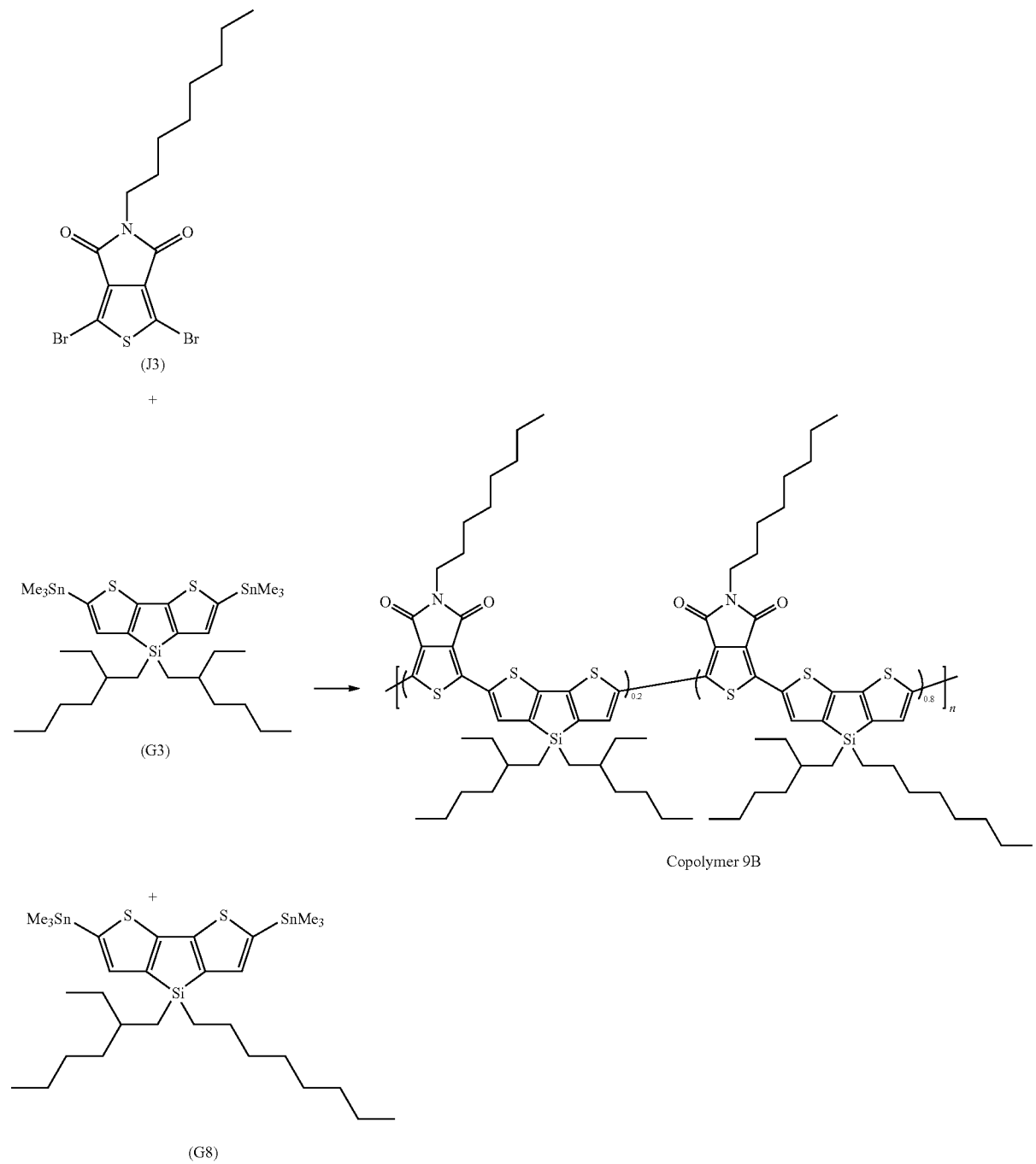

Copolymer 9B 1,3-dibromo-5-octyl-4H-thieno[3,4-c]pyrrole-4,6-(5H)-dione (Compound J3 (imidothiophene dibromide), 211 mg, 0.50 mmol) obtained with reference to methods described in known literature (Organic Letters 2004, 6, 3381-3384) and the Compound G8 (400 mg, 0.54 mmol) obtained in Synthesis Example B5 as monomers were placed in a first 50 mL two-necked recovery flask (A) in a nitrogen atmosphere, tetrakis(triphenylphosphine)palladium (0) (20 mg, 3 mol %), the triphenylphosphine-containing heterogeneous palladium complex catalyst Pd-EnCat TPP30 (Sigma-Aldrich Co. LLC., 44 mg, 3 mol %), toluene (9.2 mL) and N,N-dimethylformamide (2.2 mL) were added, and the mixture was agitated for 1 hour at 90° C. and 1 hour at 100° C.

Next, 1,3-dibromo-5-octyl-4H-thieno[3,4-c]pyrrole-4,6-(5H)-dione (Compound J3 (imidothiophene dibromide), 53 mg, 0.13 mmol) obtained with reference to methods described in known literature (Organic Letters 2004, 6, 3381-3384) and the Compound G3 (100 mg, 0.13 mmol) obtained in Synthesis Example B2 as monomers were placed in a second 50 mL two-necked recovery flask (B) in a nitrogen atmosphere, tetrakis(triphenylphosphine)palladium (0) (5.1 mg, 3 mol %), the triphenylphosphine-containing heterogeneous palladium complex catalyst Pd-EnCat TPP30 (Sigma-Aldrich Co. LLC., 11 mg, 3 mol %), toluene (2.3 mL) and N,N-dimethylformamide (0.6 mL) were added, and the mixture was agitated for 1 hour at 90° C. and 1 hour at 100° C.

At this point, the copolymer in the reaction solution of the flask (A) had a weight-average molecular weight Mw of $6.5 \times 10^3$ and a PDI of 1.5, while the copolymer in the reaction solution of the flask (B) had a weight-average molecular weight Mw of $6.6 \times 10^3$ and a PDI of 1.6. The reaction solution of the flask (B) was then added to the reaction solution of the flask (A), and agitated for 10 hours at 100° C. This was diluted 4 times with toluene, and heated and agitated for another 0.5 hours at 100° C., after which terminal treatment was performed by adding trimethyl(phenyl)tin (0.5 mL) and heating and agitating for 8 hours at 100° C., then adding bromobenzene (4.0 mL) and heating and agitating for 8 hours at 100° C., after which the reaction solution was poured into methanol and the precipitate was filtered out. The resulting solid was dissolved in chloroform, diamine silica gel (Fuji Silysia Chemical Ltd.) was added, and the mixture was agitated for 1 hour at room temperature and passed through a short column of acidic silica gel. The solution was concentrated and recrystallized with chloroform/ethyl acetate as the solvent, and the precipitate was filtered out to obtain the target Copolymer 9B (220 mg). The resulting Copolymer 9B had a weight-average molecular weight Mw of $4.66 \times 10^5$, and a PDI of 7.9.

Comparative Example B1

Synthesis Example of Copolymer 10B

[Chemical Formula 120]

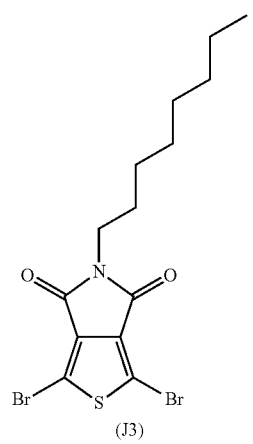

(J3)

+

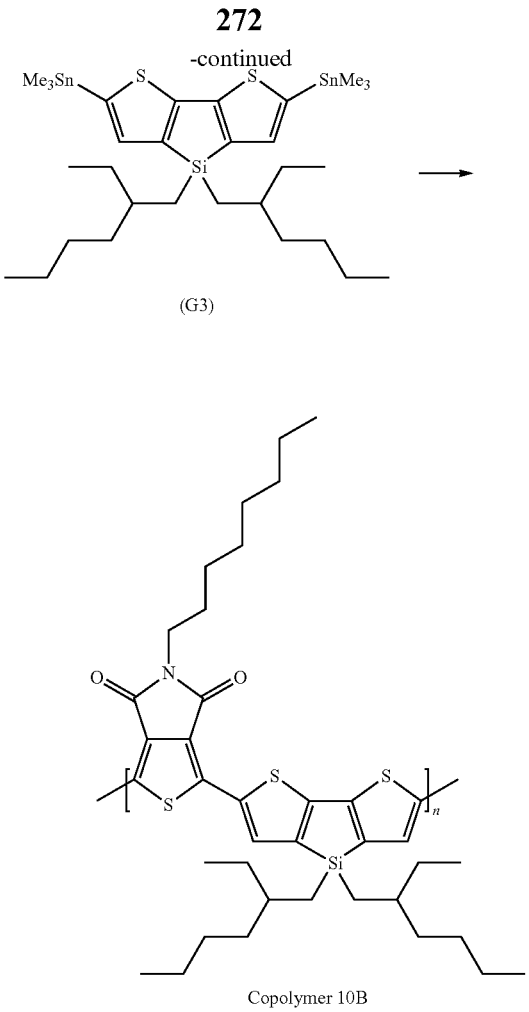

Copolymer 10B 1,3-dibromo-5-octyl-4H-thieno[3,4-c]pyrrole-4,6-(5H)-dione (Compound J3 (imidothiophene dibromide), 138 mg, 0.33 mmol) obtained with reference to methods described in known literature (Organic Letters 2004, 6, 3381-3384) and the Compound G3 (255 mg, 0.34 mmol) obtained in Synthesis Example B2 were placed in a 50 mL two-necked recovery flask in a nitrogen atmosphere, tetrakis(triphenylphosphine) palladium (0) (12 mg, 3 mol %), the triphenylphosphine-containing heterogeneous palladium complex catalyst Pd-EnCat TPP30 (Sigma-Aldrich Co. LLC., 23 mg, 3 mol %), toluene (5.3 mL) and N,N-dimethylformamide (1.3 mL) were added, and the mixture was agitated for 1 hour at 90° C. and 10 hours at 100° C. The reaction solution was diluted 4 times with toluene, and heated and agitated for another 0.5 hours at 100° C., after which terminal treatment was performed by adding trimethyl(phenyl)tin (0.3 mL) and heating and agitating for 8 hours at 100° C., then adding bromobenzene (1.5 mL) and heating and agitating for 8 hours at 100° C., after which the reaction solution was poured into methanol and the precipitate was filtered out. The resulting solid was dissolved in chloroform, diamine silica gel (Fuji Silysia Chemical Ltd.) was added, and the mixture was agitated for 1 hour at room temperature and passed through a short column of acidic silica gel. The solution was concentrated and recrystallized with chloroform/ethyl acetate as the solvent, and the precipitate was filtered out to obtain the target Copolymer 10B (174 mg). The resulting Copolymer 10B had a weight-average molecular weight Mw of $1.37 \times 10^5$, and a PDI of 3.3.

Comparative Example B2

Synthesis Example of Copolymer 11B

[Chemical Formula 121]

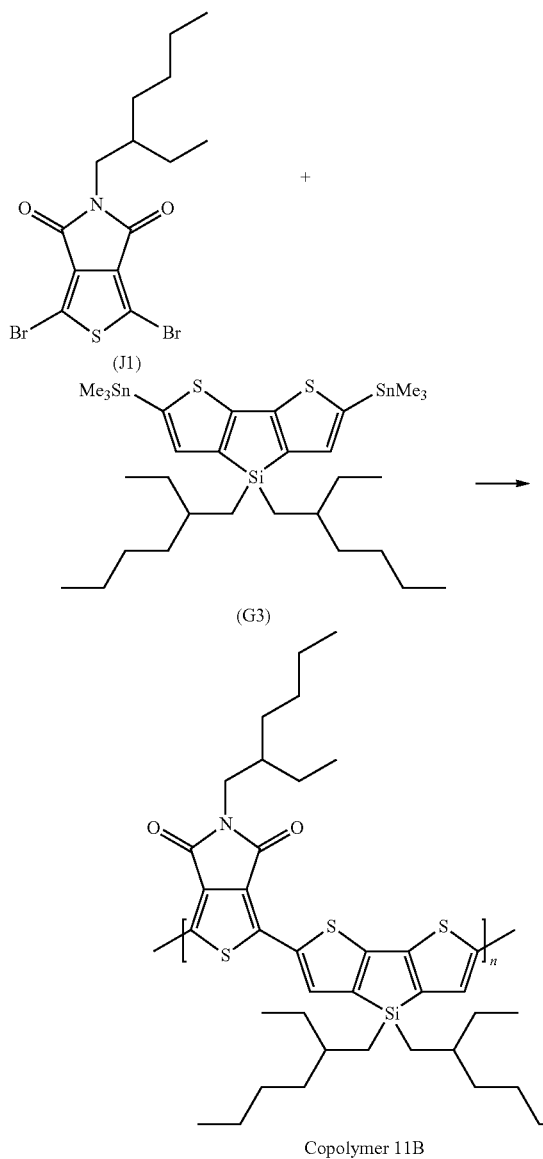

Copolymer 11B

Synthesis was performed as in the synthesis example of Copolymer 10B except that 1,3-dibromo-5-(2-ethylhexyl)-4H-thieno[3,4-c]pyrrole-4,6-(5H)-dione (Compound J1 (imidothiophene dibromide), 138 mg, 0.33 mmol) obtained with reference to methods described in known literature (J. Am. Chem. Soc. 2010, 132, 7595-7597) was used instead of the Compound J3, to obtain the target Copolymer 11B (182 mg). The resulting Copolymer 11B had a weight-average molecular weight Mw of $2.00 \times 10^5$, and a PDI of 3.2.

Copolymer-containing inks containing copolymers obtained as described above were each subjected to storage stability testing by the methods described above. The results are shown in Table 2 below. In Table 2, an "x" indicates that gelling was confirmed within 5 minutes after the container was removed from the heat source and left standing at room temperature, while "○" indicates that gelling was not confirmed after 5 minutes but was confirmed after 1 hour, and "⊙" indicates that no gelling was confirmed even after 1 hour. In Table 2, the molar ratio (%) represents the molar ratio of the repeating units represented by Formula (2A) as a percentage of the repeating units making up each copolymer.

Synthesis Example B15

Synthesis of Compound G18

[Chemical Formula 122]

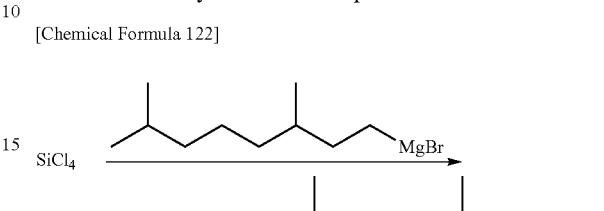

Tetrahydrofuran (100 ml) and tetrachlorosilane (17.0 g, 100 mmol) were placed in a 500 mL four-necked flask in a nitrogen atmosphere, and cooled to −10° C. 3.7-dimethyloctyl magnesium bromide (Sigma-Aldrich Co. LLC., 1.0 M, 100 ml) was added dropwise, and the mixture was agitated for 1 hour at 10° C. or less. The temperature was raised gradually to room temperature over the course of about 1 hour, and the mixture was left standing overnight. The precipitated salt was filtered out, the tetrahydrofuran was removed by concentration under reduced pressure, and distillation under reduced pressure was performed to obtain the target 3,7-dimethyloctyl trichlorosilane (99-102° C./0.3 Torr, 22.3 g, yield 81%).

[Chemical Formula 123]

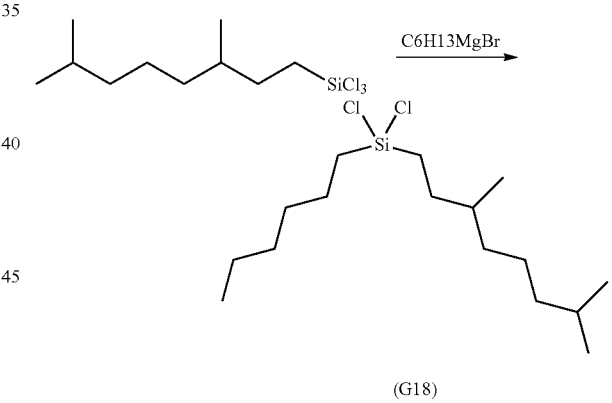

Tetrahydrofuran (50 ml) and 3,7-dimethyloctyl trichlorosilane (11.0 g, 40.0 mmol) were placed in a 200 mL four-necked flask in a nitrogen atmosphere, and cooled to −20° C. n-hexyl magnesium bromide (Sigma-Aldrich Co. LLC., 2.0 M, 21 ml) was added dropwise, and the mixture was agitated for 1 hour at 10° C. or less. The temperature was raised gradually to room temperature over the course of about 1 hour, and the mixture was left standing overnight. The precipitated salt was filtered out, the tetrahydrofuran was removed by concentration under reduced pressure, and distillation under reduced pressure was performed to obtain the target 3,7-dimethyloctyl-n-hexyl-dichlorosilane (Compound G18) (127-130° C./0.26 Torr, 9.5 g, yield 73%).

Compound G18: $^1$H-NMR (400 MHz, solvent: deuterated chloroform): δ1.54-1.46 (m, 4H), 1.41-1.21 (m, 11H), 1.17-1.02 (m, 7H), 0.91-0.86 (m, 12H)

Synthesis Example B16

Synthesis of Compound G19

[Chemical Formula 124]

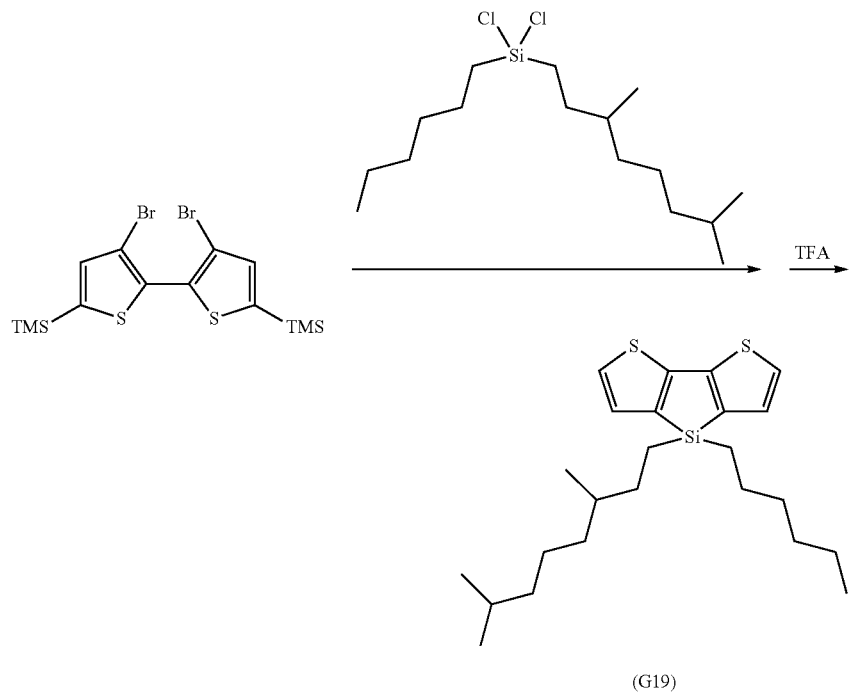

(G19)

3,3'-dibromo-5,5'-bis(trimethylsilyl)-2,2'-bithiophene (Compound G4, synthesized in accordance with WO 2010/136353, 11.4 g, 24.3 mmol) was placed in a 500 mL four-necked flask in a nitrogen atmosphere, and dissolved in tetrahydrofuran (200 mL). This was cooled to −78° C., and a solution of n-butyl lithium in hexane (KANTO CHEMICAL CO., INC., 1.59 M, 32.1 mL) was added dropwise. After about 20 minutes of agitation, the 3,7-dimethyloctyl-n-hexyl-dichlorosilane (Compound G18, 9.5 g) synthesized in Synthesis Example B15 was added dropwise. The temperature was raised gradually to room temperature over the course of about 2 hours, water was added, and the product was extracted with hexane. The organic layer was washed with water, dried over sodium sulfate, and concentrated by filtration. The resulting oily substance was dissolved in chloroform (40 mL) and hexane (80 mL), trifluoroacetic acid (3.6 mL) was added, and the mixture was agitated for about 10 minutes at room temperature. Saturated sodium bicarbonate solution was added to the reaction solution, which was extracted with hexane and then concentrated under reduced pressure. The resulting yellow oily substance was dissolved in hexane, and subjected to silica gel column chromatography (solvent: hexane) to obtain the target 4-(3,7-dimethyloctyl)-4-n-hexyldithieno[3,2-b:2',3'-d]silole (Compound G19, 8.2 g, yield 81%).

Compound G19: $^1$H-NMR (400 MHz, solvent: deuterated chloroform): δ7.19 (d, 2H J=4.8 Hz), 7.05 (d, 1H, J=5.2 Hz), 7.05 (d, 1H, J=4.0 Hz), 1.52-1.46 (m, 2H), 1.42-1.34 (m, 2H), 1.30-1.18 (m, 10H), 1.11-1.08 (m, 4H), 0.92-0.88 (m, 4H), 0.85-0.80 (m, 12H)

Synthesis Example B17

Synthesis of Compound G20

[Chemical Formula 125]

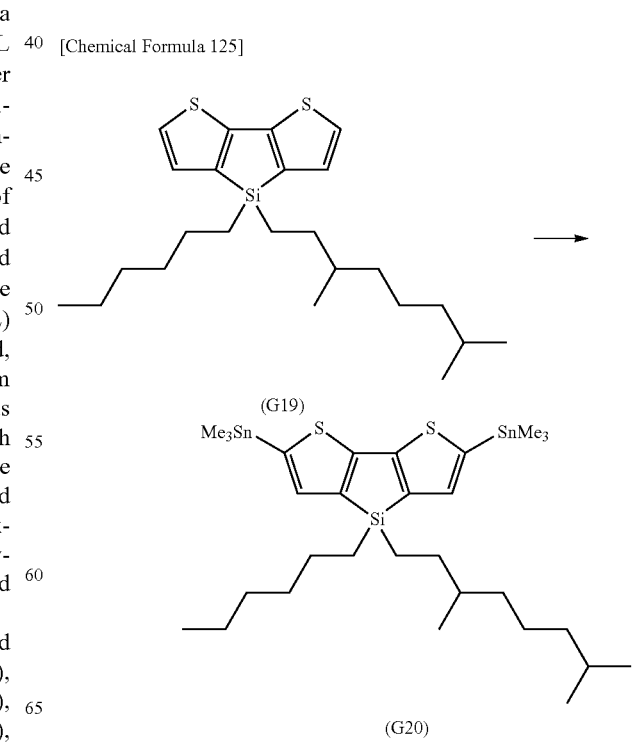

(G20)

A reaction was performed as in Synthesis Example B2 except that the Compound G19 (3.06 g, 7.31 mmol) was used instead of the Compound G2, while the other reagents were used in similar proportions, to quantitatively obtain 4-(3,7-dimethyloctyl)-4-n-hexyl-2,6-bis(trimethyltin)-dithieno[3,2-b:2',3'-d]silole (Compound G20).

Compound G20: $^1$H-NMR (400 MHz, solvent: deuterated chloroform): δ7.08 (s, 2H), 1.52-1.46 (m, 2H), 1.42-1.34 (m, 2H), 1.30-1.18 (m, 10H), 1.11-1.08 (m, 4H), 0.92-0.88 (m, 4H), 0.85-0.80 (m, 12H), 0.38 (s, 18H)

Synthesis Example B18

Synthesis of Compound G21

[Chemical Formula 126]

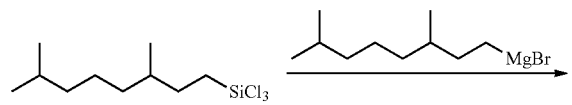

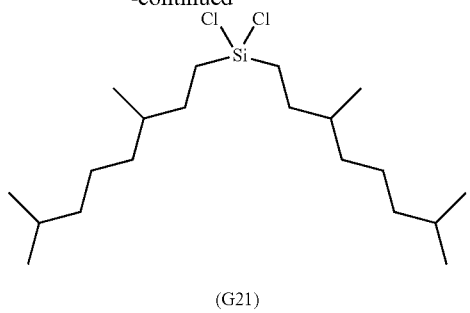

(G21)

Tetrahydrofuran (50 mL) and 3,7-dimethyloctyl trichlorosilane (11.27 g, 40.9 mmol) were placed in a 200 mL four-necked flask in a nitrogen atmosphere, and cooled to −20° C. 3,7-dimethyloctyl magnesium bromide (Sigma-Aldrich Co. LLC., 1.0 M, 42.9 ml) as added dropwise, and the mixture was agitated for 1 hour at 10° C. or less. The temperature was raised gradually to room temperature over the course of about 1 hour, and the mixture was left standing overnight. The precipitated salt was filtered out, the tetrahydrofuran was removed by concentration under reduced pressure, and distillation under reduced pressure was performed to obtain the target bis(3,7-dimethyloctyl)dichlorosilane (Compound G21) (150-152° C./0.6 Torr, 11.3 g, yield 73%).

Compound G21: $^1$H-NMR (400 MHz, solvent: deuterated chloroform): δ1.56-1.44 (m, 4H), 1.43-1.37 (m, 2H), 1.35-1.21 (m, 8H), 1.17-0.99 (m, 10H), 0.89-0.86 (m, 18H)

Synthesis Example B19

Synthesis of Compound G22

[Chemical Formula 127]

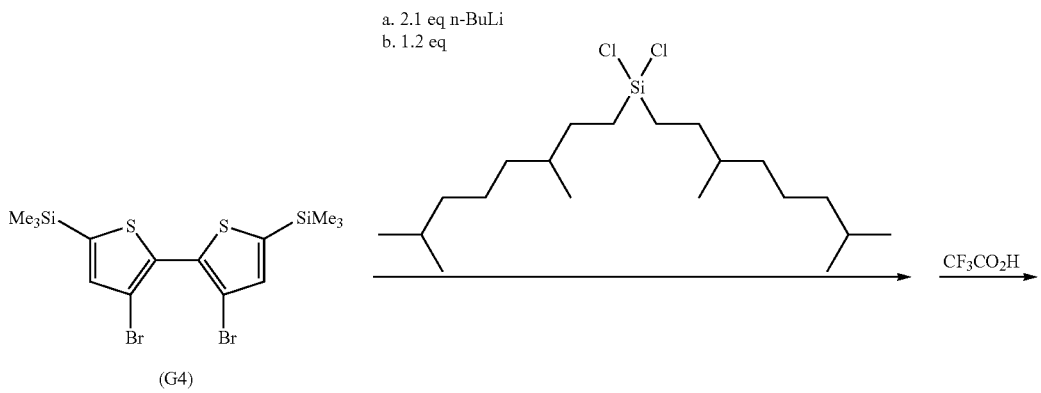

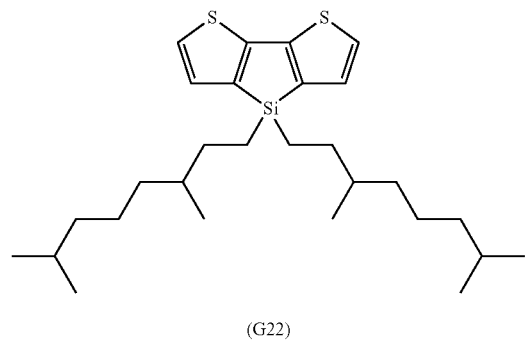

(G22)

3,3'-dibromo-5,5'-bis(trimethylsilyl)-2,2'-bithiophene (Compound G4, synthesized in accordance with WO 2010/136353, 11.6 g, 24.7 mmol) was placed in a 500 mL four-necked flask in a nitrogen atmosphere, and dissolved in tetrahydrofuran (200 mL). This was cooled to −78° C., and a solution of n-butyl lithium in hexane (KANTO CHEMICAL CO., INC., 1.59 M, 32.7 mL) was added dropwise. After about 20 minutes of agitation, the bis(3,7-dimethyloctyl)dichlorosilane (Compound G21, 11.3 g) synthesized in Synthesis Example B18 was added dropwise. The temperature was raised gradually to room temperature over the course of about 2 hours, water was added, and the product was extracted with hexane. The organic layer was washed with water, dried over sodium sulfate, and concentrated by filtration. The resulting oily substance was dissolved in chloroform (40 mL) and hexane (80 mL), trifluoroacetic acid (3.7 mL) was added, and the mixture was agitated for about 10 minutes at room temperature. Saturated sodium bicarbonate solution was added to the reaction solution, which was extracted with hexane and then concentrated under reduced pressure. The resulting yellow oily substance was dissolved in hexane, and subjected to silica gel column chromatography (solvent: hexane) to obtain the target 4,4-bis(3,7-dimethyloctyl)-dithieno[3,2-b:2',3'-d]silole (Compound G22, 6.5 g, yield 56%.

Compound G22: $^1$H-NMR (400 MHz, solvent: deuterated chloroform): δ7.19 (d, 2H J=4.8 Hz), 7.05 (d, 2H, J=4.8 Hz), 1.53-1.46 (m, 2H), 1.41-1.33 (m, 2H), 1.30-1.15 (m, 8H), 1.10-1.00 (m, 8H), 0.94-0.87 (m, 4H), 0.85-0.80 (m, 18H)

Synthesis Example B20

Synthesis of Compound G23

[Chemical Formula 128]

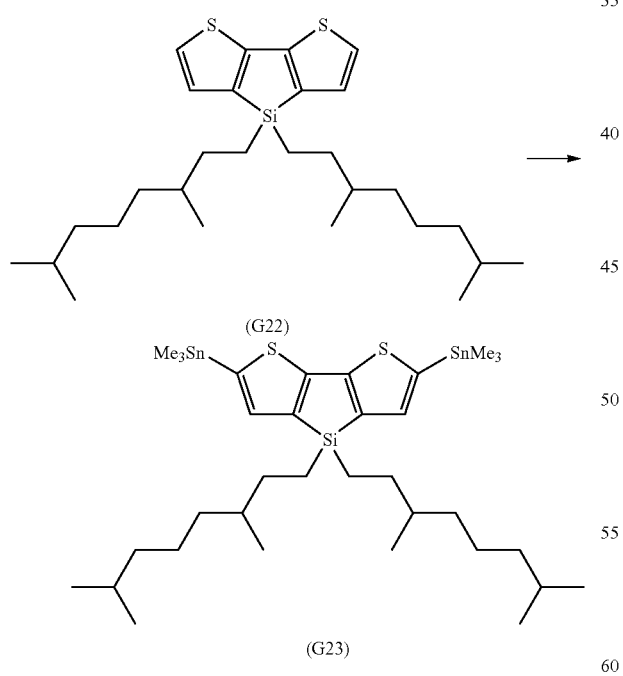

A reaction was performed as in Synthesis Example B2 except that the Compound G22 (3.36 g, 6.44 mmol) was used instead of the Compound G2, while the other reagents were used in similar proportions, to quantitatively obtain 4,4-di-n-decyl-2,6-bis(trimethyltin)-dithieno[3,2-b:2',3'-d]silole (Compound G23).

Compound G23: $^1$H-NMR (400 MHz, solvent: deuterated chloroform): δ7.08 (s, 2H), 1.45-1.38 (m, 2H), 1.40-1.32 (m, 2H), 1.30-1.15 (m, 8H), 1.10-1.00 (m, 8H), 0.94-0.87 (m, 4H), 0.85-0.80 (m, 18H)

Example B10

Synthesis Example of Copolymer 12B

[Chemical Formula 129]

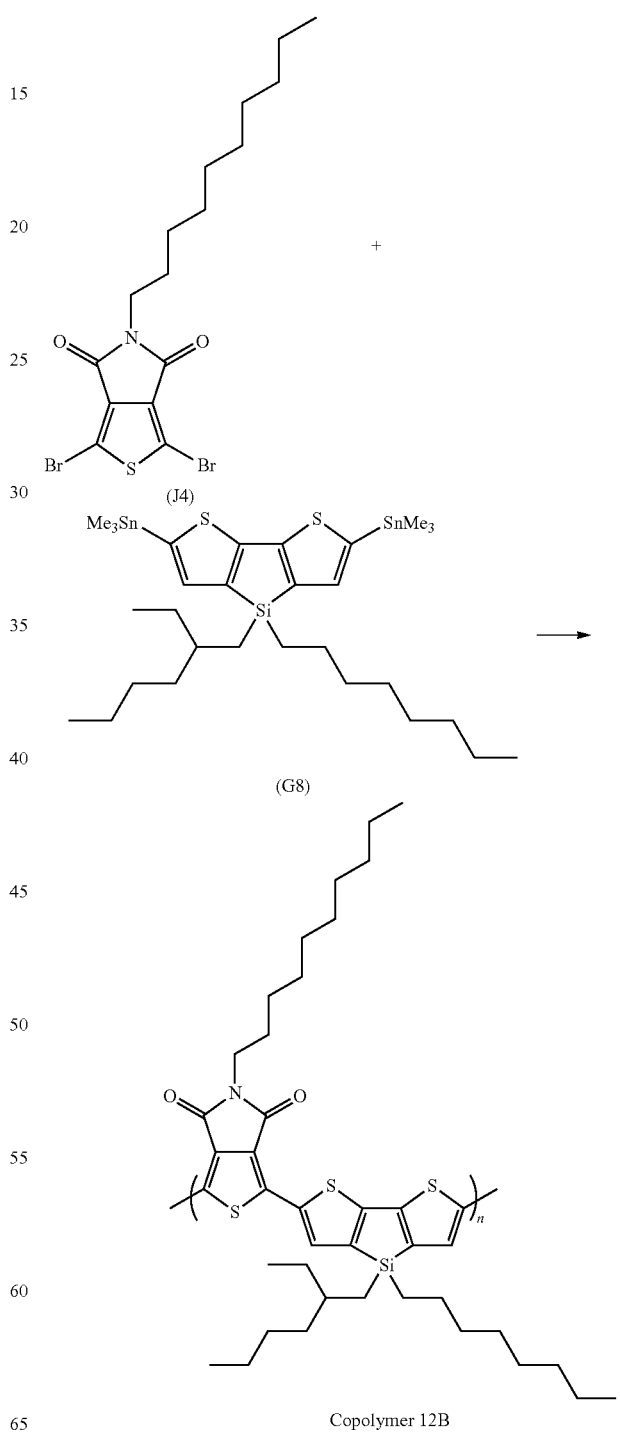

Copolymer 12B 1,3-dibromo-5-decyl-4H-thieno[3,4-c]pyrrole-4,6-(5H)-dione (Compound J4 (imidothiophene dibromide), 172 mg, 0.380 mmol) obtained with reference to the methods described in known literature (Organic Letters 2004, 6, 3381-3384) and the Compound G8 (298 mg, 0.400 mmol) obtained in Synthesis Example B5 as monomers were placed in a 50 mL two-necked recovery flask in a nitrogen atmosphere, tetrakis(triphenylphosphine)palladium (0) (13.9 mg, 3 mol %), the triphenylphosphine-containing heterogeneous palladium complex catalyst Pd-EnCat TPP30 (Sigma-Aldrich Co. LLC., 18.0 mg, 3 mol %), toluene (10.8 mL) and N,N-dimethylformamide (2.1 mL) were added, and the mixture was agitated for 1 hour at 90° C. and 11 hours at 100° C. The reaction solution was diluted 4 times with toluene, and heated and agitated for another 0.5 hours at 100° C., after which terminal treatment was performed by adding trimethyl(phenyl)tin (0.5 mL) and heating and agitating for 8 hours at 100° C., then adding bromobenzene (5.0 mL) and heating and agitating for 8 hours at 100° C., after which the reaction solution was poured into methanol and the precipitate was filtered out. The resulting solid was dissolved in chloroform, diamine silica gel (Fuji Silysia Chemical Ltd.) was added, and the mixture was agitated for 1 hour at room temperature and passed through a short column of acidic silica gel. The solution was concentrated and recrystallized with chloroform/ethyl acetate as the solvent, and the precipitate was filtered out to obtain the target Copolymer 12B (177 mg). The resulting Copolymer 12B had a weight-average molecular weight Mw of $3.81 \times 10^5$, and a PDI of 6.2.

Example B11

Synthesis Example of Copolymer 13B

[Chemical Formula 130]

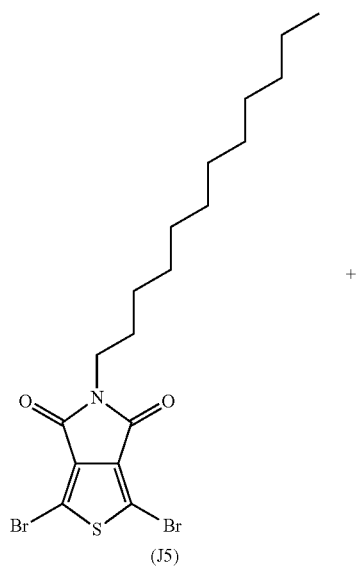

(J5)

+

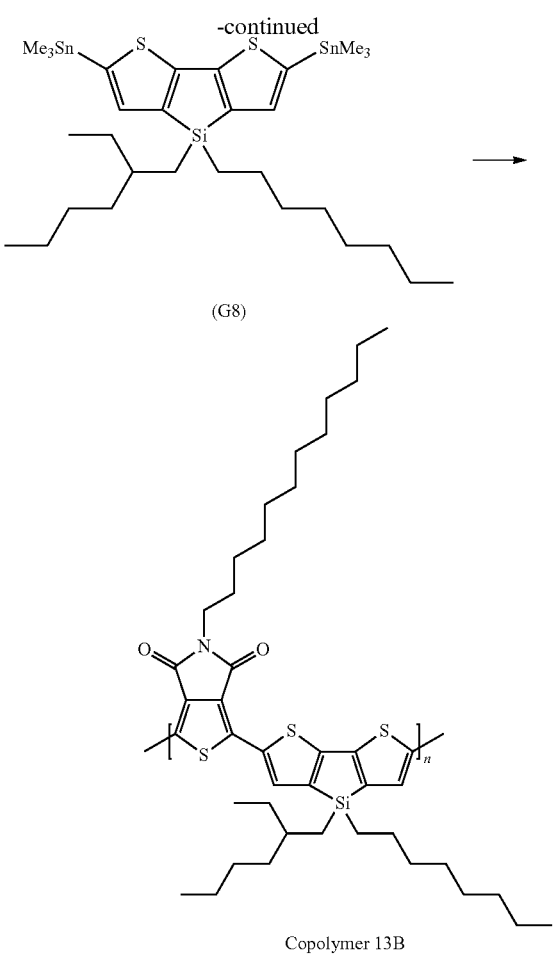

(G8)

Copolymer 13B 1,3-dibromo-5-dodecyl-4H-thieno[3,4-c]pyrrole-4,6-(5H)-dione (Compound J5 (imidothiophene dibromide), 182 mg, 0.380 mmol) obtained with reference to the methods described in known literature (Organic Letters 2004, 6, 3381-3384) and the Compound G8 (298 mg, 0.400 mmol) obtained in Synthesis Example B5 as monomers were placed in a 50 mL two-necked recovery flask in a nitrogen atmosphere, tetrakis(triphenylphosphine)palladium (0) (13.9 mg, 3 mol %), the triphenylphosphine-containing heterogeneous palladium complex catalyst Pd-EnCat TPP30 (Sigma-Aldrich Co. LLC., 18.0 mg, 3 mol %), toluene (10.8 mL) and N,N-dimethylformamide (2.1 mL) were added, and the mixture was agitated for 1 hour at 90° C. and 11 hours at 100° C. The reaction solution was diluted 4 times with toluene, and heated and agitated for another 0.5 hours at 100° C., after which terminal treatment was performed by adding trimethyl(phenyl)tin (0.5 mL) and heating and agitating for 8 hours at 100° C., then adding bromobenzene (5.0 mL) and heating and agitating for 8 hours at 100° C., after which the reaction solution was poured into methanol and the precipitate was filtered out. The resulting solid was dissolved in chloroform, diamine silica gel (Fuji Silysia Chemical Ltd.) was added, and the mixture was agitated for 1 hour at room temperature and passed through a short column of acidic silica gel. The solution was concentrated and recrystallized with chloroform/ethyl acetate as the solvent, and the precipitate was filtered out to obtain the target Copolymer 13B (176 mg). The resulting Copolymer 13B had a weight-average molecular weight Mw of $3.40 \times 10^5$, and a PDI of 5.8.

Example B12

Synthesis Example of Copolymer 14B

[Chemical Formula 131]

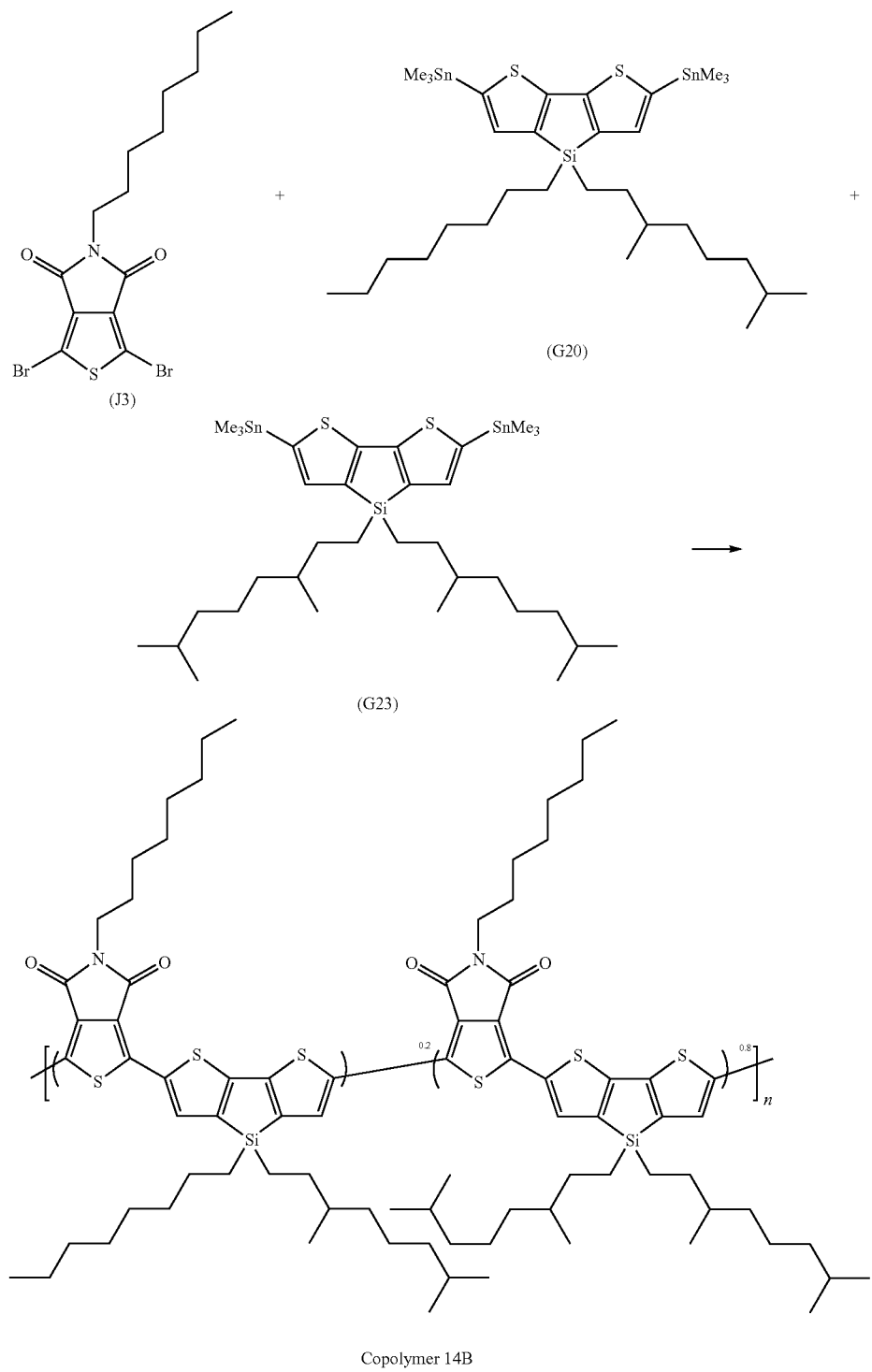

1,3-dibromo-5-octyl-4H-thieno[3,4-c]pyrrole-4,6-(5H)-dione (Compound J3 (imidothiophene dibromide), 154.9 mg, 0.366 mmol) obtained with reference to methods described in known literature (Organic Letters 2004, 6, 3381-3384), the Compound G20 (143.4 mg, 0.193 mmol) obtained in Synthesis Example B17 and the Compound G23 (154.2 mg, 0.193 mmol) obtained in Synthesis Example B20 as monomers were placed in a 50 mL two-necked recovery flask in a nitrogen atmosphere, tetrakis(triphenylphosphine)palladium (0) (12.7 mg, 3 mol %), the triphenylphosphine-containing heterogeneous palladium complex catalyst Pd-EnCat TPP30 (Sigma-Aldrich Co. LLC., 16.5 mg, 3 mol %), toluene (10 mL) and N,N-dimethylformamide (2 mL) were added, and the mixture was agitated for 1 hour at 90° C. and 2.5 hours at 100° C. The reaction solution was diluted 4 times with toluene, and heated and agitated for another 0.5 hours at 100° C., after which terminal treatment was performed by adding trimethyl(phenyl)tin (0.10 mL) and heating and agitating for 8 hours at 100° C., then adding bromobenzene (2 mL) and heating and agitating for 8 hours at 100° C., after which the reaction solution was poured into methanol and the precipitate was filtered out. The resulting solid was dissolved in chloroform, diamine silica gel (Fuji Silysia Chemical Ltd.) was added, and the mixture was agitated for 1 hour at room temperature and passed through a short column of acidic silica gel. The solution was concentrated and recrystallized with chloroform/ethyl acetate as the solvent, and the precipitate was filtered out to obtain the target Copolymer 14B (169 mg). The resulting Copolymer 14B had a weight-average molecular weight Mw of $2.46 \times 10^5$, and a PDI of 7.7.

Preparation of Photoelectric Conversion Element

Example B1-2

The Copolymer 1B as a p-type semiconductor compound and a mixture of the fullerene compounds PC61BM (phenyl C61 butyric acid methyl ester) and PC71BM (phenyl C71 butyric acid methyl ester) as n-type semiconductor compounds (Frontier Carbon Corporation, nanom spectra E123) were dissolved in a mixed o-xylene/tetralin solvent (volume ratio 9:1) in a nitrogen atmosphere to a concentration of 1.8 mass %. This solution was agitated and mixed for 1 hour at a temperature of 80° C. on a hot stirrer. After agitation and mixing, the solution was filtered with a 1 μm polytetrafluoroethylene (PTFE) filter to give an ink for coating an active layer. A glass substrate (GEOMATEC Co., Ltd.) with a patterned indium-tin oxide (ITO) transparent conductive film was sequentially ultrasound washed with acetone, and then ultrasound washed with isopropanol, and then dried by nitrogen blowing and UV-ozone treated.

Next, about 0.1 mL of a solution of zinc acetate 2-dihydrate (Wako Pure Chemical Industries, Ltd.) dissolved to a concentration of 105 mg/mL in a mixed solvent of 2-methoxyethanol (Sigma-Aldrich Co. LLC.) and ethanolamine (Sigma-Aldrich Co. LLC.) (volume ratio 100:3) was spin coated at a rate of 3000 rpm, UV-ozone treated, and heated for 15 minutes in an oven at 200° C. to form an electron extraction layer.

The substrate with the electron extraction layer formed thereon was put into a glove box, heat treated for 3 minutes at 150° C. in a nitrogen atmosphere and cooled, after which an active layer coating ink prepared as described above (0.12 mL) was spin coated to form an active layer.

Furthermore, a molybdenum trioxide ($MoO_3$) film as the hole extraction layer and then a silver film with a film thickness of 100 nm as the electrode layer were formed sequentially on an active layer by resistance heating vacuum deposition to prepare a 5 mm-square photoelectric conversion element.

Thus prepared photoelectric conversion element was evaluated by measuring the current-voltage characteristics as described above. The results are shown in Table 2 together with the weight ratio of the p-type semiconductor compound and n-type semiconductor compounds, the thickness of the active layer, and the thickness of the molybdenum trioxide ($MoO_3$) film.

Example B3-2

A photoelectric conversion element was prepared and evaluated as in Example B1-2 except that the Copolymer 3B was used as the p-type semiconductor compound. The results are given in Table 2.

Example B4-2

A photoelectric conversion element was prepared and evaluated as in Example B1-2 except that the Copolymer 4B was used as the p-type semiconductor compound. The results are given in Table 2.

Example B5-2

A photoelectric conversion element was prepared and evaluated as in Example B1-2 except that the Copolymer 5B was used as the p-type semiconductor compound. The results are given in Table 2.

Example B6-2

A photoelectric conversion element was prepared and evaluated as in Example B1-2 except that the Copolymer 6B was used as the p-type semiconductor compound. The results are given in Table 2.

Example B7-2

A photoelectric conversion element was prepared and evaluated as in Example B1-2 except that the Copolymer 7B was used as the p-type semiconductor compound. The results are given in Table 2.

Example B8-2

A photoelectric conversion element was prepared and evaluated as in Example B1-2 except that the Copolymer 8B was used as the p-type semiconductor compound. The results are given in Table 2.

Example B9-2

A photoelectric conversion element was prepared and evaluated as in Example B1-2 except that the Copolymer 9B was used as the p-type semiconductor compound. The results are given in Table 2.

Comparative Example B1-2

A photoelectric conversion element was prepared and evaluated as in Example B1-2 except that the Copolymer 10B was used as the p-type semiconductor compound. The results are given in Table 2.

Example B10-2

A photoelectric conversion element was prepared and evaluated as in Example B1-2 except that the Copolymer 12B was used as the p-type semiconductor compound. The results are given in Table 2.

Example B11-2

A photoelectric conversion element was prepared and evaluated as in Example B1-2 except that the Copolymer 13B was used as the p-type semiconductor compound. The results are given in Table 2.

Example B12-2

A photoelectric conversion element was prepared and evaluated as in Example B1-2 except that the Copolymer 14B was used as the p-type semiconductor compound. The results are given in Table 2.

copolymer that contains the repeating unit represented by Formula (1A) and the repeating unit represented by Formula (1B) has good storage stability, and because it is easy to form a coating film with this ink, the copolymer of the present invention is suited to use as a photoelectric conversion element material.

As shown in Table 2, moreover, the photoelectric conversion elements obtained using the copolymers of the present invention according to Examples B1-2, B3-2 to B12-2 all exhibited high conversion efficiency. These results show that a photoelectric conversion element for a photovoltaics with superior characteristics can be provided using the copolymer of the present invention.

TABLE 2

| | | Weight-Average Molecular Weight (Mw) | R1 | R2 | R3 | R4 | R5 |
|---|---|---|---|---|---|---|---|
| Ex B1 | Copolymer 1B | $1.50 \times 10^5$ | 2-ethylhexyl | 2-ethylhexyl | n-octyl | — | — |
| Ex B2 | Copolymer 2B | $1.78 \times 10^5$ | 2-ethylhexyl | 2-ethylhexyl | cyclohexyl | — | — |
| Ex B3 | Copolymer 3B | $2.98 \times 10^5$ | n-hexadecyl | 2-ethylhexyl | n-octyl | — | — |
| Ex B4 | Copolymer 4B | $2.26 \times 10^5$ | n-octyl | 2-ethylhexyl | n-butylthienyl | — | — |
| Ex B5 | Copolymer 5B | $3.64 \times 10^5$ | n-octyl | 2-ethylhexyl | n-octyl | 2-ethylhexyl | 2-ethylhexyl |
| Ex B6 | Copolymer 6B | $2.99 \times 10^5$ | n-octyl | 2-ethylhexyl | n-octyl | 2-ethylhexyl | 2-ethylhexyl |
| Ex B7 | Copolymer 7B | $1.67 \times 10^5$ | n-octyl | 2-ethylhexyl | n-octyl | 2-ethylhexyl | 2-ethylhexyl |
| Ex B8 | Copolymer 8B | $2.39 \times 10^5$ | n-octyl | 2-ethylhexyl | n-butylthienyl | n-octyl | n-butylthienyl |
| Ex B9 | Copolymer 9B | $4.66 \times 10^5$ | n-octyl | 2-ethylhexyl | n-octyl | 2-ethylhexyl | 2-ethylhexyl |
| CE B1 | Copolymer 10B | $1.37 \times 10^5$ | n-octyl | 2-ethylhexyl | 2-ethylhexyl | — | — |
| CE B2 | Copolymer 11B | $2.00 \times 10^5$ | 2-ethylhexyl | 2-ethylhexyl | 2-ethylhexyl | — | — |
| Ex B10 | Copolymer 12B | $3.81 \times 10^5$ | n-decyl | 2-ethylhexyl | n-octyl | — | — |
| Ex B11 | Copolymer 13B | $3.40 \times 10^5$ | n-dodecyl | 2-ethylhexyl | n-octyl | — | — |
| Ex B12 | Copolymer 14B | $2.46 \times 10^5$ | n-octyl | 3,7-dimetyloctyl | n-hexyl | 3,7-dimetyloctyl | 3,7-dimetyloctyl |

| | Molar Ratio | Monomer Sequence | Storage Stability | Absorption Maximum Wavelength [nm] | Film Thickness [nm] | PCE [%] | PN Ratio | MoO$_3$ Film Thickness [nm] |
|---|---|---|---|---|---|---|---|---|
| Ex B1 | about 100 | Alternating Copolymer | ○ | 677 | 220 | 6.77 | 2.0 | 1.5 |
| Ex B2 | about 100 | Alternating Copolymer | ◉ | 673 | — | No Data | — | — |
| Ex B3 | about 100 | Alternating Copolymer | ◉ | 677 | 220 | 6.71 | 2.0 | 3.0 |
| Ex B4 | about 100 | Alternating Copolymer | ◉ | 670 | 100 | 7.76 | 2.0 | 1.5 |
| Ex B5 | about 90 | Random | ◉ | 676 | 220 | 7.74 | 2.0 | 1.5 |
| Ex B6 | about 80 | Random | ◉ | 676 | 250 | 8.77 | 2.0 | 1.5 |
| Ex B7 | about 70 | Random | ◉ | 675 | 210 | 8.56 | 2.0 | 1.5 |
| Ex B8 | about 50 | Random | ○ | 672 | 90 | 6.89 | 2.0 | 1.5 |
| Ex B9 | about 80 | Block | ○ | 677 | 220 | 9.33 | 2.0 | 1.5 |
| CE B1 | about 100 | Alternating Copolymer | X | 671 | 210 | 6.44 | 2.0 | 1.5 |
| CE B2 | about 100 | Alternating Copolymer | X | 673 | — | No Data | — | — |
| Ex B10 | about 100 | Alternating Copolymer | ○ | 678 | 240 | 9.19 | 2.0 | 1.5 |
| Ex B11 | about 100 | Alternating Copolymer | ○ | 677 | 210 | 8.50 | 2.0 | 1.5 |
| Ex B12 | about 50 | Random | ◉ | 676 | 90 | 6.13 | 2.5 | 1.5 |

As shown above, although the Copolymers of Comparative Example B1 and Comparative Example B2 had relatively high molecular weights, the storage stability of the inks containing these polymers was poor.

On the other hand, the copolymers of Examples B1 to B12 (the copolymers of the present invention) all had high molecular weights, and inks containing these copolymers had good storage stability. Moreover, the inks containing the copolymers had good storage stability even if a substituent of a nitrogen atom in the imidothiophene ring was a 2-ethylhexyl group or a linear octyl group. Thus, an ink containing a While the present invention has been described in detail and with reference to specific embodiments thereof, it will be apparent to one skilled in the art that various changes and modifications can be made therein without departing from the spirit and scope thereof.

REFERENCE SIGNS LIST

101 Anode
102 Hole extraction layer
103 Active layer

104 Electron extraction layer
105 Cathode
106 Base material
107 Photoelectric conversion element
1 Weather-resistant protective film
2 Ultraviolet protection film
3, 9 Gas barrier film
4, 8 Getter film
5, 7 Seal material
6 Photovoltaics element
10 Back sheet
12 Base material
13 Photovoltaic module
14 Thin photovoltaics

The invention claimed is:
1. A copolymer, comprising:
a repeating unit represented by Formula (1A);
a repeating unit represented by Formula (1B); and
a repeating unit represented by Formula (1C),

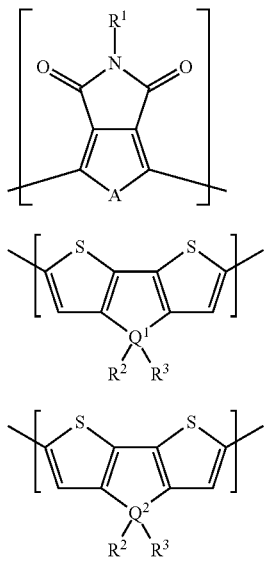

where A represents an atom selected from elements of Group 16 of the periodic table,
each of $Q^1$ and $Q^2$ independently represents an atom selected from elements of Group 14 of the periodic table,
$R^1$ represents a hydrocarbon group optionally having a heteroatom,
$R^2$ represents an optionally substituted branched alkyl group,
$R^4$ represents an optionally substituted linear alkyl group, optionally substituted aromatic hydrocarbon group, or optionally substituted aromatic heterocyclic group,
each of $R^3$ and $R^5$ independently represents an optionally substituted branched alkyl group, optionally substituted linear alkyl group, optionally substituted cycloalkyl group, optionally substituted aromatic hydrocarbon group, optionally substituted aliphatic heterocyclic group, or optionally substituted aromatic heterocyclic group, and
at least one of a combination of $R^2$ and $R^5$ and a combination of $R^3$ and $R^4$ is a combination of groups that are different from each other, wherein a ratio of the repeating units represented by Formula (1B) and a ratio of the repeating units represented by Formula (1C) each satisfies 1 mol % or more and 98 mol % or less.

2. The copolymer according to claim 1, wherein the copolymer comprises a repeating unit represented by Formula (2A) and a repeating unit represented by Formula (2B),

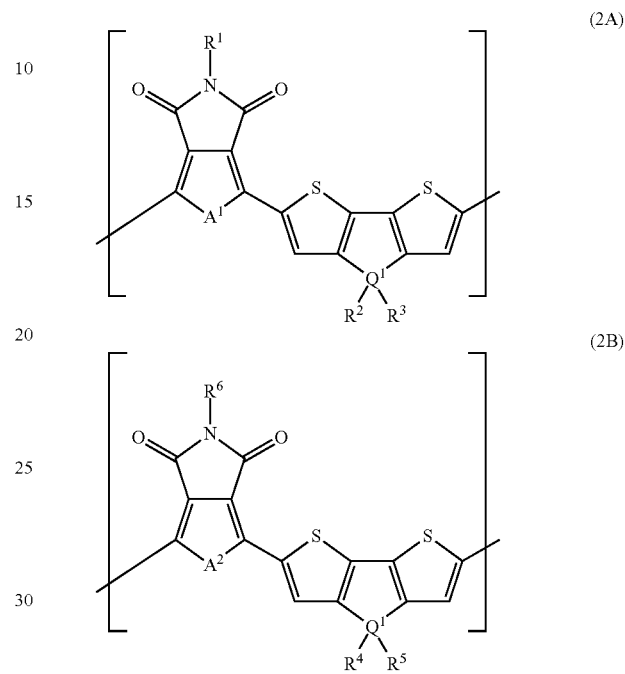

wherein each of $A^1$ and $A^2$ independently represents an atom selected from elements of group 16 of the periodic table,
each of $Q^1$ and $Q^2$ independently represents an atom selected from elements of Group 14 of the periodic table,
each of $R^1$ and $R^6$ independently represents a hydrocarbon group optionally having a heteroatom,
$R^2$ represents an optionally substituted branched alkyl group,
$R^4$ represents an optionally substituted linear alkyl group, optionally substituted aromatic hydrocarbon group, or optionally substituted aromatic heterocyclic group,
each of $R^3$ and $R^5$ independently represents an optionally substituted branched alkyl group, optionally substituted linear alkyl group, optionally substituted cycloalkyl group, optionally substituted aromatic hydrocarbon group, optionally substituted aliphatic heterocyclic group, or optionally substituted aromatic heterocyclic group, and
at least one of a combination of $R^2$ and $R^5$ and a combination of $R^3$ and $R^4$ is a combination of groups that are different from each other.

3. An organic semiconductor material, comprising the copolymer according to claim 1.
4. An organic electronic device, comprising the organic semiconductor material according to claim 3.
5. The organic electronic device according to claim 4, which is a photoelectric conversion element.
6. The organic electronic device according to claim 4, which is a photovoltaics.
7. A photovoltaic module, comprising the organic electronic device according to claim 6.
8. An organic semiconductor material, comprising the copolymer according to claim 2.

9. An organic electronic device comprising the organic semiconductor material according to claim 8.

10. The organic electronic device according to claim 9, which is a photoelectric conversion element.

11. The organic electronic device according to claim 9, which is a photovoltaics.

12. A photovoltaic module comprising the organic electronic device according to claim 11.

13. The copolymer according to claim 1, wherein A represents O or S.

14. The copolymer according to claim 1, wherein each of $Q^1$ and $Q^2$ independently represents C, Si, Ge, or Sn.

15. The copolymer according to claim 1, wherein $R^1$ is selected from the group consisting of an optionally substituted alkyl group, optionally substituted alkenyl group, optionally substituted aromatic hydrocarbon group, and optionally substituted aromatic heterocyclic group.

16. The copolymer according to claim 1, wherein $R^4$ is an optionally substituted linear alkyl group, and each of $R^3$ and $R^5$ is independently selected from the group consisting of an optionally substituted branched alkyl group, an optionally substituted linear alkyl group, an optionally substituted aromatic hydrocarbon group, and optionally substituted aromatic heterocyclic group.

17. The copolymer according to claim 2, wherein each of $A^1$ and $A^2$ independently represents O or S.

18. The copolymer according to claim 2, wherein each of $Q^1$ and $Q^2$ independently represents C, Si, Ge, or Sn.

19. The copolymer according to claim 2, wherein each of $R^1$ and $R^6$ is independently selected from the group consisting of an optionally substituted alkyl group, optionally substituted alkenyl group, optionally substituted aromatic hydrocarbon group, and optionally substituted aromatic heterocyclic group.

20. The copolymer according to claim 2, wherein $R^4$ is an optionally substituted linear alkyl group, and each of $R^3$ and $R^5$ is independently selected from the group consisting of an optionally substituted branched alkyl group, an optionally substituted linear alkyl group, and optionally substituted aromatic hydrocarbon group, and optionally substituted aromatic heterocyclic group.

* * * * *

UNITED STATES PATENT AND TRADEMARK OFFICE
CERTIFICATE OF CORRECTION

PATENT NO.       : 9,249,257 B2
APPLICATION NO.  : 14/556767
DATED            : February 2, 2016
INVENTOR(S)      : Junya Kawai et al.

It is certified that error appears in the above-identified patent and that said Letters Patent is hereby corrected as shown below:

On the Title page, Item (54), Title, "COPOLYMER, ORGANIC SEMICONDUCTOR MATERIAL, ORGANIC ELECTRICAL DEVICE, PHOTOVOLTAIC MODULE" should read -- COPOLYMER, ORGANIC SEMICONDUCTOR MATERIAL, ORGANIC ELECTRICAL DEVICE, AND PHOTOVOLTAIC MODULE --

Specification

Column 167, line 42, "formed" should read -- performed --

Column 181, line 56, "Compound F11" should read -- Compound F1 --

Claims

Column 289, Claim 1, Formula (1C),

" 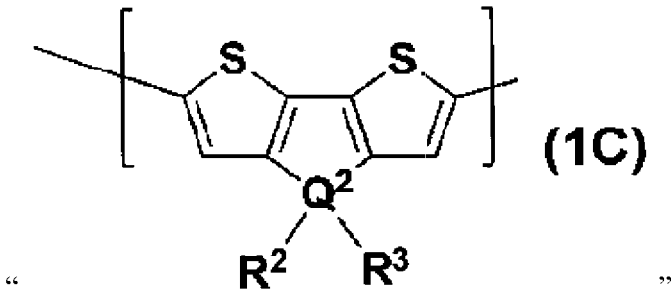 "

Signed and Sealed this
Twenty-sixth Day of July, 2016

Michelle K. Lee
*Director of the United States Patent and Trademark Office*

CERTIFICATE OF CORRECTION (continued)
U.S. Pat. No. 9,249,257 B2

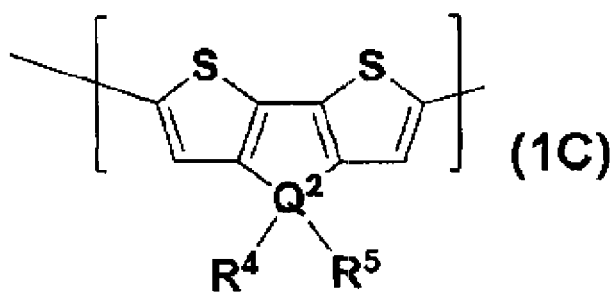

should read --                                           --

Column 290, Claim 2, Formula (2B),

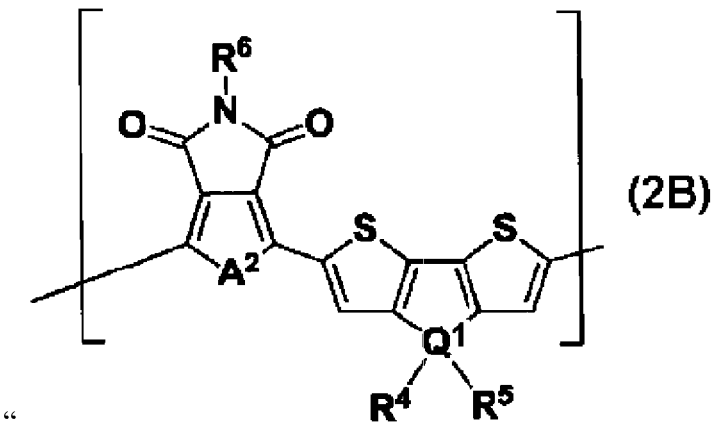

"                                                       "

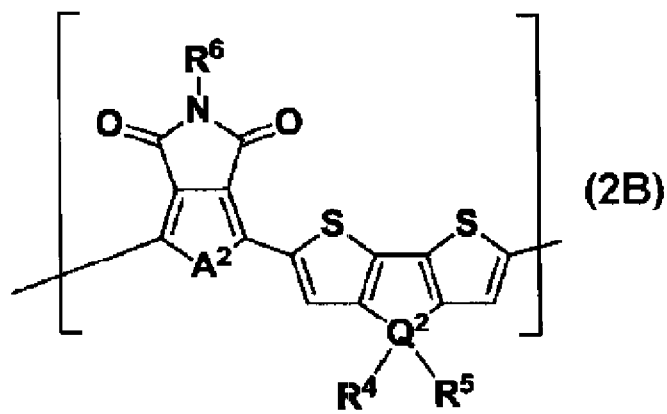

should read --                                           --

Column 291, lines 1-2, Claim 9, "An organic electronic device comprising the organic semiconductor material according to claim 8." should read -- An organic electronic device, comprising the organic semiconductor material according to claim 8. --

Column 291, lines 7-8, Claim 12, "A photovoltaic module comprising the organic electronic device according to claim 11." should read -- A photovoltaic module, comprising the organic electronic device according to claim 11. --